US011569184B2

(12) United States Patent
Tsuruda

(10) Patent No.: US 11,569,184 B2
(45) Date of Patent: Jan. 31, 2023

(54) TERAHERTZ DEVICE

(71) Applicant: ROHM Co., Ltd., Kyoto (CN)

(72) Inventor: Kazuisao Tsuruda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/719,056

(22) Filed: Apr. 12, 2022

(65) Prior Publication Data

US 2022/0238464 A1 Jul. 28, 2022

Related U.S. Application Data

(63) Continuation of application No. 16/999,029, filed on Aug. 20, 2020, now Pat. No. 11,335,653.

(30) Foreign Application Priority Data

Sep. 2, 2019 (JP) ............................ JP2019-159604

(51) Int. Cl.

| | |
|---|---|
| ***H01L 23/66*** | (2006.01) |
| ***H01Q 15/16*** | (2006.01) |
| ***H01L 29/20*** | (2006.01) |
| ***H01Q 1/22*** | (2006.01) |
| ***H01Q 19/13*** | (2006.01) |
| ***H01L 29/88*** | (2006.01) |
| ***H01Q 15/23*** | (2006.01) |

(52) U.S. Cl.

CPC .............. *H01L 23/66* (2013.01); *H01L 29/20* (2013.01); *H01Q 1/2283* (2013.01); *H01Q 15/16* (2013.01); *H01Q 19/13* (2013.01); *H01L 29/882* (2013.01); *H01L 2223/6677* (2013.01); *H01Q 15/23* (2013.01)

(58) Field of Classification Search

CPC ........ H01Q 1/2283; H01Q 1/40; H01Q 15/16; H01Q 15/23; H01Q 19/10; H01Q 19/12; H01Q 19/13; H01L 23/66; H01L 24/10; H01L 25/16; H01L 29/20; H01L 29/205; H01L 29/88; H01L 29/882; H01L 2223/6677; H01L 2224/16225; H01L 2224/32245; H01L 2224/33181; H01L 2224/48091; H01L 2224/48247; H01L 2224/73265; H01L 2224/81192; H01L 2924/181; H01L 2924/00014

See application file for complete search history.

(56) References Cited

U.S. PATENT DOCUMENTS

| | | | |
|---|---|---|---|
| 2015/0034825 A1 | 2/2015 | Debray et al. | |
| 2016/0036122 A1 | 2/2016 | Debray | |

FOREIGN PATENT DOCUMENTS

| | | |
|---|---|---|
| JP | 2016111542 A | 6/2016 |

*Primary Examiner* — Robert Karacsony

(74) *Attorney, Agent, or Firm* — Hamre, Schumann, Mueller & Larson, P.C.

(57) ABSTRACT

A terahertz device of the present invention includes a terahertz element generating an electromagnetic wave, a dielectric including a dielectric material and surrounding the terahertz element, a gas space including a gas, and a reflecting film serving as a reflecting portion. The reflecting film includes a portion opposing the terahertz element through the dielectric and the gas space and reflecting the electromagnetic wave toward a direction, wherein the electromagnetic wave is generated from the terahertz element and transmitted through the dielectric and the gas space. In addition, the refractive index of the dielectric is lower than the refractive index of the terahertz element and is higher than the refractive index of the gas in the gas space.

14 Claims, 68 Drawing Sheets

TERAHERTZ DEVICE

BACKGROUND OF THE INVENTION

Field of the Invention

The present invention relates to a terahertz device.

Description of the Prior Art

Miniaturization of electronic devices such as transistors is currently in development in the recent years, and sizes of electronic devices are now in a scale of nanometers. Thus, an occurrence of quantum effect is observed. In addition, ultra high-speed or new functional devices using the quantum effect are constantly and progressively developed.

In such environment, large-capacity communication or information processing, or imaging or measurement, is attempted using electromagnetic waves in a frequency range of 0.1 THz to 10 THz, which is said as a terahertz waveband. The foregoing frequency range attends to both properties of light and electric waves. If a device operating under this frequency band is achieved, the device can be used for numerous purposes such as measurement in various fields including physical properties, astronomy and biology, in addition to imaging, large-capacity communication and information process stated above.

As an element for generating or receiving electromagnetic waves in a frequency of the terahertz waveband, a structure integrating a resonant tunneling diode and a micro slot antenna is known (for example, refer to patent document 1).

PRIOR ART DOCUMENT

Patent Publication

[Patent document 1] Japan Patent Publication No. 2016-111542

SUMMARY OF THE INVENTION

Problems to be Solved by the Invention

There is a need for a solution for gain enhancement in a terahertz device having the foregoing terahertz element.

It is an objective of the present invention to provide a terahertz device that achieves gain enhancement.

Technical Means for Solving the Problem

To solve the above problem, a terahertz device includes: a terahertz element, generating an electromagnetic wave; a dielectric, including a dielectric material and surrounding the terahertz element; a gas space, including a gas; and a reflecting portion, including a portion opposing the terahertz element through the dielectric and the gas space and reflecting the electromagnetic wave toward a direction, wherein the electromagnetic wave is generated from the terahertz element and transmitted through the dielectric and the gas space. An element refractive index, which is the refractive index of the terahertz element, is higher than a gas refractive index, which is a refractive index of the gas, and a dielectric refractive index, which is the refractive index of the dielectric, is lower than the element refractive index and higher than the gas refractive index.

According to the configuration, the electromagnetic wave generated from the terahertz element is transmitted through the dielectric and the gas space to the reflecting film, and is reflected toward a direction by the reflecting film. Accordingly, output of the electromagnetic wave can be improved. Therefore, gain enhancement of the terahertz device is achieved.

In addition, because the terahertz element is surrounded by the dielectric having a dielectric refractive index lower than the element refractive index and higher than the gas refractive index, the refractive index decreases in a stepped manner from the terahertz element toward the reflecting film. Therefore, the change in refractive index at a boundary between inside and outside the terahertz element can be reduced. Accordingly, excessive reflection of the electromagnetic wave at the boundary between inside and outside the terahertz element can be suppressed, such that the generation of multiple resonant modes in the terahertz element can be suppressed.

To solve the above problem, a terahertz device includes: a terahertz element, receiving an electromagnetic wave; a dielectric, including a dielectric material and surrounding the terahertz element; a gas space, including a gas; and a reflecting portion, including a portion opposing the terahertz element through the dielectric and the gas space and reflecting an incident electromagnetic wave toward the terahertz element. An element refractive index, which is the refractive index of the terahertz element, is higher than a gas refractive index, which is a refractive index of the gas, and a dielectric refractive index, which is the refractive index of the dielectric, is lower than the element refractive index and higher than the gas refractive index.

According to the configuration, the electromagnetic wave incident on the reflecting film is transmitted to the terahertz element through the gas space and the dielectric, and is received by the terahertz element. Accordingly, receiving strength of the electromagnetic wave can be increased. Therefore, gain enhancement of the terahertz device is achieved.

In addition, because the terahertz element is surrounded by the dielectric having a dielectric refractive index lower than the element refractive index and higher than the gas refractive index, the refractive index increases in a stepped manner from the reflecting film toward the terahertz element. Therefore, the change in refractive index at a boundary of the terahertz element can be reduced. Accordingly, excessive reflection of the electromagnetic wave at the boundary of the terahertz element can be suppressed, such that the generation of multiple resonant modes in the terahertz element can be suppressed.

Effect of the Invention

According to the terahertz device, gain enhancement can be achieved.

DETAILED DESCRIPTION OF THE EMBODIMENTS

Details of the embodiments of a terahertz device are given with the accompanying drawings below. The embodiments are examples for illustrating specific configurations of methods based on technical concepts, and materials, shapes, structures, configurations and sizes of the constituting components are not limited to the description below. Various modifications may be added to the embodiments below. Further, regarding the drawings, parts are illustratively depicted for better clarity.

In the present invention, an expression of so-called "A is formed on B" includes, unless otherwise specified, a configuration of A being directly formed on B and a configuration of A being formed on B with an interposing object disposed between A and B. Similarly, an expression of so-called "A is disposed on B" includes, unless otherwise specified, a configuration of A being directly disposed on B and a configuration of A being disposed on B with an interposing object disposed between A and B.

Moreover, an expression of "A overlaps with B when observed in a certain direction" includes, unless otherwise specified, a configuration of a complete overlap between A and B, and a configuration of a partial overlap between A and B.

First Embodiment

Figure 1:
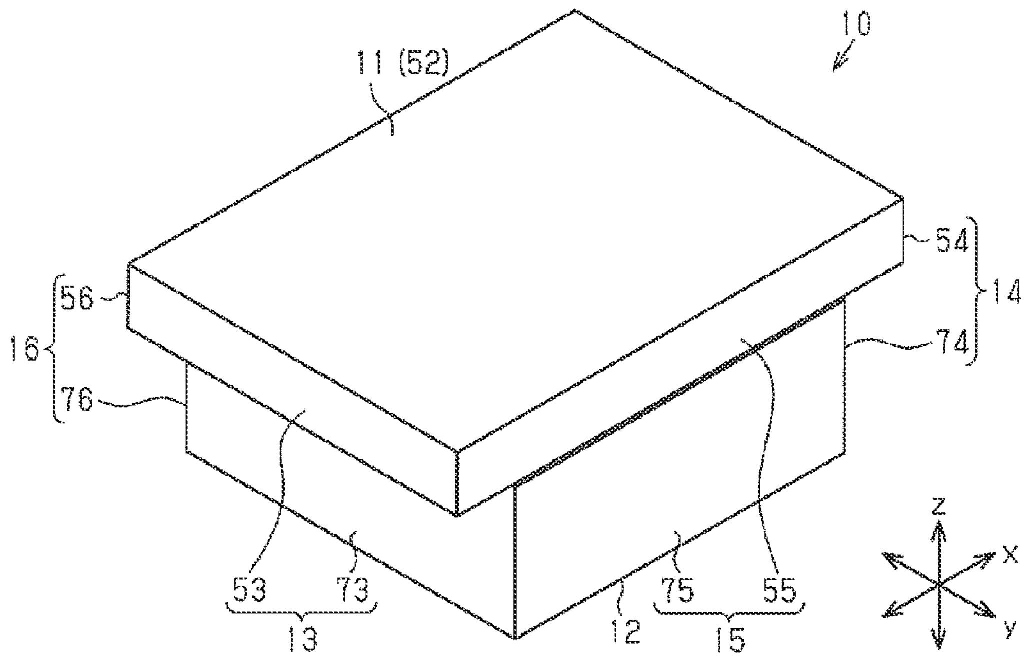
FIG. 1 is a three-dimensional diagram of a terahertz device according to a first embodiment when observed from the top.
Figure 2:
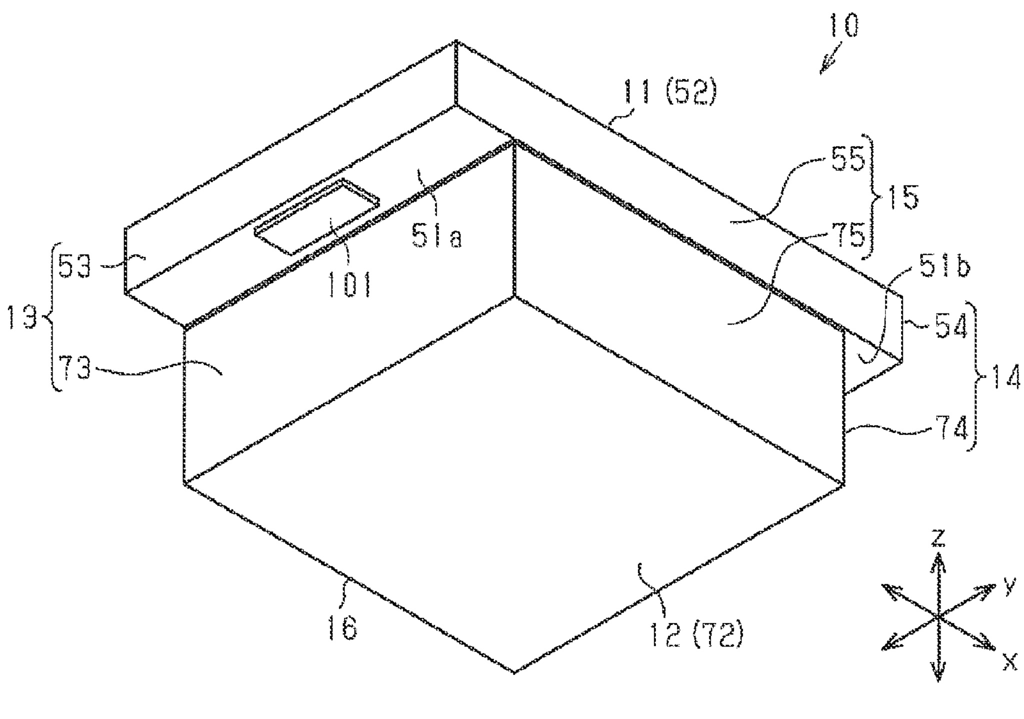
FIG. 2 is a three-dimensional diagram of a terahertz device when observed from the bottom.
Figure 3:
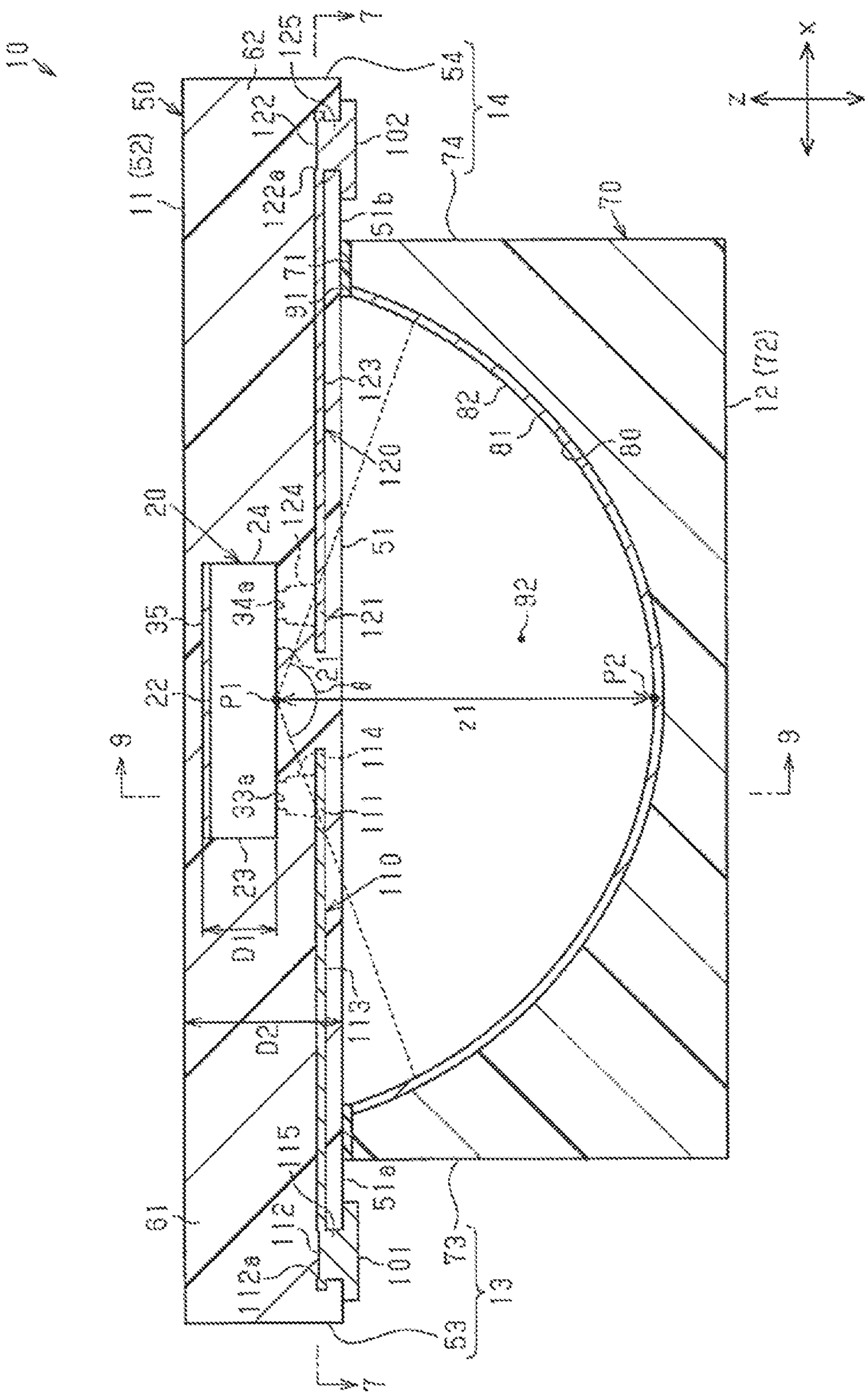
FIG. 3 is a section diagram for illustrating a sectional structure of a terahertz device.
Figure 4:
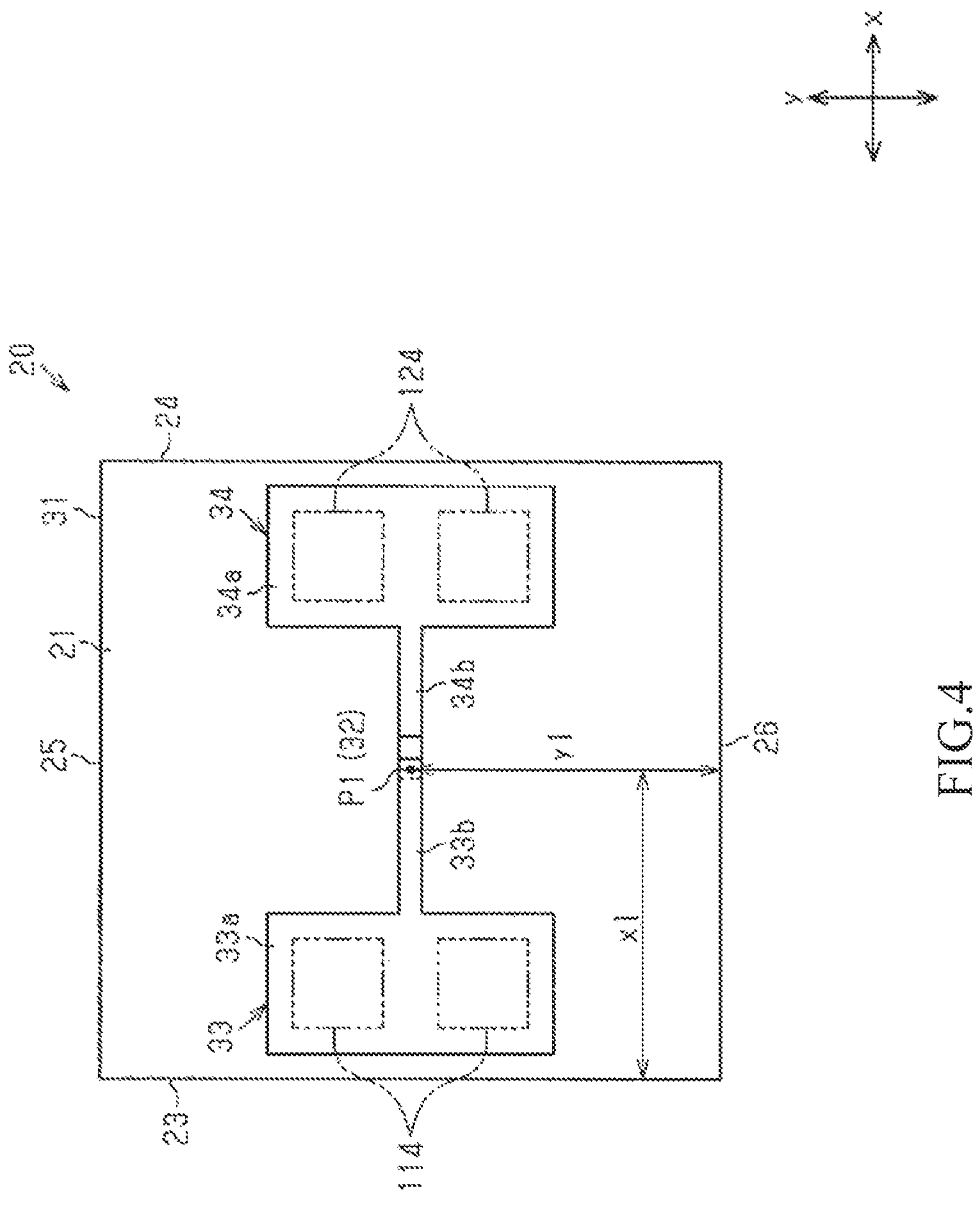
FIG. 4 is a front view of a terahertz element.
Figure 5:
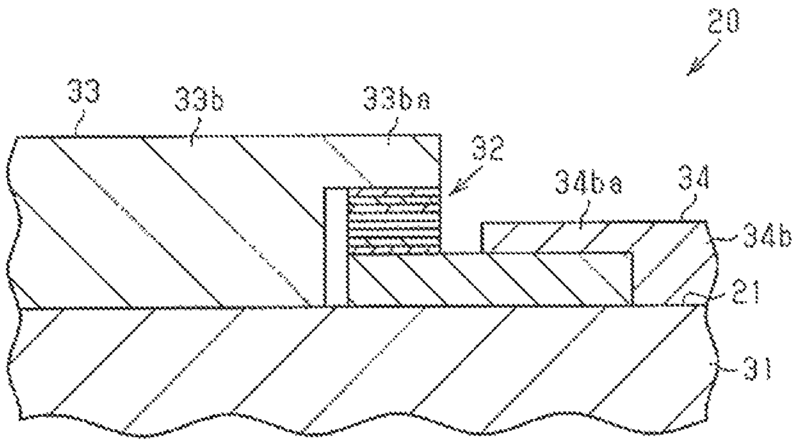
FIG. 5 is a section diagram illustratively representing an active element and peripherals thereof.
Figure 6:
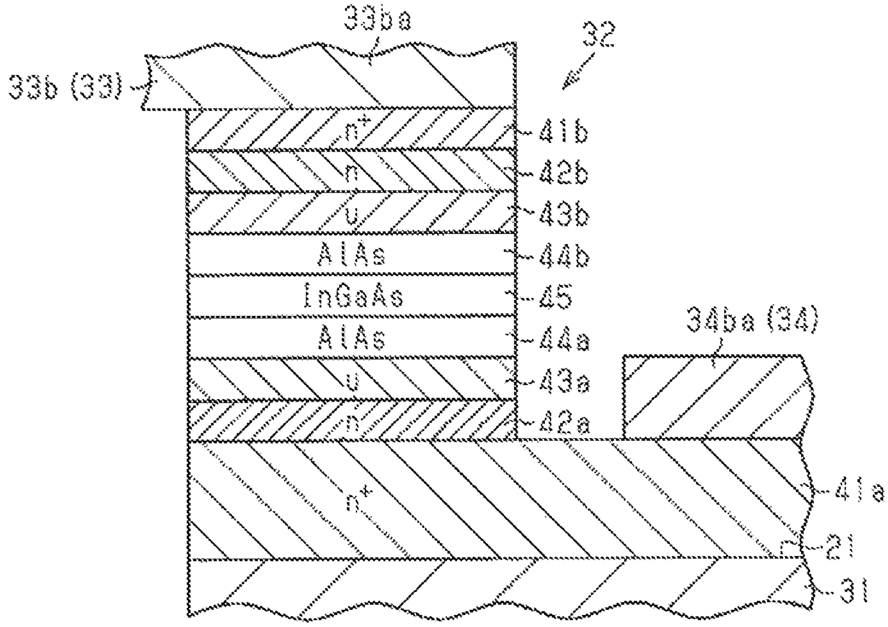
FIG. 6 shows an enlarged partial view of FIG. 5.
Figure 7:
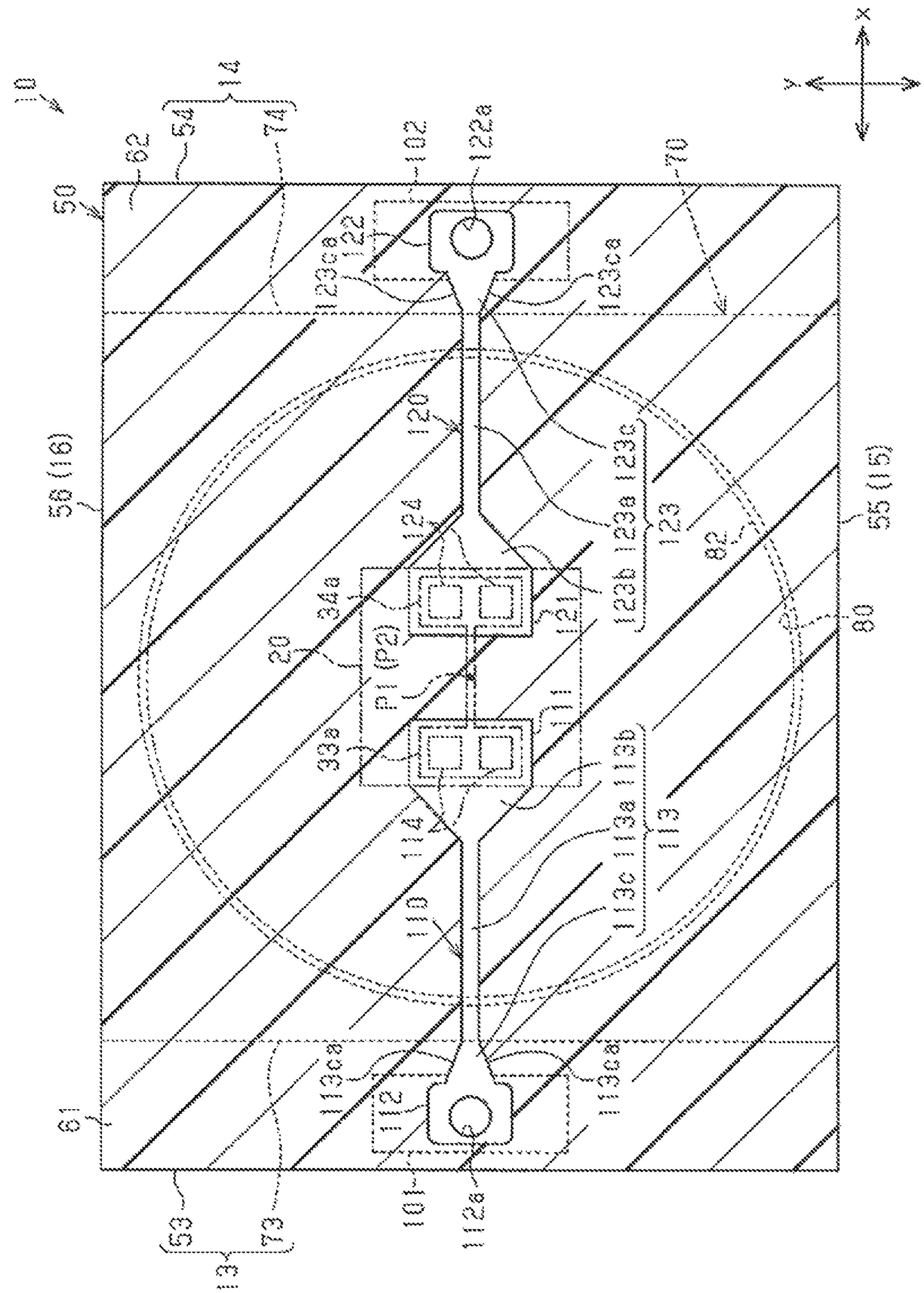
FIG. 7 is a section diagram of FIG. 3 along the line 7-7.
Figure 8:
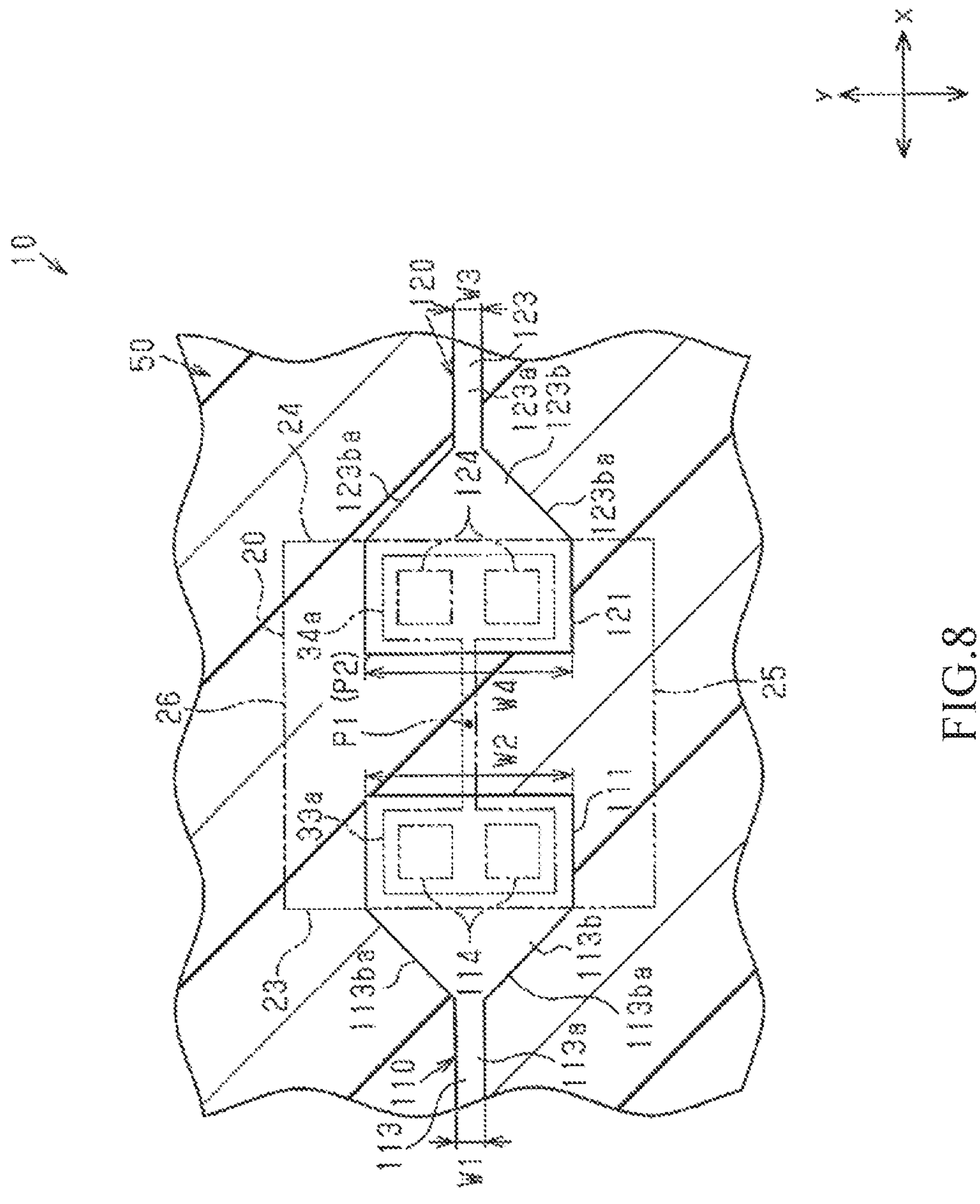
FIG. 8 shows an enlarged partial view of FIG. 7.
Figure 9:
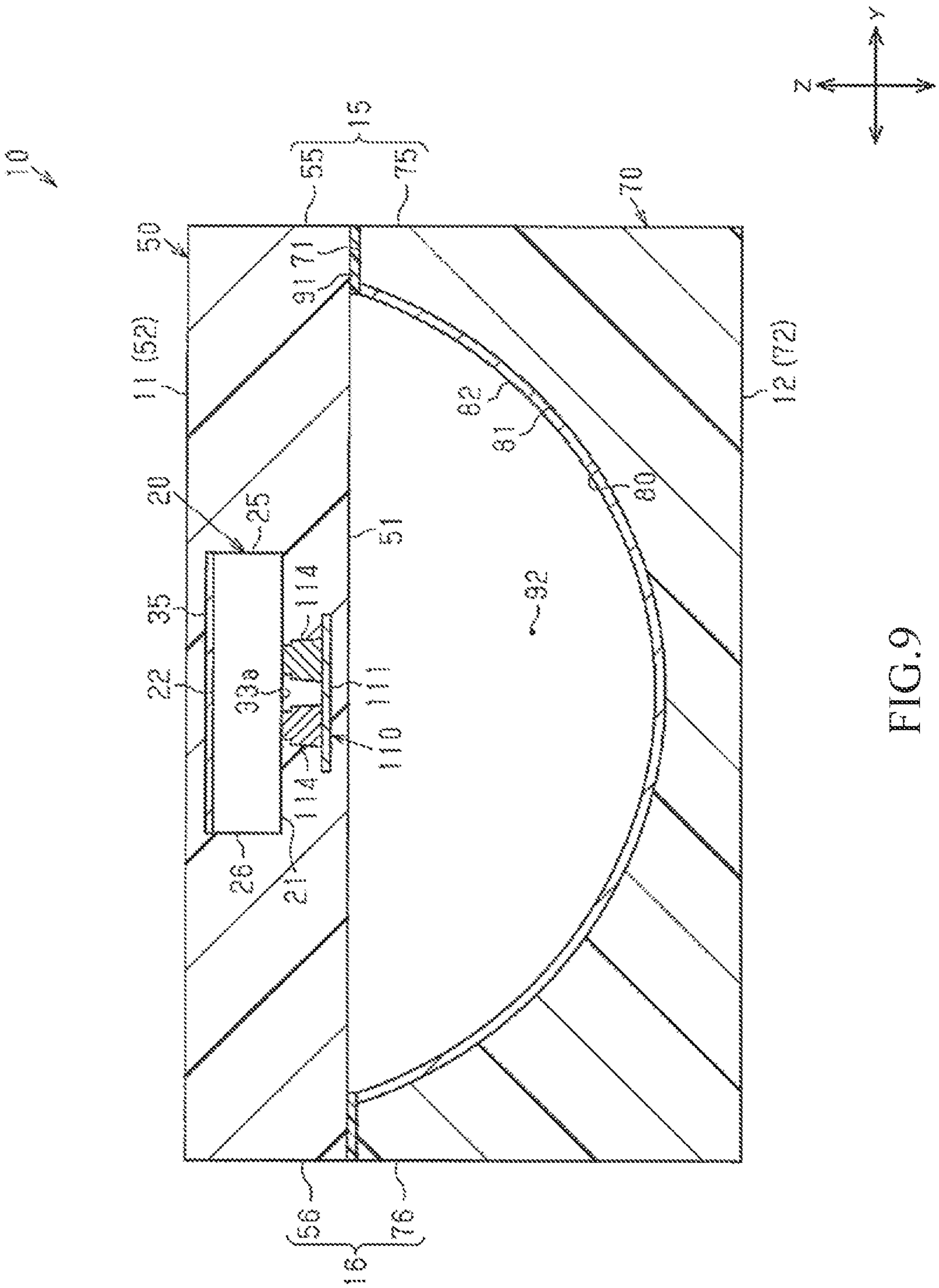
FIG. 9 is a section diagram of FIG. 3 along the line 9-9.

FIG. 1 to FIG. 9 show a terahertz device 10 according to a first embodiment of the present invention. More specifically, FIG. 1 and FIG. 2 are three-dimensional diagrams of the terahertz device 10. FIG. 3 shows a section diagram for illustrating a sectional structure of a terahertz device. FIG. 4 is a front view of a terahertz element. FIG. 5 shows a section diagram illustratively representing an active element and peripherals thereof. FIG. 6 shows an enlarged partial view of FIG. 5. FIG. 7 shows a section diagram of FIG. 3 along the line 7-7. FIG. 8 shows an enlarged partial view of FIG. 7. FIG. 9 is a section diagram of FIG. 3 along the line 9-9. In addition, for illustrating purposes, in FIG. 7 and FIG. 8, electrically conductive portions 110 and 120 are depicted by omitting some shading lines.

As shown in FIG. 1 and FIG. 2, the terahertz device 10 according to the first embodiment of the present invention in overall is rectangular in shape. The terahertz device 10 includes a device main surface 11, a surface on a side opposite to the device main surface 11, that is, a device back surface 12, and four device side surfaces 13 to 16. The device main surface 11 is shaped as a rectangle having a long side direction and a short side direction orthogonal to each other. The terahertz device 10 of this embodiment outputs (in other words, irradiates) electromagnetic waves from the device main surface 11.

For better illustration, in this embodiment, the long side direction of the device main surface 11 is set as the x direction, and the short side of the device main surface 11 is set as the y direction. Further, a direction orthogonal to the x direction and the y direction is set as the z direction. The z direction may be said as a height direction of the terahertz device 10.

The device main surface 11 and the device back surface 12 are surfaces crossing the z direction, and are orthogonal to the z direction in this embodiment. The device main surface 11 and the device back surface 12 may also be said as two end surfaces in the height direction of the terahertz device 10.

For better illustration, a direction in the z direction from the device back surface 12 toward the device main surface 11 is said as "top/upward". The top/upward may also be said as a direction orthogonal to the device main surface 11 and away from the device main surface 11. The terahertz device 10 of this embodiment outputs electromagnetic waves towards the top.

The first device side surface 13 and the second device side surface 14 are two end surfaces in the x direction of the terahertz device 10, and cross the x direction. The first device side surface 13 and the second device side surface 14 of this embodiment are orthogonal to the x direction, along the y direction and the z direction. The first device side surface 13 and the second device side surface 14 of this embodiment are formed in a stepped manner. Details of the above are given below.

The third device side surface 15 and the fourth device side surface 16 are two end surfaces in the y direction of the terahertz device 10, and cross the y direction. The third device side surface 15 and the fourth device side surface 16 of this embodiment are orthogonal to the y direction, along the y direction and the z direction.

The terahertz device 10 includes a terahertz element 20, a dielectric 50, an antenna base 70, a reflecting film 82 serving as a reflecting portion, and a gas space 92.

The terahertz element 20 is an element that converts electromagnetic waves of the terahertz waveband to electric energy. Further, the so-called electromagnetic waves include any one or both concepts of light and electric waves. The terahertz element 20 converts, by means of oscillation, electric energy inputted to electromagnetic waves of the terahertz waveband. Accordingly, electromagnetic waves (in other words, terahertz waves) are generated from the terahertz element 20. The frequency (oscillation frequency) of the electromagnetic waves generated from the terahertz element 20 is, for example, 0.1 THz to 10 THz.

As shown in FIG. 3 and FIG. 4, the terahertz element 20 is shaped as a plate with the z direction as the thickness direction, and is in overall shaped as a rectangular plate in this embodiment. In this embodiment, the terahertz element 20 is shaped as a square when observed in the z direction (also to be said as "top view" hereinafter). Moreover, the top view shape of the terahertz element 20 is not limited to a square, but may also be a rectangle, an ellipsoid or a polygon.

Further, if focusing on a point where the z direction coincides with the thickness direction of the terahertz element 20, "observing in the z direction" may also be said as observing in the thickness direction of the terahertz element 20. In addition, if focusing on a point where the terahertz device 10 of the present embodiment outputs electromagnetic waves upward, "observing in the z direction" may also be said as observing in the direction in which the electromagnetic waves are output, or may be said as observing from the top.

The dimension of the terahertz element 20 in the z direction is an element thickness D1, which is set, for example, according to the oscillation frequency of the electromagnetic waves. As an example, the element thickness D1 may be thinner as the frequency of electromagnetic waves gets higher, and thicker as the frequency of electromagnetic waves gets lower.

The terahertz element 20 includes an element main surface 21 and an element back surface 22 serving as surfaces crossing the thickness direction of the terahertz element 20. The element main surface 21 and the element back surface 22 are surfaces crossing the z direction, and are orthogonal to the z direction in this embodiment. Thus, the z direction may also be said as a direction orthogonal to the device main surface 21.

When observed in the z direction, the element main surface 21 and the element back surface 22 are shaped as rectangles, for example, as squares. However, the shapes of the element main surface 21 and the element back surface 22 are not limited to the above examples, and may be changed as desired.

As shown in FIG. 3, the terahertz element 20 of this embodiment is configured in a state where the element back surface 22 faces upward (in other words, a state where the element main surface 21 facing downward). The element main surface 21 is configured to be closer to the vicinity of the device back surface 12 than the element back surface 22, and the element back surface 22 is configured to be closer to the vicinity of the device main surface 11 than the element main surface 21.

The terahertz element 20 includes two end surfaces in the x direction, that is, a first element side surface 23 and a second element side surface 24, and two end surfaces in the y direction, that is, a third element side surface 25 and a fourth element side surface 26. The first element side surface 23 and the second element side surface 24 are surfaces crossing the x direction, and are orthogonal to the x direction in this embodiment. The third element side surface 25 and the fourth element side surface 26 are surfaces crossing the y direction, and are orthogonal to the y direction in this embodiment. The first element side surface 23 and the second element side surface 24 are orthogonal to the third element side surface 25 and the fourth element side surface 26.

As shown in FIG. 4, the terahertz element 20 includes an oscillation point P1 at which oscillation of electromagnetic waves is performed. In this embodiment, the oscillation point P1 is a point (in other words, a region) at which electromagnetic waves are generated. The oscillation point P1 is formed on the element main surface 21. The element main surface 21 where the oscillation point P1 is forms an active surface where oscillation of electromagnetic waves is performed. The z direction (in other words, the thickness direction of the terahertz element 20 or the height direction of the terahertz device 10) may also be said as a direction orthogonal to a surface provided with the oscillation point P1.

In this embodiment, the oscillation point P1 is configured at the center of the element main surface 21. In this embodiment, electromagnetic waves are radially irradiated from the oscillation point P1 toward the x direction, the y direction and the z direction. However, the position of the oscillation point P1 is not limited to being the center of the element main surface 21, and may be any position as desired.

In this embodiment, a first vertical distance x1 between the first element side surface 23 (or the second element side surface 24) and the oscillation point P1 may be, for example, $(\lambda'_{InP}/2)+((\lambda'_{InP}/2)\times N)$ (where N is an integer equal to or more than 0: N=0, 1, 2, . . . ).

In addition, $\lambda'_{InP}$ is a valid wavelength of electromagnetic waves transmitted in the terahertz element 20. When an element refractive index, which is the refractive index of the terahertz element 20, is set to n1, c is the speed of light and fc is used as the center frequency of the electromagnetic waves, $\lambda'_{InP}$ is (1/n1)×(c/fc). Wherein, fc may also be said as the target frequency of the terahertz element 20. Further, fc may also be the maximum frequency outputted from the electromagnetic waves generated from the terahertz element 20.

Because the element refractive index n1 is higher than a dielectric refractive index n2, which the refractive index of the dielectric 50 surrounding the terahertz element 20, the electromagnetic waves oscillated by the terahertz element 20 are reflected at a free end of the first element side surface 23. Associated details are given below. Accordingly, by setting the first vertical distance x1 as described above, the terahertz element 20 is designed as a resonator (primary resonator) in the terahertz device 10.

Similarly, a second vertical distance y1 between the third element side surface 25 (or the fourth element side surface 26) and the oscillation point P1 may be, for example, $(\lambda'_{InP}/2)+(\lambda'_{InP}/2)\times N)$ (where N is an integer equal to or more than 0: N=0, 1, 2, . . . ).

Further, the vertical distances x1 and y1 may be different values for each element side surfaces 23, 24, 25, 26, given that the values are calculated by the calculation equations. For example, the first vertical distance x1 between the first element side surface 23 and the oscillation point P1 and the first vertical distance between the second element side surface 24 and the oscillation point P1 may be different. Similarly, the second vertical distance y1 between the third element side surface 25 and the oscillation point P1 and the second vertical distance between the fourth element side surface 26 and the oscillation point P1 may also be different.

As shown in FIG. 5 and FIG. 6, the terahertz element 20 includes an element substrate 31, an active element 32, a first element conductive layer 33 and a second element conductive layer 34.

The element substrate 31 includes a semiconductor and is semi-insulative. The semiconductor forming the element substrate 31 is, for example, InP.

The element refractive index n1 is the refractive index of the element substrate 31 (the absolute refractive index). When the element substrate 31 is InP, the element refractive index n1 is approximately 3.4.

In this embodiment, the element substrate 31 is shaped as a rectangular plate, and is, for example, a square in top view. The element main surface 21 and the element back surface 22 are the main surface and the back surface of the element substrate 31, and the two element side surfaces 23 to 26 are side surfaces of the element substrate 31.

The active element 32 converts electromagnetic waves of the terahertz waveband to electric energy. The active element 32 is formed on the element substrate 31. In this embodiment, the active element 32 is disposed on the center of the element main surface 21. The oscillation point P1 may also be said as a position disposed with the active element 32.

The active element 32 is typically a resonant tunneling diode (RTD). However, the present invention is not limited to the above example. The active element 32 may also be implemented by, for example, a tunnel injection transit time (TUNNETT) diode, an impact ionization avalanche transit time (IMPATT) diode, a GaAs field-effect transistor (FET), a GaN FET, a high electron mobility transistor (HEMT), or a heterojunction bipolar transistor (HBT).

An implementation example of the active element 32 is given below.

A semiconductor layer 41*a* is formed on the element substrate 31. The semiconductor layer 41*a* is formed of, for example, GaInAs. The semiconductor layer 41*a* is doped with an n-type impurity at a high concentration.

A GaInAs layer 42*a* is laminated on the semiconductor layer 41*a*. The GaInAs layer 42*a* is doped with an n-type impurity. For example, the impurity concentration of the GaInAs layer 42*a* is lower than the impurity concentration of the semiconductor layer 41*a*.

A GaInAs layer 43*a* is laminated on the GaInAs layer 42*a*. The GaInAs layer 43*a* is not doped with any impurity.

An AlAs layer 44*a* is laminated on the GaInAs layer 43*a*, an InGaAs layer 45 is laminated on the AlAs layer 44*a*, and an AlAs layer 44*b* is laminated on the InGaAs layer 45. The AlAs layer 44*a*, InGaAs layer 45 and AlAs layer 44*b* form the RTD portion.

A GaInAs layer 43*b* not doped with any impurity is laminated on the AlAs layer 44*b*. A GaInAs layer 42*b* doped with an n-type impurity is laminated on the GaInAs layer 43*b*. A GaInAs layer 41*b* is laminated on the GaInAs layer 42*b*. The GaInAs layer 41*b* is doped with an n-type impurity at a high concentration. For example, the impurity concentration of the GaInAs layer 41*b* is higher than the impurity concentration of the GaInAs layer 42*b*.

In addition, the active element 32 may be any configuration as desired, given that the specific configuration thereof is capable of generating (or receiving, or both) electromagnetic waves. In other words, it may be said that it is sufficient for the active element 32 to be an element that oscillates electromagnetic waves in the terahertz waveband.

As shown in FIG. 3, an element reflecting layer 35 reflecting electromagnetic waves is formed on the element back surface 22 in this embodiment. Electromagnetic waves radiated upward from the oscillation point P1 (the active element 32) are reflected downward by the element reflecting layer 35.

Moreover, the element thickness D1 may also be set so that the resonant condition of electromagnetic waves is established. More specifically, in the presence of the element reflecting layer 35, electromagnetic waves are reflected at a fixed end at an interface between the element back surface 22 and the element reflecting layer 35, causing a phase shift π. Considering the above, the element thickness D1 of this embodiment may be set as $(\lambda'_{InP}/4)+(\lambda'_{InP}/2)\times N$ (where N is a positive integer equal to or more than 0: N=0, 1, 2 . . . ). By setting the element thickness D1 as described above, standing waves may be excited in the terahertz element 20. However, the element thickness D1 is not limited the example above, but may be changed as desired.

As shown in FIG. 4, the first element conductive layer 33 and the second element conductive layer 34 are individually formed on the element main surface 21. The first element conductive layer 33 and the second element conductive layer 34 are metal-containing laminated layer structures. The respective laminated layer structures of the first element conductive layer 33 and the second element conductive layer 34 are, for example, structures including laminated layers of Au, Pd and Ti. Alternatively, the respective laminated layer structures of the first element conductive layer 33 and the second element conductive layer 34 are structures including laminated layers of Au and Ti. Both the first element conductive layer 33 and the second element conductive layer 34 are formed by vacuum evaporation or sputtering.

The element conductive layers 33 and 34 include pads 33*a* and 34*a* configured opposite to each other with the oscillation point P1 (active element 32) interposed in between in a designated direction (the x direction in this embodiment), and element conducting portions 33*b* and 34*b* extending from the pads 33*a* and 34*a* toward the active element 32.

The pads 33*a* and 34*a* extend, for example, in a direction (the y direction in this embodiment) orthogonal to the opposing direction of the two pads 33*a* and 34*a*. The pads 33*a* and 34*a* are, for example, shapes having a long side direction and a short side direction, when observed in the z direction. Specifically, the pads 33*a* and 34*a* are shaped as rectangles having they direction as the long side direction and the x direction as the short side direction.

The pads 33*a* and 34*a* are disposed on positions non-overlapping with the oscillation point P1, when observed in the z direction. For example, the pads 33*a* and 34*a* are disposed on two sides with respect to the oscillation point P1 (in other words, the active element 32) in the x direction, and are disposed closer to the vicinities of the element side surfaces 23 and 24 than the oscillation point P1 in this embodiment.

The element conducting portions 33*b* and 34*b* are, for example, narrow elongated shapes extending in the x direction, and the y-direction lengths of the element conducting portions 33*b* and 34*b* are shorter than the y-direction lengths of the pads 33*a* and 34*a*.

As shown in FIG. 6, front end portions 33*ba* and 34*ba* of the element conducting portions 33*b* and 34*b* overlap with the active element 32, when observed in the z direction, and are electrically connected to the active element 32. Specifically, the front end portion 33*ba* of the first element conducting portion 33*b* is located on the GaInAs layer 41*b*, and is connected to the GaInAs layer 41*b*.

In addition, the semiconductor layer 41*a* extends in the x direction further toward the second pad 34*a* than other layers such as the GaInAs layer 42*a*. The front end portion 34*ba* of the second element conducting portion 34*b* is a part that is not laminated with the GaInAs layer 42*a* in the semiconductor layer 41*a*. Accordingly, the active element 32 is conducted with the two element conductive layers 33 and 34 (in other words, the two pads 33*a* and 34*a*). Moreover, the second element conducting portion 34*b* is spaced from other layers such as the GaInAs layer 42*a* in the x direction.

As omitted from the drawing, different from FIG. 6, the GaInAs layer doped with an n-type impurity at a high concentration is between the GaInAs layer 41*b* and the front end portion 33*ba* of the first element conducting portion 33*b*. Accordingly, the first element conductive layer 33 is in good contact with the GaInAs layer 41*b*.

The dielectric 50 is to be described below.

The dielectric 50 includes a material for electromagnetic waves generated from the terahertz element 20 to pass through, that is, a dielectric material. In this embodiment, the dielectric 50 includes a resin material, for example, including epoxy resin (e.g., glass epoxy resin). The dielectric 50 is insulative. Moreover, the color of the dielectric 50 is black, or any color as desired.

The dielectric refractive index n2, which is the refractive index (absolute refractive index) of the dielectric 50, is lower than the element refractive index n1. For example, the dielectric refractive index n2 is 1.5. Moreover, the dielectric 50 may be a one-layer structure, or may be a multilayer structure. That is to say, one or more interfaces may also be formed in the dielectric 50.

As shown in FIG. 3, the dielectric 50 surrounds the terahertz element 20. In this embodiment, the dielectric 50 surrounds the entire terahertz element 20, and covers the element main surface 21, the element back surface 22 and the element side surfaces 23 to 26 of the terahertz element 20.

The element main surface 21, the element back surface 22 and the element side surfaces 23 to 26 of the terahertz element 20 are joined with the dielectric 50. That is to say, the dielectric 50 of this embodiment surrounds the terahertz element 20 in a gap-free manner between the dielectric 50 and the terahertz element 20. In other words, the dielectric 50 seals the terahertz element 20.

The dielectric 50 is shaped as, for example, a plate having the z direction as the thickness direction. Specifically, the dielectric 50 is shaped as a rectangular plate having the x direction as the long side direction and the y direction as the short side direction.

The dielectric 50 includes a dielectric main surface 51 and a dielectric back surface 52 as surfaces crossing the z direction. The dielectric main surface 51 and a dielectric back surface 52 are, for example, orthogonal to the z direction. The dielectric main surface 51 faces downward. The dielectric back surface 52 is a surface on a side opposite to the dielectric main surface 51, and faces upward. In this embodiment, the dielectric back surface 52 constitutes the device main surface 11.

The dielectric 50 includes end surfaces in the x direction, that is, a first dielectric surface 53 and a second dielectric surface 54, and end surfaces in the y direction, that is, a third dielectric surface 55 and a fourth dielectric surface 56. The dielectric side surfaces 53 to 56 constitute parts of the device side surfaces 13 to 16. In this embodiment, the first dielectric side surface 53 and the second dielectric side surface 54 are orthogonal to the third dielectric side surface 55 and the fourth dielectric side surface 56.

The terahertz element 20 is disposed in the dielectric 50 in a state where the element main surface 21 faces the dielectric main surface 51. The terahertz element 20 is disposed between the dielectric main surface 51 and the dielectric back surface 52. In this embodiment, the dielectric thickness D2, which is the z-direction length of the dielectric 50, is set as satisfying the resonant condition of electromagnetic waves generated from the terahertz element 20. Specifically, the dielectric thickness D2 may be set as $(\lambda'_R/2)+(2'_R/2)\times N$ (where N is a positive integer equal to or more than 0: N=0, 1, 2 . . . ). In the above, $\lambda'_R$ is an effective wavelength of electromagnetic waves transmitted at the dielectric 50, and is, for example, $(1/n2)\times(c/fc)$. Moreover, the dielectric thickness D2 may also be said as a distance between the dielectric main surface 51 and the dielectric back surface 52.

The antenna base 70 is to be described below.

As shown in FIG. 1 and FIG. 2, the antenna base 70 is in overall shaped as, for example, a rectangle. The antenna base 70 is formed of, for example, an insulative material. More specifically, the antenna base 70 is formed of a dielectric, for example, synthetic resin such as epoxy resin. The epoxy resin is, for example, glass epoxy resin. However, the material of the antenna base 70 is not limited to the above example, and may be any material as desired, for example, Si, Teflon™ and glass. Moreover, the color of the antenna base 70 is black, or any color as desired.

In this embodiment, the dielectric 50 and the antenna base 70 are separate individuals. The antenna base 70 may be constituted of a material same with the dielectric 50, or may be constituted by a different material.

As shown in FIG. 3, the antenna base 70 is disposed on a side opposite to an output direction of electromagnetic waves of the terahertz device 10 with respect to the dielectric 50, and specifically, disposed on the side of the dielectric main surface 51 of the dielectric 50. The antenna base 70 is disposed on a position opposing the dielectric 50 in the z direction. The z direction may also be said as an opposing direction of the antenna base 70 and the dielectric 50.

Herein, the dielectric 50 includes protruding portions 61 and 62 further protruding to the sides compared to the antenna base 70, when observed in the z direction. Specifically, the dielectric 50 of this embodiment is formed as being longer than the antenna base 70 in the x direction. Thus, the protruding portions 61 and 62 protrude toward two sides in the x direction with respect to the antenna base 70. The two protruding portions 61 and 62 are disposed on two sides in the x direction with respect to the antenna base 70 and are spaced in the x direction, when observed in the z direction. The terahertz element 20 is disposed between the two protruding portions 61 and 62.

In this embodiment, the y-direction length of the dielectric 50 is set to be equal to the y-direction length of the antenna base 70, and the dielectric 50 does not protrude in the y direction with respect to the antenna base 70. In addition, the z-direction length of the antenna base 70 is set to be longer than the dielectric thickness D2.

As shown in FIG. 1 to FIG. 3, the antenna base 70 includes a base main surface 71 opposing the dielectric main surface 51, a base back surface 72 on a side opposite to the base main surface 71, and base side surfaces 73 to 76.

The base main surface 71 and the base back surface 72 are surfaces crossing the z direction, and are orthogonal to the z direction in this embodiment. The base main surface 71 and the base back surface 72 are shaped as, for example, rectangles (for example, as squares). The base back surface 72 constitute the device back surface 12. In this embodiment, the base main surface 71 and the base back surface 72 are, for example, in a same shape. However, the present invention is not limited to the above example; the base main surface 71 and the base back surface 72 may also be in different shapes.

The base main surface 71 is formed as being smaller than the dielectric main surface 51 in the x direction. Thus, a portion of the dielectric main surface 51 further extends toward the x direction compared to the base main surface 71. On the other hand, the y-direction length of the base main surface 71 is set to be equal to the y-direction length of the dielectric main surface 51.

In this embodiment, the base side surfaces 73 to 76 are surfaces facing the sides in the terahertz device 10 (the antenna base 70). The base side surfaces 73 to 76 may also be said as end surfaces in a direction orthogonal to an opposing direction of the base main surface 71 and the base back surface 72 in the antenna base 70. The base side surfaces 73 to 76 connect the base main surface 71 and the base back surface 72.

The first base side surface 73 and the second base side surface 74 are two end surfaces in the x direction of the antenna base 70. The first base side surface 73 and the second base side surface 74 are surfaces crossing the x direction, and are orthogonal to the x direction in this embodiment.

The first base side surface 73 constitutes the first device side surface 13. Specifically, the first device side surface 13 is constituted by the first dielectric side surface 53 and the first base side surface 73. The first dielectric side surface 53 is configured to be closer to the side compared to the first base side surface 73, and in other words, configured in a direction away from the terahertz element 20. Thus, the first device side surface 13 is stepped, and a portion of the dielectric main surface 51 as a step surface is exposed between the first dielectric side surface 53 and the first base side surface 73. That is to say, the dielectric main surface 51 includes a first extruding surface 51*a* extruding further toward the side compared to the antenna base 70 (in other words, the first base side surface 73). The first extruding surface 51*a* is a portion of the dielectric main surface 51 corresponding to the first protruding portion 61.

Similarly, the second base side surface 74 constitutes the second device side surface 14. Specifically, the second device side surface 14 is constituted by the second dielectric side surface 54 and the second base side surface 74. The second dielectric side surface 54 is configured to be closer to the side compared to the second base side surface 74, and in other words, configured in a direction away from the terahertz element 20. Thus, the second device side surface 14 is stepped, and a portion of the dielectric main surface 51 as a step surface is exposed between the second dielectric side surface 54 and the second base side surface 74. That is to say, the dielectric main surface 51 includes a second extruding surface 51*b* extruding further toward the side compared to the antenna base 70 (in other words, the second base side surface 74). The second extruding surface 51*b* is a portion on the dielectric main surface 51 corresponding to the second protruding portion 62.

The third base side surface 75 constitutes the third device side surface 15. Specifically, the third device side surface 15 is constituted by the third dielectric side surface 55 and the third base side surface 75. In this embodiment, the third dielectric side surface 55 and the third base side surface 75 become the same plane. Thus, the third device side surface 15 becomes a flat surface without any step formed thereon.

Similarly, the fourth base side surface 76 constitutes the fourth device side surface 16. Specifically, the fourth device side surface 16 is constituted by the fourth dielectric side surface 56 and the fourth base side surface 76. In this embodiment, the fourth dielectric side surface 56 and the fourth base side surface 76 become the same plane. Thus, the fourth device side surface 16 becomes a flat surface without any step formed thereon.

As shown in FIG. 3, an antenna recess 80 recessed from the base main surface 71 is formed on the antenna base 70. The antenna recess 80 is recessed in a direction from the base main surface 71 toward the base back surface 72, that is, recessed downward. In other words, it may be said that the antenna recess 80 is recessed from the base main surface 71 toward a direction away from the dielectric 50 (or the dielectric main surface 51), or may be said as being recessed toward a direction away from the terahertz element 20. In this embodiment, the antenna recess 80 in overall is shaped substantially as a semi-sphere. The antenna recess 80 has an opening toward the top. The opening of the antenna recess 80 is shaped as a circle, when observed from the top.

The antenna recess 80 includes an antenna surface 81 opposing the terahertz element 20 through the dielectric 50 and the gas space 92. The antenna surface 81 is an inner surface of the antenna recess 80. The antenna surface 81 is formed correspondingly to the shape of the antenna. Specifically, the antenna surface 81 curves in a manner of recessing toward a direction away from the terahertz element 20. The antenna surface 81 is, for example, curved as a mortar, and as an example, curved to be shaped as a parabolic antenna. The antenna surface 81 is shaped as a circle, when observed from the top.

The reflecting film 82 serving as a reflecting portion is to be described below.

The reflecting film 82 reflects electromagnetic waves generated from the terahertz element 20 toward a direction.

As shown in FIG. 3, the reflecting film 82 is formed on the antenna surface 81. The reflecting film 82 is formed of a material that reflects electromagnetic waves generated from the terahertz element 20, for example, formed of a metal such as Cu or an alloy. The reflecting film 82 may be a one-layer structure, or may be a multilayer structure. In this embodiment, the reflecting film 82 is formed throughout the entire antenna surface 81. On the other hand, the reflecting film 82 is not formed on the base main surface 71.

The reflecting film 82 is shaped as an antenna. In this embodiment, because the antenna surface 81 is shaped as an antenna, the reflecting film 82 formed on the antenna surface 81 is naturally shaped as an antenna. In this embodiment, the reflecting film 82 is shaped as a parabolic antenna. In other words, the reflecting film 82 is a rotating parabolic mirror bent into a mortar in shape. The reflecting film 82 is shaped as a circle, when observed in the z direction. The reflecting film 82 curves by protruding toward the device back surface 12. The reflecting film 82 opens toward a direction (the top in this embodiment).

The reflecting film 82 opposes the electric 50 in the z direction. In other words, the reflecting film 82 is disposed on a position opposing the dielectric 50. Electromagnetic waves reflected by the reflecting film 82 are outputted upward through the dielectric 50.

The reflecting film 82 is configured on the side of the element main surface 21 where the oscillation point P1 is located but not on the element back surface 22, and opposes the terahertz element 20 (the element main surface 21 in this embodiment). In other words, the terahertz element 20 is configured in the dielectric 50 in a state of opposing the reflecting film 82 by the element main surface 21. Further, if focusing on the position relationship of the pads 33*a* and 34*a* and the reflecting film 82, it may be said that the pads 33*a* and 34*a* face the direction of the reflecting film 82.

The reflecting film 82 is configured, for example, by locating a focus of the reflecting film 82 at the oscillation point P1. In this embodiment, the center P2 of the reflecting film 82 coincides with the oscillation point P1 when observed in the z direction. In this embodiment, the center P2 is the center of the circular reflecting film 82 when observed in the z direction.

Further, if a vertical distance from the oscillation point P1 to the reflecting film 82 is set as a specified distance z1, the coordinate of the reflecting film 82 in the z direction is set as Z and the position of the reflecting film 82 in the x direction is set as X, the reflecting film 82 curves in a manner of satisfying a condition $Z=(1/(4z1))X^2$. Herein, the X is set as "0" at the center P2. The same applies to the y-direction position of the reflecting film 82. However, the curving pattern of the reflecting film 82 is not limited to the above example, and may be changed as desired.

The z direction may also be said as an opposing direction of the reflecting film 82 and the terahertz element 20 (the element main surface 21). Further, the z direction may also be said as an opposing direction of the center P2 of the reflecting film 82 and the oscillation point P1, and the specified distance z1 may also be said as a distance between the oscillation point P1 and the center P2.

Further, the reflecting film 82 may also be configured on a position corresponding to the frequency of electromagnetic waves so that electromagnetic waves generated from the terahertz element 20 resonate. Specifically, in this embodiment, the specified distance z1 may also be set as satisfying the resonance condition of electromagnetic waves generated from the terahertz element 20.

A distance from one end to another end of the reflecting film 82 in the x direction or the y direction is referred to as an opening width of the reflecting film 82, when observed in the z direction. In this embodiment, the reflecting film 82 is formed throughout the entire antenna surface 81, and thus the opening width of the reflecting film 82 is consistent with the opening width of the antenna recess 80. In addition, the opening width of the antenna recess 80 may also be said as the diameter of a circular opening portion of the antenna recess 80.

The reflecting film 82 is formed as being larger than the terahertz element 20, when observed in the z direction. Specifically, the reflecting film 82 is formed as being larger than the terahertz element 20 in both the x direction and the y direction, and the opening width of the reflecting film 82 is set as being longer than both the x-direction length and the y-direction length of the terahertz element 20.

As shown in FIG. 3, the terahertz element 20 may also radially irradiate electromagnetic waves from the oscillation point P1 over the range of the opening angle θ. That is to say, electromagnetic waves generated from the terahertz element 20 may also be directional. The opening angle θ is, for example, 120° to 180°. However, the opening angle θ is not limited to the above example, and may be angle as desired.

In this configuration, the reflecting film 82 may also be formed, for example, throughout an angle range of the opening angle θ or more with respect to the oscillation point P1. Accordingly, electromagnetic waves that are not reflected by the reflecting film 82 may be reduced, thereby achieving gain enhancement.

In this embodiment, the antenna base 70 and the dielectric 50 are separate individuals that are fixedly assembled in the z direction. Specifically, the terahertz device 10 includes an adhesive layer 91 as a fixing portion that fixes the dielectric 50 and the antenna base 70. The adhesive layer 91 is formed of, for example, an insulative material, e.g., a resin-containing adhesive. The adhesive layer 91 is disposed between the base main surface 71 and the dielectric main surface 51, and is disposed along the periphery of the opening portion of the antenna recess 80.

The adhesive layer 91 is adhered and fixed with the dielectric 50 and the antenna base 71. That is to say, the dielectric 50 and the antenna base 70 are assembled by the adhesive layer 91 in the z direction. Accordingly, the dielectric 50 and the antenna base 70 are unitized. Accordingly, position offsets of the dielectric 50 and the antenna base 70 in a direction orthogonal to the z direction are limited by the adhesive layer 91, and hence the relative position of the terahertz element 20 in the dielectric 50 and the reflecting film 82 of the antenna base 70 is not easily shifted.

Particularly in this embodiment, the inner peripheral end of the adhesive layer 91 is arranged on a position at the same plane as the surface of the reflecting film 82, and is formed throughout the end of the base main surface 71 and the reflecting film 82. That is to say, the adhesive layer 91 is constituted so as not to protrude further inward (in other words, the side of the terahertz element 20) compared to the reflective film 82.

The inner peripheral end of the adhesive layer 91 may be said as an end on the side of the terahertz element 20 in the adhesive layer 91. The inner peripheral end of the adhesive layer 91 corresponds to, for example, the antenna recess 80, and is shaped as a circle, when observed in the z direction. However, the shape of the inner peripheral end of the adhesive layer 91 may be changed as desired.

The gas space 92 is to be described below.

As shown in FIG. 3, the gas space 92 in this embodiment is defined by the dielectric main surface 51 and the antenna surface 81. Specifically, the opening portion of the antenna recess 80 is covered by the dielectric main surface 51. Accordingly, the dielectric main surface 51 and the inner surface of the antenna recess 80, i.e., the antenna surface 81, define the gas space 92. In this embodiment, the adhesive layer 91 is disposed along the periphery of the opening portion of the antenna recess 80, and hence the gas space 92 is sealed. That is to say, the gas space 92 is sealed by the adhesive layer 91. The reflecting film 82 is disposed in the gas space 92.

The gas space 92 is substantially formed as a semi-sphere. The gas space 92 is formed as being larger than the terahertz element 20 in the diameter direction, when observed in the z direction.

The gas space 92 includes a gas. A gas refractive index n3, which is the refractive index of the gas in the gas space 92, is lower than the dielectric refractive index n2. That is to say, the gas space 92 includes a gas having a refractive index lower than the dielectric refractive index n2. For example, the gas in the gas space 92 is air. In this case, the gas refractive index n3 is approximately 1. Moreover, the gas in the gas space 92 is not limited to being air, and may be any gas, given that the gas has a refractive index lower than the dielectric refractive index n2.

The reflecting film 82 includes a portion opposing the terahertz element 20 through the dielectric 50 and the gas space 92. In this embodiment, the reflecting film 82 in overall opposes the terahertz element 20 through the dielectric 50 and the gas space 92.

In this embodiment, the reflecting film 82 reflects electromagnetic waves, which are generated from the terahertz element 20 and transmitted through the dielectric 50 and the gas space 92, toward the z direction (specifically, the top). In other words, it may be said that the reflecting film 82 is a film that guides electromagnetic waves generated from the oscillation point P1 and transmitted through the dielectric 50 and the gas space 92 to a direction.

As shown in FIG. 2 and FIG. 3, the terahertz device 10 includes electrodes 101 and 102 for electrically connecting to the exterior, and electrically conductive portions 110 and 120 disposed in the dielectric 50 and electrically connected to the terahertz element 20.

The electrodes 101 and 102 of this embodiment are formed on portions non-overlapping with the reflecting film 82, when observed in the z direction, and specifically, on two sides in the x direction of the reflecting film 82. The electrodes 101 and 102, for example, include laminated layer structures containing a Ni layer and a Au layer. However, the present invention is not limited to the above examples. The configurations of the electrodes 101 and 102 may be any as desired, for example, configurations containing a Pd layer, or configurations containing a Sn layer.

The electrodes 101 and 102 of this embodiment are disposed on the sides with respect to the antenna base 70. Specifically, the electrodes 101 and 102 are formed on portions on the dielectric main surface 51 that are respectively corresponding to the protruding portions 61 and 62, that is, the extruding surfaces 51*a* and 51*b*. The two electrodes 101 and 102 are in spaced and opposing arrangement in the x direction. The electrodes 101 and 102 face a direction opposite to the output direction of electromagnetic waves of the terahertz device 10, that is, the bottom. The electrodes 101 and 102 are shaped as desired, and are, for example, shaped as rectangles with the y direction as the long side direction and the x direction as the short side direction.

In addition, the z-direction length of the antenna base 70 is larger than the thickness of the dielectric 50. Thus, the electrodes 101 and 102 are configured to be closer to the top (in other words, the side of the device main surface 11) compared to a central portion in the z direction of the terahertz device 10.

The electrically conductive portions 110 and 120 are disposed in the dielectric 50. That is to say, the dielectric 50 seals the terahertz element 20 as well as the two electrically conductive portions 110 and 120. Accordingly, the reflecting film 82 outside the dielectric 50 is kept out of contact from the electrically conductive portions 110 and 120 in the dielectric 50. That is to say, the dielectric 50 provides a function of insulating the electrically conductive portions 110 and 120 from the reflecting film 82.

The two electrically conductive portions 110 and 120 extend in the protruding direction of the protruding portions 61 and 62, that is, the x direction, in a manner that the terahertz element 20 overlaps with both the electrodes 101 and 102, when observed in the z direction. In this embodiment, the two electrically conductive portions 110 and 120 are shaped as strips with the y direction as the width direction and extending in the x direction. In this embodiment, the x direction corresponds to "first direction", and the y direction corresponds to "second direction".

The two electrically conductive portions 110 and 120 of this embodiment are shaped as films with the z direction as the thickness direction. However, specific shapes of the two electrically conductive portions 110 and 120 may be any as desired, or may be shaped as plates having a specified thickness. In this embodiment, the terahertz element 20 is flip-chip mounted on the two electrically conductive portions 110 and 120.

The first electrically conductive portion 110 electrically connects the terahertz element 20 and the first electrode 101. The first electrically conductive portion 110 extends in the protruding direction of the first protruding portion 61, that is, the x direction, in a manner that the first pad 33*a* and the first electrode 101 oppose each other.

As shown in FIG. 3, the first electrically conductive portion 110 includes a first element opposing portion 111 opposing the first pad 33*a* in the z direction, a first electrode opposing portion 112 opposing the first electrode 101 in the z direction, a first connecting portion 113 connecting the first element opposing portion 111 and the first electrode opposing portion 112, and a first column portion 115 connecting the first electrode opposing portion 112 and the first electrode 101. In this embodiment, the first element opposing portion 111 and the first electrode opposing portion 112 constitute two end portions in the x direction of the first electrically conductive portion 110.

As shown in FIG. 7 to FIG. 9, the first element opposing portion 111 is disposed between the terahertz element 20 and the reflecting film 82, and at least a portion thereof overlaps with the first pad 33*a*, when observed in the z direction. The first element opposing portion 111 opposes the reflecting film 82 in the z direction. The first pad 33*a* extends in the y direction, and correspondingly, the first element opposing portion 111 extends in the y direction. For example, the first element opposing portion 111 is shaped as a rectangle with the y direction as long side direction and the x direction as the short side direction.

The first electrically conductive portion 111 includes a first bump 114 provided between the first element opposing portion 111 and the first pad 33*a*. The terahertz element 20 is flip-chip mounted on the first element opposing portion 111 with the first bump 114 interposed in between. The first pad 33*a* and the first element opposing portion 111 are electrically connected by the first bump 114.

In this embodiment, the first bump 114 is provided as plural in quantity. For example, the first pad 33*a* and the first element opposing portion 111 extend in the y direction, and correspondingly, the plurality of (two in this embodiment) first bumps 114 are arranged in the y direction. The first element opposing portion 111 and the first bump 114 are configured on positions non-overlapping with the oscillation point P1, when observed in the z direction. The first bump 114 is shaped as, for example, a quadrilateral column. However, the shape of the bump 114 is not limited to the above example, and may be any shape as desired.

The bump 114 may be a one-layer structure, or may be a multilayer structure. As an example, the first bump 114 may also be a laminated layer structure of a Cu-containing metal layer, a Ti-containing metal layer, and a Sn-containing alloy layer. The Sn-containing alloy layer is, for example, a Sn—Sb alloy layer or a Sn—Ag alloy layer.

Further, a first insulating layer surrounding the first bump 114 may also be formed on the first element opposing portion 111. The first insulating layer may be shaped as a frame having a top opening, and the first bump 114 is accommodated in the first insulating layer. Accordingly, side leaning of the first bump 114 can be suppressed. However, the first insulating layer is optional.

The first electrode opposing portion 112 formed in a manner of having at least a portion thereof overlap with the first electrode 101, when observed in the z direction. For example, the first electrode opposing portion 112 is formed on a position protruding from the antenna base 70 toward the side, and specifically, formed in the first protruding portion 61. Thus, the first electrode opposing portion 112 is configured on a position non-overlapping with the reflecting film 82, when observed in the z direction.

When observed in the z direction, the first electrode opposing portion 112 of this embodiment is shaped as a rectangle extending in the x direction and the y direction. When observed in the z direction, the first electrode 101 is formed as being wider than the first electrode opposing portion 112. However, the present invention is not limited to the above example; the first electrode 101 may be formed as being smaller than the first electrode opposing portion 112 or be shaped the same.

As shown in FIG. 7 and FIG. 8, the first connecting portion 113 is disposed between the first element opposing portion 111 and the first electrode opposing portion 112, and has they direction as the width direction and extends in the x direction. A portion of the first connecting portion 111 opposes the reflecting film 82 in the z direction. That is to say, a portion of the first connecting portion 111 is disposed on a position overlapping with the reflecting film 82. In other words, the first connecting portion 113 includes a portion overlapping with the reflecting film 82 and a portion non-overlapping with the reflecting film 82, when observed in the z direction.

The first connecting portion 113 of this embodiment is formed as having a width narrower than the first element opposing portion 111. Specifically, the width (the y-direction length) of the first connecting portion 113 is set as being shorter than the width (the y-direction length) of the first element opposing portion 111. The first connecting portion 113 of this embodiment is formed as having, for example, a width narrower than the first electrode opposing portion 112. In other words, the first electrode opposing portion 112 extends further in they direction than the first connecting portion 113.

The first connecting portion 113 includes a first connecting body portion 113*a* formed as having a width narrower than those of the first element opposing portion 111 and the first electrode opposing portion 112, and a first element side taper portion 113*b* and a first electrode side taper portion 113*c* respectively located on two sides in the long side direction of the first connecting body portion 113*a*.

The first connecting body portion 113*a* extends in the x direction as the long side direction, and has a fixed width in the y direction. The first connecting body portion 113*a* overlaps with the reflecting film 82, when observed in the z direction. It may be said that the first connecting body portion 113*a* connects the first element opposing portion 111 and the first electrode opposing portion 112. As shown in FIG. 8, the width W1 of the first connecting body portion 113*a* is shorter than the width W2 of the first element opposing portion 111.

The first element side taper portion 11*b* connects the first connecting body portion 113*a* and the first element opposing portion 111. The first element side taper portion 113*b* is formed, for example, on a position in the x direction adjacent to the terahertz element 20, when observed in the z direction, and overlaps with the reflecting film 82, when observed in the z direction.

The first element side taper portion 11*b* is formed as having a width that gradually increases from the first connecting body portion 113*a* toward the first element opposing portion 111. In this embodiment, the first element side taper portion 113*b* includes a pair of first element side inclining surfaces 113*ba*. The pair of first element side inclining surfaces 113*ba* incline in a manner of gradually departing each other from the first connecting body portion 113*a* toward the first element opposing portion 111.

As shown in FIG. 7, the first electrode side taper portion 113*c* connects the first connecting body portion 113*a* and the first electrode opposing portion 112. The first electrode side taper portion 113*c* is configured, for example, on a portion non-overlapping with the reflecting film 82, when observed in the z direction, and for example, formed in the first protruding portion 61.

The first electrode side taper portion 113*c* is formed as having a width that gradually increases from the first connecting body portion 113*a* toward the first electrode opposing portion 112. In this embodiment, the first electrode side taper portion 113*c* includes a pair of first electrode side inclining surfaces 113*ca*. The pair of first electrode side inclining surfaces 113*ca* incline in a manner of gradually departing each other from the first connecting body portion 113*a* toward the first electrode opposing portion 112.

As shown in FIG. 3, the first column portion 115 is disposed between the first electrode 101 and the first electrode opposing portion 112. The first column portion 115 extends in the z direction as the height direction, and is connected to the first electrode 101 and the first electrode opposing portion 112.

The first column portion 115 is shaped as, for example, a cylinder. However, the specific shape of the first column portion 115 may be any as desired, or may be shaped as, for example, an angular column. In this embodiment, a first recess 112*a* is formed on a position overlapping with the first column 115 in the first electrode opposing portion 112. Further, the first recess 112*a* may be excluded.

According to the configuration, the first pad 33*a* of the terahertz element 20 and the first electrode 101 are electrically connected by the first bump 114, the first element opposing portion 111, the first connecting portion 113, the first electrode opposing portion 112 and the first column portion 115.

As shown in FIG. 3, the second electrically conductive portion 120 electrically connects the terahertz element 20 and the second electrode 102. As shown in FIG. 7 and FIG. 8, in this embodiment, the first electrically conductive portion 110 and the second electrically conductive portion 120 are formed on positions having a mutual offset of 180°, when observed in the z direction, and oppose each other in the x direction. It may also be said that the two electrically conductive portions 110 and 120 radially extend from the terahertz element 20 toward the reflecting film 82, when observed in the z direction.

Particularly, it may also be said that the two electrically conductive portions 110 and 120 in this embodiment extend from the terahertz element 20 toward directions away from each other, when observed in the z direction. Specifically, the first electrically conductive portion 110 extends in the x direction from the terahertz element 20 toward the first protruding portion 61 when observed in the z direction, and the second electrically conductive portion 120 extends from the terahertz element 20 toward a direction opposite to the direction of the first protruding portion 61 when observed in the z direction.

As shown in FIG. 3, the second electrically conductive portion 120 extends in the protruding direction of the second protruding portion 62, that is, the x direction, in a manner that the second pad 34*a* and the second electrode 102 oppose each other. The second electrically conductive portion 120 includes a second element opposing portion 121 opposing the second pad 34*a* in the z direction, a second electrode opposing portion 122 opposing the second electrode 102 in the z direction, a second connecting portion 123 connecting the second element opposing portion 121 and the second electrode opposing portion 122, and a second column portion 125 connecting the second electrode opposing portion 122 and the second electrode 102. In this embodiment, the second element opposing portion 121 and the second electrode opposing portion 122 constitute two end portions in the x direction of the second electrically conductive portion 120.

The second element opposing portion 121 is disposed between the terahertz element 20 and the reflecting film 82, and is formed in a manner of having at least a portion thereof overlap with the second pad 34*a*, when observed in the z direction. The second element opposing portion 121 opposes the reflecting film 82 in the z direction. The second pad 34*a* extends in the y direction, and correspondingly, the second element opposing portion 121 extends in the y direction. For example, the second element opposing portion 121 is shaped as a rectangle with they direction as the long side direction and the x direction as the short side direction.

In this embodiment, the two pads 33*a* and 34*a* are spaced in the x direction, and correspondingly, the two element opposing portions 111 and 121 are configured as opposing each other in the x direction. In addition, the dielectric 50 is present between the two element opposing portions 111 and 121, and the two element opposing portions 111 and 121 are insulated by the dielectric 50. In other words, it may be said that the two electrically conductive portions 110 and 120 extend from the respective element opposing portions 111 and 121 in a spaced arrangement toward directions away from each other.

In this embodiment, the two electrically conductive portions 110 and 120 are in a symmetric arrangement in the x direction with respect to the oscillation point P1. Accordingly, influences caused by asymmetry of the two electrically conductive portions 110 and 120 upon a radiation mode can be suppressed. Moreover, the two electrically conductive portions 110 and 120 may also be in a symmetric arrangement in they direction with respect to the oscillation point P1.

The second electrically conductive portion 120 includes a second bump 124 provided between the second element opposing portion 121 and the second pad 34*a*. The terahertz element 20 is flip-chip mounted on the second element opposing portion 121 with the second bump 124 interposed in between. The second pad 34*a* and the second element opposing portion 121 are electrically connected by the second bump 124.

In this embodiment, the second bump 124 is provided as plural in quantity. For example, the second pad 34*a* and the second element opposing portion 121 extend in the y direction, and correspondingly, the plurality of (two in this embodiment) second bumps 124 are arranged in the y direction. The second element opposing portion 121 and the second bump 124 are configured on positions non-overlapping with the oscillation point P1, when observed in the z direction. The first bump 114 and the second bump 124 are in a spaced and opposing arrangement in the x direction, and are aligned in the y direction. However, the present invention is not limited to the above example, and the first bump 114 and the second bump 124 may also be in a staggered arrangement in the y direction.

The second electrode opposing portion 122 is formed in a manner of having at least a portion thereof overlap with the second electrode 102, when observed in the z direction. For example, the second electrode opposing portion 122 is formed on a position protruding from the antenna base 70 toward the side, and specifically, formed in the second protruding portion 62. Thus, the second electrode opposing portion 122 is configured on a position non-overlapping with the reflecting film 82, when observed in the z direction.

When observed in the z direction, the second electrode opposing portion 122 of this embodiment is shaped as a rectangle extending in the x direction and the y direction. When observed in the z direction, the second electrode 102 is formed as being wider than the second electrode opposing portion 122. However, the present invention is not limited to the above example; the second electrode 102 may be formed as being smaller than the second electrode opposing portion 122 or be shaped the same.

The second connecting portion 123 is disposed between the second element opposing portion 121 and the second electrode opposing portion 122, and has they direction as the width direction and extends in the x direction. A portion of the second connecting portion 111 opposes the reflecting film 82 in the z direction. That is to say, a portion of the second connecting portion 111 is disposed on a position overlapping with the reflecting film 82. In other words, the second connecting portion 123 includes a portion overlapping with the reflecting film 82 and a portion non-overlapping with the reflecting film 82, when observed in the z direction.

The second connecting portion 123 of this embodiment is formed as having a width narrower than the second element opposing portion 121. Specifically, the width (the y-direction length) of the second connecting portion 123 is set as being lower than the width (the y-direction length) of the second element opposing portion 121. The second connecting portion 123 of this embodiment is formed as having, for example, a width narrower than the second electrode opposing portion 122. In other words, the second electrode opposing portion 122 extends further in the y direction than the second connecting portion 123.

The second connecting portion 123 includes a second connecting body portion 123*a* formed as having a width narrower than the second element opposing portion 121 and the second electrode opposing portion 122, and a second element side taper portion 123*b* and a second electrode side taper portion 123*c* respectively located on two sides in the long side direction of the second connecting body portion 123*a*.

The second connecting body portion 123*a* extends in the x direction as the long side direction, and has a fixed width in the y direction. The second connecting body portion 123*a* overlaps with the reflecting film 82, when observed in the z direction. It may be said that the second connecting body portion 123*a* connects the second element opposing portion 121 and the second electrode opposing portion 122. As shown in FIG. 8, the width W3 of the second connecting body portion 123*a* is shorter than the width W4 of the second element opposing portion 121.

The second element side taper portion 123*b* connects the second connecting body portion 123*a* and the second element opposing portion 121. The second element side taper portion 123*b* is formed, for example, on a position in the x direction adjacent to the terahertz element 20, when observed in the z direction, and overlaps with the reflecting film 82, when observed in the z direction.

The second element side taper portion 123*b* is formed as having a width that gradually increases from the second connecting body portion 123*a* toward the second element opposing portion 121. In this embodiment, the second element side taper portion 123*b* includes a pair of second element side inclining surfaces 123*ba*. The pair of second element side inclining surfaces 123*ba* incline in a manner of gradually departing each other from the second connecting body portion 123*a* toward the second element opposing portion 121.

As shown in FIG. 7, the second electrode side taper portion 123*c* connects the second connecting body portion 123*a* and the second electrode opposing portion 122. The second electrode side taper portion 123*c* is formed, for example, on a portion non-overlapping with the reflecting film 82, when observed in the z direction, and for example, formed in the second protruding portion 62.

The second electrode side taper portion 123*c* is formed as having a width that gradually increases from the second connecting body portion 123*a* toward the second electrode opposing portion 122. In this embodiment, the second electrode side taper portion 123*c* includes a pair of second electrode side inclining surfaces 123*ca*. The pair of second electrode side inclining surfaces 123*ca* incline in a manner of gradually departing each other from the second connecting body portion 123*a* toward the second electrode opposing portion 122.

As shown in FIG. 3, the second column portion 125 is disposed between the second electrode 102 and the second electrode opposing portion 122. The second column portion 125 extends in the z direction as the height direction, and is connected to the second electrode 102 and the second electrode opposing portion 122.

The second column portion 125 is shaped as, for example, a cylinder. However, the specific shape of the second column portion 125 may be any as desired, or may be shaped as, for example, an angular column. In this embodiment, a second recess 122*a* is formed on a position overlapping with the second column 125 in the second electrode opposing portion 122. Further, the second recess 122*a* may be excluded.

According to the configuration, the second pad 34*a* of the terahertz element 20 and the second electrode 102 are electrically connected by the second bump 124, the second element opposing portion 121, the second connecting portion 123, the second electrode opposing portion 122 and the second column portion 125.

The reflecting film 82 of this embodiment is in an electrically floating state. Specifically, the antenna base 70 having the reflecting film 82 formed thereon is insulative. The electrically conductive portions 110 and 120 are disposed in the dielectric 50, and thus the reflecting film 82 is insulated from the two electrically conductive portions 110 and 120. Moreover, the reflecting film 82 is spaced from the two electrodes 101 and 102, and the antenna base 70 is disposed between the two. Thus, the reflecting film 82 is insulated from the two electrodes 101 and 102. Accordingly, the floating state of the reflecting film 82 is maintained.

Details of the manufacturing method for the terahertz device 10 of this embodiment are given with reference to FIG. 10 to FIG. 22 below. For illustration purposes, the manufacturing method for one terahertz device 10 is first described below.

Figure 10:
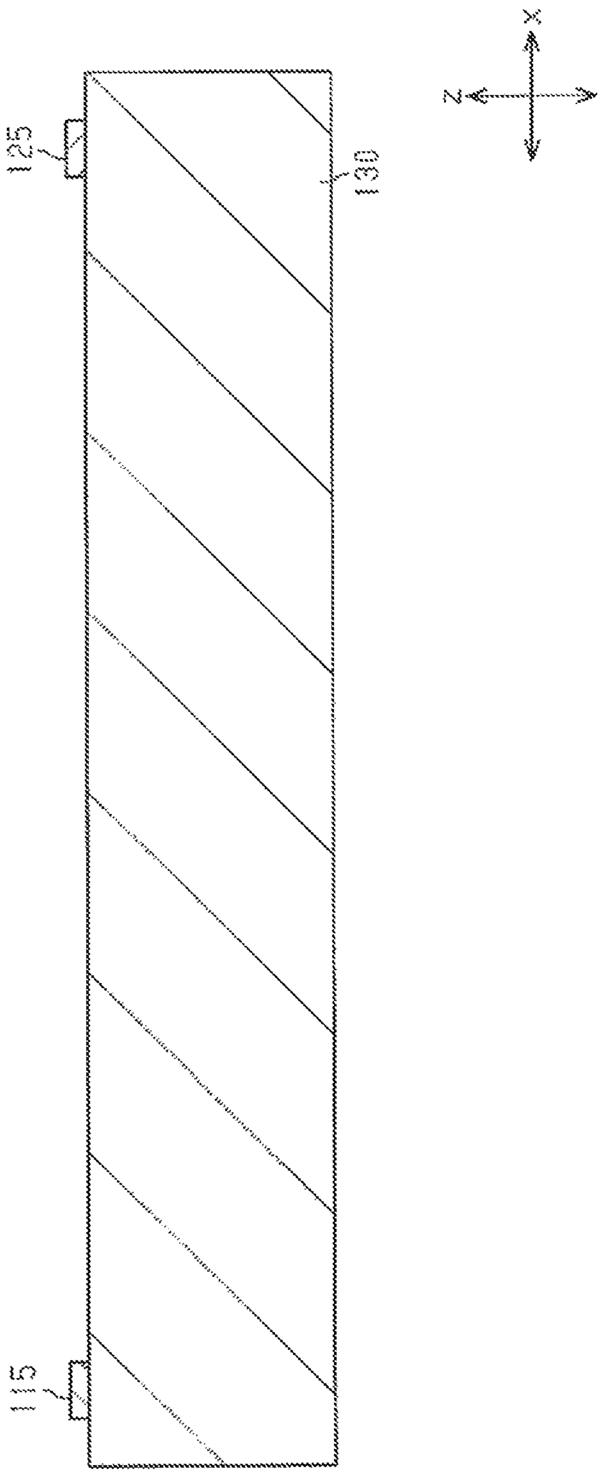
FIG. 10 is a section diagram of a step of a manufacturing method for a terahertz device according to the first embodiment.

As shown in FIG. 10, the manufacturing method for the terahertz device 10 includes a step of forming the columns 115 and 125 on a support substrate 130.

The support substrate 10 includes a monocrystalline material, that is, a semiconductor material, and is a Si monocrystalline material in this embodiment. The thickness of the support substrate 130 in this embodiment is, for example, approximately 727 to 775 μm. Moreover, the support substrate 130 is not limited to being a Si wafer, and may be, for example, a glass substrate.

The step of forming the columns 115 and 125 includes, for example, a step of forming a substrate layer on the support substrate 130. Forming of the substrate layer is performed by sputtering. In this embodiment, after forming a Ti layer as the substrate layer on the support substrate 130, a Cu layer joined with the Ti layer is formed. That is to say, the substrate layer is formed by a Ti layer and a Cu layer laminated on each other. In this embodiment, the thickness of the Ti layer is approximately 10 to 30 nm, and the thickness of the Cu layer is approximately 200 to 800 nm. Moreover, the constituting material and thickness of the substrate layer are not limited to the above examples.

Next, a coating layer joined with the substrate layer is formed. Forming of the coating layer is performed by forming a resist layer using lithography and electroplating. Specifically, a photosensitive resist is applied by covering the entire surface of the substrate layer, and exposure and development are performed on the photosensitive resist. Accordingly, a patterned resist layer (to be referred to as a "resist pattern" hereinafter) is formed. The photosensitive resist is, for example but not limited to, applied using a rotary coating machine. At this point, a portion of the substrate layer is exposed from the resist pattern. Then, the substrate layer is used as an electrically conductive path for electroplating. Accordingly, the coating layer is laminated on the substrate layer exposed from the resist pattern. The constituting material of the coating layer of this embodiment is, for example, Cu. The resist pattern is removed after the coating layer is formed. The columns 115 and 125 are formed by the above steps. The columns 115 and 125 are erected from the support substrate 130 toward the top.

Figure 11:
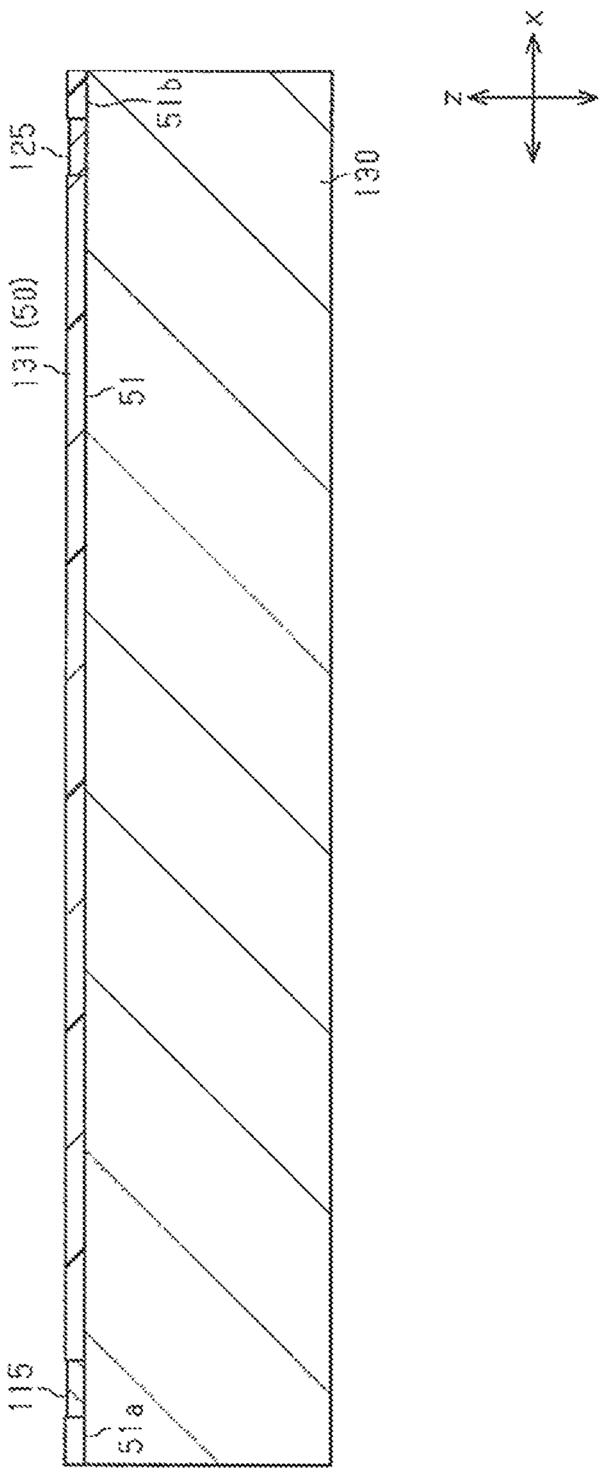
FIG. 11 is a section diagram of a step of a manufacturing method for a terahertz device.

As shown in FIG. 11, the manufacturing method for the terahertz device 10 includes a first sealing step forming a first dielectric layer 131 covering the columns 115 and 125. In the first sealing step, the first dielectric layer 131 is formed by, for example, molding. In this embodiment, the first dielectric layer 131 is electrically insulative, and is, for example, a synthetic resin that uses epoxy resin as the main agent. The first electric layer 131 constitutes a portion of the dielectric 50.

Specific steps for forming the first dielectric layer 131 may be any as desired, and include, for example, the following steps, that is, forming the first dielectric layer 131 higher than the columns 115 and 125, and then grinding the first dielectric layer 131 so as to expose front end surfaces of the columns 115 and 125. In this case, a ground print, i.e., a ground mark, is formed on the upper surface of the first dielectric layer 131.

Further, when the first dielectric layer 131 is ground, the front end surfaces of the columns 115 and 125 may be ground. In this case, raw edges may be produced on the front end surfaces of the columns 115 and 125. Thus, the manufacturing method for the terahertz device 10 may include a step of removing the raw edges of the columns 115 and 125. In this case, as shown in FIG. 11, the front end surfaces of the columns 115 and 125 become positions slightly more recessed compared to the upper surface of the first dielectric layer 131.

Figure 12:
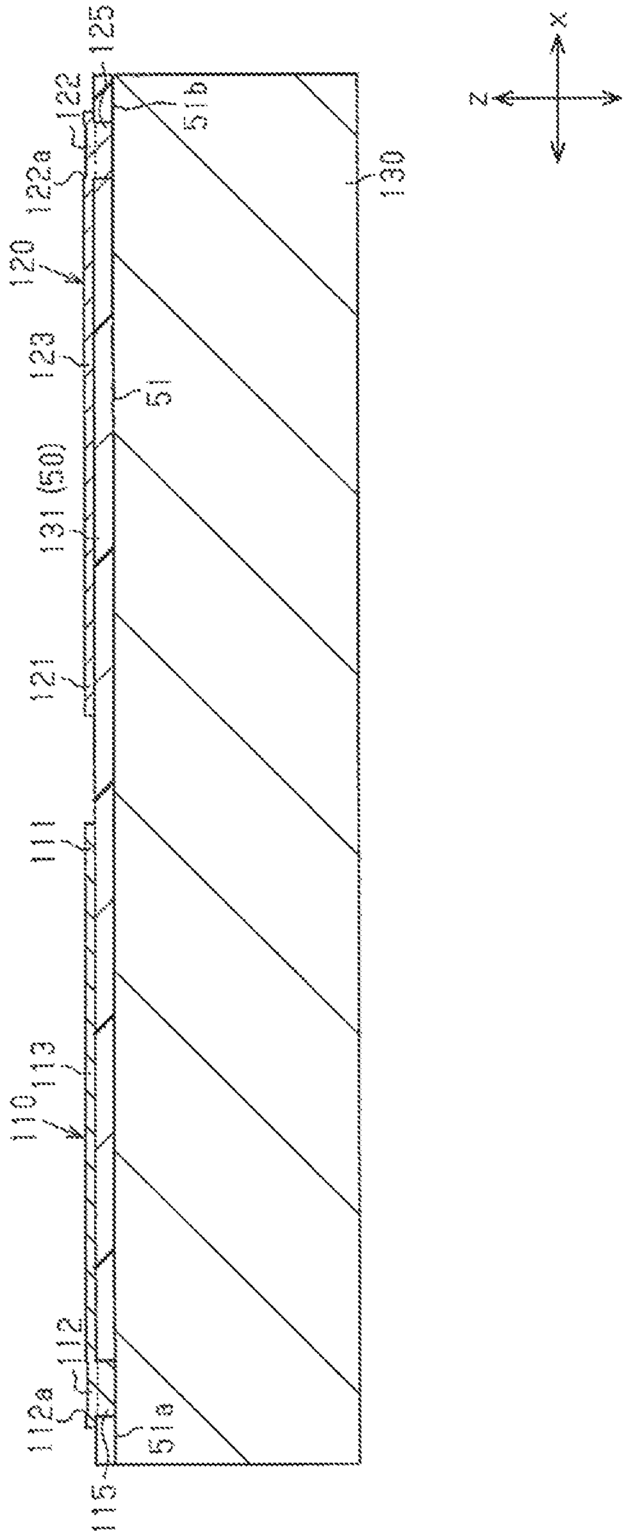
FIG. 12 is a section diagram of a step of a manufacturing method for a terahertz device.

As shown in FIG. 12, the manufacturing method for the terahertz device 10 includes a step of forming the element opposing portions 111 and 121, the electrode opposing portions 112 and 122, and the connecting portions 113 and 123. In this step, the element opposing portions 111 and 121, the electrode opposing portions 112 and 122, and the connecting portions 113 and 123 are formed by patterning the first dielectric layer 131. Moreover, the element opposing portions 111 and 121, the electrode opposing portions 112 and 122, and the connecting portions 113 and 123 may also include the substrate layer and the coating layer.

Herein, according to the relationship that the front end surfaces of the column portions 115 and 125 are more recessed compared to the upper surface of the first dielectric layer 131, recesses **112*a* and 122*a* are formed on the electrode opposing portions 112 and 122 formed on the front end surfaces of the columns 115 and 125**.

Figure 13:
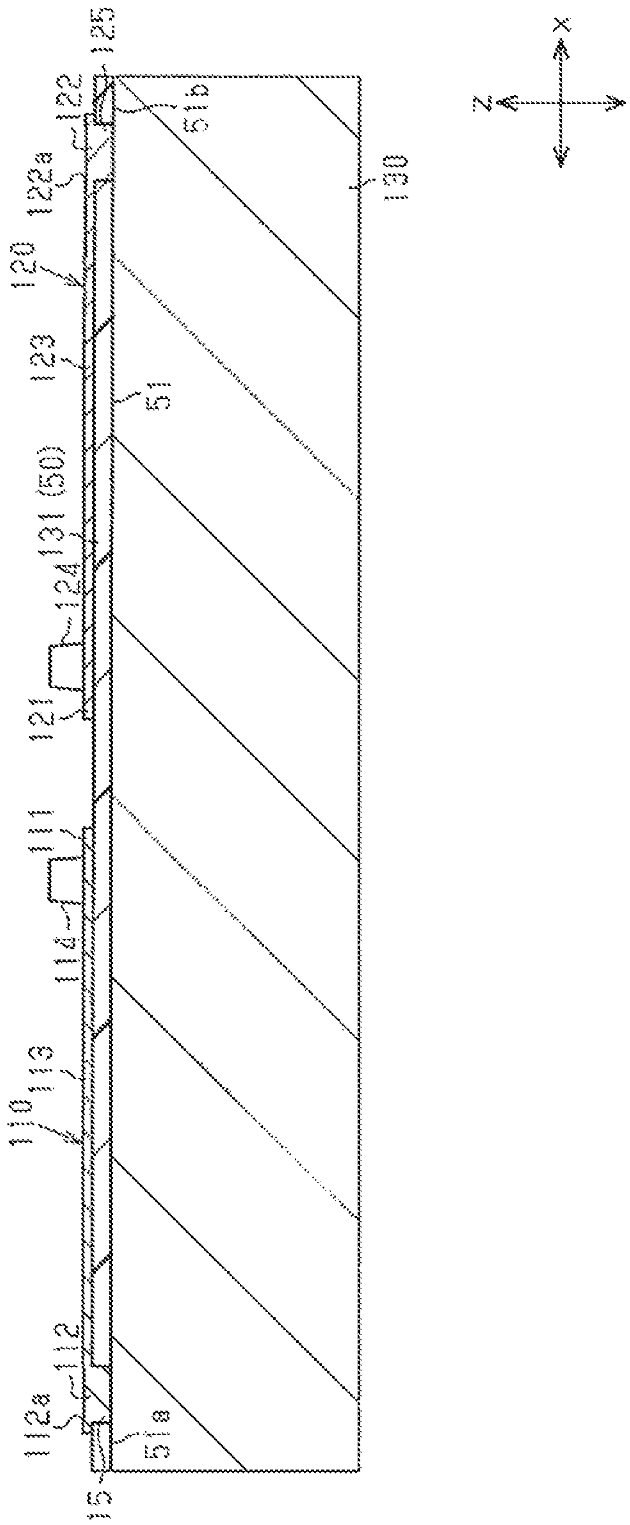
FIG. 13 is a section diagram of a step of a manufacturing method for a terahertz device.
Figure 14:
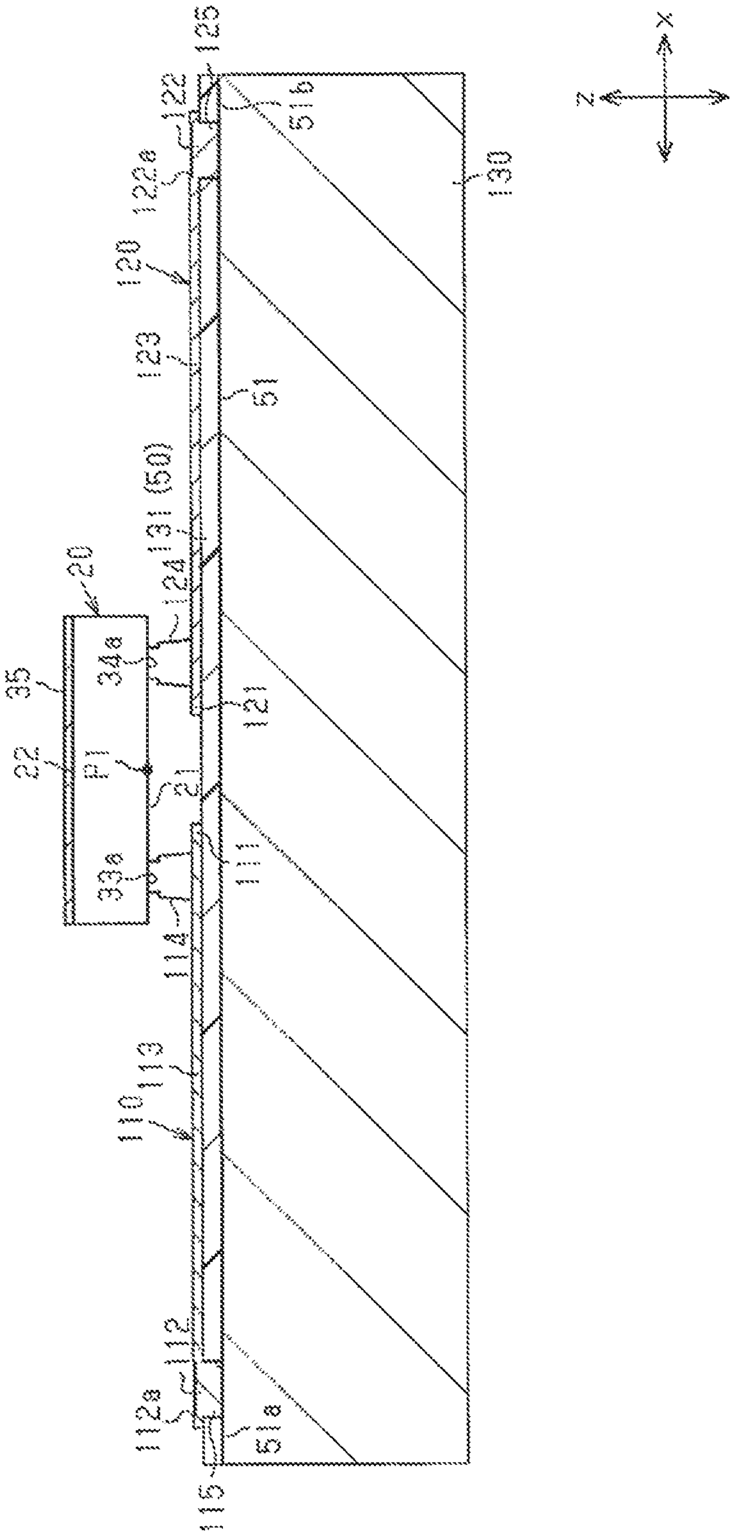
FIG. 14 is a section diagram of a step of a manufacturing method for a terahertz device.

As shown in FIG. 13 and FIG. 14, the manufacturing method for the terahertz device 10 includes an element mounting step of the terahertz element 20. The element mounting step is performed, for example, by flip-chip bonding.

As shown in FIG. 13, the element mounting step includes a step of forming the bumps 114 and 124. The step of forming the bumps 114 and 124, for example, includes a step of forming a resist layer outside a bump forming region where the bumps 114 and 124 are formed, a step of laminating the conductive layer constituting the bumps 114 and 124 on the bump forming region, and a step of removing the resist layer. The resist layer, for example, is formed of a photosensitive resist, and is patterned by exposure and development.

Moreover, when an unwanted substrate layer is formed in the step of forming the electrically conductive portions 110 and 120, the manufacturing method for the terahertz device 10 may also include a step of removing the unwanted substrate layer. The unwanted substrate layer may be removed, for example, by wet etching using a mixed solution of $H_2SO_4$ and $H_2O_2$.

As shown in FIG. 14, the element mounting step includes a step of bonding the terahertz element 20 to the electrically conductive portions 110 and 120 using the bumps 114 and 124. Accordingly, the terahertz element 20 is flip-chip mounted on the electrically conductive portions 110 and 120, and the terahertz element 20 and the electrically conductive portions 110 and 120 are electrically conducted.

Figure 15:
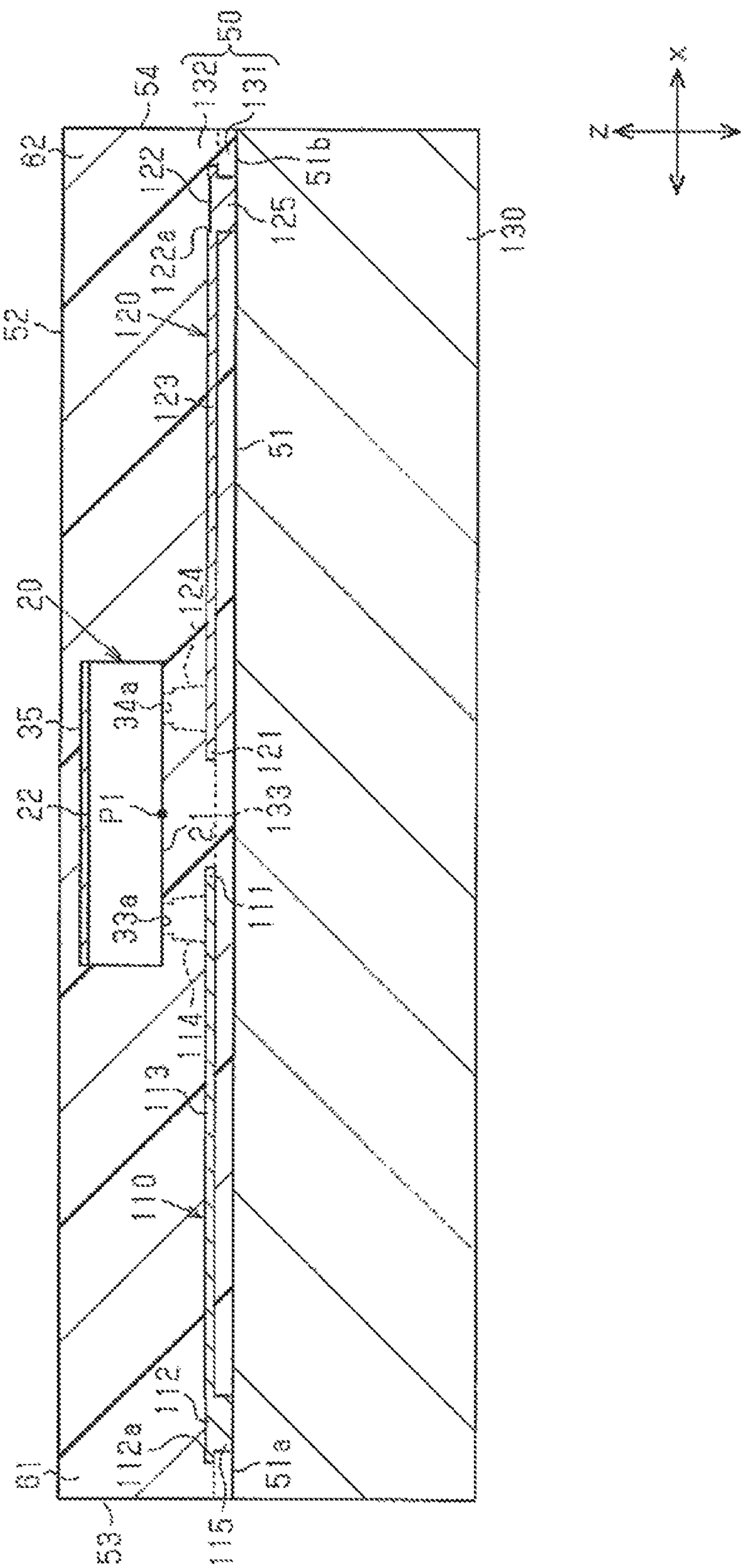
FIG. 15 is a section diagram of a step of a manufacturing method for a terahertz device.

As shown in FIG. 15, the manufacturing method for the terahertz device 10 includes a second sealing step of laminating a second dielectric layer 132 on the electrically conductive portions 110 and 120 and the terahertz element 20. In the second sealing step, the second dielectric layer 132 is formed by, for example, molding. In this embodiment, the second dielectric layer 132 is formed of a material same with that of the first dielectric layer 131. That is to say, the second dielectric layer 132 is electrically insulative, and is, for example, a synthetic resin that uses epoxy resin as the main agent. The dielectric 50 includes the first dielectric layer 131 and the second dielectric layer 132, wherein the lower surface of the first dielectric layer 131 constitutes the main dielectric surface 51, and the upper surface of the second dielectric layer 132 constitutes the dielectric back surface 52. The terahertz element 20 and the electrically conductive portions 110 and 120 are sealed by the two dielectric layers 131 and 132.

Moreover, before the second dielectric layer 132 is formed, for example, an underfill glue with epoxy resin as a main agent is filled below the terahertz element 20 (between the terahertz element 20 and the first dielectric layer 131 or the electrically conductive portions 110 and 120).

In addition, in this embodiment, an interface 133 may also be formed between the first dielectric layer 131 and the second dielectric layer 132. However, the two dielectric layers 131 and 132 may also be integrated without forming the interface 133.

Figure 16:
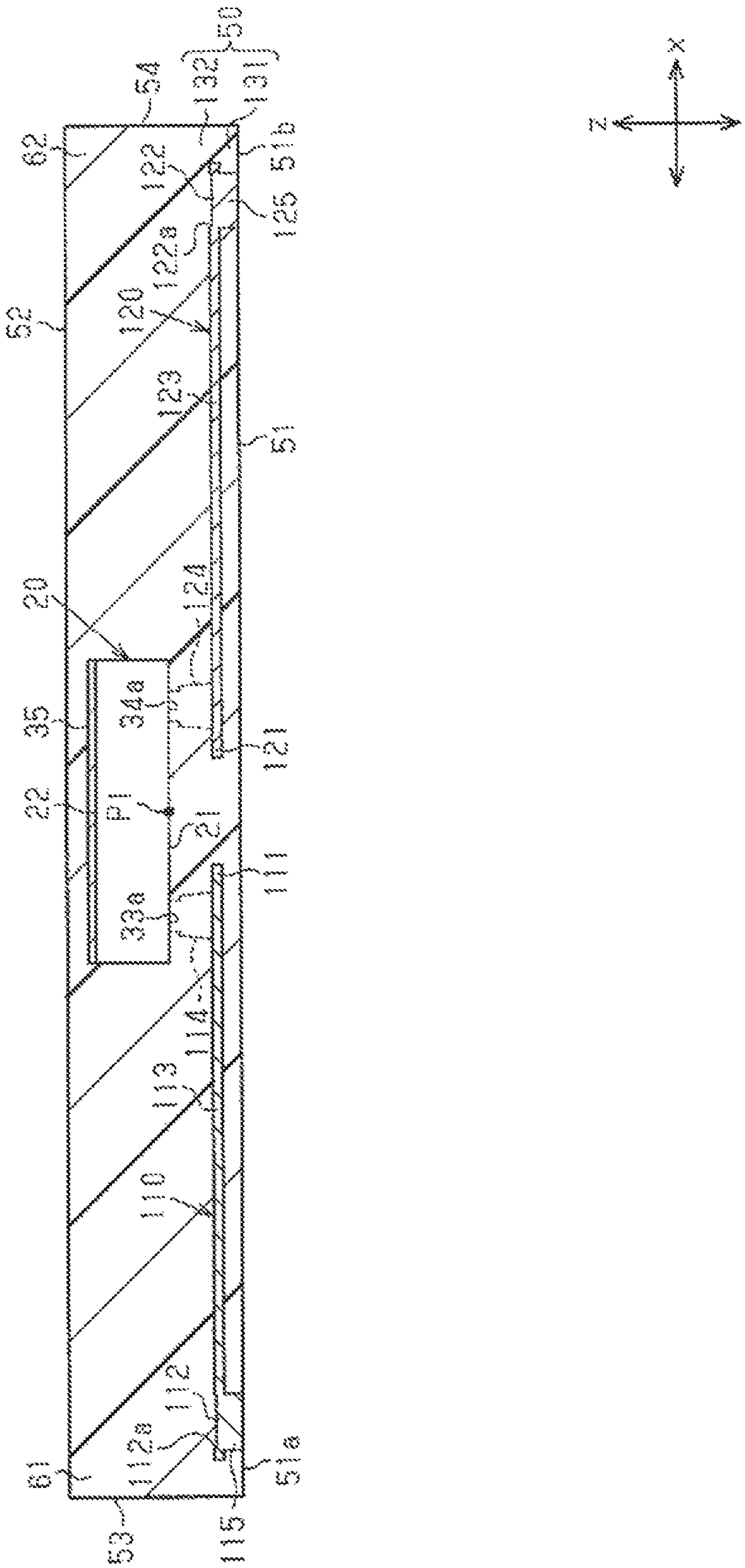
FIG. 16 is a section diagram of a step of a manufacturing method for a terahertz device.

As shown in FIG. 16, the manufacturing method for the terahertz device 10 includes a step of exposing the dielectric main surface 51 of the dielectric 50 and base end surfaces of the columns 115 and 125 by removing the support substrate 130. The step of removing the support substrate 130 is implemented by, for example, a mechanical grinder. However, the step of removing the support substrate 130 is not limited to the configuration of using a mechanical grinder.

Figure 17:
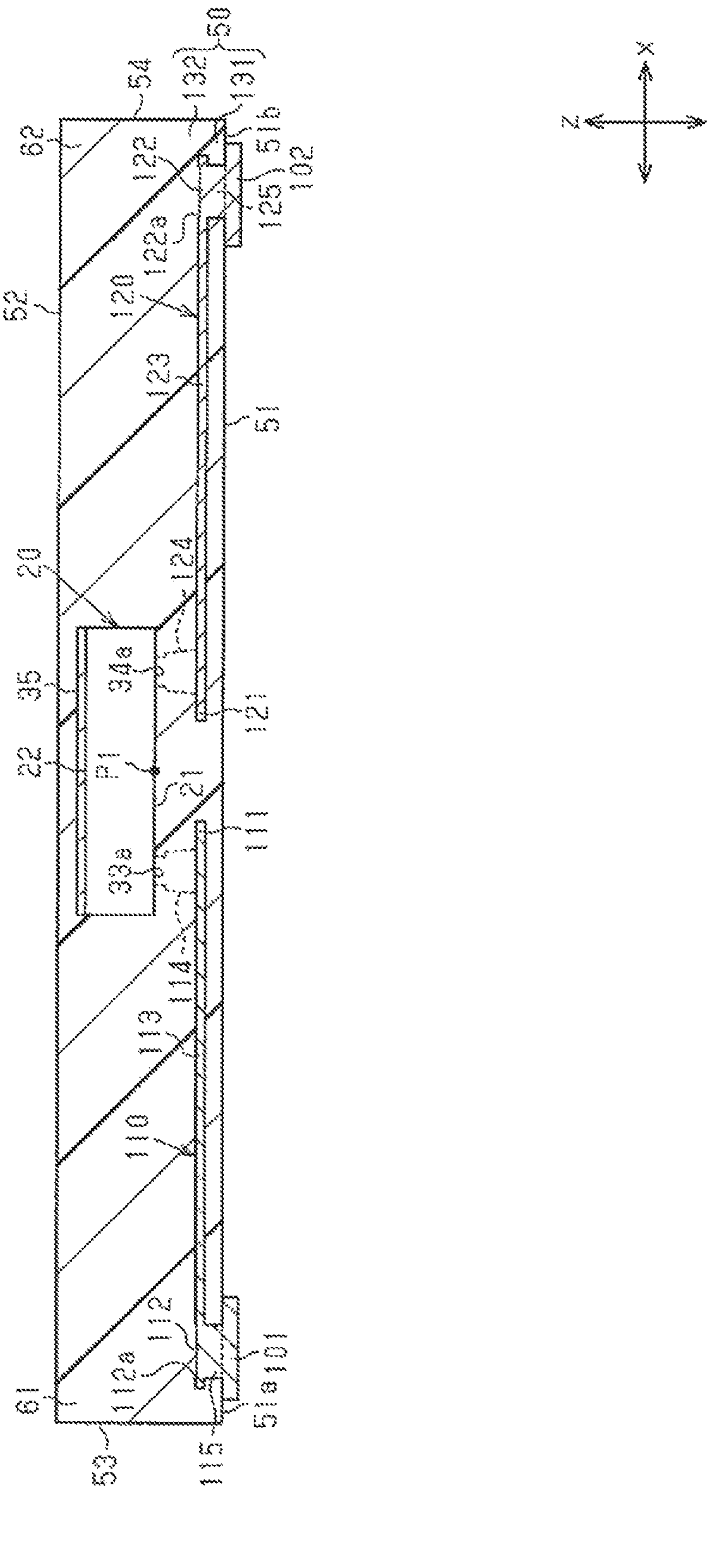
FIG. 17 is a section diagram of a step of a manufacturing method for a terahertz device.

As shown in FIG. 17, the manufacturing method for the terahertz device 10 includes a step of forming the electrodes 101 and 102. The step of forming the electrodes 101 and 102 is performed by, for example, electroless plating. In this embodiment, a Ni layer, a Pd layer and a Au layer are sequentially laminated by, for example, electroless plating, so as to accordingly form the electrodes 101 and 102.

Moreover, the method for forming the electrodes 101 and 102 is not limited to the above example, and a Ni layer and a Au layer may be sequentially laminated, only a Au layer may be laminated, only a Sn layer may be laminated, or Sn may be formed on a Ni layer.

Figure 18:
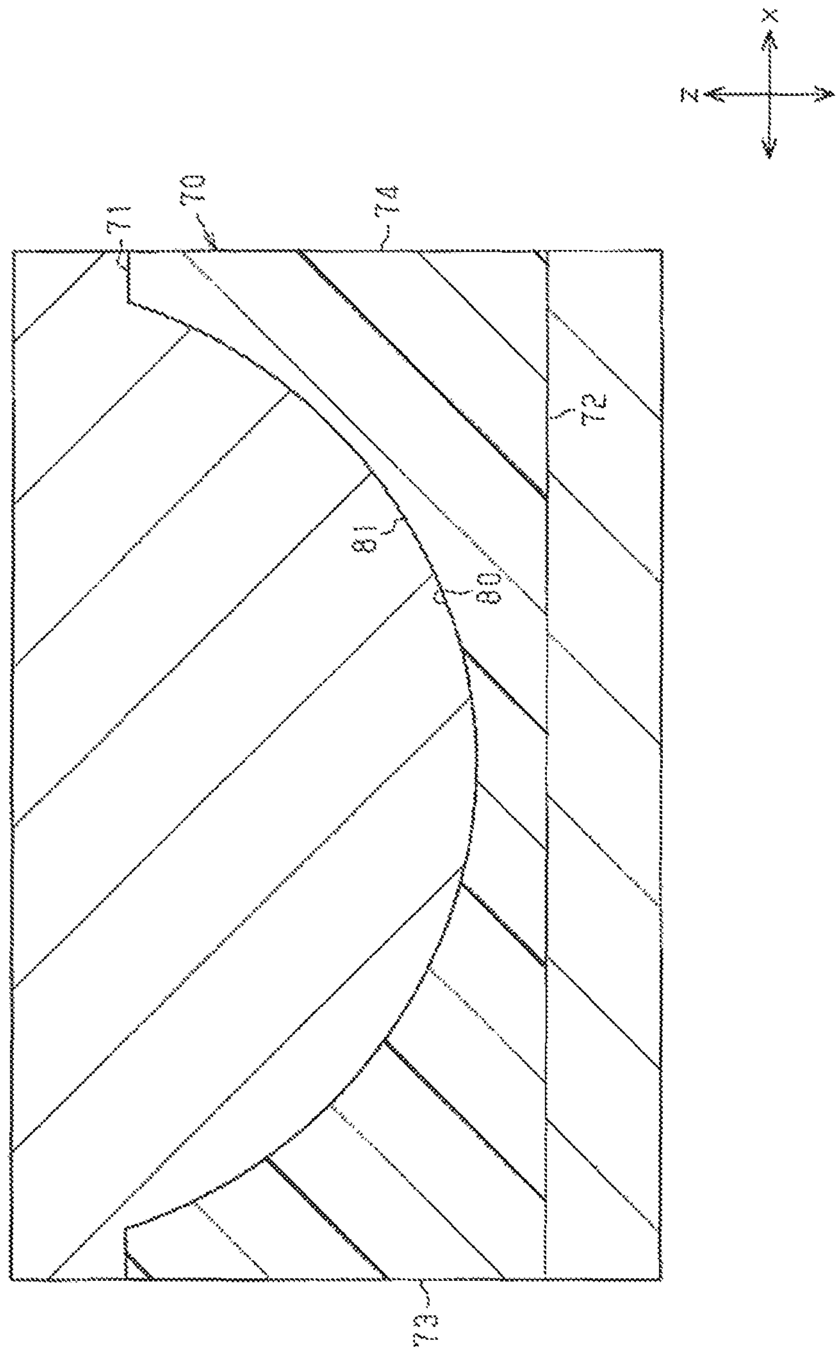
FIG. 18 is a section diagram of a step of a manufacturing method for a terahertz device.

Moreover, as shown in FIG. 18, the manufacturing method for the terahertz device 10 includes a step of forming the antenna recess 80 in the antenna base 70. In this step, a mold formed correspondingly to the antenna surface 81 is used to form the antenna recess 80 including the antenna surface 81.

Figure 19:
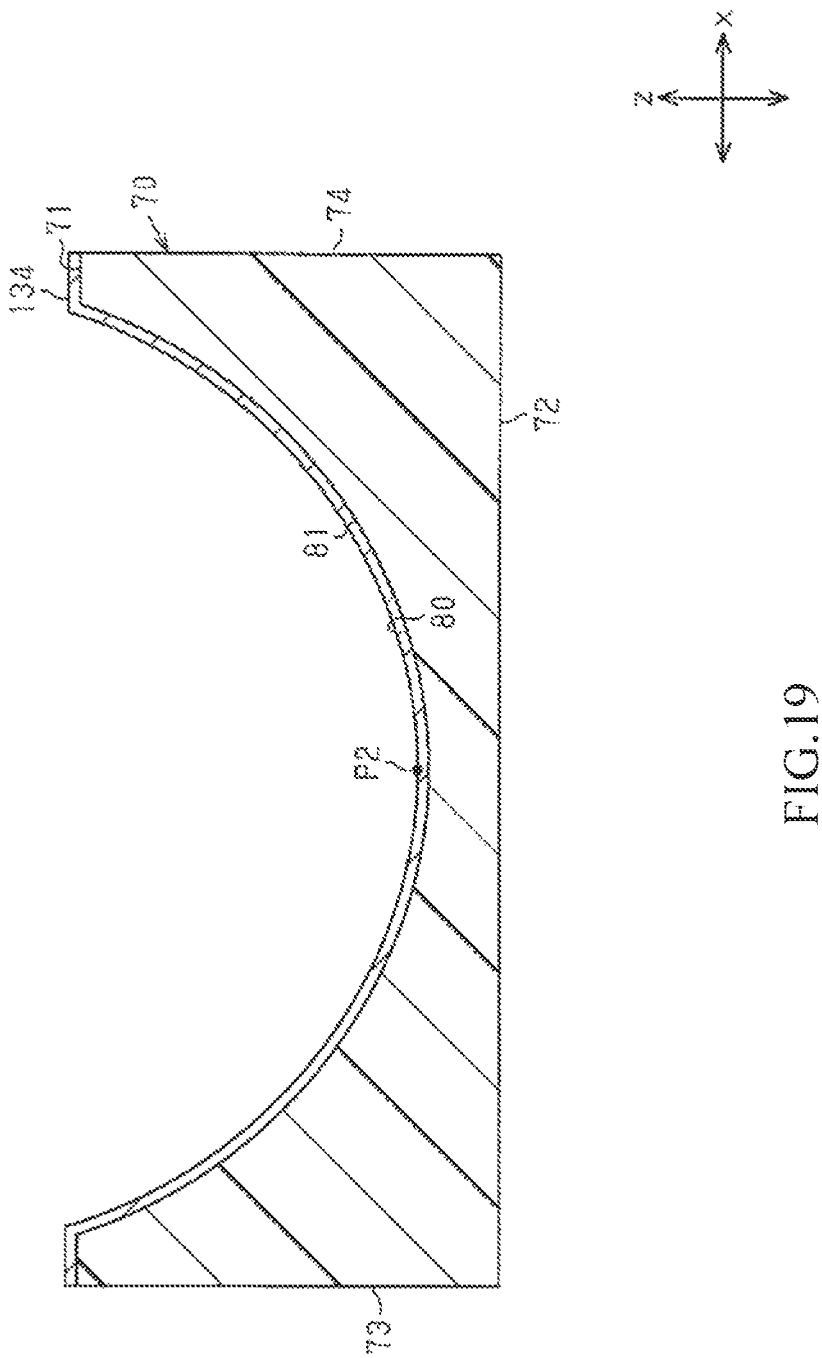
FIG. 19 is a section diagram of a step of a manufacturing method for a terahertz device.

As shown in FIG. 19, after forming the antenna recess 80, the manufacturing method for the terahertz device 10 includes a step of forming a metal film 134 constituting the reflecting film 82. In this step, the metal film 134 is formed on both the base main surface 71 and the antenna surface 81.

Figure 20:
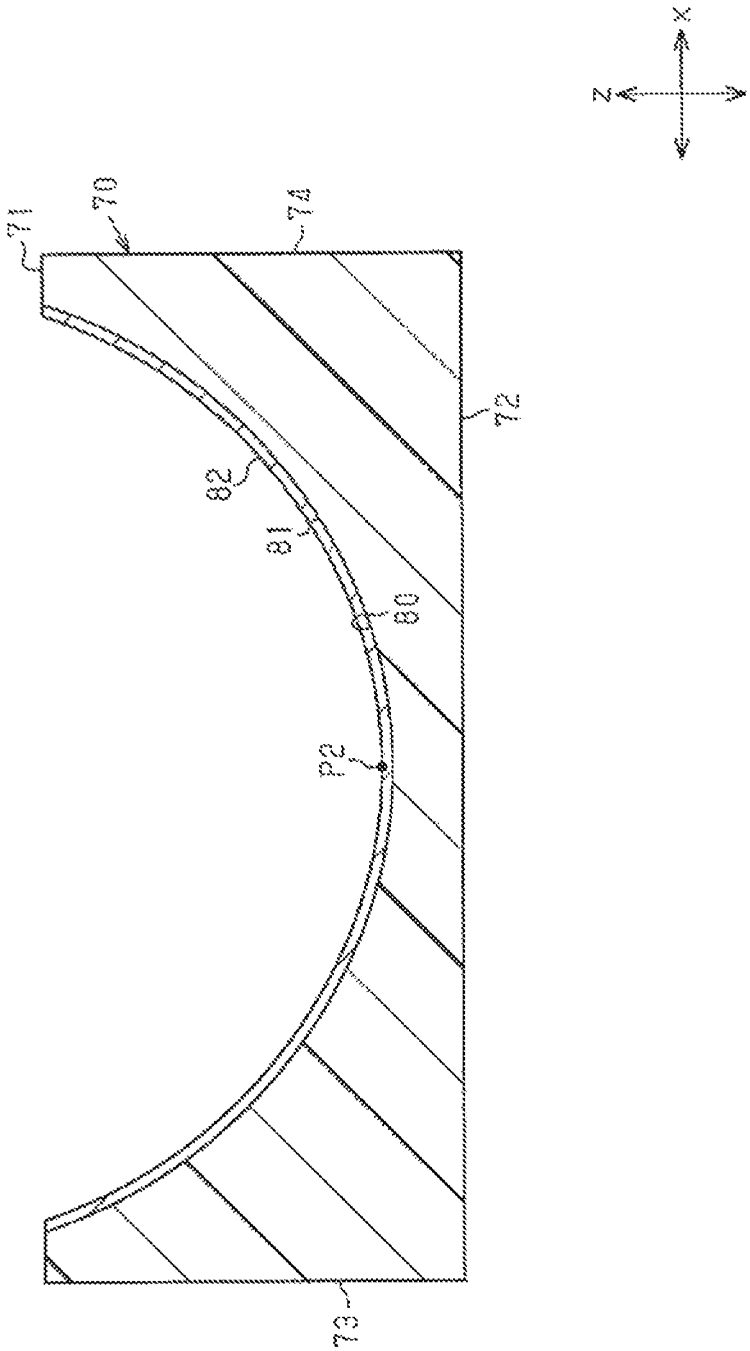
FIG. 20 is a section diagram of a step of a manufacturing method for a terahertz device.

As shown in FIG. 20, the manufacturing method for the terahertz device 10 includes a step of removing the metal film 134 formed on the base main surface 71. A specific method for removing the metal film 134 of the base main surface 71 may be any as desired, for example, a removal method implemented by patterning, or a removal method implemented by grinding. Accordingly, the reflecting film 82 is formed only on the antenna surface 81.

Herein, the step for forming the reflecting film 82 is not limited to the above step. For example, the manufacturing method for the terahertz device 10 may be configured to include the following steps, that is, shielding the base main surface 71, and forming the reflecting film 82 on the antenna surface 81 using electron beam evaporation. In this case, the step of removing the reflecting film 82 formed on the base main surface 71 is not needed.

The manufacturing method for the terahertz device 10 includes a step of assembling the dielectric 50 with the antenna base 70 having the reflecting film 82 formed thereon. In this step, the adhesive layer 91 is used to bond the antenna base 70 with the dielectric 50. Accordingly, as shown in FIG. 3, the terahertz device 10 is manufactured.

Moreover, for illustration purposes, the manufacturing method for one terahertz device 10 is described; however, multiple terahertz devices 10 may be simultaneously manufactured.

Figure 21:
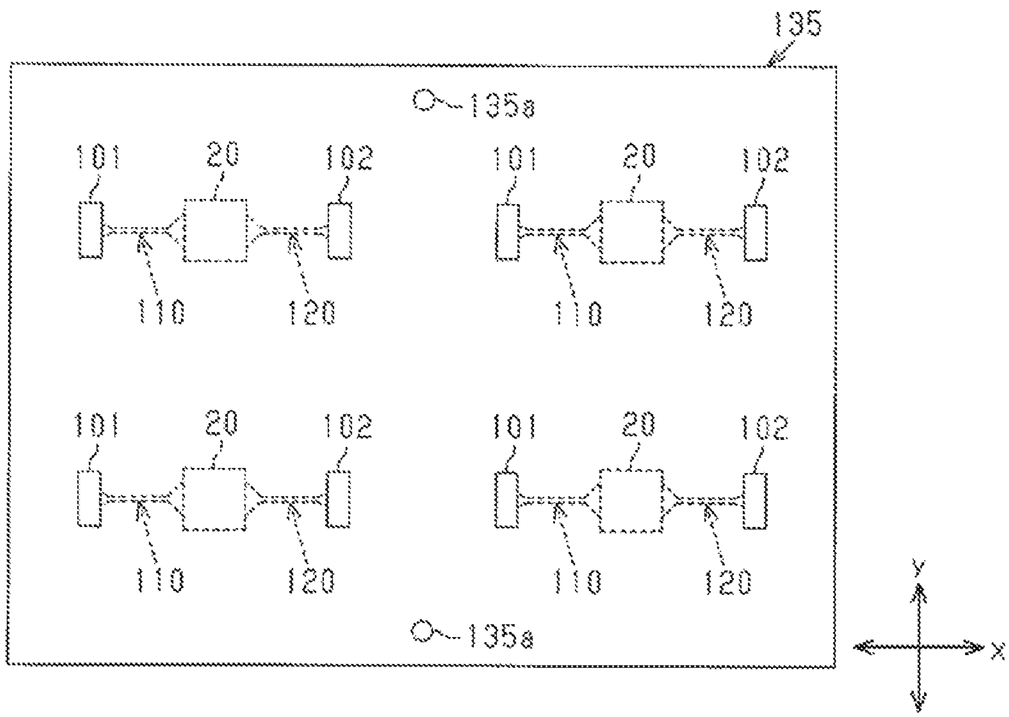
FIG. 21 is a planar diagram of a step of a manufacturing method for a terahertz device.

For example, as shown in FIG. 21, an assembly board 135 is prepared, wherein the assembly board 135 is embedded with multiple units including the terahertz element 20, the electrically conductive portions 110 and 120, and the electrodes 101 and 102.

Figure 22:
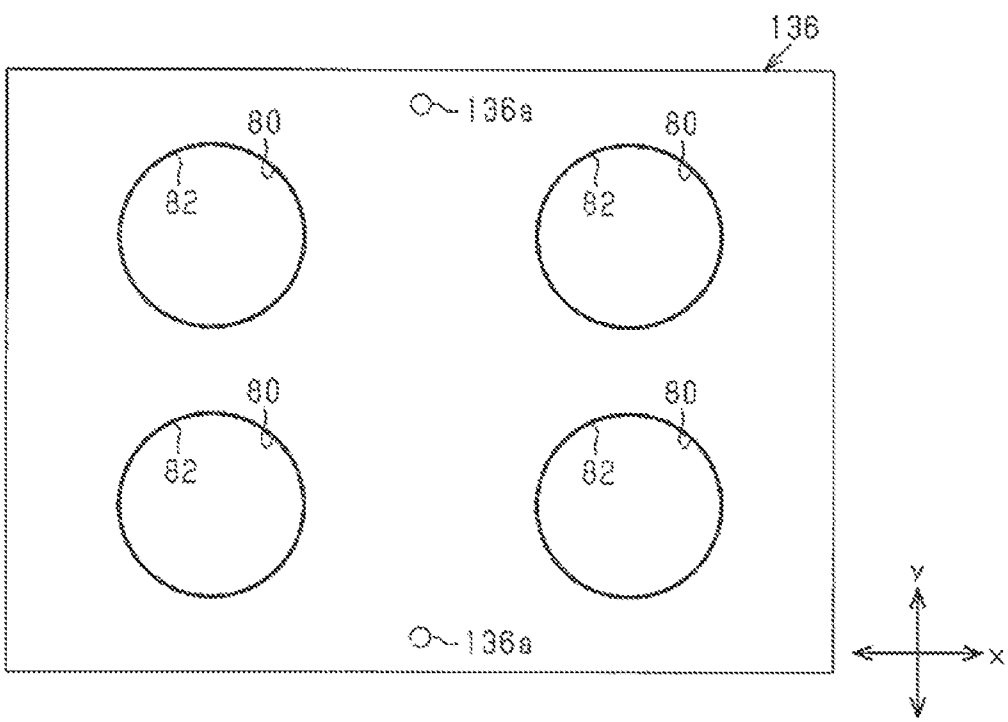
FIG. 22 is a planar diagram of a step of a manufacturing method for a terahertz device.

Moreover, as shown in FIG. 22, a base assembly 136 arranged with multiple antenna recesses 80 and reflecting films 82 is prepared. Then, the assembly board 135 and the base assembly 136 in a position aligned state are bonded by an adhesive, and then cut by dicing. Accordingly, multiple terahertz devices 10 are manufactured.

Herein, when the assembly board 135 and the base assembly 136 are adhered, a first positioning portion **135*a* formed on the assembly board 135 and a second positioning portion 136*a* formed on the base assembly 136 are used to position the assembly board 135 and the base assembly 136. For example, the assembly board 135 and the base assembly 136 may be positioned by means of overlapping the two positioning portions 135*a* and 136*a***.

Figure 23:
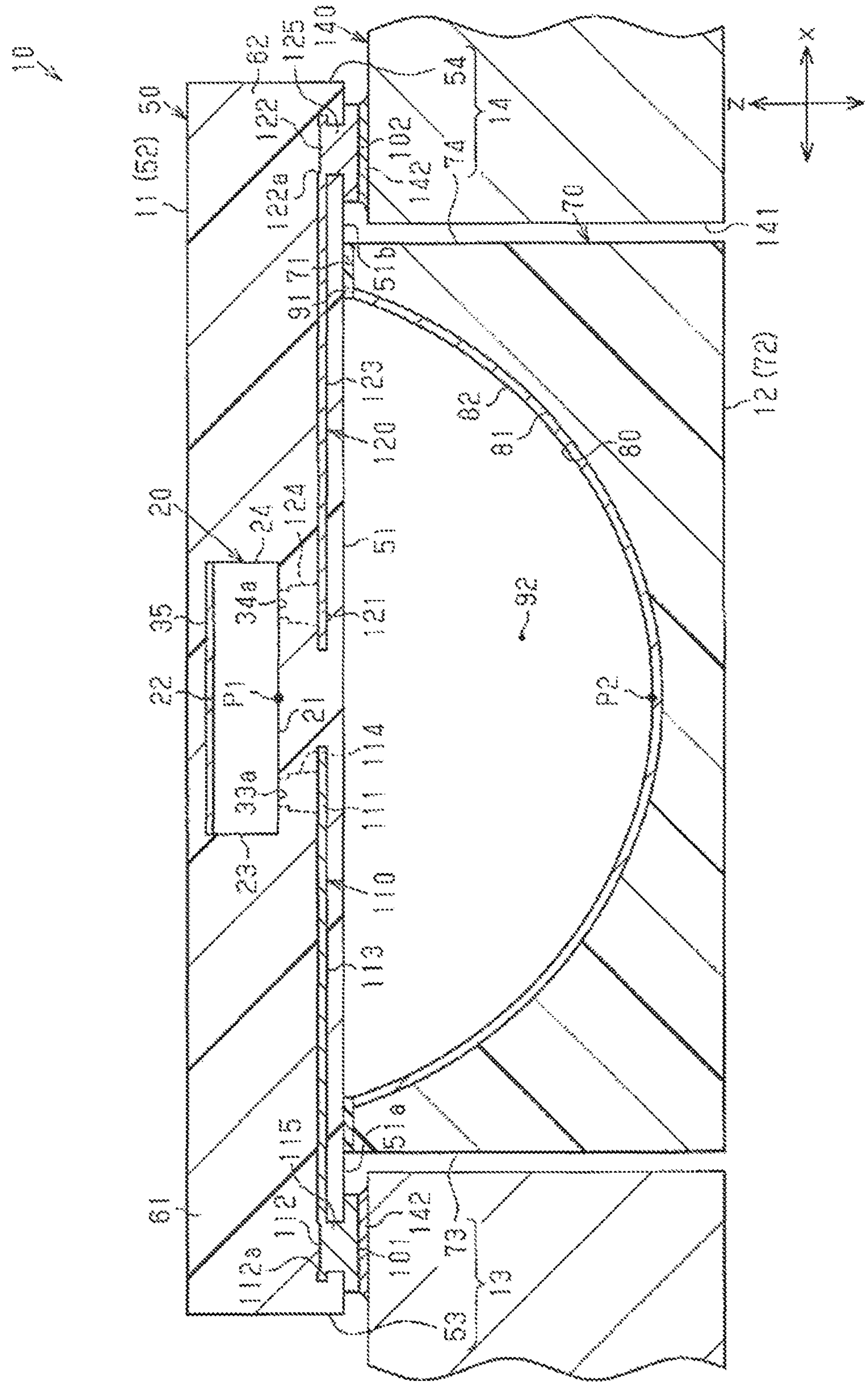
FIG. 23 is a section diagram of an example of a mounting form of a terahertz device on a circuit substrate.

As shown in FIG. 23, the terahertz device 10 of this embodiment can be mounted to a circuit substrate 140 in a state where the antenna base 70 is inserted into a hole 141 of the circuit substrate 140. In this case, the two electrodes 101 and 102 are bonded to the circuit substrate 140 by an electrically conductive bonding material 142 such as solder.

Figure 24:
FIG. 24(*a*) is a schematic diagram of a terahertz element surrounded by a gas, and FIG. 24(*b*) is a curve diagram of the change in refractive index under the condition of FIG. 24(*a*)
Figure 24:
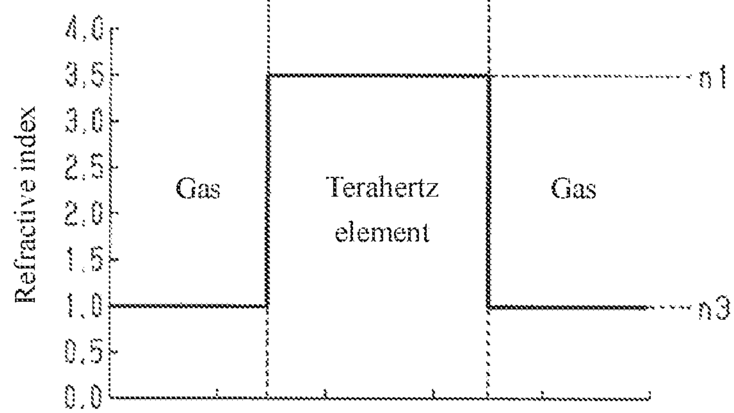
Figure 25:
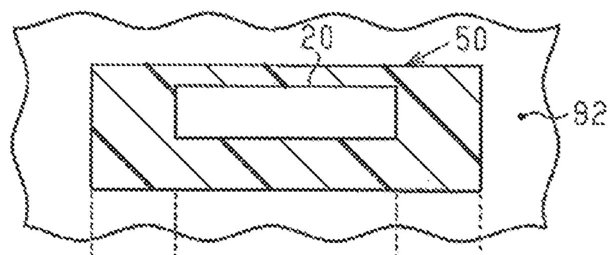
FIG. 25(*a*) is a schematic diagram of a terahertz element surrounded by a dielectric and a gas, and FIG. 25(*b*) is a curve diagram of the change in refractive index under the condition of FIG. 25(*a*)
Figure 25:
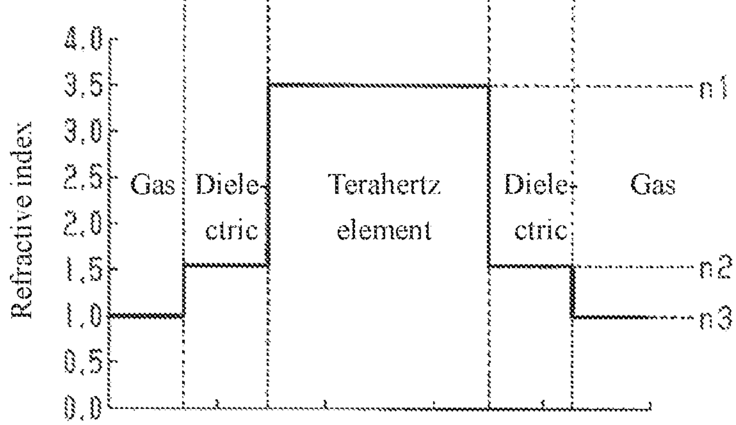

Effects of the embodiments are described in detail with reference to FIG. 24 and FIG. 25 below. FIG. 24(*a*) illustratively represents a terahertz element 20 surrounded by a gas, and 24(*b*) shows a curve diagram of the change in refractive index under the condition of 24(*a*). FIG. 25(*a*) illustratively represents a terahertz element 20 surrounded by a gas and the dielectric 50, and 25(*b*) shows a curve diagram of the change in refractive index under the condition of 25(*a*).

In this embodiment, electromagnetic waves generated from the terahertz element 20 are transmitted through the dielectric 50 and the gas space 92 to the reflecting film 82, and are reflected toward a direction (the top in this embodiment) by the reflecting film 82. Accordingly, electromagnetic waves are outputted from the terahertz device 10 (specifically, the device main surface 11). The device main surface 11 of this embodiment may also be said as an output surface outputting electromagnetic waves reflected by the reflecting film 82.

Herein, the two conditions below are compared for illustration, that is, it is assumed that electromagnetic waves are transmitted from the terahertz element 20 toward the reflecting film 82 without going through the dielectric 50, and electromagnetic waves are transmitted from the terahertz element 20 toward the reflecting film 82 through the dielectric 50.

As shown in FIG. 24(*a*) and FIG. 24(*b*), when it is assumed that the dielectric 50 does not exist and the terahertz element 20 is surrounded by a gas, the change in the refractive index at a boundary between inside and outside of the terahertz element 20, specifically, a boundary between the terahertz element 20 and the gas, is larger. In this case, electromagnetic waves are easily reflected at the boundary between inside and outside of the terahertz element 20, so electromagnetic waves can be easily contained in the terahertz element 20. As such, multiple resonant modes can be easily generated in the terahertz element 20. Hence, there is a concern of generating electromagnetic waves of a frequency outside the target frequency.

Regarding the above, as shown in FIG. 25 (*a*) and FIG. 25(*b*), when the terahertz element 20 is surrounded by the dielectric 50 having the dielectric refractive index n2 lower than the element refractive index n1 and higher than the gas refractive index n3, the refractive index decreases in a stepped manner as getting away from the terahertz element 20. Thus, at the boundary between inside and outside of the terahertz element 20, and more specifically, at the boundary between the terahertz element 20 and the dielectric 50, the change in the refractive index is decreased. Accordingly, reflection of electromagnetic waves at the boundary between inside and outside of the terahertz element 20 can be suppressed, such that multiple resonant modes are not easily generated.

The following effects are provided according to the embodiment described in detail above.

(1-1) The terahertz device 10 of the present invention includes the terahertz element 20 generating electromagnetic waves, the dielectric 50 including a dielectric material and surrounding the terahertz element 20, the gas space 92 including a gas, and the reflecting film 82 serving as a reflecting portion. The reflecting film 82 includes the portion opposing the terahertz element 20 through the dielectric 50 and the gas space 92 and reflecting electromagnetic waves toward a direction, wherein the electromagnetic waves are generated by the terahertz element 20 and transmitted through the dielectric 50 and the gas space 92. Further, if the refractive index of the terahertz element 20 is set as the element refractive index n1, the refractive index of the gas in the gas space 92 is set as the gas refractive index n3, and the refractive index of the dielectric 50 is set as the dielectric refractive index n2, there is n1>n2>n3.

According to the configuration, the electromagnetic waves generated from the terahertz element 20 are transmitted through the dielectric 50 and the gas space 92 to the reflecting film 82, and are reflected toward a direction by the reflecting film 82. Accordingly, output of the electromagnetic wave can be improved. That is to say, gain of electromagnetic waves outputted from the terahertz device 10 can be enhanced.

Herein, because the terahertz element 20 is surrounded by the dielectric 50 having a refractive index between the element refractive index n1 and the gas refractive index n3, the change in the refractive index at the boundary between inside and outside of the terahertz element 20 can be decreased. Accordingly, excessive reflection of electromagnetic waves at the boundary between inside and outside of the terahertz element 20 can be suppressed, such that the generation of multiple resonant modes in the terahertz element 20 can be suppressed. Hence, generation of electromagnetic waves of a frequency outside the target frequency can be suppressed. In other words, the Q value of the frequency characteristics of electromagnetic waves outputted from the terahertz element 20 can be increased. Accordingly, the frequency characteristics of the gain in the terahertz device 10 can be enhanced. Specifically, drastic changes in gain relative to the change in frequency of electromagnetic waves can be suppressed, thereby broadening the frequency band where stable and high gain can be obtained.

(1-2) The dielectric 50 includes the dielectric main surface 51 opposing the reflecting film 82, and the dielectric back surface 52 on a side opposite to the dielectric main surface 51. The terahertz device 10 includes the antenna base 70 having the antenna surface 81, wherein the antenna surface 81 curves in a manner of recessing toward a direction away from the terahertz element 20. The reflecting film 82 is a film formed on the antenna surface 81, and the gas space 92 is defined by the dielectric main surface 51 and the antenna surface 81.

According to the configuration, because the gas space 92 is defined by the dielectric main surface 51 and the antenna surface 81, electromagnetic waves emitted from the dielectric main surface 51 pass through the gas space 92 and reach the reflecting film 82. Accordingly, the effect of (1-1) can be achieved.

(1-3) The dielectric 50 and the antenna base 70 are separate individuals, and the terahertz device 10 includes the adhesive layer 91 as a fixing portion that fixes the dielectric 50 and the antenna base 70. According to the configuration, position offsets of the dielectric 50 and the antenna base 70 can be suppressed by the adhesive layer 91, and thus position offsets of the terahertz element 20 and the reflecting film 82 can also be suppressed.

(1-4) The adhesive layer 91 is disposed between the base main surface 71 of the antenna base 70 and the dielectric main surface 51, and the gas space 92 is sealed by the adhesive layer 91. According to the configuration, alien objects such as those obstructing transmission of electromagnetic waves can be prevented from invading into the gas space 92. Further, the reflecting film 82 disposed in the gas space 92 can be protected.

(1-5) The reflecting film 82 is formed on the antenna surface 81 but is not formed on the base main surface 71. According to the configuration, the reflecting film 82 formed on the base main surface 71 is prevented from reflecting electromagnetic waves. Accordingly, undesirable situations caused by unwanted reflected waves can be suppressed, for example, suppressing generation of unwanted standing waves.

(1-6) The terahertz device 20 includes the device main surface 21 having the oscillation point P1, and a surface on a side opposite to the device main surface 21, that is, the device back surface 22. The terahertz element 20 is surrounded by the dielectric 50 in a state where the element main surface 21 faces the reflecting film 82. According to the configuration, electromagnetic waves generated from the oscillation point P1 do not pass through the terahertz element 20 but are transmitted toward the reflecting film 82. Accordingly, electromagnetic waves can easily reach the reflecting film 82, and thus electromagnetic waves can be appropriately reflected by the reflecting film 82. Accordingly, the gain can be further enhanced.

(1-7) The reflecting film 82 is shaped as a parabolic antenna. According to the configuration, electromagnetic waves can be appropriately reflected toward one direction. Accordingly, the gain can be further enhanced.

(1-8) The reflecting film 82 is configured by locating a focus of the reflecting film 82 at the oscillation point P1. According to the configuration, electromagnetic waves generated from the oscillation point P1 are guided toward one direction by the reflecting film 82. Accordingly, electromagnetic waves that are not reflected toward one direction by the reflecting film 82 may be reduced, thereby achieving gain enhancement.

(1-9) The reflecting film 82 is in an electrically floating state. According to the configuration, undesirable conditions such as the reflecting film 82 absorbing electromagnetic waves can be suppressed.

(1-10) The antenna base 70 is formed of an insulative material. According to the configuration, electrical connection of the reflecting film 82 to certain components through the antenna base 70 can be suppressed.

(1-11) The element reflecting layer 35 reflecting electromagnetic waves is formed on the element back surface 22 of the terahertz element 20. According to the configuration, electromagnetic waves leaking to the top from the terahertz element 20 can be suppressed, and output of electromagnetic waves from the terahertz element 20 toward the reflecting film 82 can be increased. Accordingly, the gain can be further enhanced.

(1-12) The terahertz device 10 includes the electrically conductive portions 110 and 120 provided in the dielectric 50 and electrically connected to the terahertz element 20. According the configuration, it is difficult for the electrically conductive portions 110 and 120 located in the dielectric 50 to become in contact with the reflecting film 82 outside the dielectric 50. Accordingly, electrical connection between the electrically conductive portions 110 and 120 and the reflecting film 82 can be suppressed.

(1-13) The dielectric 50 includes the protruding portions 61 and 62 further protruding to the sides compared to the antenna base 70, when observed in the z direction. On the portions on the dielectric main surface 51 corresponding to the protruding portions 61 and 62, that is, the extruding surfaces 51*a* and 51*b*, the electrodes 101 and 102 electrically connected to the electrically conductive portions 110 and 120 are formed. According to the configuration, the electrodes 101 and 102 and the electrically conductive portions 110 and 120 can be used to achieve electrical connection of the terahertz element 20 to the exterior.

Particularly, according to the configuration, the circuit substrate 140 can be mounted in a state where the antenna base 70 is inserted into the hole 141 provided at the circuit substrate 140. Accordingly, the terahertz device 10 can be suppressed from protruding from the circuit substrate 140 toward the z direction when the terahertz device 10 is mounted on the circuit substrate 140, thereby achieving a low profile.

That is to say, gain enhancement can be achieved by the terahertz device 10 including the antenna base 70 having the reflecting film 82, and the expansion of the terahertz device 10 in the z direction is equivalent to the size of the antenna base 70. Hence, there is likely a concern of an undesirable situation where the terahertz device 10 can become an obstruction when the circuit substrate 140 is mounted.

Regarding the above, if the two electrodes 101 and 102 are formed on the structures of the extruding surfaces 51*a* and 51*b*, the terahertz device 10 can be mounted on the circuit substrate 140 in a state where the antenna base 70 is inserted into the hole 141, as described above. Specifically, the antenna base 70 can be inserted into the hole 141 till the position at which the electrodes 101 and 102 come into contact with the circuit substrate 140. Accordingly, the amount of protrusion of the terahertz device 10 from the circuit substrate 140 can be reduced, and so the undesirable situation caused by the antenna base 70 included can be suppressed.

Moreover, because the two electrodes 101 and 102 are formed on the extruding surfaces 51*a* and 51*b* of the protruding portions 61 and 62 that further protrude to the sides compared to the antenna base 70, when viewed in the z direction, the two electrodes 101 and 102 do not overlap with the reflecting film 82, when viewed in the z direction. Accordingly, transmission of electromagnetic waves reflected by the reflecting film 82 is not easily obstructed by the two electrodes 101 and 102. Accordingly, the decrease in gain caused by obstructed transmission of electromagnetic waves reflected by the reflecting film 82 by the two electrodes 101 and 102 can be suppressed.

(1-14) The electrodes 101 and 102 are shifted and configured to be closer to the side of the device main surface 11 in the z direction compared to the central portion of the terahertz device 10. According to the configuration, the dimension of the antenna base 70 inserted into the hole 141 can be enlarged, hence achieving an even lower profile.

(1-15) The terahertz element 20 includes the pads 33*a* and 34*a* formed on the element main surface 21. The electrically conductive portions 110 and 120 extend in the protruding directions of the protruding portions 61 and 62, that is, the x direction, in a manner of overlapping with both the terahertz element 20 and the electrodes 101 and 102, when observed in the z direction, and include the element opposing portions 111 and 121 opposing the pads 33*a* and 34*a* in the z direction. The terahertz element 20 is disposed on the bumps 114 and 124 provided between the pads 33*a* and 34*a* and the element opposing portions 111 and 121, and is flip-chip mounted on the element opposing portions 111 and 121. Accordingly, the terahertz element 20 can be electrically connected to the two electrodes 101 and 102.

Particularly, because flip-chip mounting is used as a mounting form of the terahertz element 20, compared to mounting implemented by wire bonding, high-speed signal transmission can be achieved. That is to say, in a high frequency band of electromagnetic waves in the terahertz frequency band, if mounting is implemented by wire bonding, there is a concern for an undesirable situation where the signal transmission speed is limited as caused by lead wires. Regarding the above, if flip-chip mounting without lead wires is used, the above undesirable situation is avoided. Accordingly, high-speed signal transmission can be achieved.

(1-16) The electrically conductive portions 110 and 120 include the electrode opposing portions 112 and 122 opposing the electrodes 101 and 102, and the connecting portions 113 and 123 connecting the element opposing portions 111 and 121 with the electrode opposing portions 112 and 122 and extending in the x direction. If they direction in the electrically conductive portions 110 and 120 is used as the width direction, at least portions of the connecting portions 113 and 124 are formed as being narrower than the element opposing portions 111 and 121. According to the configuration, because portions or all of the connecting portions 113 and 123 is overlapping with the reflecting film 82, there is a concern of blocking (to be referred to as cut-off) of electromagnetic waves caused by the connecting portions 113 and 123.

Regarding the above, in this embodiment, since at least portions of the connecting portions 113 and 123 are formed as being narrower than the element opposing portions 111 and 121, the cut-off area can be reduced. Accordingly, cut-off can be mitigated.

Moreover, because the element opposing portions 111 and 121 are formed as being wider than the connecting portions 113 and 123, the contact area can be increased. Accordingly, electrical connection of the pads 33*a* and 34*a* of the bumps 114 and 124 with the element opposing portions 111 and 121 can be appropriately achieved.

(1-17) The electrode opposing portions 112 and 122 are formed as being wider than the connecting portions 113 and 123. According to the configuration, the contact area can be increased, and thus electrical connection of the electrode opposing portions 112 and 122 with the electrodes 101 and 102 can be appropriately achieved.

(1-18) The first connecting portion 113 includes the first connecting body portion 113*a* formed as having a width narrower than the first element opposing portion 111, and a first element side taper portion 113*b* connecting the first connecting body portion 113*a* and the first element opposing portion 111. The first element side taper portion 11*b* is formed as having a width that gradually increases from the first connecting body portion 113*a* toward the first element opposing portion 111. According to the configuration, reflected waves generated in the first electrically conductive portion 110 can be reduced. The same applies to the second connecting portion 123.

(1-19) The first connecting body portion 113*a* is formed as having a width narrower than the first electrode opposing portion 112. The first connecting portion 113 includes the first electrode side taper portion 113*c* connecting the first connecting body portion 113*a* and the first electrode opposing portion 112, and the first electrode side taper portion 113*c* is formed as having a width that gradually increases from the first connecting body portion 113*a* toward the first electrode opposing portion 112. According to the configuration, reflected waves generated in the first electrically conductive portion 110 can be reduced. The same applies to the second connecting portion 123.

(1-20) The two electrically conductive portions 110 and 120 extend from the terahertz element 20 toward directions away from each other, when observed in the z direction. For example, the two pads 33*a* and 34*a* are in a spaced and opposing arrangement in the x direction. Further, the two extruding surfaces 51*a* and 51*b* are in disposed apart in the x direction, and the two electrodes 101 and 102 are also disposed apart in the x direction. Thus, the two electrically conductive portions 110 and 120 extend away from each other in the x direction in a manner that the pads 33*a* and 34*a* and the electrodes 101 and 102 are respectively opposite. That is to say, the two electrically conductive portions 110 and 120 are arranged in symmetry with respect to the x direction. Accordingly, undesirable influences caused by asymmetry of the two electrically conductive portions 110 and 120 upon a radiation mode of the electromagnetic wave can be suppressed.

(1-21) The first pad 33*a* and the first element opposing portion 111 extend in the y direction, and the plurality of first bumps 114 are arranged in the y direction. Similarly, the second pad 34*a* and the second element opposing portion 121 extend in the y direction, and the plurality of second bumps 124 are arranged in the y direction. Accordingly, the contact area can be increased, thereby reducing contact resistance.

Moreover, in the configuration where the two pads 33*a* and 34*a* are disposed apart in the x direction, assuming that the two pads 33*a* and 34*a* extend in the x direction, there is a concern for the following undesirable situation, that is, a concern for short circuit due to the decreased distance between the two pads 33*a* and 34*a*, or transmission of electromagnetic waves obstructed by interference of the oscillation point P1 and the two pads 33*a* and 34*a*. Regarding the above, in this embodiment, the two pads 33*a* and 34*a* extend in a direction orthogonal to the opposing direction thereof, that is, the y direction, so the foregoing undesirable situations can be suppressed.

Variation Example of the First Embodiment

A variation example of the terahertz device 10 according to the first embodiment is described below. However, given that the variation example below does not result in any contradiction, the variation example may be applied to other implementation forms, and variation examples may be used in combination.

Figure 26:
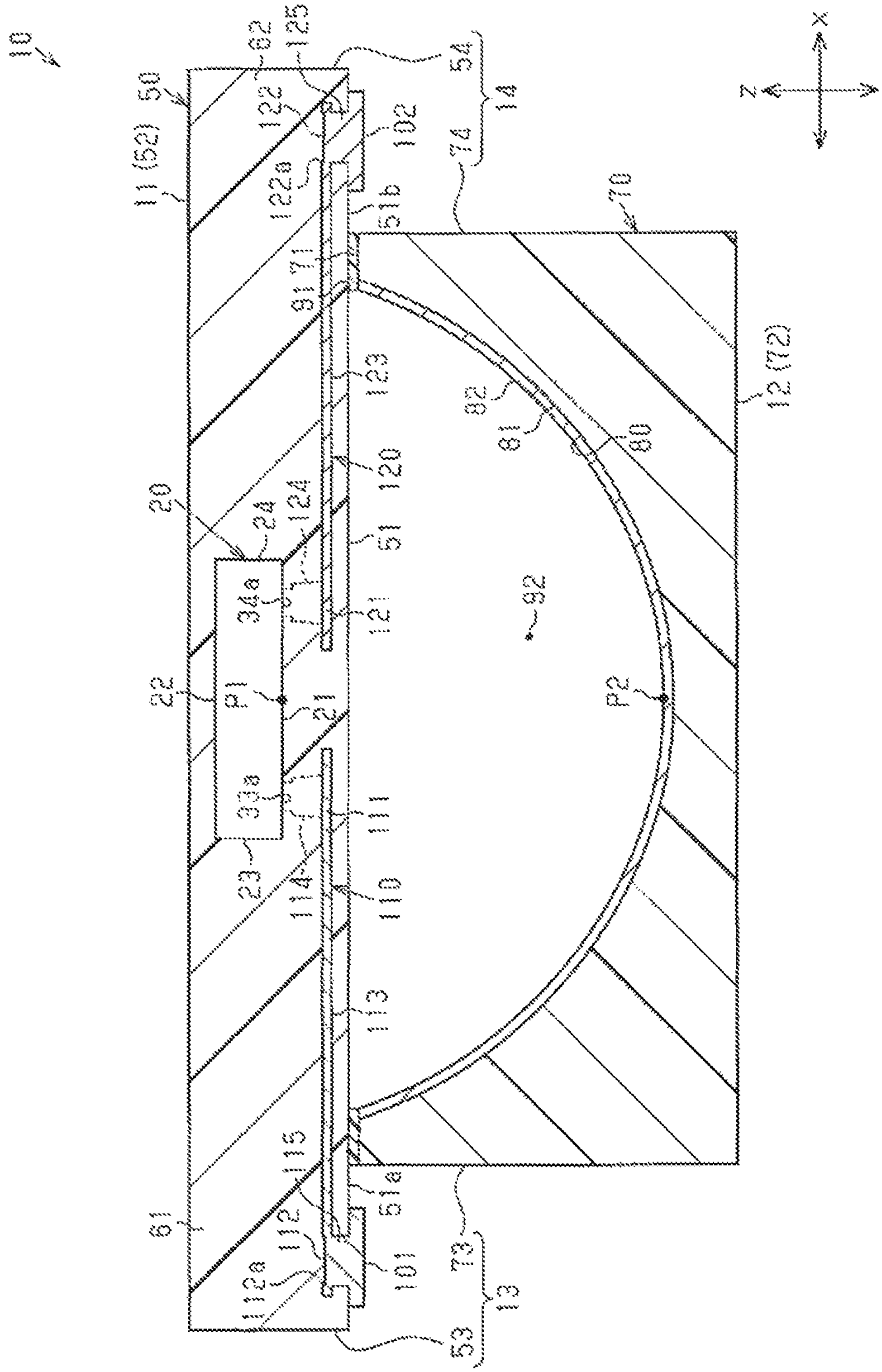
FIG. 26 is a section diagram of a variation example of a terahertz device according to the first embodiment.
Figure 27:
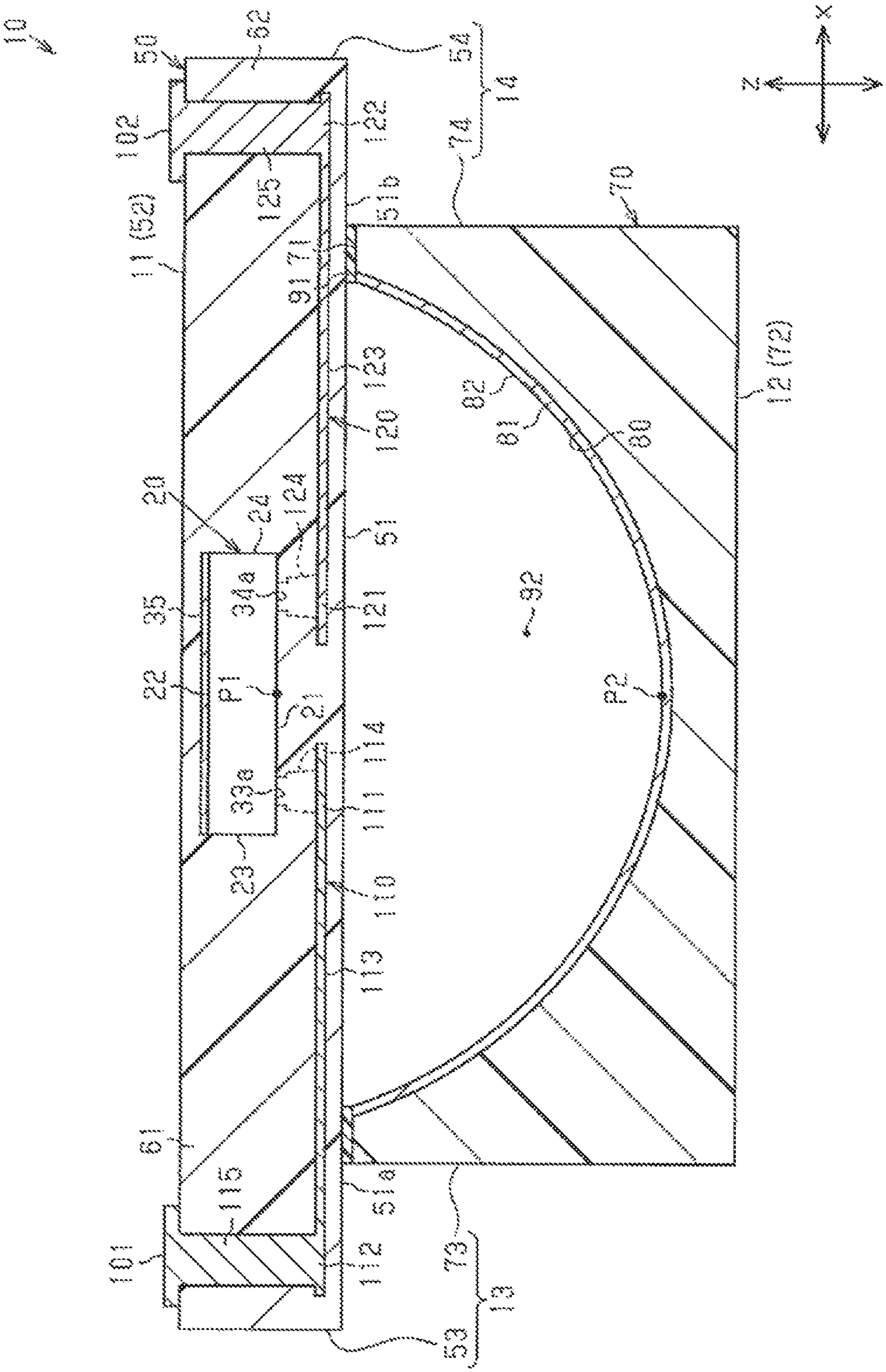
FIG. 27 is a section diagram of a variation example of a terahertz device according to the first embodiment.
Figure 28:
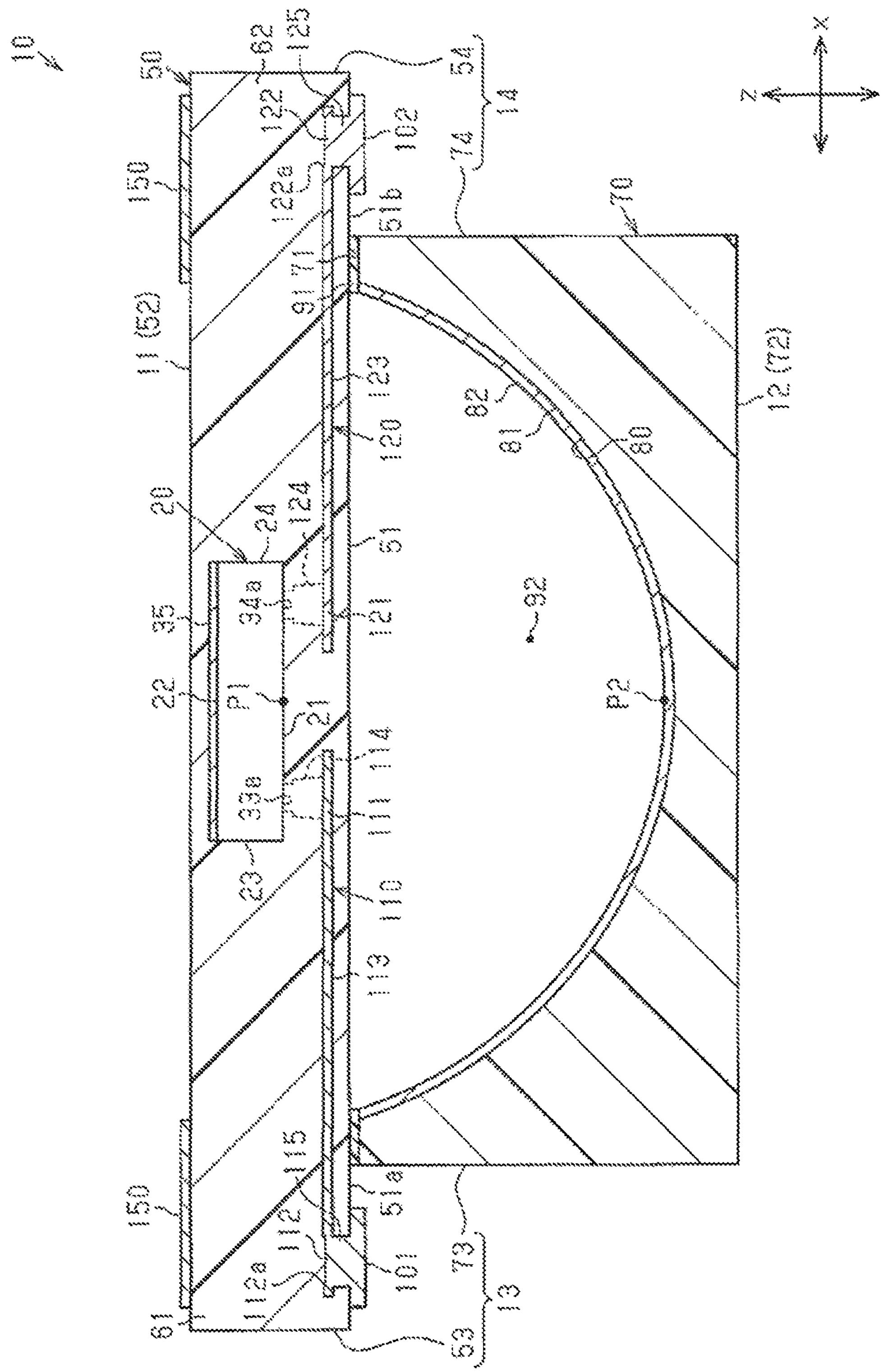
FIG. 28 is a section diagram of a variation example of a terahertz device according to the first embodiment.

- As shown in FIG. 26, the element reflecting layer 35 may be omitted. In this case, the terahertz element 20 outputs electromagnetic waves toward two directions, to the top and bottom. That is to say, the terahertz element 20 may be a configuration that outputs directional electromagnetic waves, or may be a configuration that outputs non-directional electromagnetic waves.
- The reflecting film 82 may also be formed over an angle range of the opening angle θ or more with respect to the oscillation point P1. That is to say, the reflecting film 82 may be a configuration that reflects a portion of electromagnetic waves generated from the terahertz element 20.
- As shown in FIG. 27, the electrodes 101 and 102 may be formed on the dielectric back surface 52. Specifically, the electrodes 101 and 102 are formed on portions in the dielectric back surface 52 corresponding to the protruding portions 61 and 62. In this case, the column portions 115 and 125 may be erected from the electrode opposing portions 112 and 122 toward the dielectric back surface 52 (the top).
- As shown in FIG. 28, the terahertz device 10 includes a reflection reducing film 150 formed on the dielectric back surface 52. The reflection reducing film 150 may be referred to as a reflection resist film, or may be referred to as an anti-reflection (AR) coating.

The reflection reducing film 150 may be formed, for example, on a portion overlapping with the electrically conductive portions 110 and 120 or the electrodes 101 and 102 but non-overlapping with the reflecting film 82, when observed in the z direction. Accordingly, generation of standing waves caused by reflection of electromagnetic waves at the electrically conductive portions 110 and 120 or the electrodes 101 and 102 can be suppressed. Moreover, the specific configuration of the reflection reducing film 150 may be in any configuration, given that the reflection of electromagnetic waves of the terahertz wave band can be at least reduced.

Second Embodiment

The terahertz device 10 of the second embodiment is given with reference to FIG. 29 to FIG. 31 below. In the description below, constituents common with those of the terahertz device 10 of the first embodiment are represented by the same denotations, and associated details are sometimes omitted for brevity.

Figure 29:
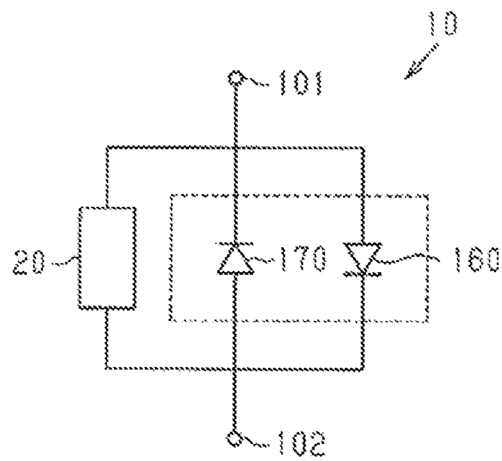
FIG. 29 is a brief circuit diagram of a terahertz device according to a second embodiment.

As shown in FIG. 29, the terahertz device 10 of this embodiment includes protection diodes 160 and 170 as an example of specific elements electrically connected to the terahertz element 20. The protection diodes 160 and 170 are electrically connected to the terahertz element 20, and are connected in parallel to the terahertz element 20 in this embodiment. The two protection diodes 160 and 170 are connected to the terahertz element 20 in a manner of becoming opposite directions. The protection diodes 160 and 170 may also be Zener diodes, Schottky diodes, or light emitting diodes, apart from common diodes.

Moreover, the specific elements are not limited to the protection diodes 160 and 170, and may also be a control integrated circuit, for example, an application-specific integrated circuit (ASIC). The control integrated circuit can perform, for example, detection, amplification of current flowing to the terahertz element 20, or power supply of the terahertz element 20 or signal processing. Further, the connection form of the specific element to the terahertz element 20 may be any as desired, for example, a serial connection.

Figure 30:
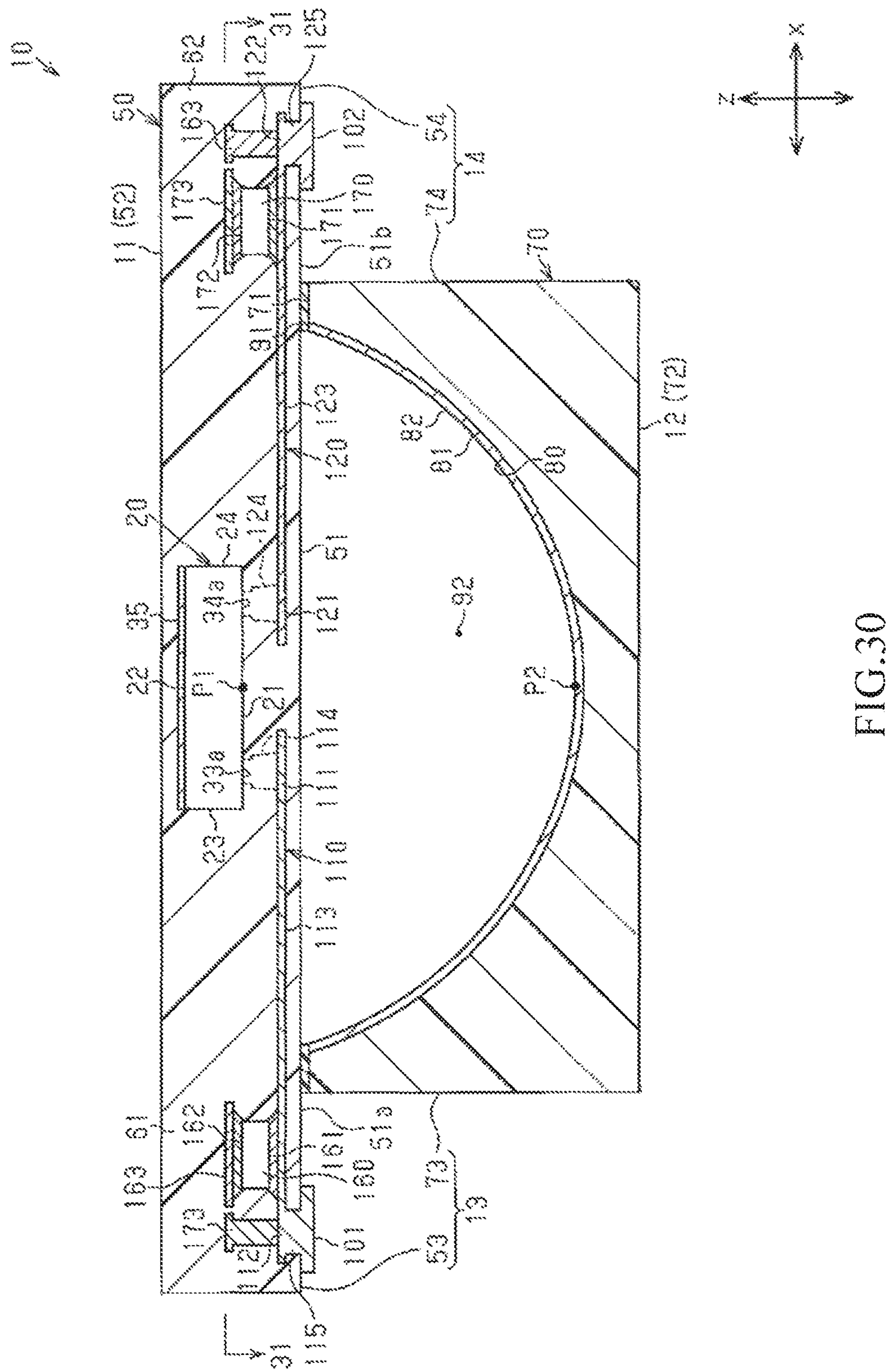
FIG. 30 is a section diagram for illustrating a sectional structure of a terahertz device of the second embodiment.

As shown in FIG. 30, the two protection diodes 160 and 170 are disposed in the dielectric 50. That is to say, the dielectric 50 seals the two protection diodes 160 and 170 and the terahertz element 20.

The two protection diodes 160 and 170 are configured on positions non-overlapping with the reflecting film 82, when observed in the z direction. Specifically, in the dielectric 50, the protection diodes 160 and 170 are disposed in the protruding portions 61 and 62 protruding from the antenna base 70 toward the sides. Accordingly, transmission of electromagnetic waves reflected by the reflecting film 82 can be prevented from being obstructed by the two protection diodes 160 and 170. The two protection diodes 160 and 170 of this embodiment are in an opposing arrangement in the x direction with the terahertz element 20 interposed in between.

The first protection diode 160 includes a first anode electrode 161 and a first cathode electrode 162. The first anode electrode 161 and the first cathode electrode 162 are formed, for example, on two end surface of the first protection diode 160 in the z direction, that is, the lower surface and the upper surface. The first protection diode 160 is mounted on the first electrically conductive portion 110 (for example, the first electrode opposing portion 112) in a state where the first anode electrode 161 is bonded with the first electrically conductive portion 110.

Figure 31:
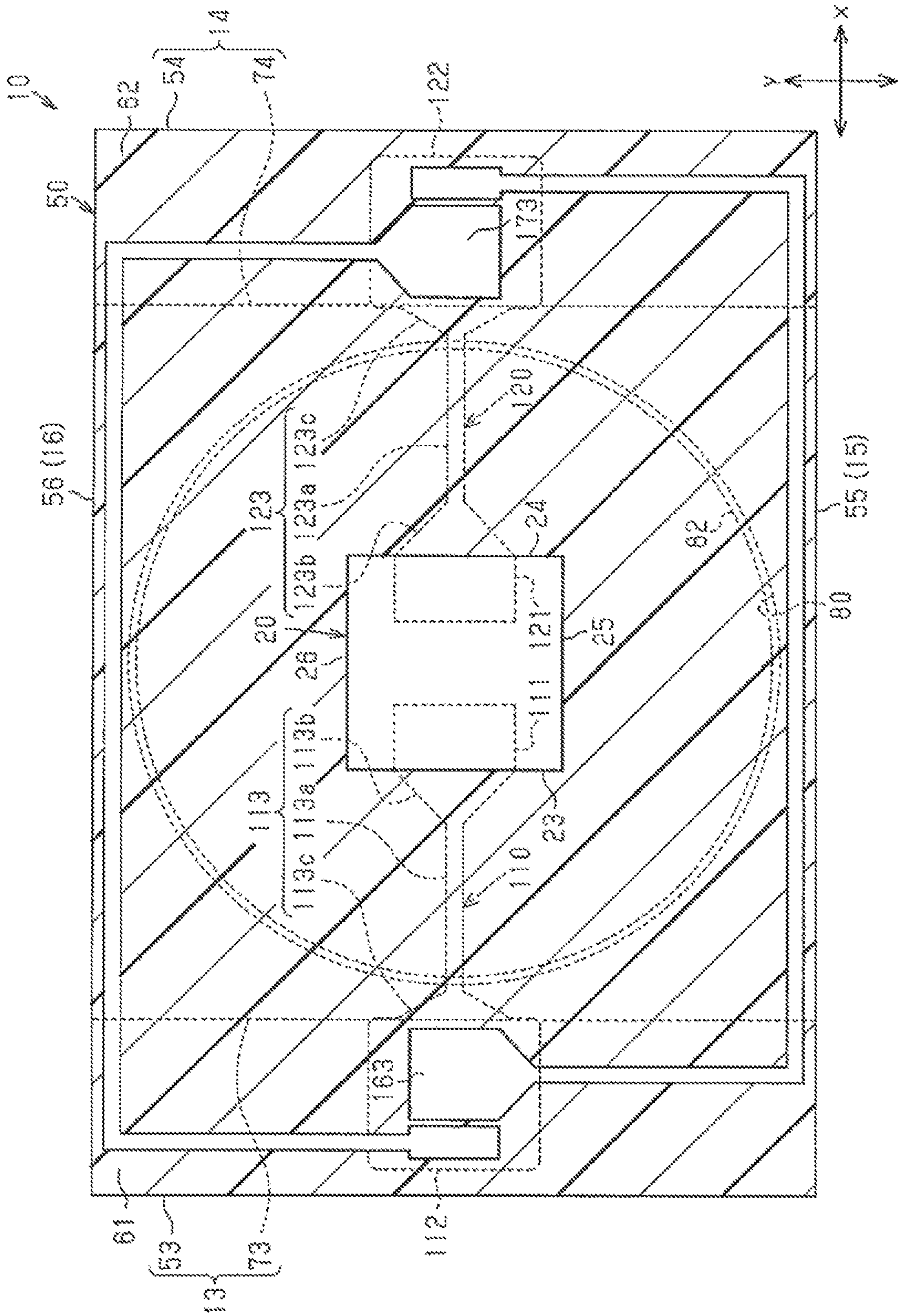
FIG. 31 is a section diagram of FIG. 30 along the line 31-31.

As shown in FIG. 31, the terahertz device 10 of this embodiment includes a first protection connecting portion 163 electrically connecting the first protection diode 160 and the second electrically conductive portion 120. The first protection connecting portion 163 is disposed in the dielectric 50, detours in a manner of non-overlapping with the reflective film 82, and connects the first cathode electrode 162 and the second electrically conductive portion 120 (specifically, the second electrode opposing portion 122). Accordingly, the first protection diode 160 is electrically connected to the two electrodes 101 and 102.

As shown in FIG. 30, the second protection diode 170 includes a second anode electrode 171 and a second cathode electrode 172. The second anode electrode 171 and the second cathode electrode 172 are formed, for example, on two end surface of the second protection diode 170 in the z direction, that is, the lower surface and the upper surface. The second protection diode 170 is mounted on the second electrically conductive portion 120 (for example, the second electrode opposing portion 122) in a state where the second anode electrode 171 is bonded with the second electrically conductive portion 120.

As shown in FIG. 31, the terahertz device 10 of this embodiment includes a second protection connecting portion 173 electrically connecting the second protection diode 170 and the first electrically conductive portion 110. The second protection connecting portion 173 is disposed in the dielectric 50, detours in a manner of non-overlapping with the reflective film 82, and connects the second cathode electrode 172 and the first electrically conductive portion 110 (specifically, the first electrode opposing portion 112). Accordingly, the second protection diode 170 is electrically connected to the two electrodes 101 and 102. The protection portions 163 and 173 may be referred to as protection connecting patterns, or may be referred to as protection connecting films.

In this embodiment, the first protection diode 160 is configured to be closer to the inner side than the first electrode 101, and the second protection diode 170 is configured to be closer to the inner side than the second electrode 102. In other words, the protection diodes 160 and 170 and the electrodes 101 and 102 are arranged in the x direction toward a direction away from the terahertz element 20. However, the protection diodes 160 and 170 are sealed in the dielectric 50, and thus the protection diodes 160 and 170 are not in contact with the electrodes 101 and 102.

The following effects are provided according to the embodiment described in detail above.

(2-1) The terahertz device 10 includes the protection diodes 160 and 170 connected in parallel to the terahertz element 20. According to the configuration, for example, when two ends of the terahertz element 20 are applied by a high voltage due to static electricity, current may be enabled to flow through the protection diodes 160 and 170. Accordingly, excessive current can be suppressed from flowing to the terahertz element 20, hence protecting the terahertz element 20.

(2-2) The two protection diodes 160 and 170 are connected to the terahertz element 20 in a manner of becoming opposite directions. According to the configuration, the terahertz element 20 can be protected regardless of a high voltage in which direction is generated.

(2-3) The protection diodes 160 and 170 are configured on positions non-overlapping with the reflecting film 82, when observed in the z direction. According to the configuration, transmission of electromagnetic waves reflected by the reflecting film 82 can be prevented from being obstructed by the two protection diodes 160 and 170.

(2-4) The protection diodes 160 and 170 are disposed in the protruding portions 61 and 62, and are mounted on the electrically conductive portions 110 and 120. The terahertz device 10 includes: a first protection connecting portion 163, detouring in a manner of non-overlapping with the reflective film 82, when observed in the z direction, and connecting the first protection diode 160 and the second electrically conductive portion 120; and a second protection connecting portion 173, detouring in a manner of non-overlapping with the reflective film 82, when observed in the z direction, and connecting the second protection diode 170 and the first connective portion 110. According to the configuration, transmission of electromagnetic waves reflected by the reflecting film 82 can be prevented from being obstructed, and electrical connection between the first protection diode 160 and the second electrically conductive portion 120 and between the second protection diode 170 and the first electrically conductive portion 110 can be achieved.

Variation Example of the Second Embodiment

A variation example of the terahertz device 10 according to the second embodiment is described below. However, given that the variation example below does not result in any contradiction, the variation example may be applied to other implementation forms, and variation examples may be used in combination.

Figure 32:
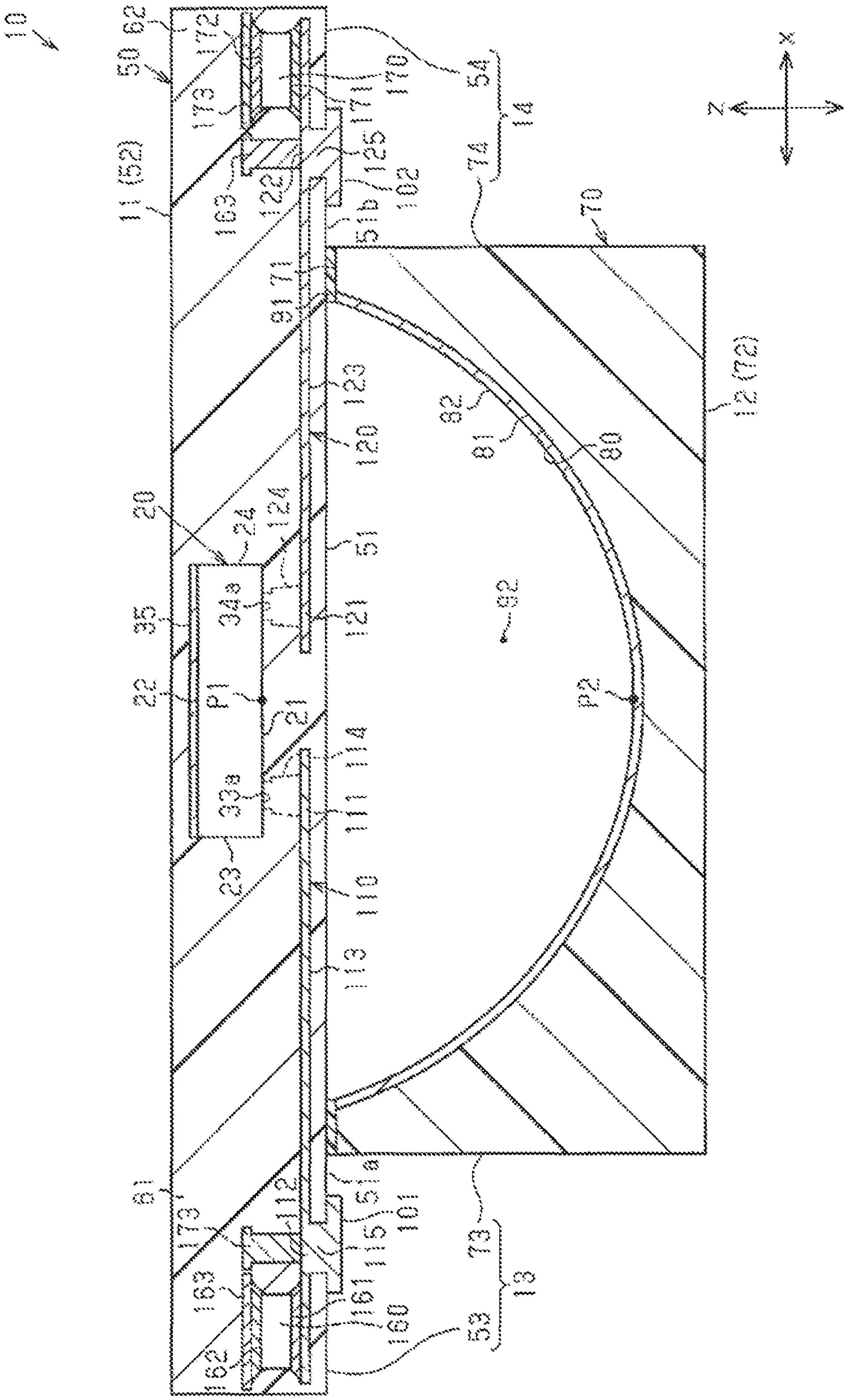
FIG. 32 is a section diagram of a variation example of a terahertz device according to the second embodiment.

As shown in FIG. 32, the protection diodes 160 and 170 may also be configured on the outer sides of the electrodes 101 and 102, in other words, configured on opposite sides of the terahertz element 20 with respect to the electrodes 101 and 102. In this case, a portion of the first protection connecting portion 163 closer to the inner side than the second protection diode 170 may be connected to the second electrically conductive portion 120, and a portion of the second protection connecting portion 173 closer to the inner side than the first protection diode 160 may be connected to the first electrically conductive portion 110. Specific shapes or positions of the two protection connecting portions 163 and 173 may be changed as desired, for example, with a portion being overlapping with the reflective film 82.

Third Embodiment

Details of the terahertz device 10 of the third embodiment are given with reference to FIG. 33 to FIG. 38 below. In the description below, constituents common with those of the terahertz device 10 of the first embodiment are represented by the same denotations, and associated details are sometimes omitted for brevity. In addition, for illustrating purposes, in FIG. 36, the column portions 201 and 202 and the electrically conductive portions 210 and 220 are depicted by omitting the shading lines. The same applies to FIGS. 39, 41 and 43.

Figure 33:
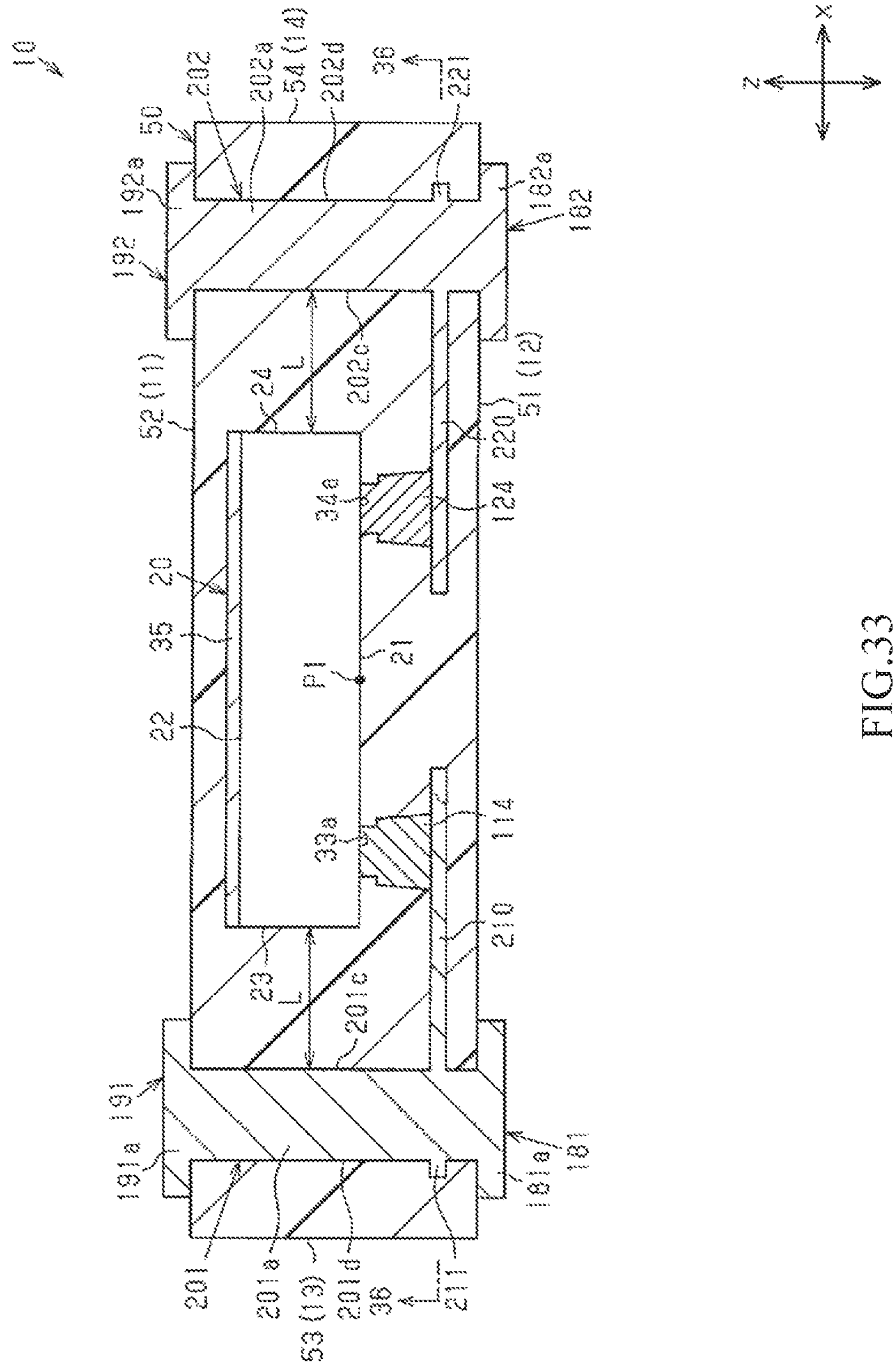
FIG. 33 is a section diagram for illustrating a sectional structure of a terahertz device according to a third embodiment.

As shown in FIG. 33, the terahertz device 10 of this embodiment does not include the antenna base 70. That is to say, the reflecting film 82 (reflecting portion) may also be omitted from the terahertz device 10.

In this embodiment, the dielectric main surface 51 constitutes the device back surface 12. Electromagnetic waves generated from the terahertz element 20 are outputted from the dielectric main surface 51. That is to say, the terahertz device 10 of this embodiment outputs electromagnetic waves from the dielectric main surface 51 (in other words, the device back surface 12). Moreover, the dielectric side surfaces 53 to 56 constitute the device side surfaces 13 to 16.

The terahertz device 10 of this embodiment includes first surface electrode 181 and 182 formed on the dielectric main surface 51, and second surface electrodes 191 and 192 formed on the dielectric back surface 52, as electrodes. The first surface electrodes 181 and 182 oppose the second surface electrodes 191 and 192 in the z direction. The first surface electrodes 181 and 182 and the second surface electrodes 191 and 192 are disposed on positions non-overlapping with the terahertz element 20, when observed in the z direction, and specifically, on outer sides of the terahertz element 20.

Figure 34:
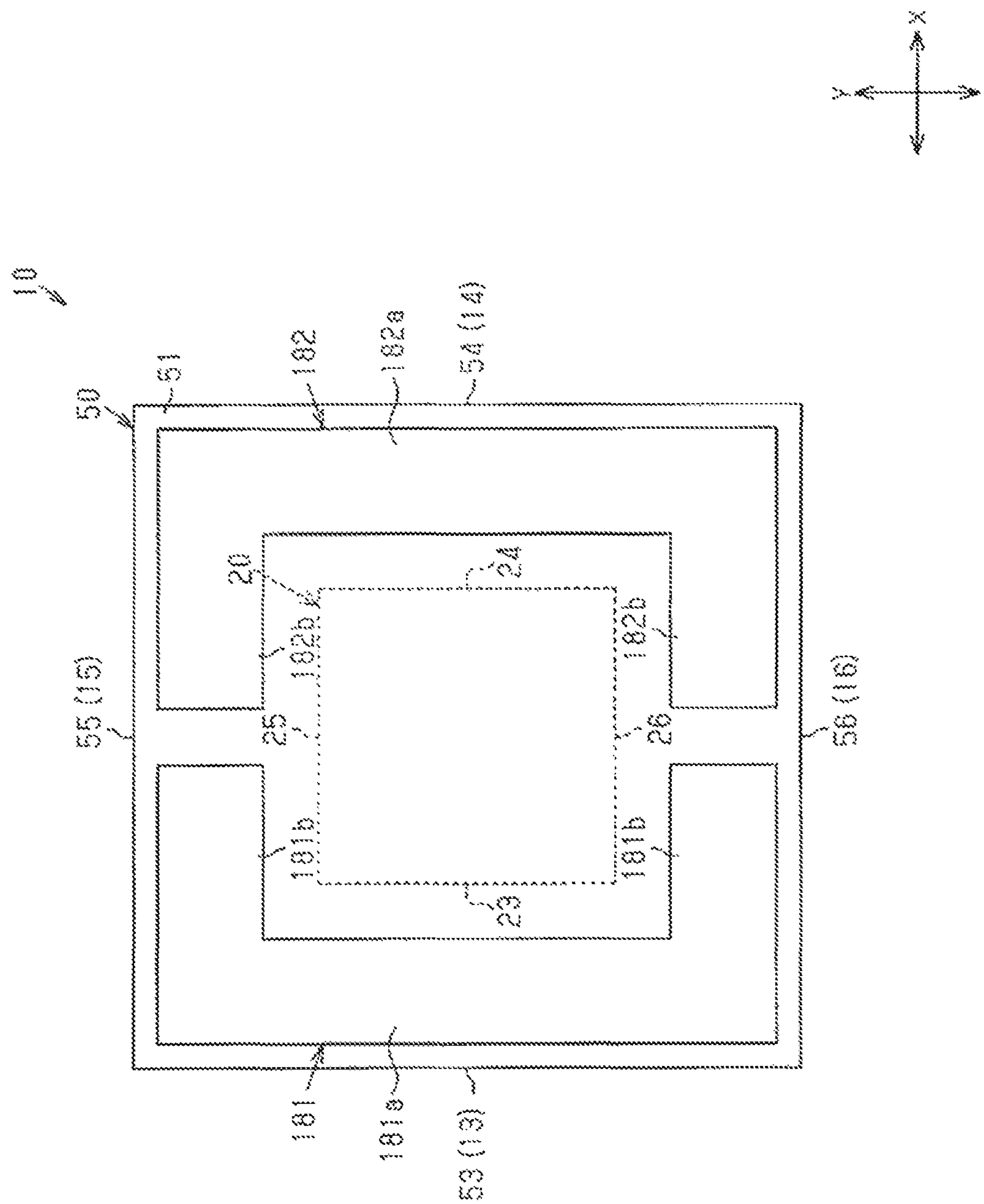
FIG. 34 is a bottom view of a terahertz element.

As shown in FIG. 34, the two first surface electrodes 181 and 182 are formed as U-shaped strips facing each other in the x direction, and are in a spaced and opposing arrangement in the x direction. The first surface electrodes 181 and 182 surround the terahertz element 20 by shape of a frame, when observed in the z direction. Specifically, the first surface electrodes 181 and 182 are formed on two end portions in the y direction in the dielectric main surface 51, and include first base electrodes 181*a* and 182*a* extending further toward the y direction than the terahertz element 20, and first protruding electrodes 181*b* and 182*b* protruding from two end portions in the y direction of the first base electrodes 181*a* and 182*a* toward the x direction. The two first protruding electrodes 181*b* and 182*b* protrude in a manner of approaching each other, and front end surfaces of the two first protruding electrodes 181*b* and 182*b* are spaced and opposite in the x direction. In this case, it may be said that each of the first surface electrodes 181 and 182 surrounds the terahertz element 20 by shape of a frame in three directions, when observed in the z direction, or it may be said that the two first surface electrodes 181 and 182 function collaboratively to surround the terahertz element 20 in shape of a frame from four directions (two sides of both the x direction and the y direction).

In this embodiment, the widths (the x-direction lengths) of the first base electrodes 181*a* and 182*a* are equal to the widths (the y-direction lengths) of the first protruding electrodes 181*b* and 182*b*. However, the present invention is not limited to the above examples; the widths of the first base electrodes 181*a* and 182*b* may also be wider than the widths of the first protruding electrodes 181*b* and 182*b*, and the widths of the first base electrodes 181*a* and 182*a* may also be narrower than the widths of the first protruding electrodes 181*b* and 182*b*.

Figure 35:
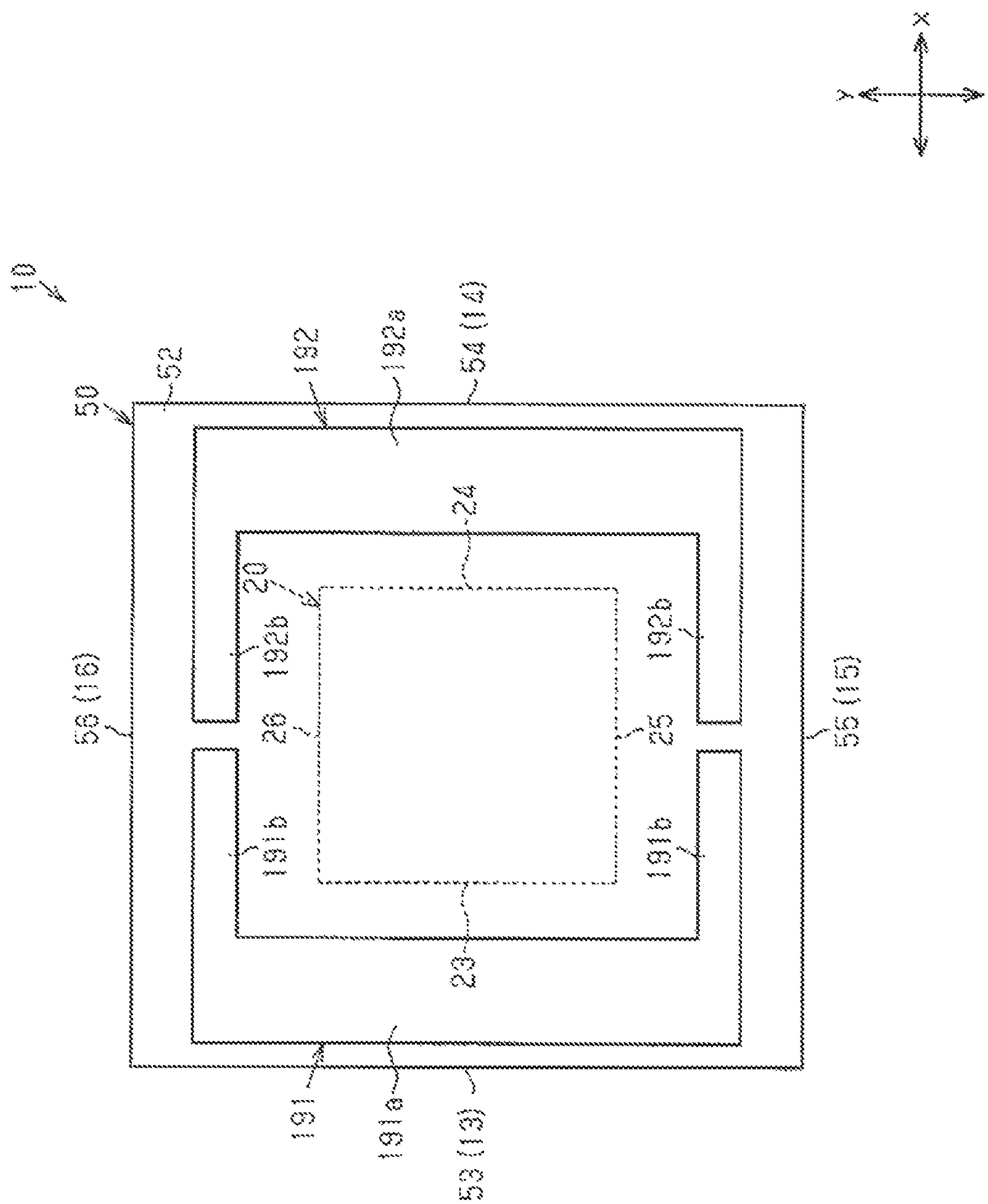
FIG. 35 is a top view of a terahertz element.

As shown in FIG. 35, the two second surface electrodes 191 and 192 are formed as U-shaped strips facing each other in the x direction, and are arranged apart and in opposite in the x direction. The second surface electrodes 191 and 192 surround the terahertz element 20 by shape of a frame, when observed in the z direction. Specifically, the second surface electrodes 191 and 192 are formed on two end portions in the y direction in the dielectric back surface 52, and include second base electrodes 191*a* and 192*a* extending further toward the y direction than the terahertz element 20, and second protruding electrodes 191*b* and 192*b* protruding from two end portions in they direction of the second electrodes 191*a* and 192*a* toward the x direction. The two second protruding electrodes 191*b* and 192*b* protrude in a manner of approaching each other, and front end surfaces of the two second protruding electrodes 191*b* and 192*b* are spaced and opposite in the x direction. In this case, it may be said that each of the second surface electrodes 191 and 192 surrounds the terahertz element 20 by shape of a frame in three directions, when observed in the z direction, or it may be said that the two second surface electrodes 191 and 192 function collaboratively to surround the terahertz element 20 in shape of a frame from four directions (two sides of both the x direction and the y direction).

In this embodiment, the widths (the x-direction lengths) of the second base electrodes 191*a* and 192*a* are different from the widths (the y-direction lengths) of the second protruding electrodes 191*b* and 192*b*. Specifically, the widths of the second protruding electrodes 191*b* and 192*b* are narrower than the widths of the second base electrodes 191*a* and 192*a*. However, the present invention is not limited to the above examples; the widths of the second base electrodes 191*a* and 182*b* may also be wider than the widths of the second protruding electrodes 191*b* and 192*b*.

In this embodiment, the widths of the first base electrodes 181*a* and 182*a* are equal to the widths of the second base electrodes 191*a* and 192*a*. On the other hand, the widths of the second protruding electrodes 191*b* and 192*b* are narrower than the widths of the first protruding electrodes 181*b* and 182*b*. However, the present invention is not limited to the above examples; the widths of the first base electrodes 181*a* and 182*a* may also be different from the widths of the second base electrodes 191$a$ and 192$a$, and the widths of the second protruding electrodes 191$b$ and 192$b$ may also be wider than or equal to the widths of the first protruding electrodes 181$b$ and 182$b$.

Figure 36:
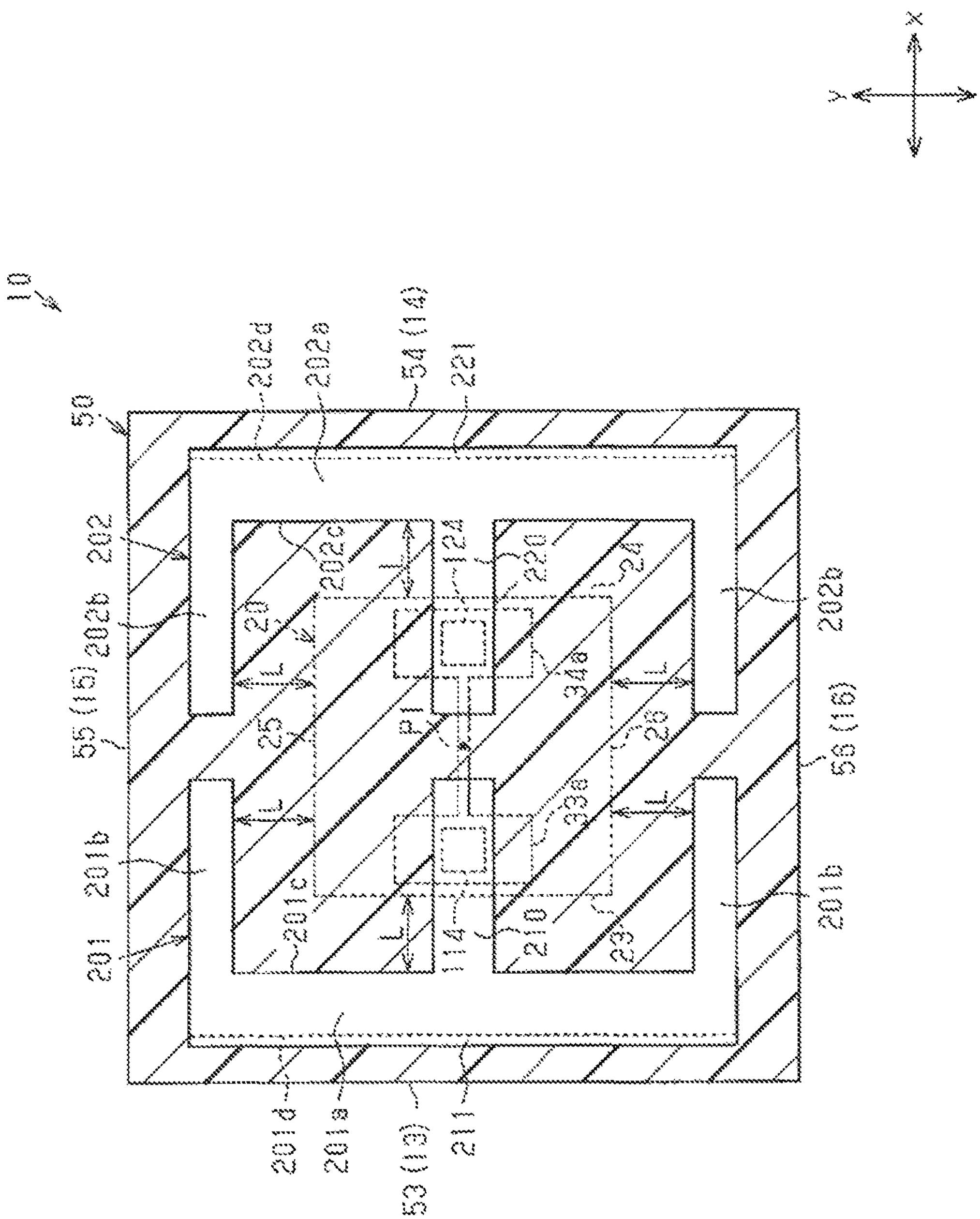
FIG. 36 is a section diagram of FIG. 33 along the line 36-36.

As shown in FIG. 33 and FIG. 36, the terahertz device 10 includes the column portions 201 and 202 that are conductive and provided in the dielectric 50. The column portions 201 and 202 pass through the dielectric 50 in the z direction and electrically connect the first surface electrodes 181 and 182 with the second surface electrodes 191 and 192.

The column portions 201 and 202 are constituted as, for example, including a substrate layer and a coating layer laminated on each other. The substrate layer includes a Ti layer and a Cu layer laminated on each other, and has a thickness of approximately 200 to 800 nm. The main component of the coating layer is Cu, and is set to be thicker than the substrate layer. The column portions 201 and 202 are formed by, for example, electroplating. However, the constituting materials and forming methods of the column portions 201 and 202 are not limited to the above examples.

The column portions 201 and 202 are similarly disposed on the outer sides of the terahertz element 20 as the first surface electrodes 181 and 182 and the second surface electrodes 191 and 192, and are shaped as a frame that surrounds the terahertz element 20. Specifically, the column portions 201 and 202 are formed as U-shapes facing each other in the x direction, when observed in the z direction, and include base column portions 201$a$ and 202$a$ extending further toward the y direction than the terahertz element 20, and protruding column portions 201$b$ and 202$b$ disposed on two end portions in the y direction of the base column portions 201$a$ and 202$a$.

The base column portions 201$a$ and 202$a$ are disposed between the first base electrodes 181$a$ and 182$a$ and the second base electrodes 191$a$ and 192$a$. The two base column portions 201$a$ and 202$a$ are configured apart and opposite in the x direction.

The protruding columns 201$b$ and 202$b$ are disposed on two end portions in the y direction of the base column portions 201$a$ and 202$a$. The protruding columns 201$b$ and 202$b$ protrude in the x direction from the base column portions 201$a$ and 202$a$ in a manner of approaching each other. The protruding column portions 201$b$ and 202$b$ are disposed between the first protruding electrodes 181$b$ and 182$b$ and the second protruding electrodes 191$b$ and 192$b$. The protruding column portions 201$b$ and 202$b$ are columns having the protruding direction, that is, the x direction, as the long side direction, the y direction as the width direction, and the z direction as the height direction.

In this case, it may be said that each of the column portions 201 and 202 surrounds the terahertz element 20 by shape of a frame in three directions, when observed in the z direction, or it may be said that the column portions 201 and 202 function collaboratively to surround the terahertz element 20 in shape of one frame from four directions (two sides of both the x direction and they direction). However, the two column portions 201 and 201 are arranged apart in a manner of being not electrically conducted to each other.

As shown in FIG. 36, the column portions 201 and 202 include inner surfaces 201$c$ and 202$c$ and outer surfaces 201$d$ and 202$d$. The inner surfaces 201$c$ and 202$c$ are configured to be closer to the vicinity of the terahertz element 20 than the outer surfaces 201$d$ and 202$d$. The first inner surface 201$c$ opposes the first element side surface 23, the third element side surface 25 and the fourth element side surface 26, and the second inner surface 202$c$ opposes the second element side surface 24, the third element side surface 25 and the fourth element side surface 26.

In this embodiment, opposing distances L from the inner surfaces 201$c$ and 202$c$ to the respective corresponding element side surfaces 23 to 26 are set to satisfy the resonant condition, and specifically, may be $(\lambda'_R/4)+(\lambda'_R/2)\times N)$ (where N is an integer equal to or more than 0: N=0, 1, 2 . . . ). Accordingly, resonant reflection of electromagnetic waves is achieved by the inner surfaces 201$c$ and 202$c$. That is to say, the column portions 201 and 202 function as resonators.

Moreover, when the distance in the x direction between the two base column portions 201$a$ and 202$a$ is equal to or lower than 3λ'R, the distance may be $(\lambda'_R/4)+((\lambda'_R/2)\times N)$ (where N is an integer equal to or more than 0: N=0, 1, 2 . . . ). Further, the distance between the two column portions 201$a$ and 202$a$ can be any as desired, and particularly when the distance between the two column portions 201$a$ and 202$a$ is quite large (for example, greater than $3\lambda'_R$), the distance can be set as desired.

Moreover, the opposing distances L may be different from one another, given that the foregoing condition is satisfied. For example, the opposing distance L between the first element side surface 23 and the first inner surface 201$c$ and the opposing distance L between the third element side surface 25 and the first inner surface 201$c$ may be the same or may be different. Similarly, the opposing distance L between the first element side surface 23 and the first inner surface 201$c$ and the opposing distance L between the second element side surface 24 and the second inner surface 202$c$ may be the same or may be different. Similarly, the opposing distance L between the third element side surface 25 and the first inner surface 201$c$ and the opposing distance L between the third element side surface 25 and the second inner surface 202$c$ may be the same or may be different.

As shown in FIG. 36, the electrically conductive portions 210 and 220 of this embodiment extend in the x direction from the base column portions 201$a$ and 202$a$ to positions overlapping with the pads 33$a$ and 34$a$. Specifically, the two electrically conductive portions 210 and 220 extend in the x direction from the central portions in the y direction of the base column portions 201$a$ and 202$a$ in a manner of approaching each other. The first pad 33$a$ opposes the first electrically conductive portion 20, and the second pad 34$a$ opposes the second electrically conductive portion 220. In addition, the first pad 33$a$ and the first electrically conductive portion 210 are electrically connected by the first bump 114, and the second pad 34$a$ and the second electrically conductive portion 220 are electrically connected by the second bump 124.

In the terahertz device 10 of this embodiment, the terahertz element 20 is electrically connected to the first surface electrodes 181 and 182 by the electrically conductive portions 210 and 220 and the column portions 201 and 202, the terahertz element 20 is electrically connected to the first surface electrode 181 and 182, and the terahertz element 20 is electrically connected to the second surface electrode 191 and 192.

Moreover, as shown in FIG. 33, the electrically conductive portions 210 and 220 of this embodiment include extruding conductive portions 211 and 221 extruding in the x direction with respect to the column portions 201 and 202. Thus, as shown in FIG. 36, on a plane provided with the electrically conductive portions 210 and 220, electrically conductive regions having widths in the x direction wider than the base column portions 201$a$ and 202$a$ are formed from the extruding conductive portions 211 and 221.

Next, with reference to FIG. 37 and FIG. 38, as effects of the embodiment, a mounting form of the terahertz device 10 is described below.

The terahertz device 10 of this embodiment is mounted using any of the first surface electrodes 181 and 182 and the second surface electrodes 191 and 192.

Figure 37:
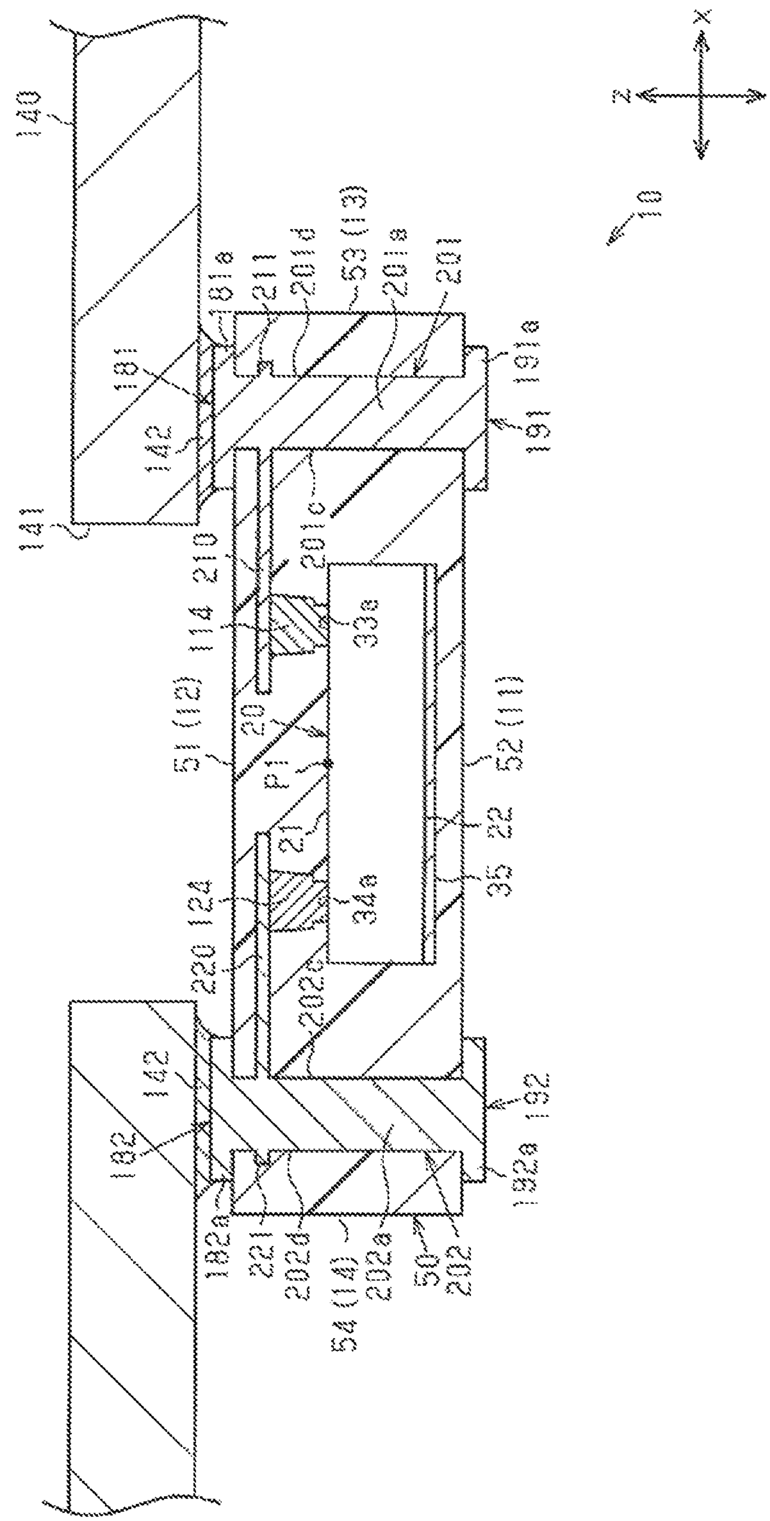
FIG. 37 is a section diagram of an example of a mounting form of a terahertz device according to the third embodiment.

For example, as shown in FIG. 37, the terahertz device 10 may also be mounted on the circuit substrate 140 using the first surface electrodes 181 and 182. In this case, for example, an electrically conductive bonding material 142 may be provided between the first surface electrodes 181 and 182 and the circuit substrate 140. In this case, electromagnetic waves are outputted upward. In this configuration, as shown in FIG. 37, the hole 141 for transmission of electromagnetic waves can be formed on the circuit substrate 140. The hole 141 is, for example, larger than the terahertz element 20, when observed in the z direction.

Figure 38:
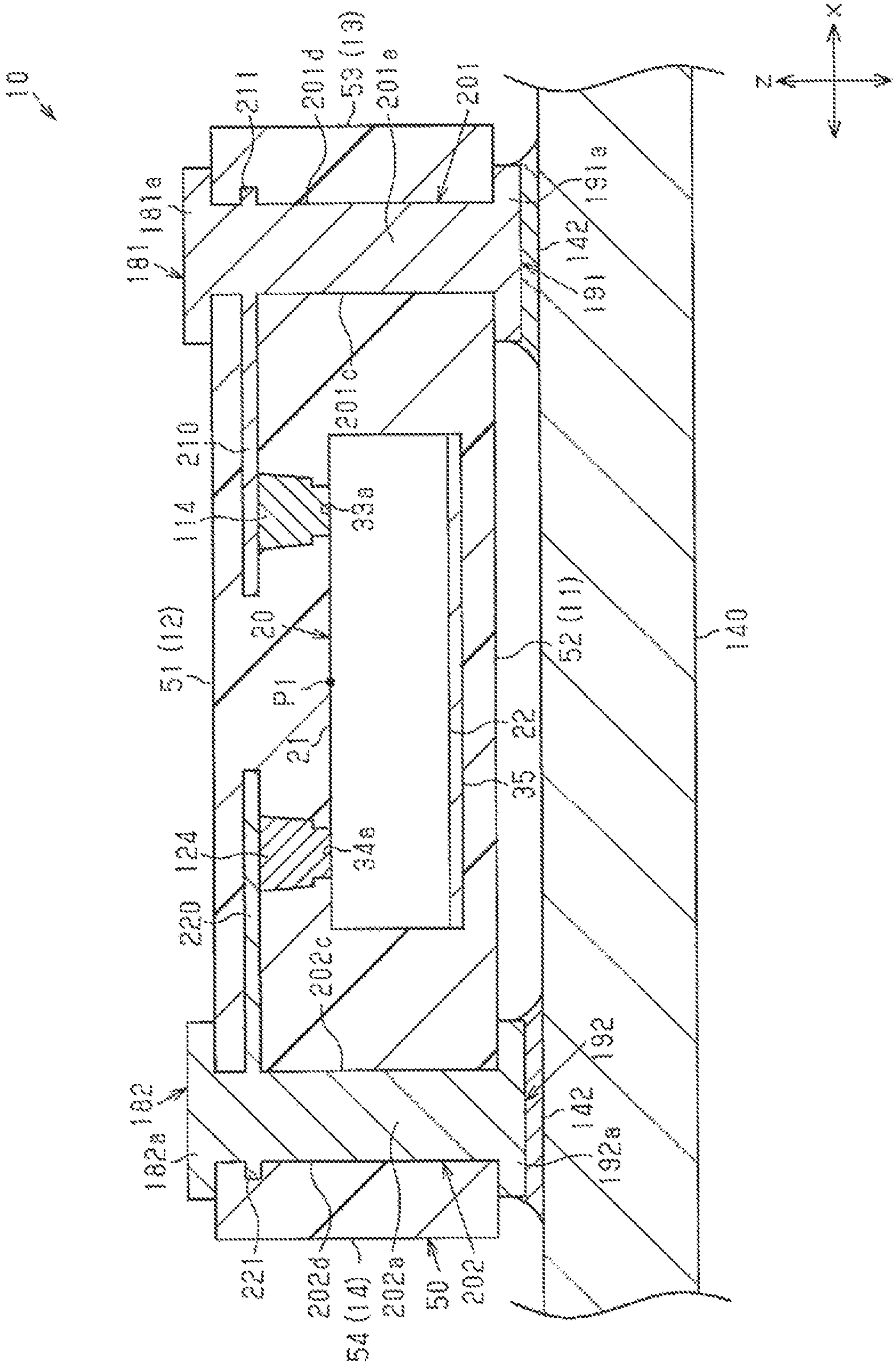
FIG. 38 is a section diagram of an example of a mounting form of a terahertz device according to the third embodiment.

Moreover, as shown in FIG. 38, the terahertz device 10 may also be mounted on the circuit substrate 140 using the second surface electrodes 191 and 192. In this case, for example, the electrically conductive bonding material 142 may be provided between the second surface electrodes 191 and 192 and the circuit substrate 140 to bond the terahertz device 10 and the circuit substrate 140. In this case, it is not necessary to provide the hole 141 on the circuit substrate 140.

The following effects are provided according to the embodiment described in detail above.

(3-1) The terahertz device 10 of the present invention includes the terahertz element 20 generating electromagnetic waves, and the dielectric 50 surrounding the terahertz element 20 and including the dielectric main surface 51 and the dielectric back surface 52. The terahertz device 10 includes first surface electrodes 181 and 182 formed on the dielectric main surface 51 and electrically connected to the terahertz element 20, and second surface electrodes 191 and 192 formed on the dielectric back surface 52 and electrically connected to the terahertz element 20. According to the configuration, the terahertz device 10 may be mounted using any one of the second surface electrodes 191 and 192 and the first surface electrodes 181 and 182, so as to improve the degree of freedom for mounting.

(3-2) Particularly, when the terahertz element 20 includes the element reflecting layer 35 and having a specified direction as an output direction of electromagnetic waves, there is a situation as below, that is, the terahertz device 10 needs to be mounted in a direction corresponding to the output direction of electromagnetic waves, causing limitations in the mounting of the terahertz device 10.

Regarding the above, according to this embodiment, since the first surface electrodes 181 and 182 and the second surface electrodes 191 and 192 are provided, the terahertz device 10 can be mounted in any direction on the circuit substrate 140. Accordingly, the terahertz device 10 can be mounted on the circuit board 140 with considerations of the output direction of electromagnetic waves.

(3-3) The terahertz device 10 includes the conductive column portions 201 and 201 passing through the dielectric 50 and hence electrically connecting the first surface electrodes 181 and 182 to the second surface electrodes 191 and 192. The column portions 201 and 202 collaboratively surround the terahertz element 20. According to the configuration, electromagnetic waves traveling in the x direction or the y direction are reflected by the column portions 201 and 202. Accordingly, resonant oscillation of electromagnetic waves can be generated in the dielectric 50, hence improving the output of electromagnetic waves.

Variation Example of the Third Embodiment

A variation example of the terahertz device 10 according to the third embodiment is described below. However, given that the variation example below does not result in any contradiction, the variation example may be applied to other implementation forms, and variation examples may be used in combination.

Figure 39:
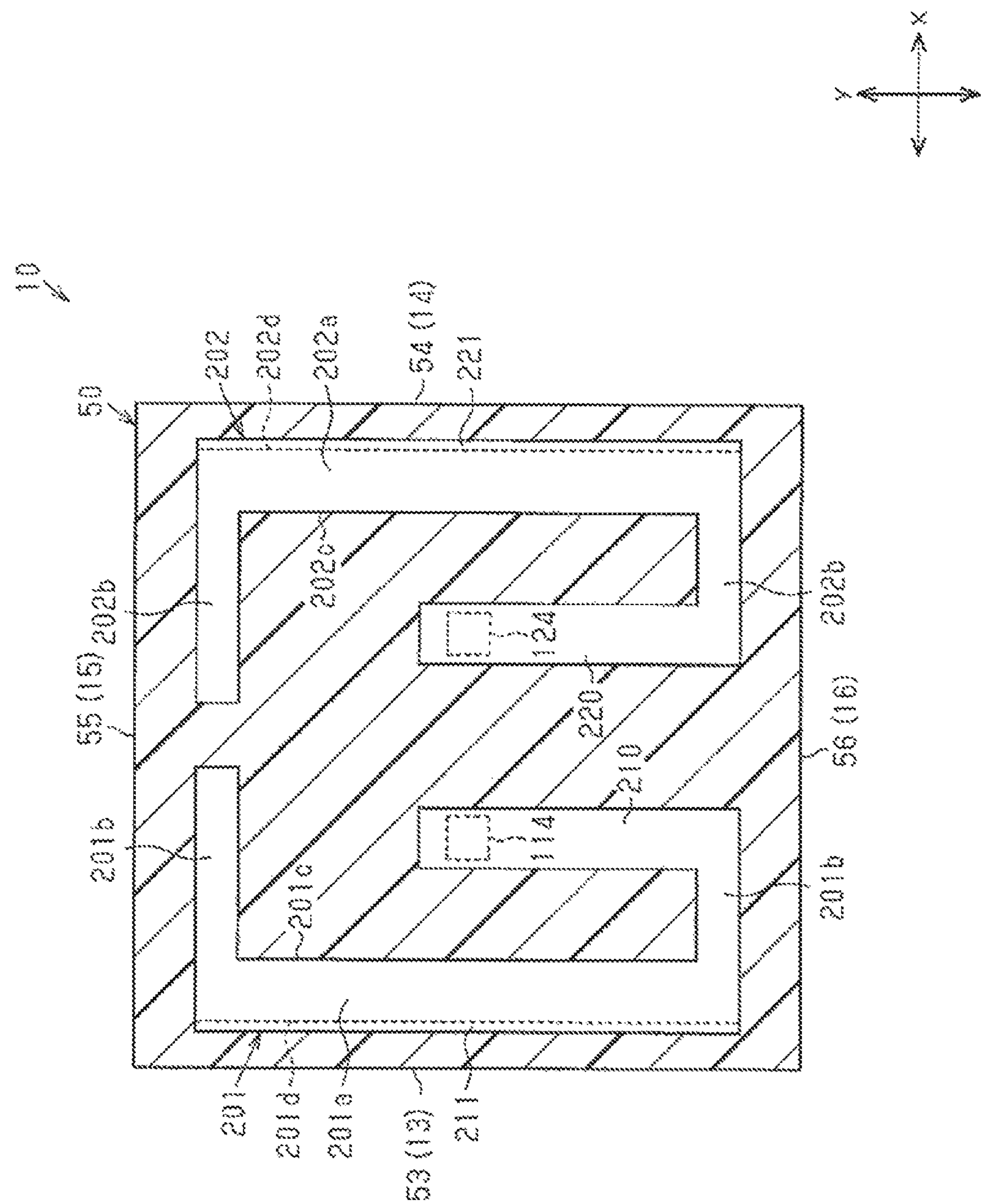
FIG. 39 is a section diagram of a variation example of a terahertz device according to the third embodiment.

As shown in FIG. 39, the electrically conductive portions 201 and 202 may also be extended in the y direction and be connected to the protruding columns 201*b* and 202*b*. In this case, a hook may be formed collaboratively by the first electrically conductive portion 210 and the first column portion 201, and a hook may also be formed collaboratively by the second electrically conductive portion 220 and the second column portion 202.

Figure 40:
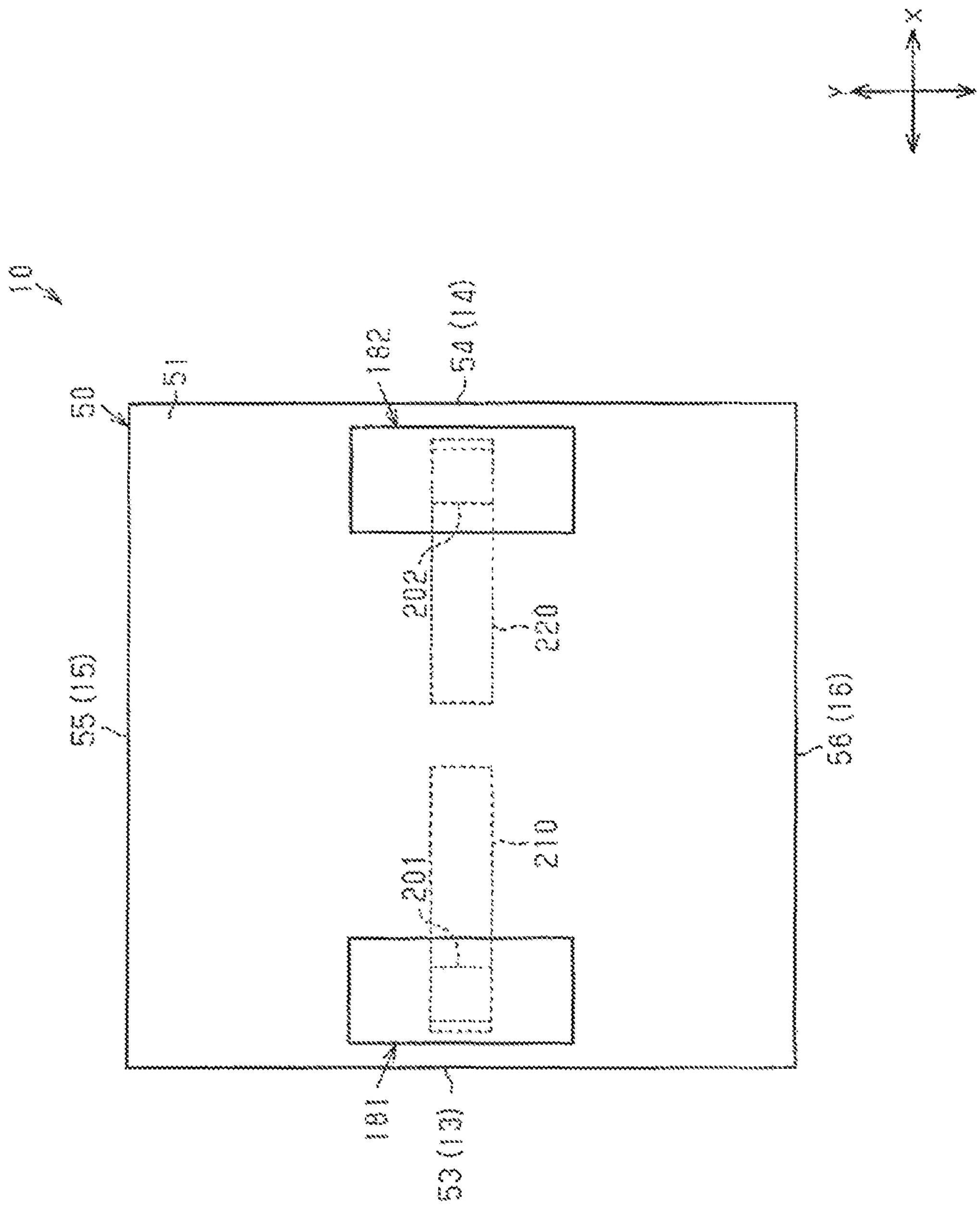
FIG. 40 is a bottom view of a variation example of a terahertz device according to the third embodiment.
Figure 41:
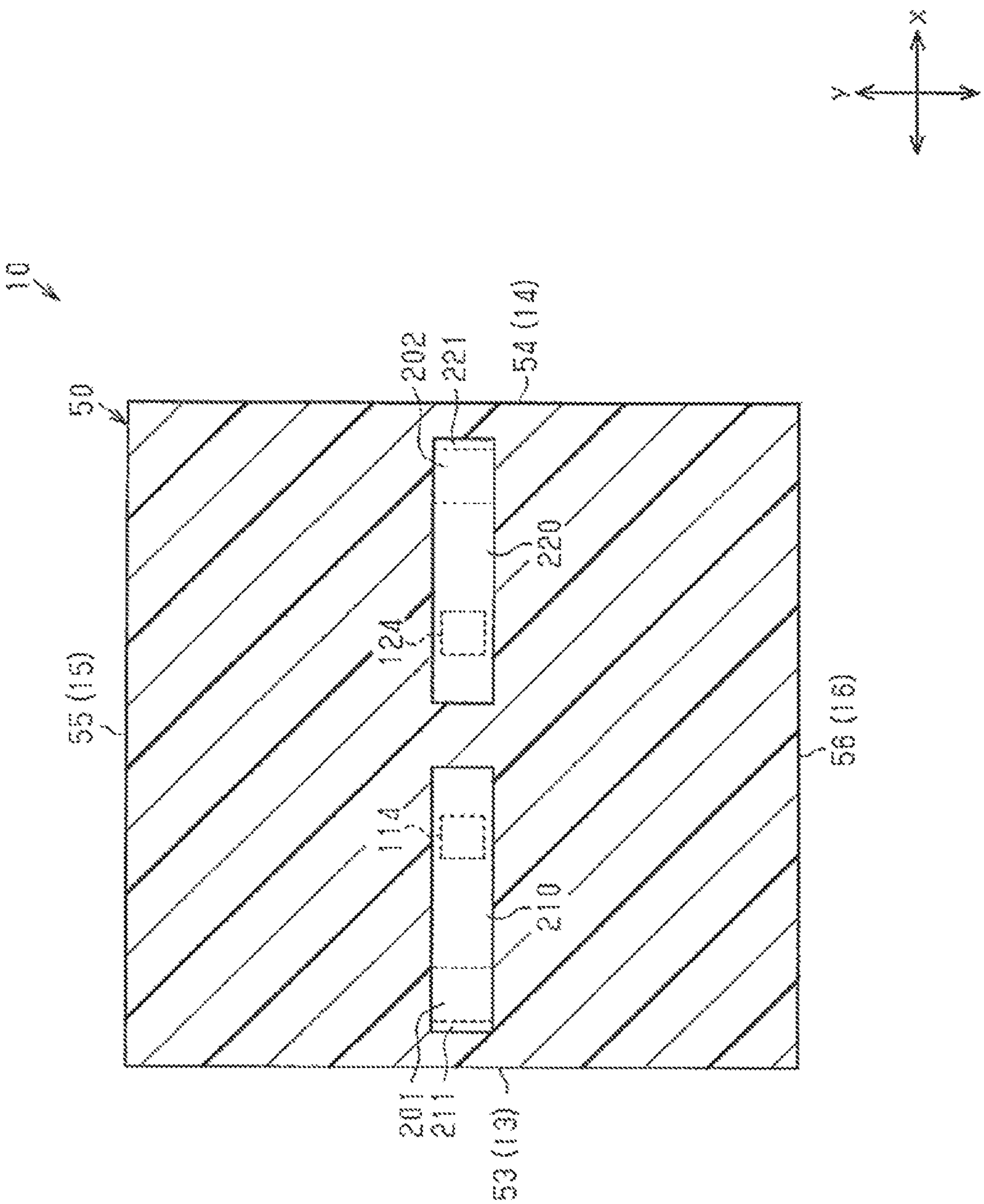
FIG. 41 is a section diagram of a variation example of a terahertz device according to the third embodiment.

As shown in FIG. 40 and FIG. 41, the first surface electrodes 181 and 182 may be shaped as non-frames. For example, the first surface electrodes 181 and 182 may be shaped as rectangles with the y direction as a long side direction and the x direction as the short side direction. The first surface electrodes 181 and 182 are disposed, for example, near two end portions in they direction of the dielectric main surface 51. The same applies to the second surface electrodes 191 and 192.

In this case, as shown in FIG. 41, the column portions 201 and 202 may also be shaped as non-frames. For example, the column portions 201 and 202 may also be shaped as angular columns with the z direction as the height direction. That is to say, the column portions 201 and 202 are not limited to being a configuration of surrounding the terahertz element 20. Further, the shapes of the column portions 201 and 202 are not limited to shapes of angular columns, and may be any shape as desired, for example, shaped as cylinders.

Figure 42:
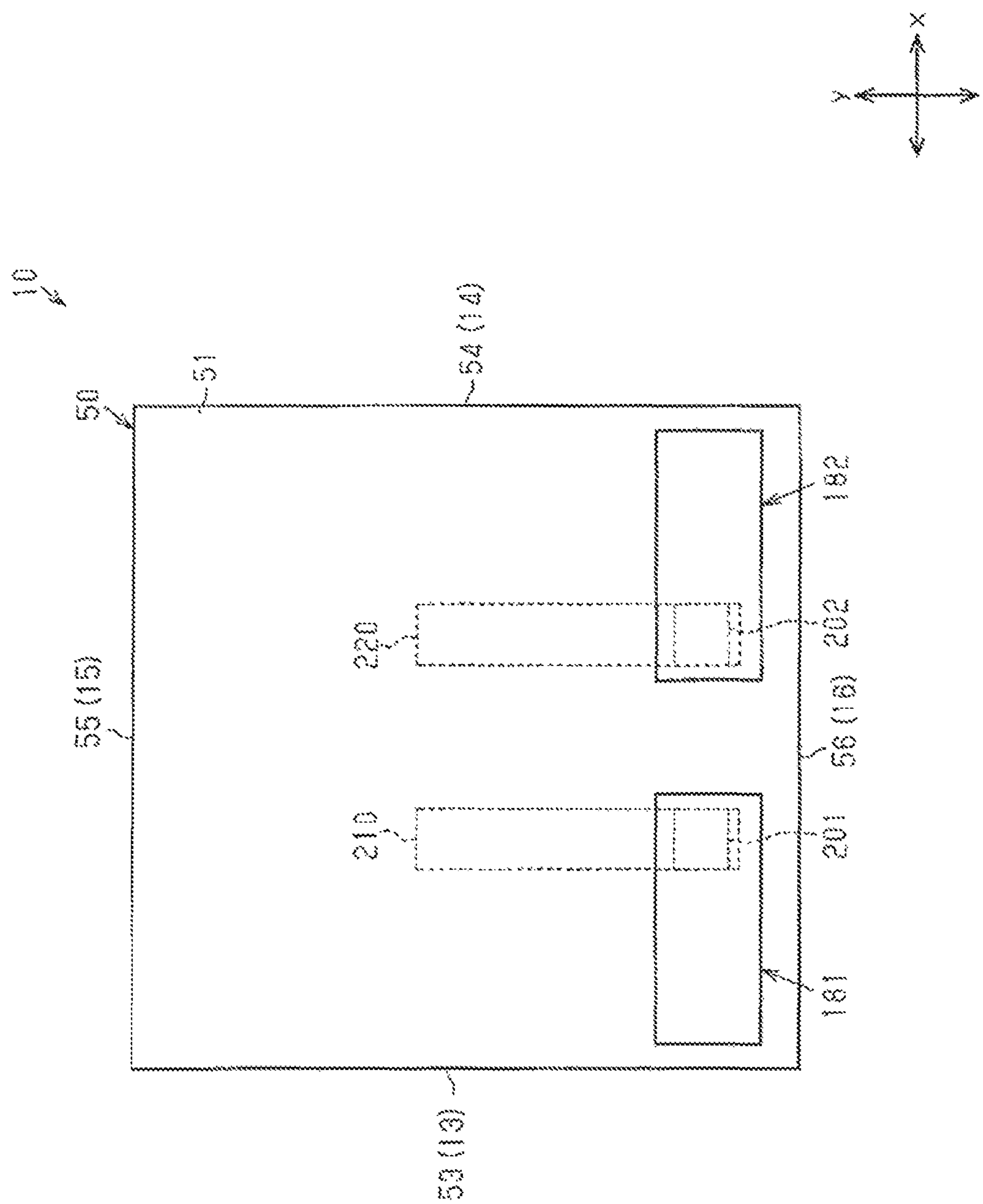
FIG. 42 is a bottom view of a variation example of a terahertz device according to the third embodiment.
Figure 43:
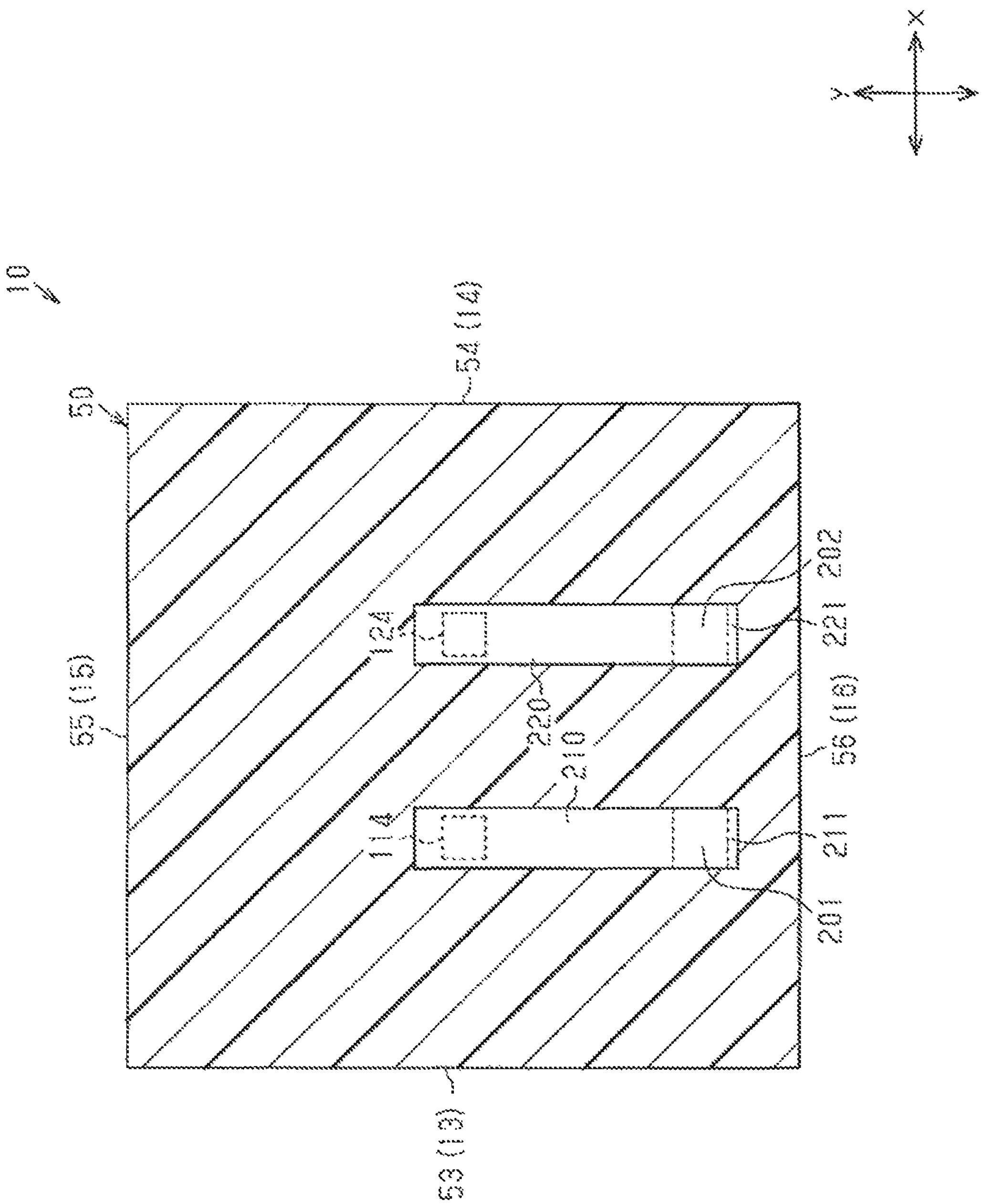
FIG. 43 is a section diagram of a variation example of a terahertz device according to the third embodiment.

As shown in FIG. 42 and FIG. 43, the first surface electrodes 181 and 182 may be together configured on one end portion in the dielectric main surface 51. For example, the first surface electrodes 181 and 182 may also be arranged in the x direction on one end portion of the two end portions in they direction in the dielectric main surface 51. The same applies to the second surface electrodes 191 and 192.

In this case, the column portions 201 and 202 may pass through portions in the dielectric 50 between the first surface electrodes 181 and 182 and the second surface electrodes 191 and 192 in the z direction, so as to electrically connect the first surface electrodes 181 and 182 with the second surface electrodes 191 and 192. Moreover, as shown in FIG. 43, the electrically conductive portions 201 and 202 may extend in the y direction.

Figure 44:
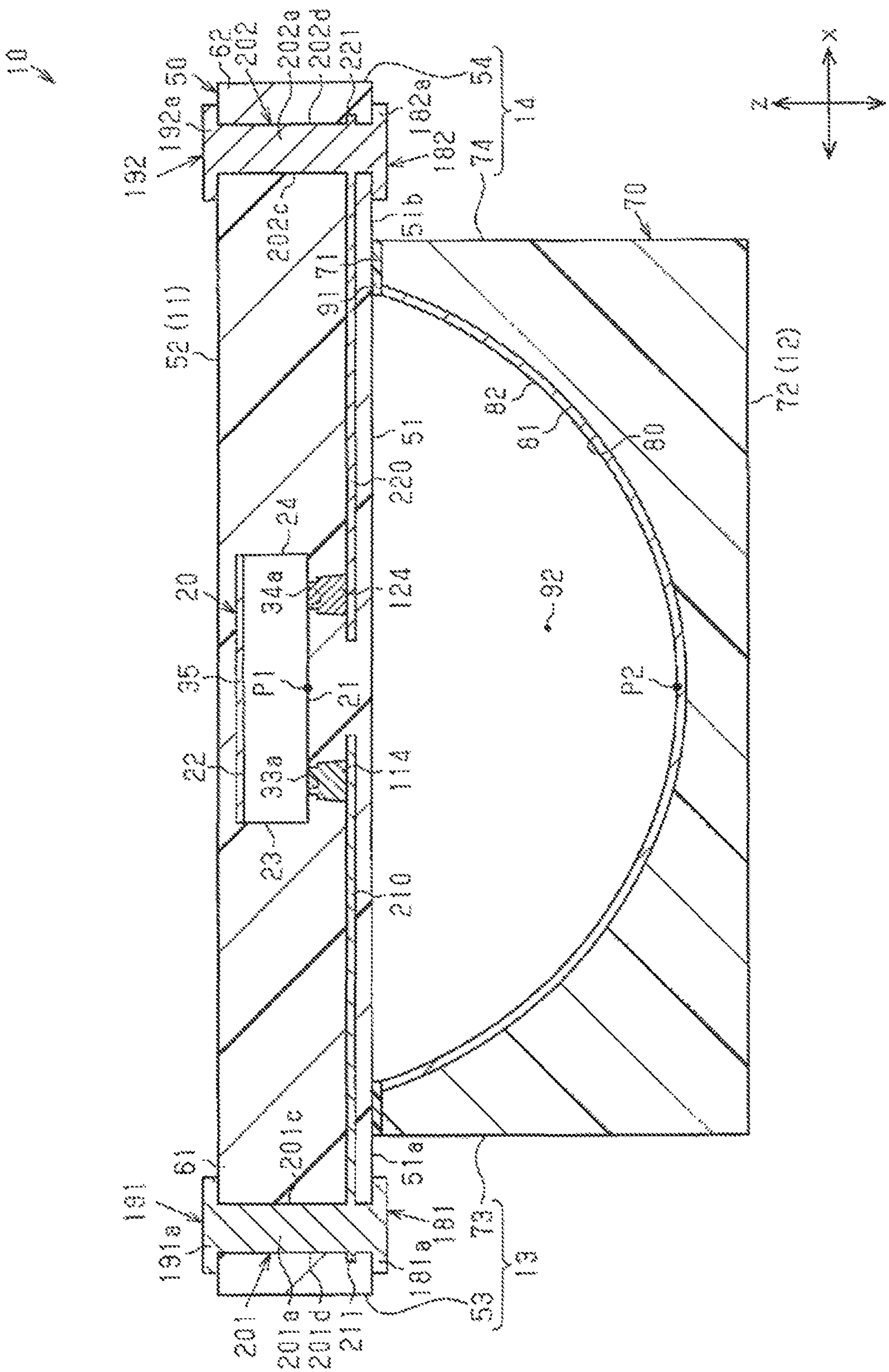
FIG. 44 is a section diagram of a variation example of a terahertz device according to the third embodiment.

As shown in FIG. 44, the terahertz device 10 may also include the antenna base 70 having the reflecting film 82. In this case, electromagnetic waves generated from the terahertz element 20 are reflected by the reflecting film 82, and are outputted from the device main surface 11 (the dielectric back surface 52). That is to say, the terahertz device 10 outputs electromagnetic waves from the device main surface 11.

In this variation example, the first surface electrodes 181 and 182 and the second surface electrodes 191 and 192 may be formed on portions non-overlapping with the reflecting film 82. For example, the first surface electrodes 181 and 182 may be formed on portions on the sides in the dielectric main surface 51 with respect to the antenna base 70, and the second surface electrodes 191 and 192 may be formed on portions on the sides in the dielectric back surface 52 with respect to the antenna base 70.

Moreover, the column portions 201 and 202 may be formed on portions non-overlapping with the reflecting film 82. As shown in FIG. 44, the column portions 201 and 202 are disposed in the protruding portions 61 and 62.

Figure 45:
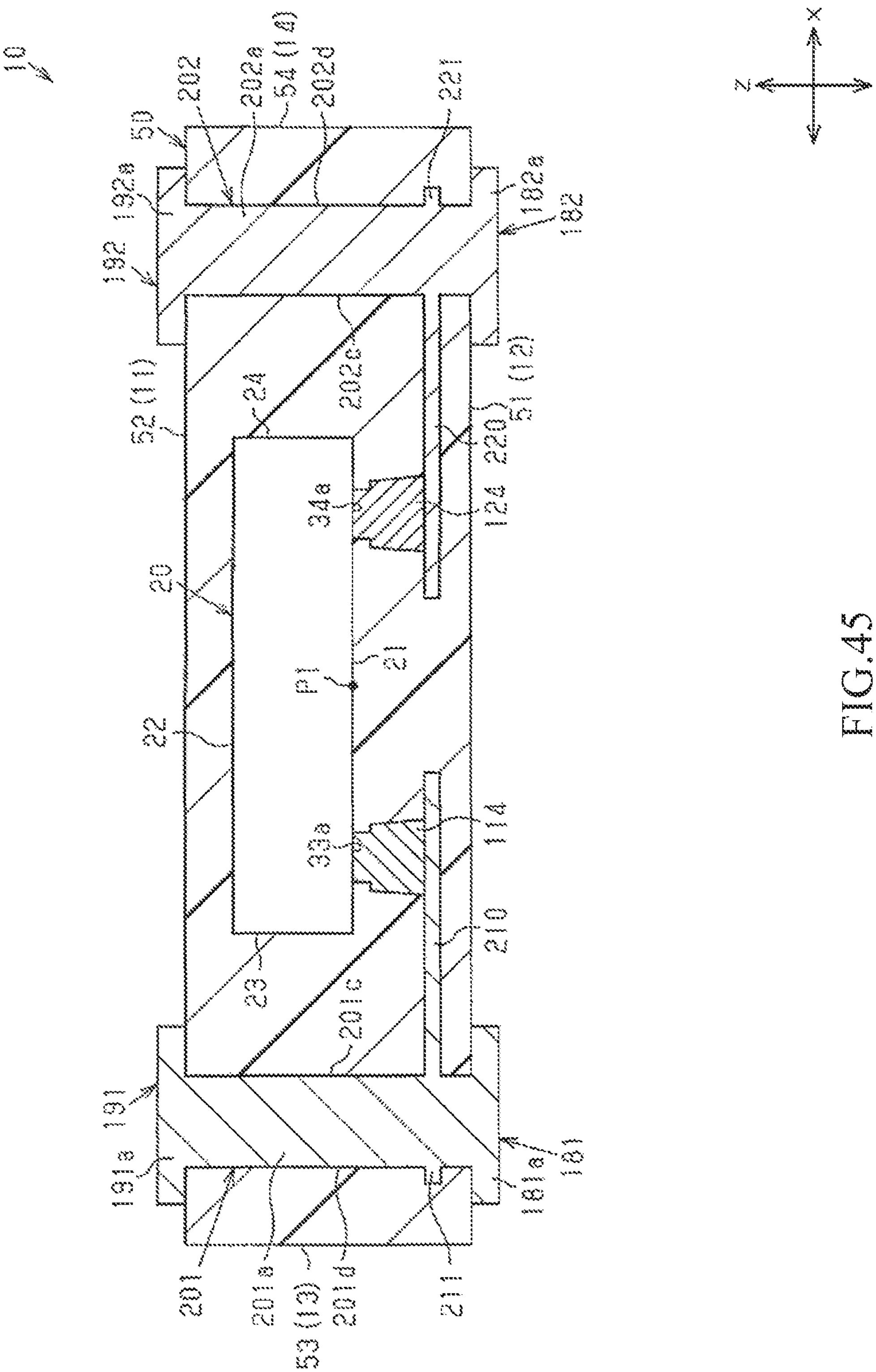
FIG. 45 is a section diagram of a variation example of a terahertz device according to the third embodiment.

As shown in FIG. 45, the element reflecting layer 35 may be omitted. Accordingly, electromagnetic waves are outputted in two directions to the top and the bottom. In this case, regarding the circuit substrate 140 having the hole 141 for transmission of electromagnetic waves, the terahertz device 10 may be mounted from the top of the circuit substrate 140 using the first surface electrodes 181 and 182, or may be mounted from the bottom using the second surface electrodes 191 and 192. Accordingly, electromagnetic waves are outputted in two directions to the top and the bottom.

Considering that the element reflecting layer 35 is not provided, the element thickness D1 may be set as $(\lambda'_{InP}/2)+(\lambda'_{InP}/2)\times N$ (where N is a positive integer equal to or more than 0: N=0, 1, 2 . . . ). By setting the element thickness D1 as described above, standing waves may be excited in the terahertz element 20. However, the element thickness D1 is not limited the example above, but may be any thickness as desired.

Figure 46:
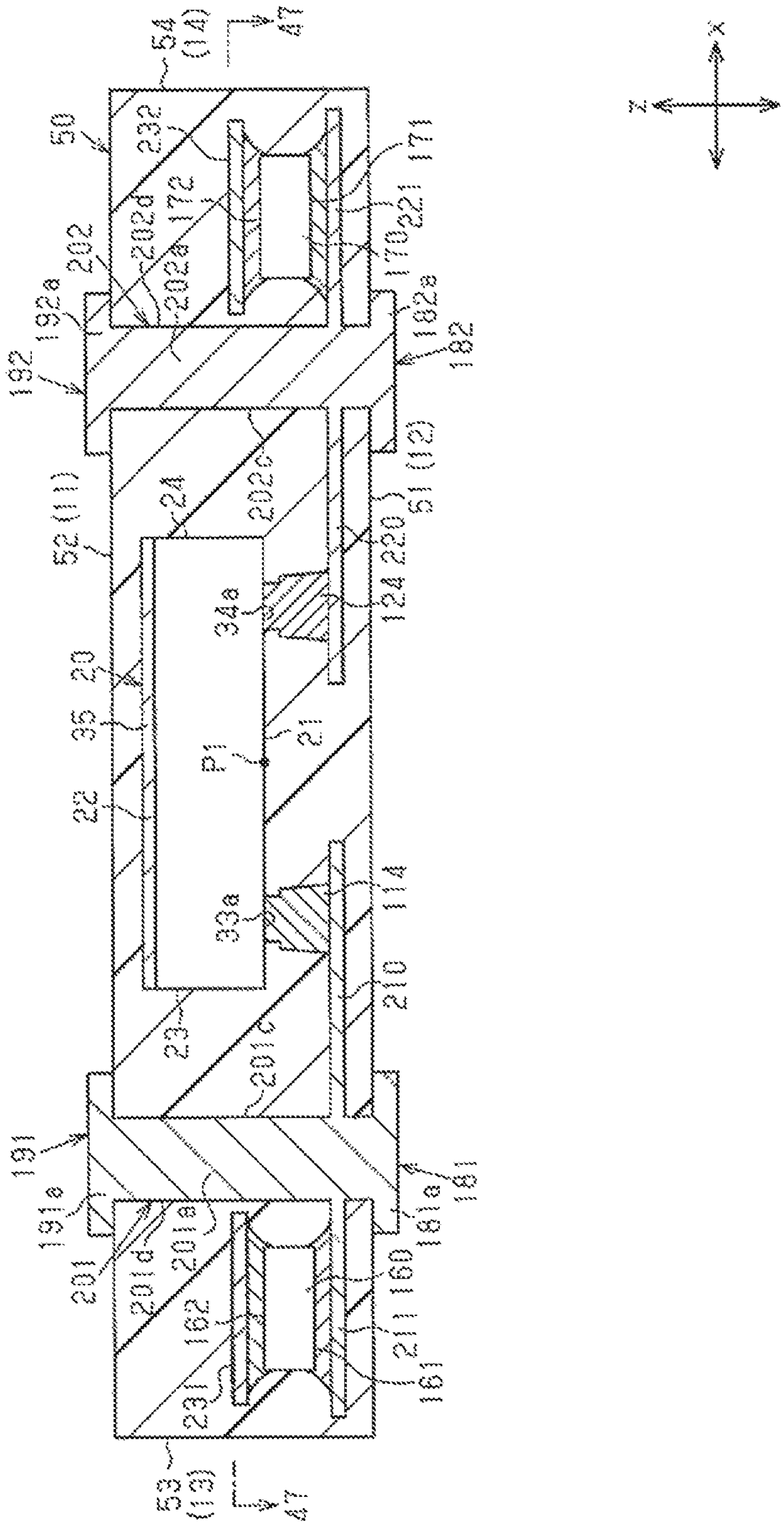
FIG. 46 is a section diagram of a variation example of a terahertz device according to the third embodiment.

As shown in FIG. 46, the terahertz device 10 may also include the protection diodes 160 and 170 as an example of specific elements. For example, the protection diodes 160 and 170 are mounted on the protruding portions 61 and 62. In this case, by mounting the first protection diode 160, the first extruding conductive portion 211 may extend further to the outer side than the first surface electrode 181 and the second surface electrode 191. Similarly, by mounting the second protection diode 170, the second extruding conductive portion 221 may extend further to the outer side than the first surface electrode 182 and the second surface electrode 192.

Figure 47:
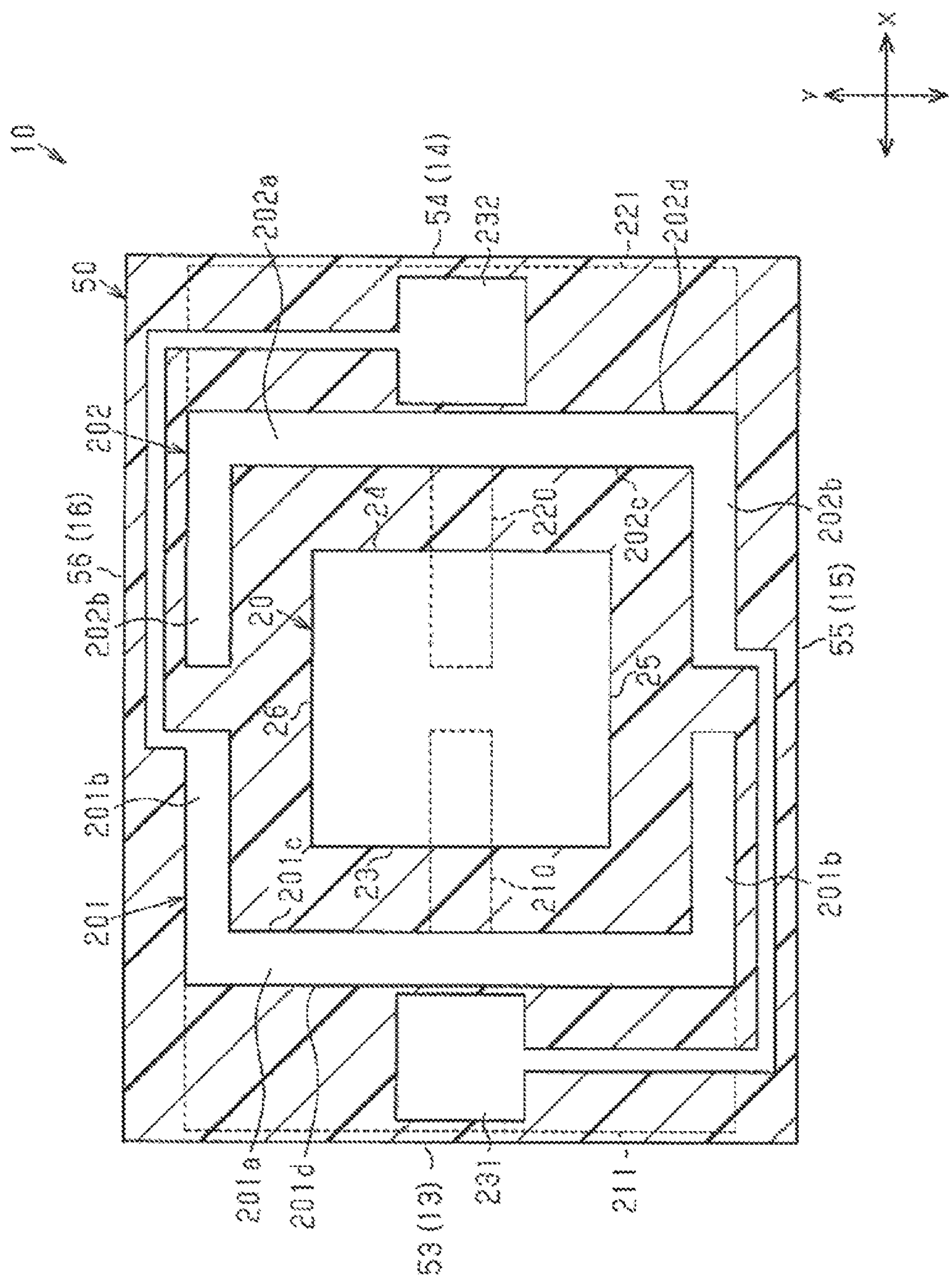
FIG. 47 is a section diagram of FIG. 46 along the line 47-47.

Further, as shown in FIG. 46 and FIG. 47, the terahertz device 10 may include the first protection connecting portion 231 electrically connecting the first protection diode 160 and the second column portion 202, and the second protection connecting portion 232 electrically connecting the second protection diode 170 and the first column portion 201. The first protection connecting portion 231 detours in a manner of non-contacting with the first column portion 201, and connects the first protection diode 160 and the second column portion 202. The second protection connecting portion 232 detours in a manner of non-contacting with the second column portion 202, and connects the second protection diode 170 and the first column portion 201. Moreover, specific shapes or positions of the two protection connecting portions 231 and 232 may be changed as desired.

Figure 48:
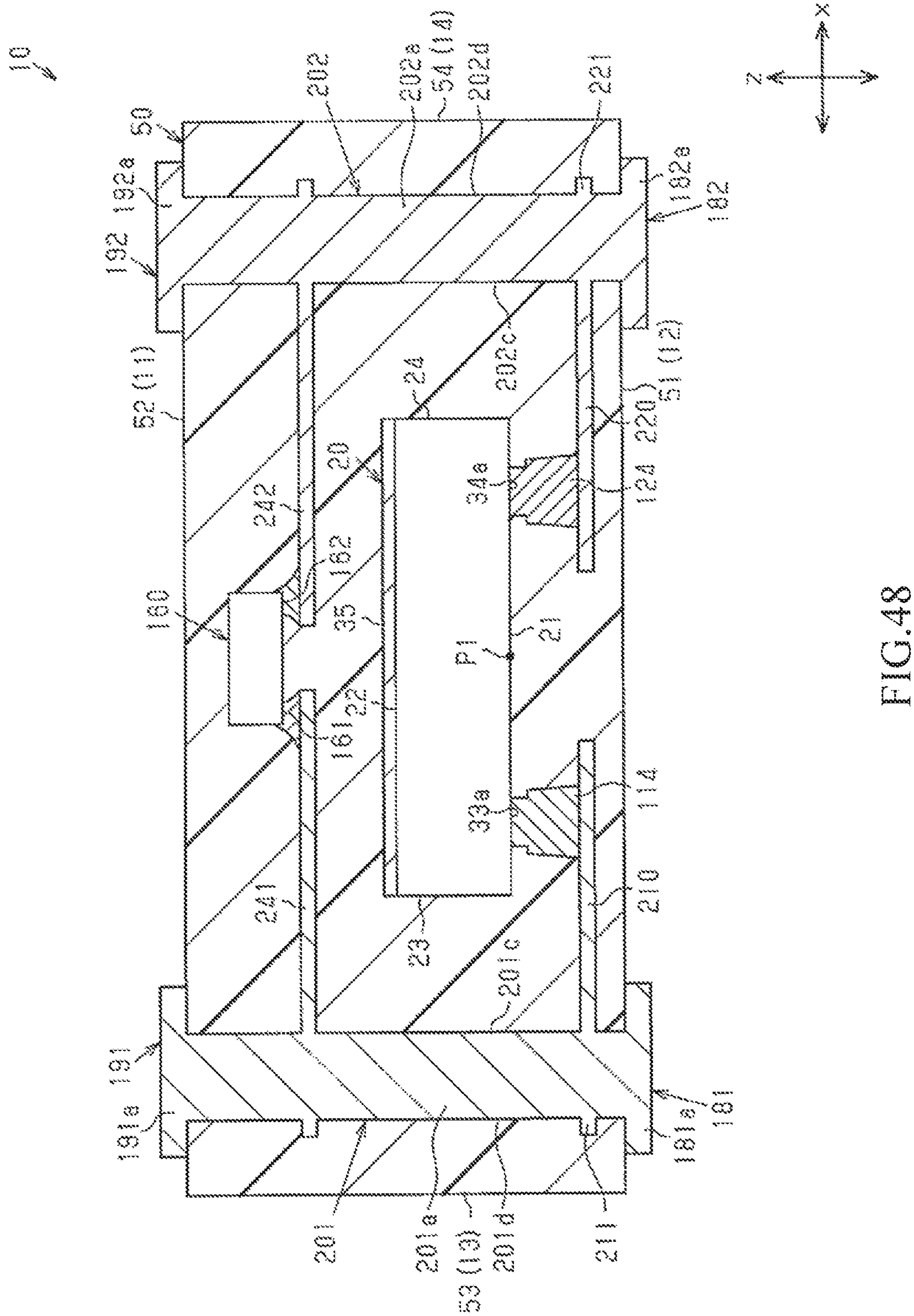
FIG. 48 is a section diagram of a variation example of a terahertz device according to the third embodiment.

As shown in FIG. 48, the terahertz element 20 and the protection diodes 160 and 170 may also be a configuration of laminated layers. Further, in FIG. 48, to better provide a drawing, only the first protection diode 160 is depicted, and the protection diodes 160 and 170 in fact are arranged in they direction.

The protection diodes 160 and 170 are disposed on the side of the element back surface 22 opposite to the element main surface 21 with respect to the terahertz element 20. Specifically, the protection diodes 160 and 170 are disposed on positions opposing the element reflecting layer 35. The protection diodes 160 and 170 overlap with the terahertz element 20, when observed in the z direction.

In this variation example, the first protection diode 160 includes the first anode electrode 161 and the first cathode electrode 162 formed on the lower surface. The first anode electrode 161 and the first cathode electrode 162 are arranged apart in the x direction.

The terahertz device 10 includes the protection connecting portions 241 and 242 electrically connecting the first protection diode 160 with the column portions 201 and 202. The anode protection connecting portion 241 electrically connects the first anode electrode 161 and the first column portion 201 by a bonding material. The cathode protection connecting portion 242 electrically connects the first cathode electrode 162 and the second column portion 202 by a bonding material. The same applies to the second protection diode 170.

The anode protection connecting portion 241 may be overlapping or non-overlapping with the first electrically conductive portion 210, when observed in the z direction. Similarly, the cathode protection connecting portion 242 may be overlapping or non-overlapping with the second electrically conductive portion 220, when observed in the z direction.

Moreover, the terahertz device 10 includes the protection connecting portions electrically connecting the second protection diode 170 with the column portions 201 and 202.

As described above, by the terahertz element 20 and the protection diodes 160 and 170 in laminated layers, expansion of the terahertz device 10 in the x direction or the y direction may be suppressed. Further, because the protection diodes 160 and 170 are disposed on positions where electromagnetic waves are not transmitted, that is, positions on the side of the element back surface 22 and opposite to the element reflecting layer 35 (in other words, the terahertz element 20), obstructed transmission of electromagnetic waves caused by the protection diodes 160 and 170 can be suppressed.

Other Variation Examples

The embodiments are examples of means to obtain terahertz devices related to the present invention, and are not to be construed as limitations to the means. The terahertz device related to the present invention can obtain means different from the exemplary means in each of the embodiments described above. An example thereof is obtained by replacing, changing, or omitting a part of the configuration of each of the embodiments, or a form obtained by adding a new configuration to each of the embodiments. Given that no technical contradiction is resulted, the following variation examples may be used in combination. Moreover, for illustration purposes, in the following variation examples, description is given using the first embodiment; however, other embodiments may also be applied given that no technical contradiction is resulted.

Figure 49:
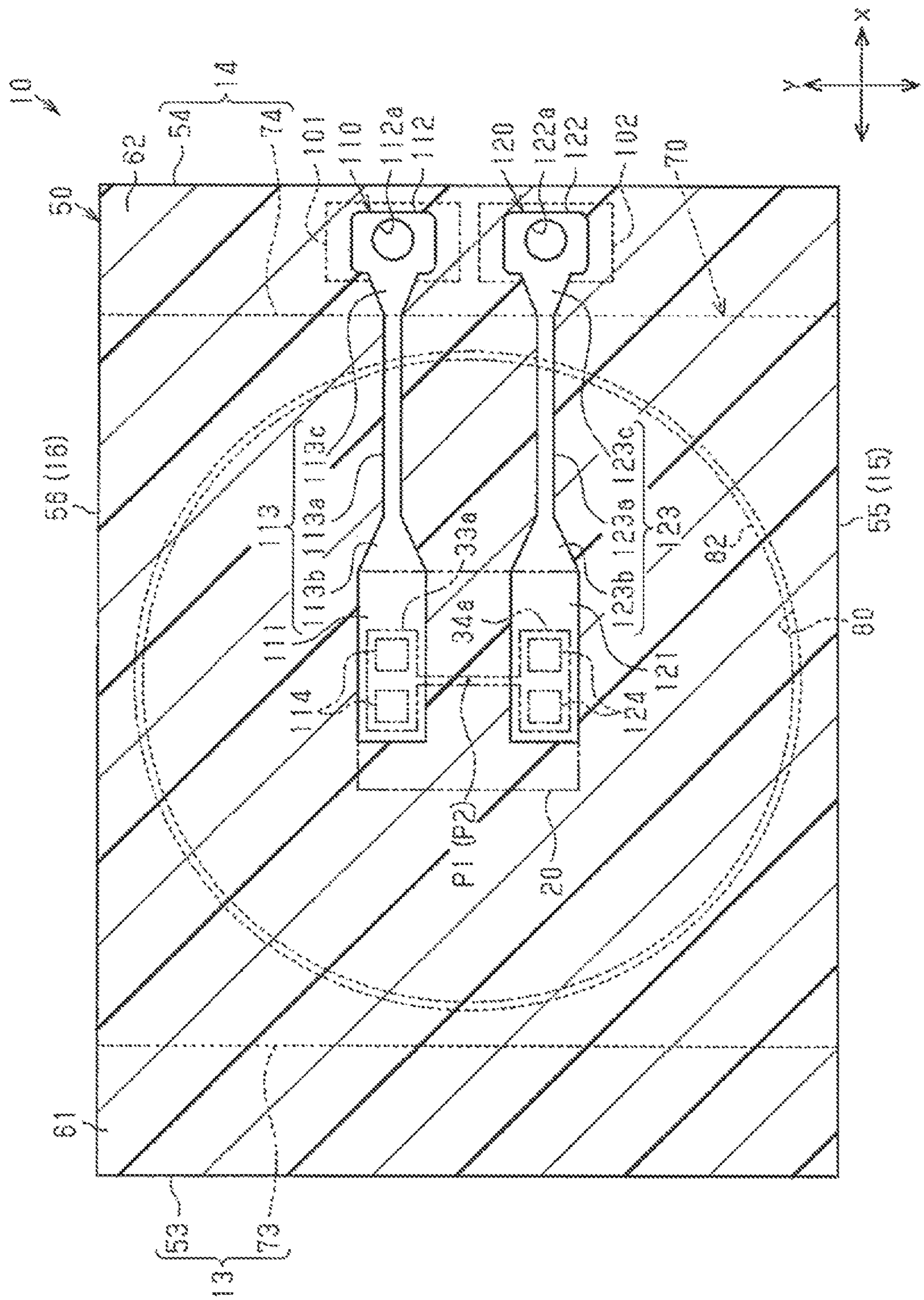
FIG. 49 is a section diagram of an electrically conductive portion of a variation example.
Figure 50:
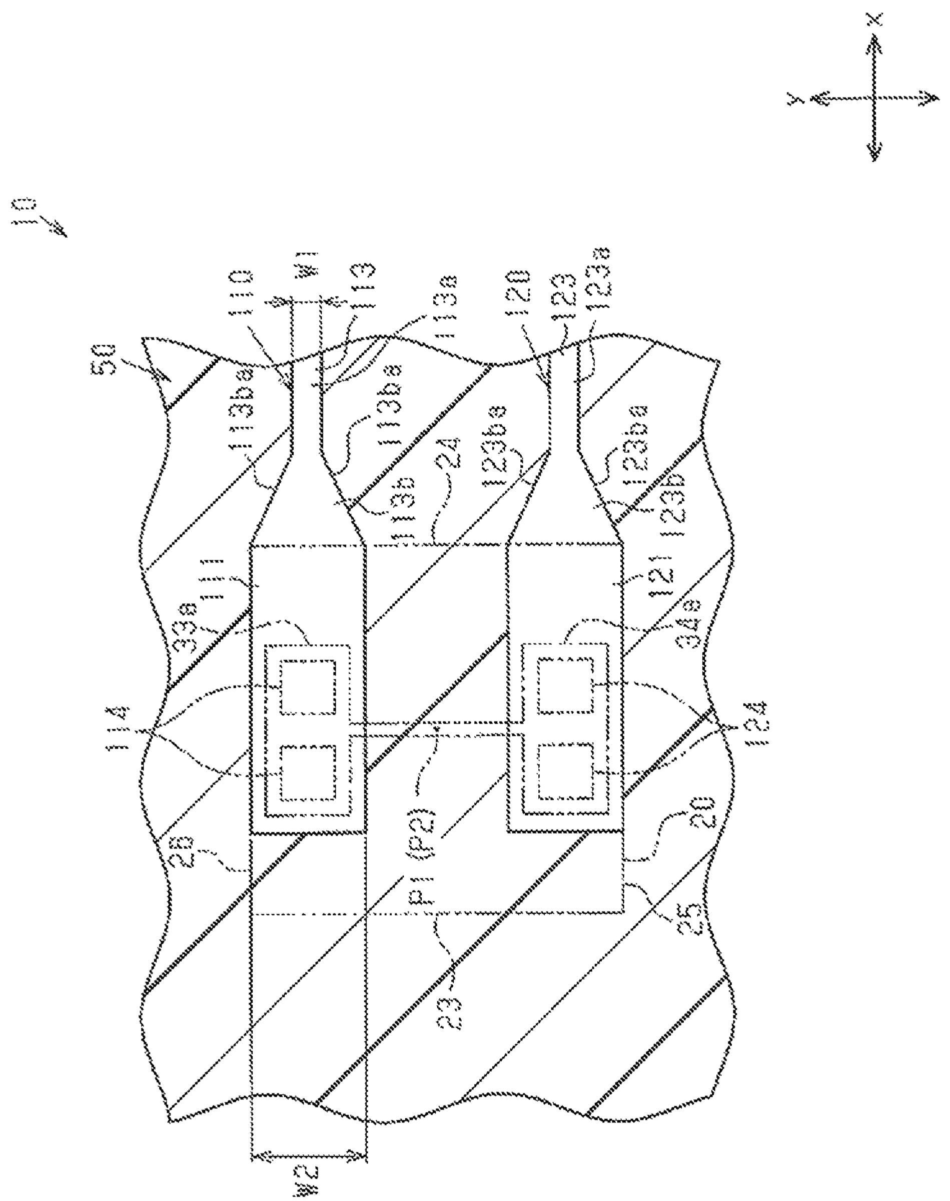
FIG. 50 shows an enlarged partial view of FIG. 49.

As shown in FIG. 49 and FIG. 50, the terahertz element 20 may also be disposed in the dielectric 50 in a state where the two pads 33*a* and 34*a* are arranged in opposite in the y direction. The two pads 33*a* and 34*a* may extend in the x direction, and are, for example, shaped as rectangles with the x direction as the long side direction and the y direction as the short side direction. Moreover, the two electrodes 101 and 102 may be arranged in the y direction on the second extruding surface 51*b*.

In this case, the two electrically conductive portions 110 and 120 may be arranged in they direction. For example, the two electrically conductive portions 110 and 120 extend in the x direction from the terahertz element 20 toward the second protruding portion 62. Specifically, the electrically conductive portions 110 and 120 extend in the x direction in a manner that the pads 33*a* and 34*a* and the electrodes 101 and 102 are respectively opposite. In this case, the two element opposing portions 111 and 121 are arranged apart in the y direction, the two electrode opposing portions 112 and 122 are arranged apart in the y direction, and the two connecting portions 113 and 123 are arranged apart in the y direction.

In this variation example, the element opposing portions 111 and 112 may be shaped as rectangles with the x direction as the long side direction and the y direction as the width direction. In this case, the first bump 114 may be arranged in plural between the first element opposing portion 111 and the first pad 33*a* in the x direction, and the second bump 124 may be arranged in plural between the second element opposing portion 121 and the second pad 34*a* in the x direction.

Further, the widths (the y-direction lengths) W1 and W3 of the connecting body portions 113*a* and 123*a* may be set to be narrower than the widths (y-direction lengths) W2 and W4 of the element opposing portions 111 and 121.

According to this variation example, the two electrically conductive portions 110 and 120 are closer because of the arrangement of the two electrically conductive portions 110 and 120. Accordingly, high-speed signal transmission in the two electrically conductive portions 110 and 120 can be achieved. Accordingly, transceiving of high-speed modulation signals can also be performed. In this case, the first protruding portion 61 may be omitted.

Moreover, the two electrodes 101 and 102 may also be disposed on portions on the dielectric main surface 51 or the dielectric back surface 52 corresponding to the first protruding portion 61. In this case, the two electrically conductive portions 110 and 120 may extend in the x direction from the terahertz element 20 toward the first protruding portion 61, when observed in the z direction. That is to say, the two electrodes 101 and 102 may be together formed on any of a portion corresponding to the first protruding portion 61 and a portion corresponding to the second protruding portion 62.

Figure 51:
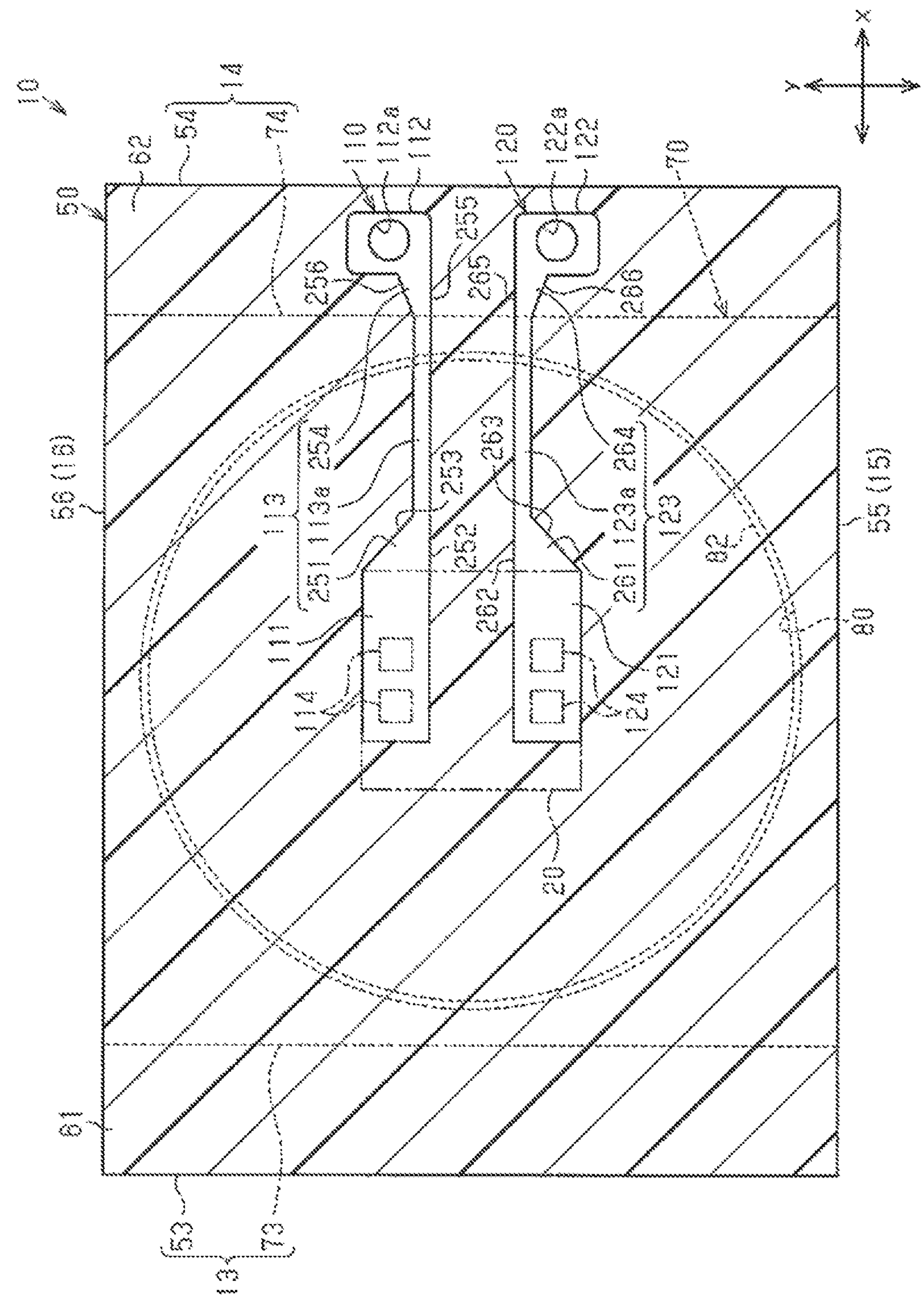
FIG. 51 is a section diagram of an electrically conductive portion of a variation example.
Figure 52:
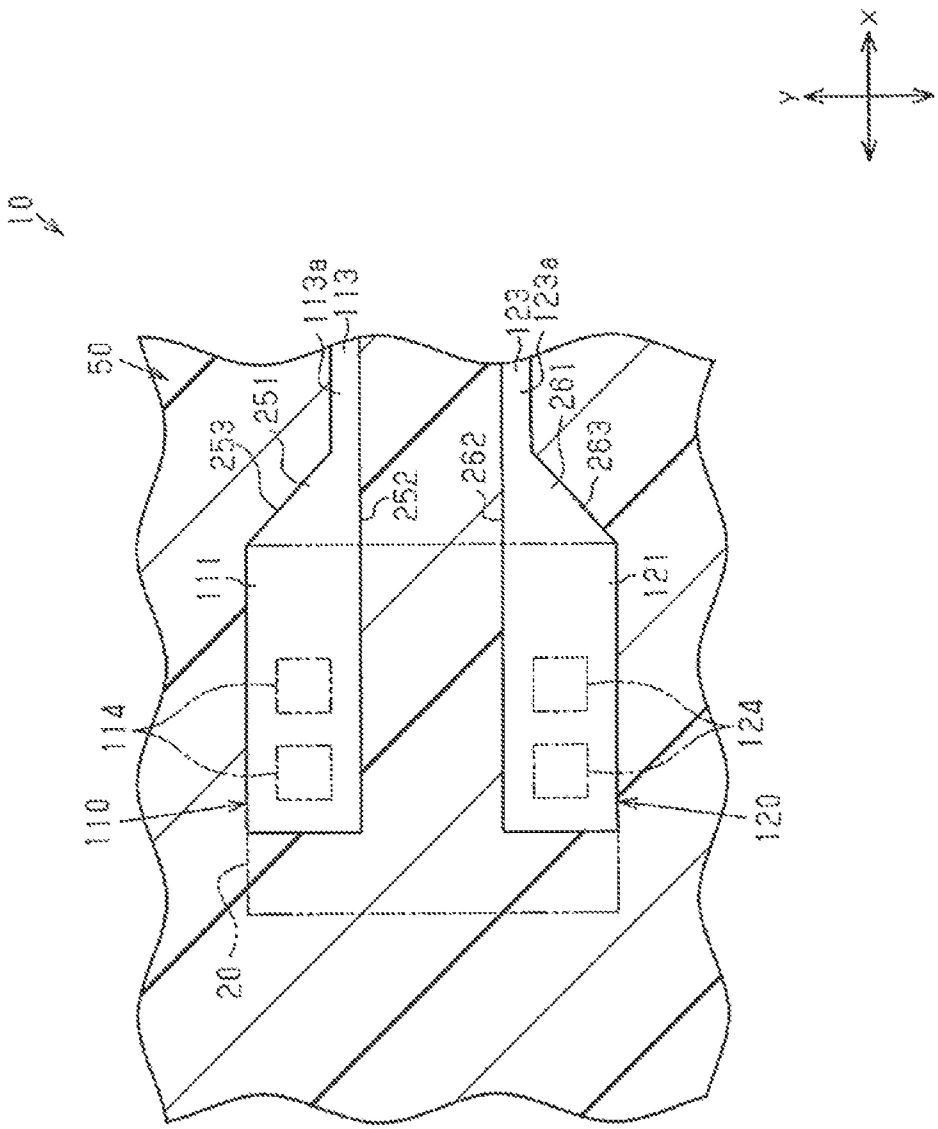
FIG. 52 shows an enlarged partial view of FIG. 51.

As shown in FIG. 51 and FIG. 52, the first element side taper portion 251 may also be a single-side taper. Specifically, the first element side taper portion 251 may be configured to include: a first element side flat surface 252, orthogonal to they direction; and a first element side inclining surface 253, inclining in a manner of gradually departing the first element side flat surface 252 from the first connecting body portion 113*a* toward the first element opposing portion 111.

Moreover, the first electrode side taper portion 254 may be configured to include: a first electrode side flat surface 255, orthogonal to the y direction; and a first electrode side inclining surface 256, inclining in a manner of gradually departing the first electrode side flat surface 255 from the first connecting body portion 113*a* toward the first element opposing portion 112.

Similarly, the second element side taper portion 261 may also be a single-side taper. Specifically, the second element side taper portion 261 may be configured to include: a second element side flat surface 262, orthogonal to the y direction; and a second element side inclining surface 263, inclining in a manner of gradually departing the second element side flat surface 262 from the second connecting body portion 123*a* toward the second element opposing portion 121.

Moreover, the second electrode side taper portion 264 may be configured to includes: a second electrode side flat surface 265, orthogonal to they direction; and a second electrode side inclining surface 266, inclining in a manner of gradually departing the second electrode side flat surface 265 from the second connecting body portion 123*a* toward the second element opposing portion 122.

In this case, the first element side flat surface 252 and the second element side flat surface 262 oppose in the y direction, and the first electrode side flat surface 255 and the second electrode side flat surface 265 oppose in the y direction. Accordingly, the distance in they direction between the two electrically conductive portions 110 and 120 is fixed.

Figure 53:
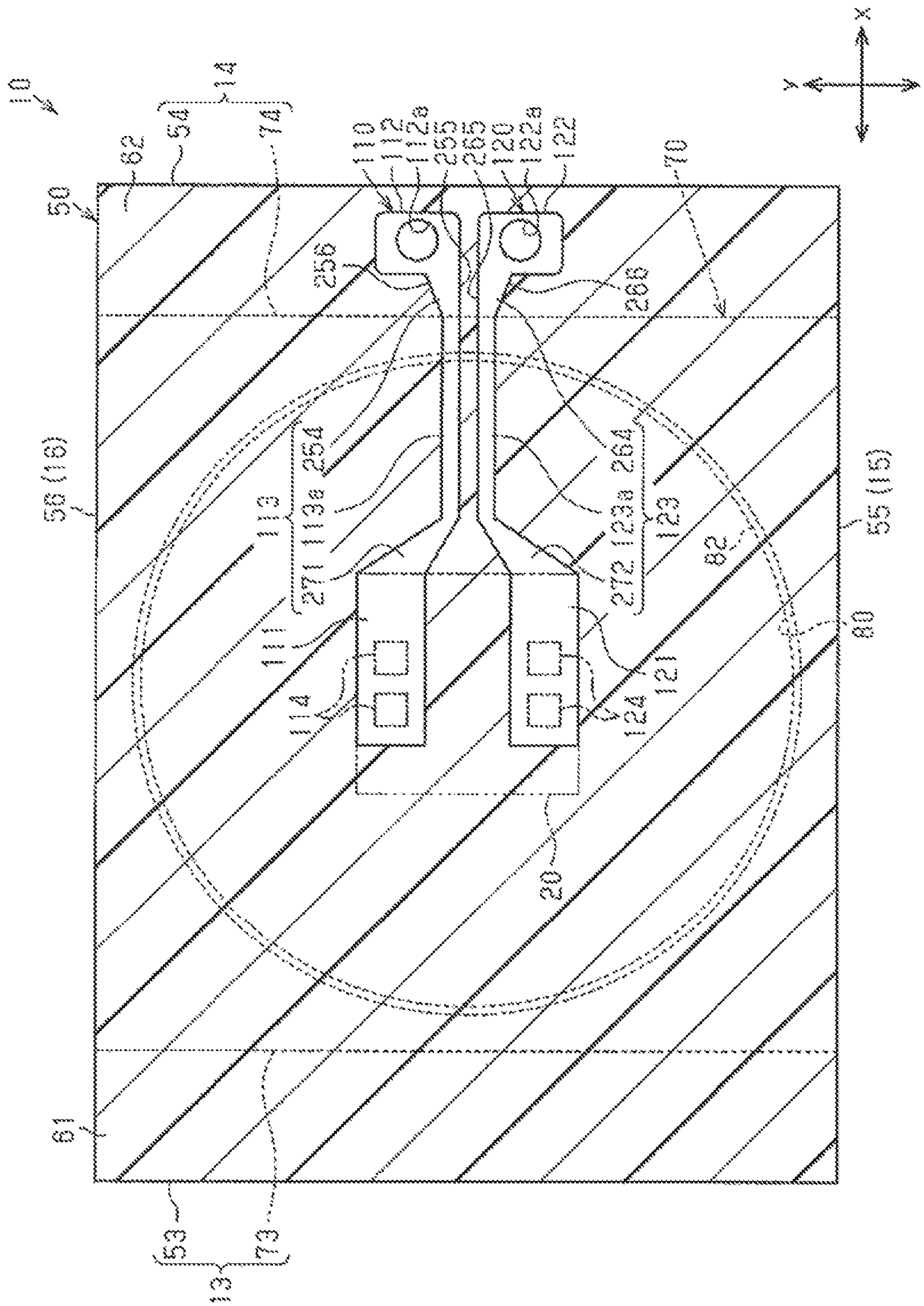
FIG. 53 is a section diagram of an electrically conductive portion of a variation example.
Figure 54:
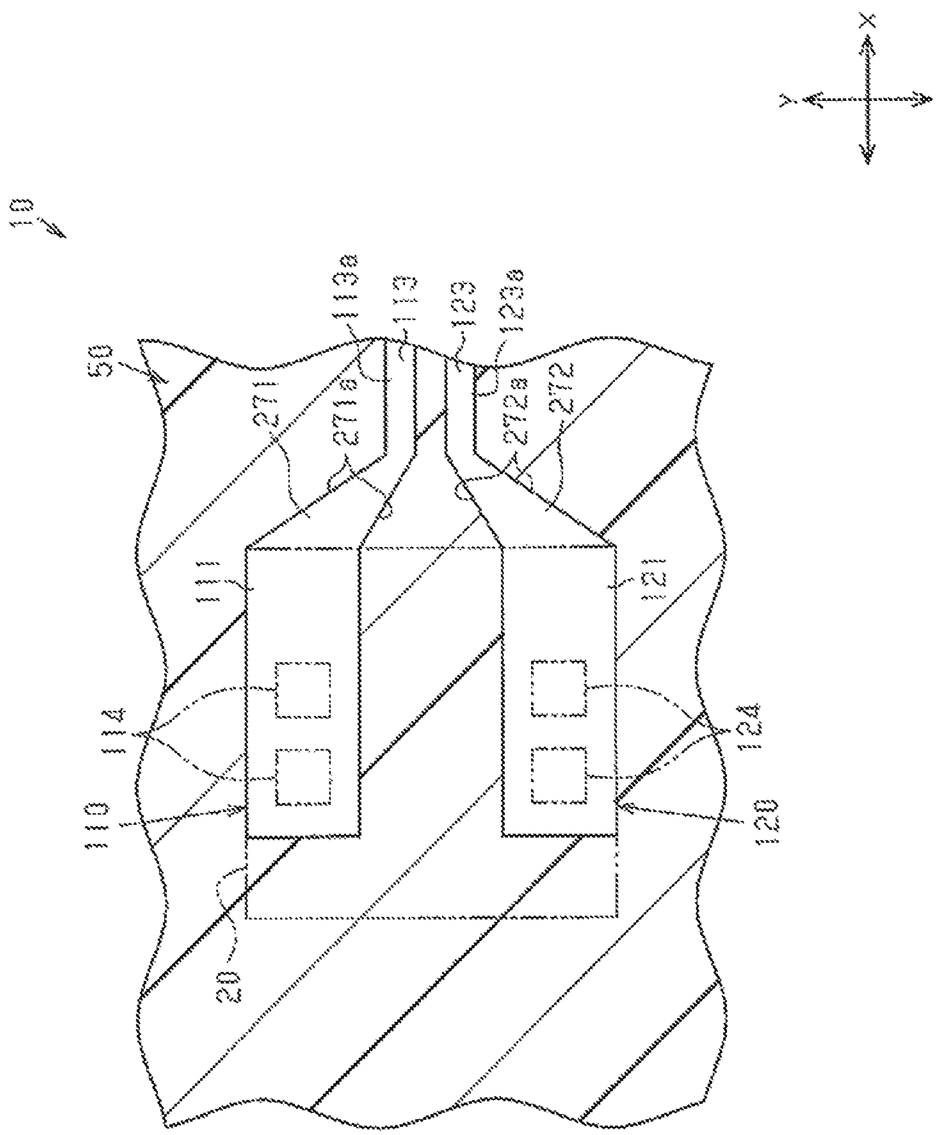
FIG. 54 shows an enlarged partial view of FIG. 53.

As shown in FIG. 53 and FIG. 54, the two connecting body portions 113*a* and 123*a* may also be arranged as being closer to each other compared to the two element opposing portions 111 and 121. That is to say, the opposing distance between the two connecting body portions 113*a* and 123*a* may be shorter than the opposing distance between the two element opposing portions 111 and 121. In this case, the two element side taper portions 271 and 272 can incline in a manner of gradually departing each other from the connecting body portions 113*a* and 123*a* toward the element opposing portions 111 and 121. Accordingly, signal transmission at an even higher speed in the two electrically conductive portions 110 and 120 can be achieved.

In this case, a pair of first element side inclining surfaces 271*a* in the first element side taper portion 271 incline toward the same direction, and the inclining angles thereof are different as the width toward the first element opposing portion 111 gradually increases. Moreover, a pair of second element side inclining surfaces 272*a* in the second element side taper portion 272 incline toward a direction opposite to that of the first element side inclining surfaces 271*a*, and the inclining angles thereof are different as the width toward the second element opposing portion 121 gradually increases. In summary, specific shapes of the element side taper portions and the electrode side taper portions can be any as desired.

Alternatively, at least one of the first element side taper portion 113*b* and the first electrode side taper portion 113*c* can be omitted. Similarly, at least one of the second element side taper portion 123*b* and the second electrode side taper portion 123*c* can be omitted.

Portions of the connecting portions 113 and 123 have widths equal to those of the element opposing portions 111 and 121. That is to say, it is sufficient for at least portions of the connecting portions 113 and 123 to have widths narrower than those of the element opposing portions 111 and 121.

The widths W1 and W3 of the connecting body portions 113*a* and 123*a* may also be equal to the widths W2 and W4 of the element opposing portions 111 and 121. That is to say, the connecting portions 113 and 123 and the element opposing portions 111 and 121 may have equal widths. In addition, the widths W1 and W3 of the connecting body portions 113*a* and 123*a* may also be equal to the widths of the electrode opposing portions 112 and 122. The widths W2 and W4 of the element opposing portions 111 and 121 may be equal to or different from the widths of the electrode opposing portions 112 and 122.

Specific shapes of the element opposing portions 111 and 121 and the electrode opposing portions 112 and 122 may be any as desired, and may be circles or ellipsoids.

At least portions of the electrodes 101 and 102 may be formed as portions overlapping with the reflecting film 82.

Figure 55:
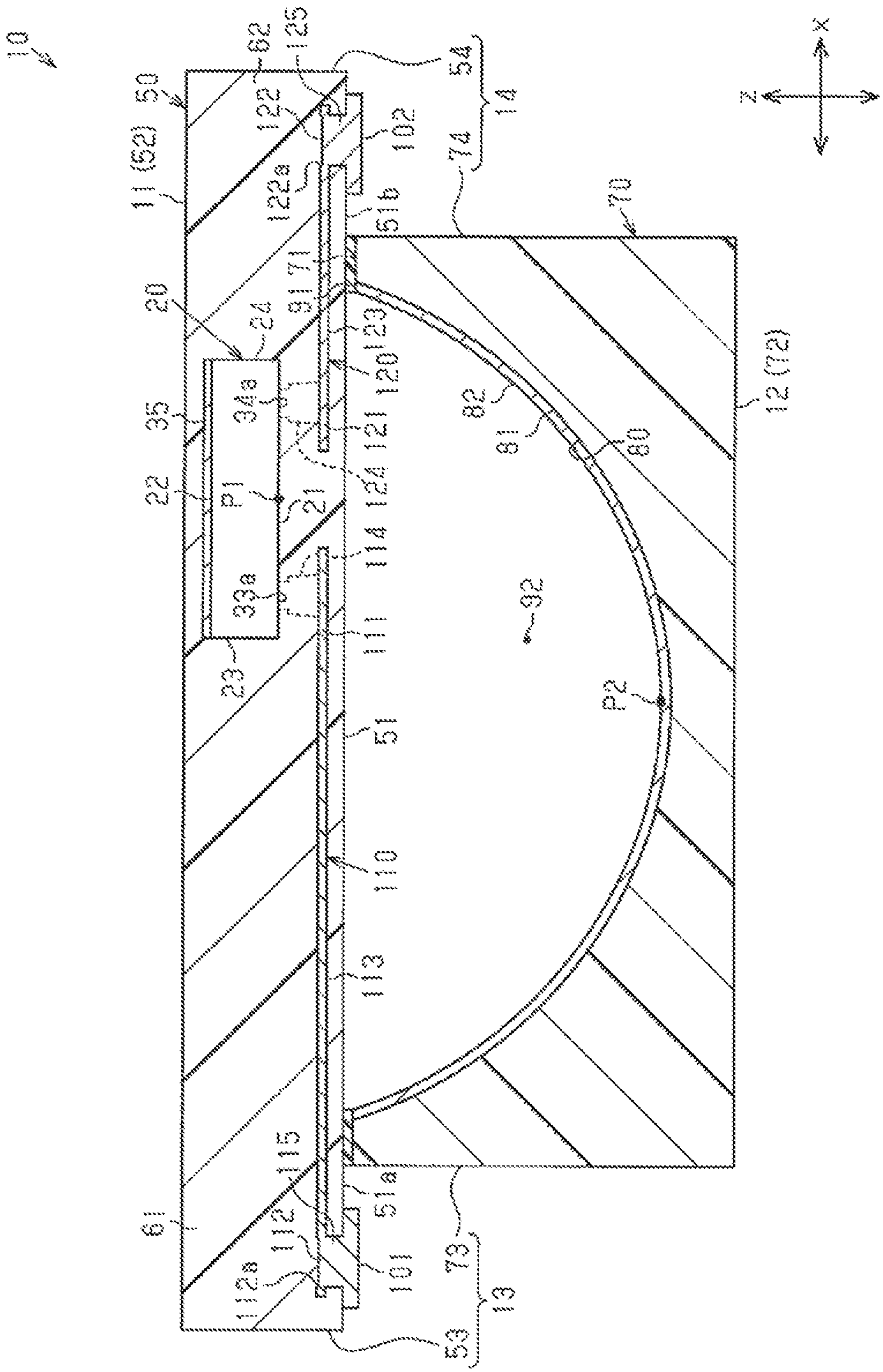
FIG. 55 is a section diagram for illustratively representing a terahertz device of a variation example.

As shown in FIG. 55, the terahertz element 22 may also be configured on a position where the oscillation point P1 is shifted from the center point P2 of the reflecting film 82, when observed in the z direction. That is to say, the focus of the reflecting film 82 may be non-coincident with the oscillation point P1.

Figure 56:
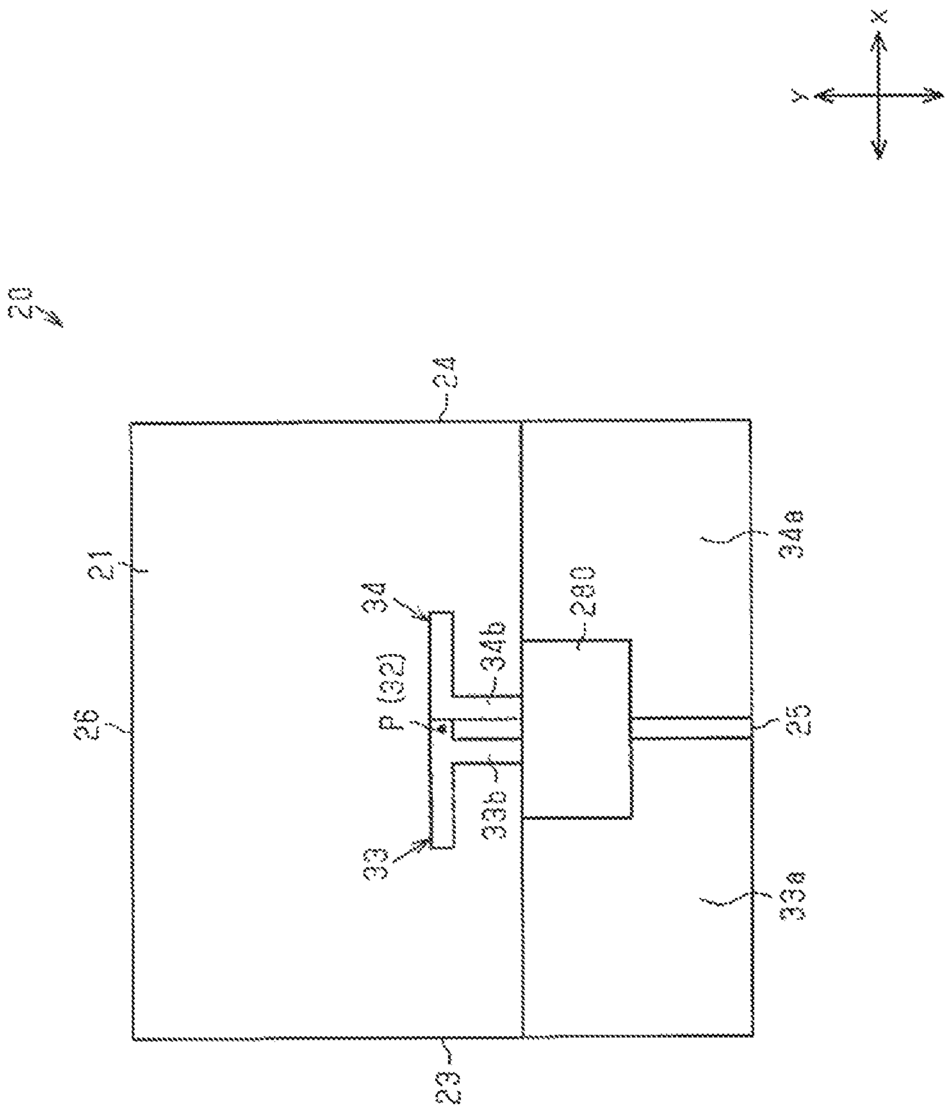
FIG. 56 is a front view for illustratively representing a terahertz device of a variation example.

The positions and shapes of the two pads 33*a* and 34*a* of the terahertz element 20 may be changed as desired. As shown in FIG. 56, the two pads 33*a* and 34*a* may be configured in opposite in the x direction or the y direction without the oscillation point P1 interposed in between, or may be together configured on an end portion in the y direction of the element main surface 21. In this case, the two pads 33*a* and 34*a* may be insulated from each other.

Moreover, portions of the two element conductive layers 33 and 34 may also constitute a dipole antenna. That is to say, the antenna can also be integrated on side of the element main surface 21 of the terahertz element 20. Moreover, the specific configuration of the antenna is not limited to a dipole antenna, and may be any configuration as desired, or may be other antennas such as a slot antenna, a bow tie antenna or a loop antenna.

As shown in FIG. 56, the terahertz element 20 may include a metal-insulator-metal (MIM) reflector 280. The MIM reflector 280 is a configuration in which an insulator is sandwiched by a portion of the first element conductive layer 33 and a portion of the second element conductive layer 34 in the z direction. The MIM reflector 280 short-circuits in a high frequency a portion of the first element conductive layer 33 and a portion of the second element conductive layer 34. The MIM reflector 280 enables reflection of high-frequency electromagnetic waves.

Figure 57:
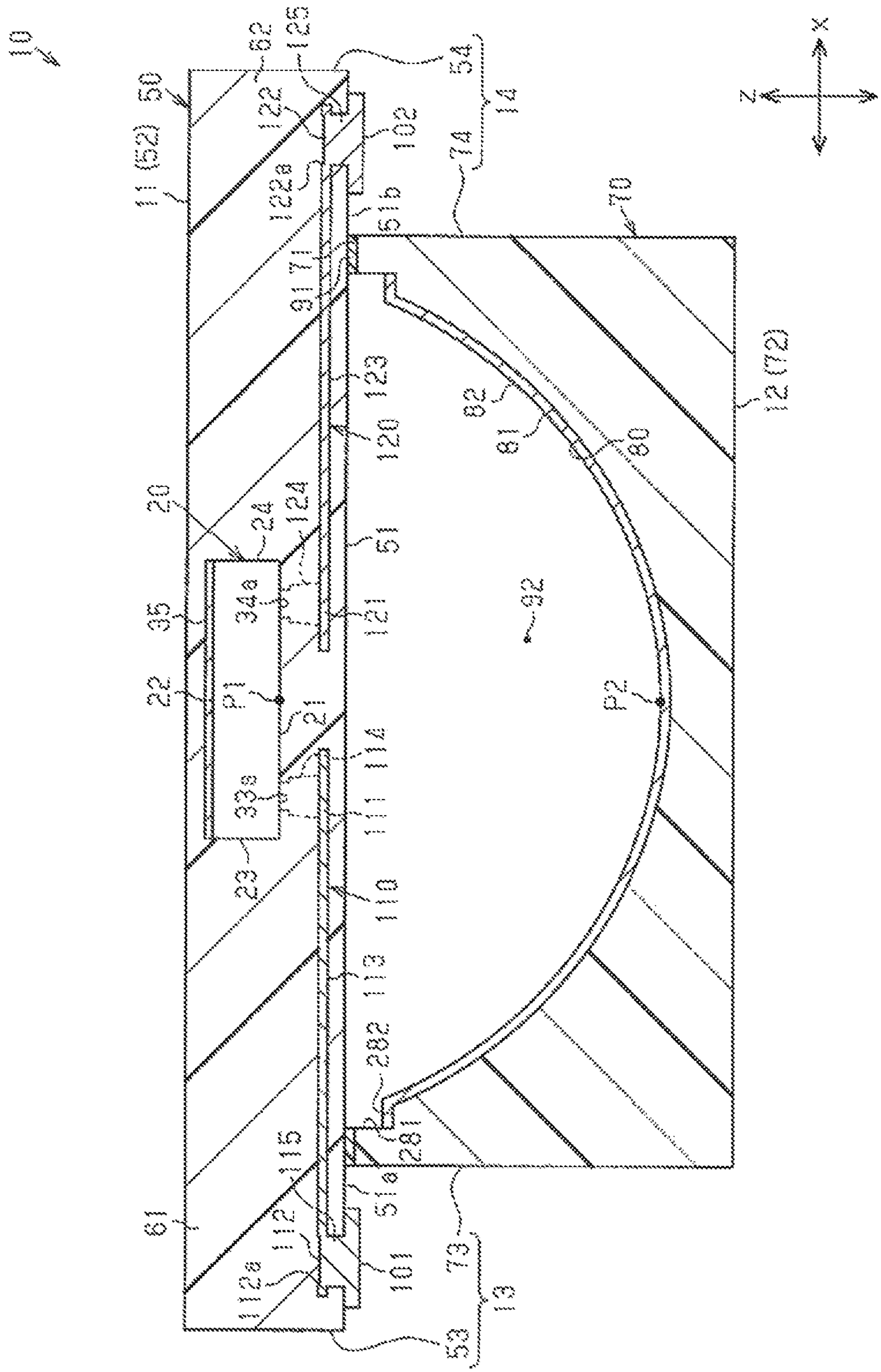
FIG. 57 is a section diagram for illustratively representing a terahertz device of a variation example.

As shown in FIG. 57, the antenna recess 80 comprises a diameter expansion surface 281 with an expanded diameter compared to the antenna surface 81, and a step surface 282 formed between the antenna surface 81 and the diameter expansion surface 281. The step surface 282 is a surface crossing the z direction. In this configuration, the reflecting film 82 is formed throughout the antenna surface 81 and the step surface 282.

Figure 58:
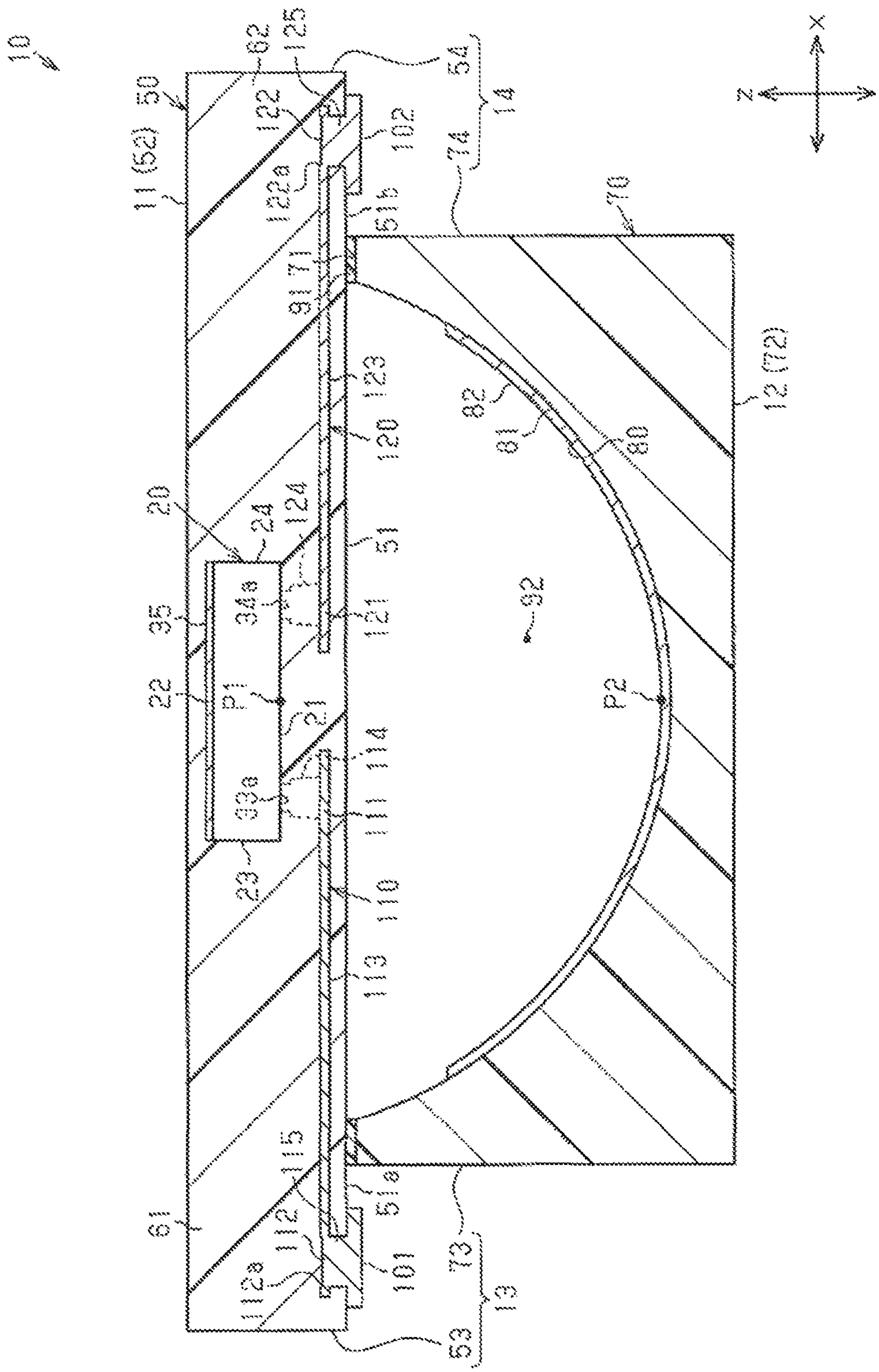
FIG. 58 is a section diagram for illustratively representing a terahertz device of a variation example.

As shown in FIG. 58, the reflecting film 82 may also be a configuration formed over the range of a portion of the antenna surface 81. Moreover, the reflecting film 82 may also be formed over an angle range of the opening angle θ or less with respect to the oscillation point P1. The reflecting film 82 may be, given that at least a portion of electromagnetic waves generated from the terahertz element 20 are reflected toward one direction, a configuration that reflects only a portion of electromagnetic waves.

The specific shape of the reflecting film 82 is not limited to the shape of a parabolic antenna, and various antenna shapes may be used. For example, the reflecting film 82 may also be shaped as a flat antenna. In this case, the antenna recess 80 may also be a shape having a bottom surface orthogonal to the z direction, and the reflecting film 82 is shaped as a flat antenna formed on the bottom surface. That is to say, the antenna recess 80 is not limited to being a curved shape.

In addition, a recess defining the gas space 92 is formed in the dielectric 50. In this case, the antenna recess 80 may also be omitted. In this variation example, the reflecting film 82 may be shaped as a flat antenna formed on the base main surface 71.

The reflecting film is not limited to being one film, but may include multiple discrete parts. For example, a slit or a hole may be formed at the reflecting film. That is to say, the shape of the reflecting film may be appropriately changed.

Figure 59:
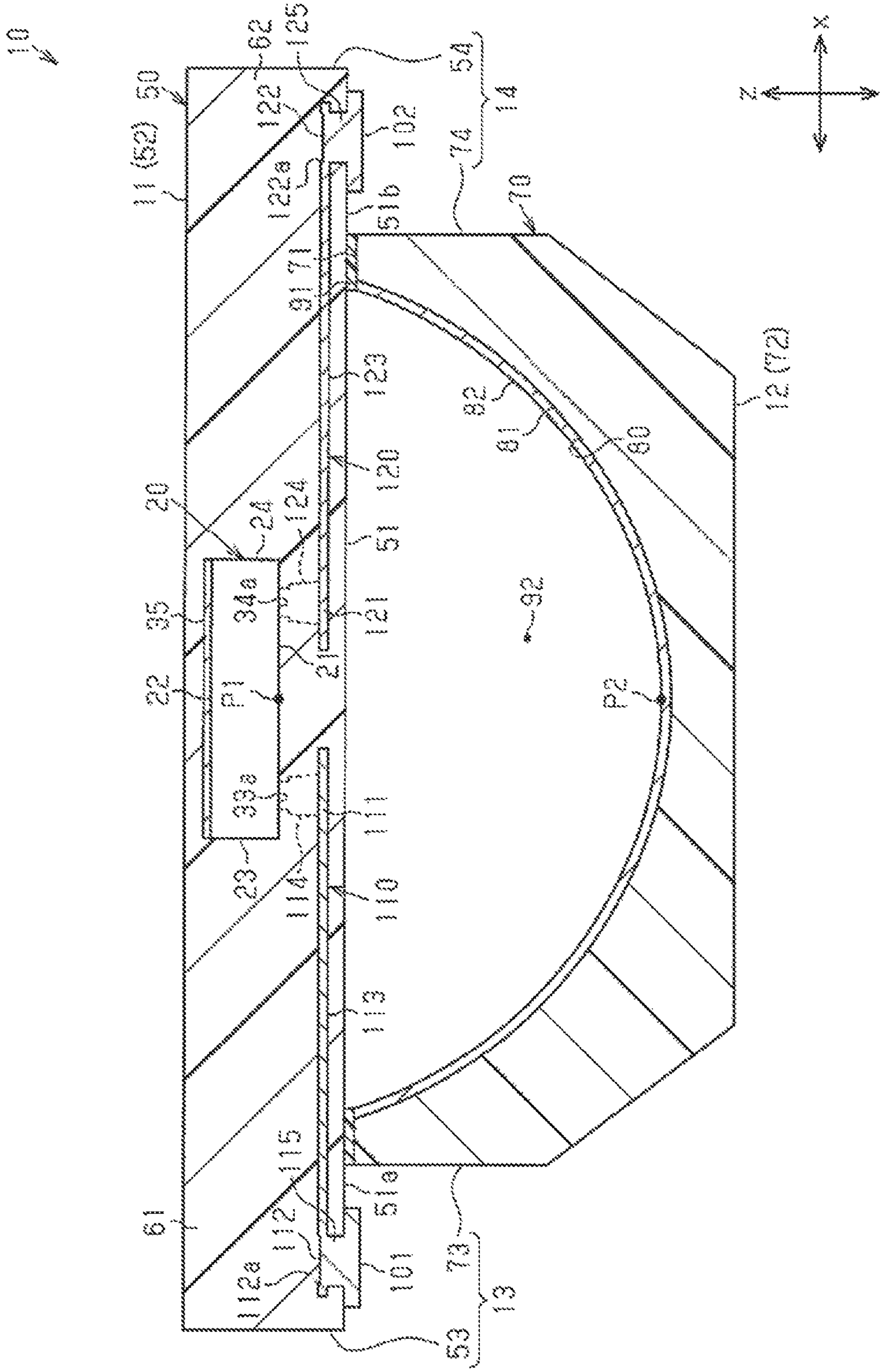
FIG. 59 is a section diagram for illustratively representing a terahertz device of a variation example.
Figure 60:
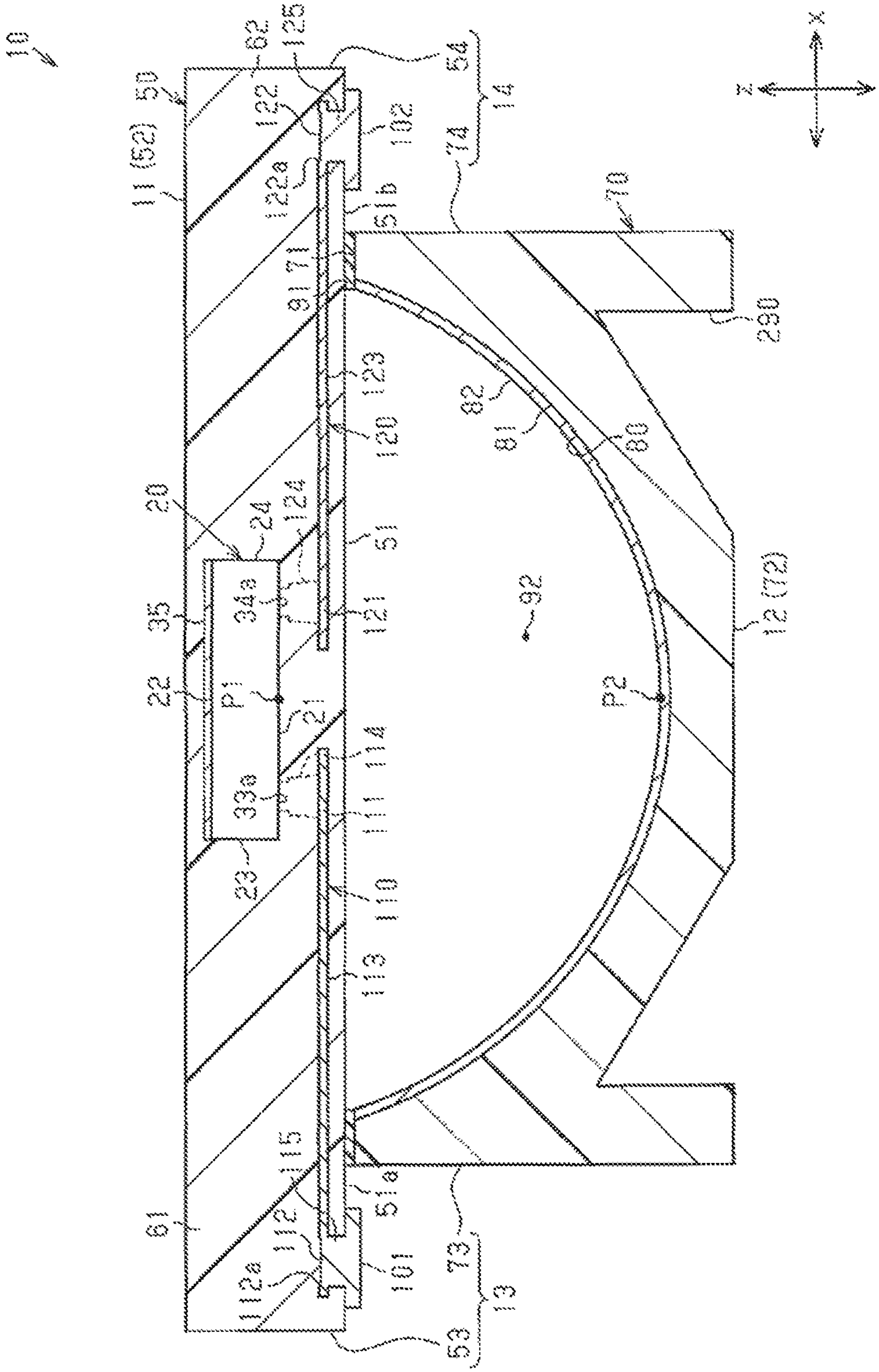
FIG. 60 is a section diagram for illustratively representing a terahertz device of a variation example.

The shape of the antenna base 70 may be appropriately changed. For example, as shown in FIG. 59, the antenna base 70 is a shaped as a dome formed by trimming off corners, or as shown in FIG. 60, a hollow portion 290 is formed at the antenna base 70.

Figure 61:
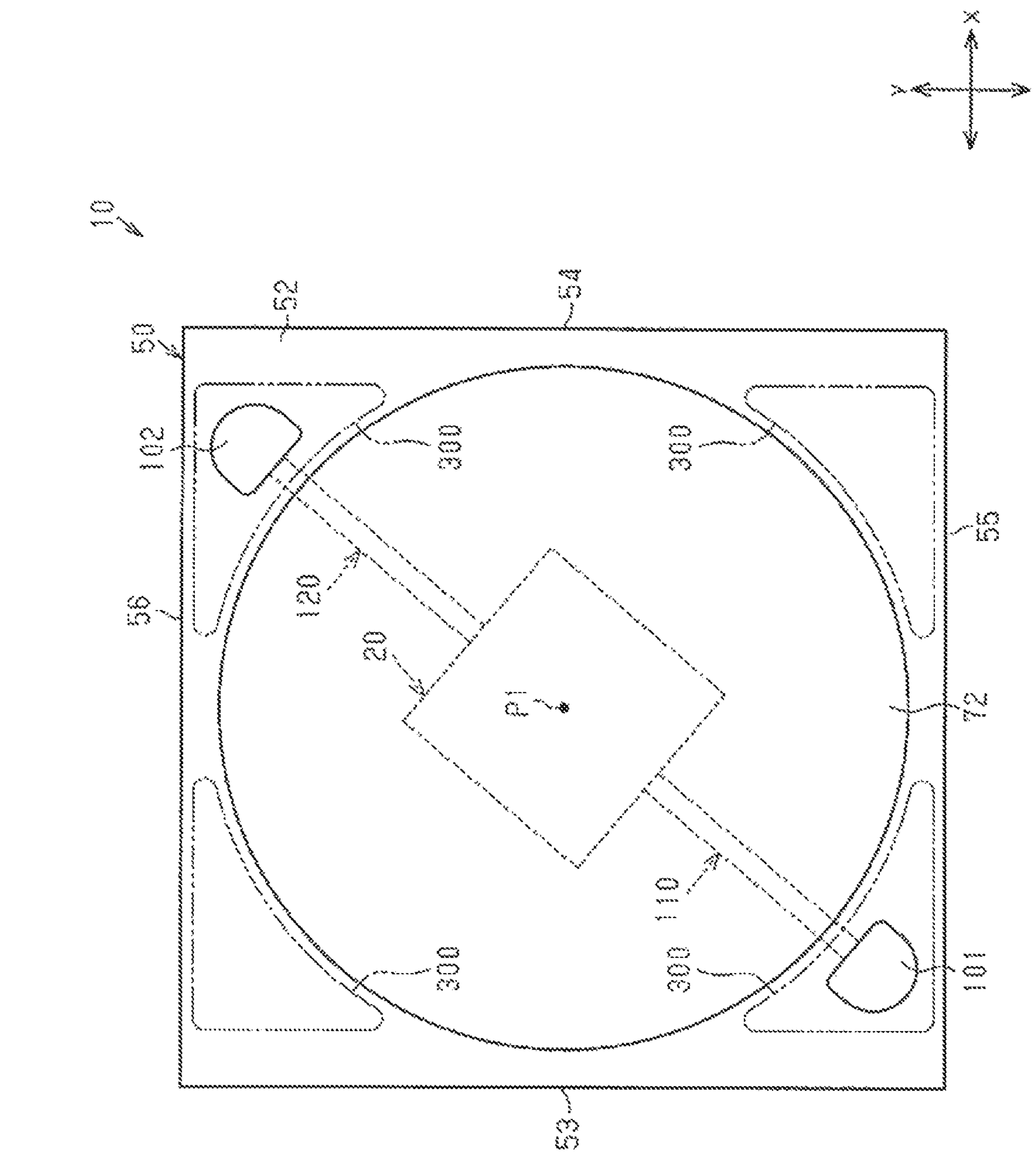
FIG. 61 is a bottom view for illustratively representing a terahertz device of a variation example.

Moreover, as shown in FIG. 61, the antenna base 70 is shaped as a circle, when observed in the z direction. Specifically, the antenna base 70 may be shaped as a cylinder with the z direction as the axis direction. In this case, exposed region 300 exposing the dielectric main surface 51 are formed around the antenna base 70. The exposed regions 300 are formed on four corners of the antenna base 70.

In this variation example, the terahertz device 10 can be mounted to the circuit substrate 140 using, for example, the exposed regions 300. Specifically, the diameter of the hole 141 formed on the circuit substrate 140 is equal to or slightly larger than the diameter of the outer periphery of the antenna base 70. In this case, if the antenna base 70 is inserted into the hole 141, the exposed region s300 are abutted against the circuit substrate 140.

Further, in this variation example, the terahertz element 20 is in an inclined configuration in a manner of crossing both of the x direction and the y direction. Moreover, the electrodes 101 and 102 are formed in a pair of exposed regions 300 arranged as inclining and opposite to each other among the four exposed regions 300.

The electrically conductive portions 110 and 120 extend in an inclining direction crossing the x direction and the y direction in a manner of electrically connecting the terahertz element 20 to the electrodes 101 and 102. In this case, it may be said that the electrically conductive portions 110 and 120 extend from the terahertz element 20 toward directions away from each other, when observed in the z direction.

The terahertz device 10 is mounted on the circuit substrate 140 by using the electrically conductive bonding material 142 between the electrodes 101 and 102 disposed in the exposed regions 300 and the circuit substrate 140. Accordingly, the terahertz device 10 may be mounted on the circuit substrate 140 without using the protruding portions 61 and 62. Thus, the protruding portions 61 and 62 may be omitted. That is to say, it is not necessary to provide the protruding portions 61 and 62, nor the electrodes 101 and 102 on the extruding surfaces 51*a* and 51*b*.

Figure 62:
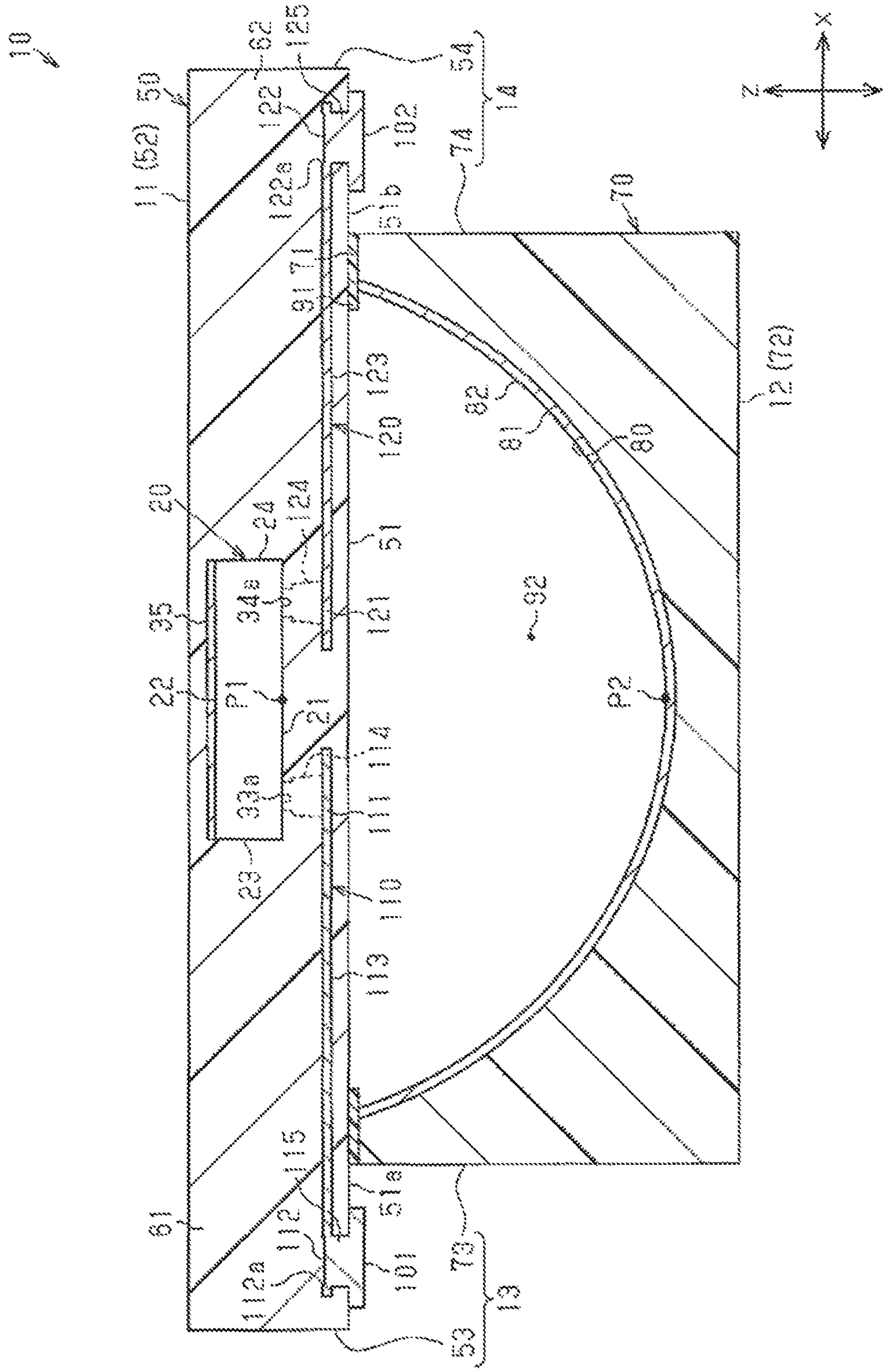
FIG. 62 is a section diagram for illustratively representing a terahertz device of a variation example.

As shown in FIG. 62, the inner peripheral end of the adhesive layer 91 may extrude further to the inner side (in other words, the side of the terahertz element 20) than the reflecting film 82.

Figure 63:
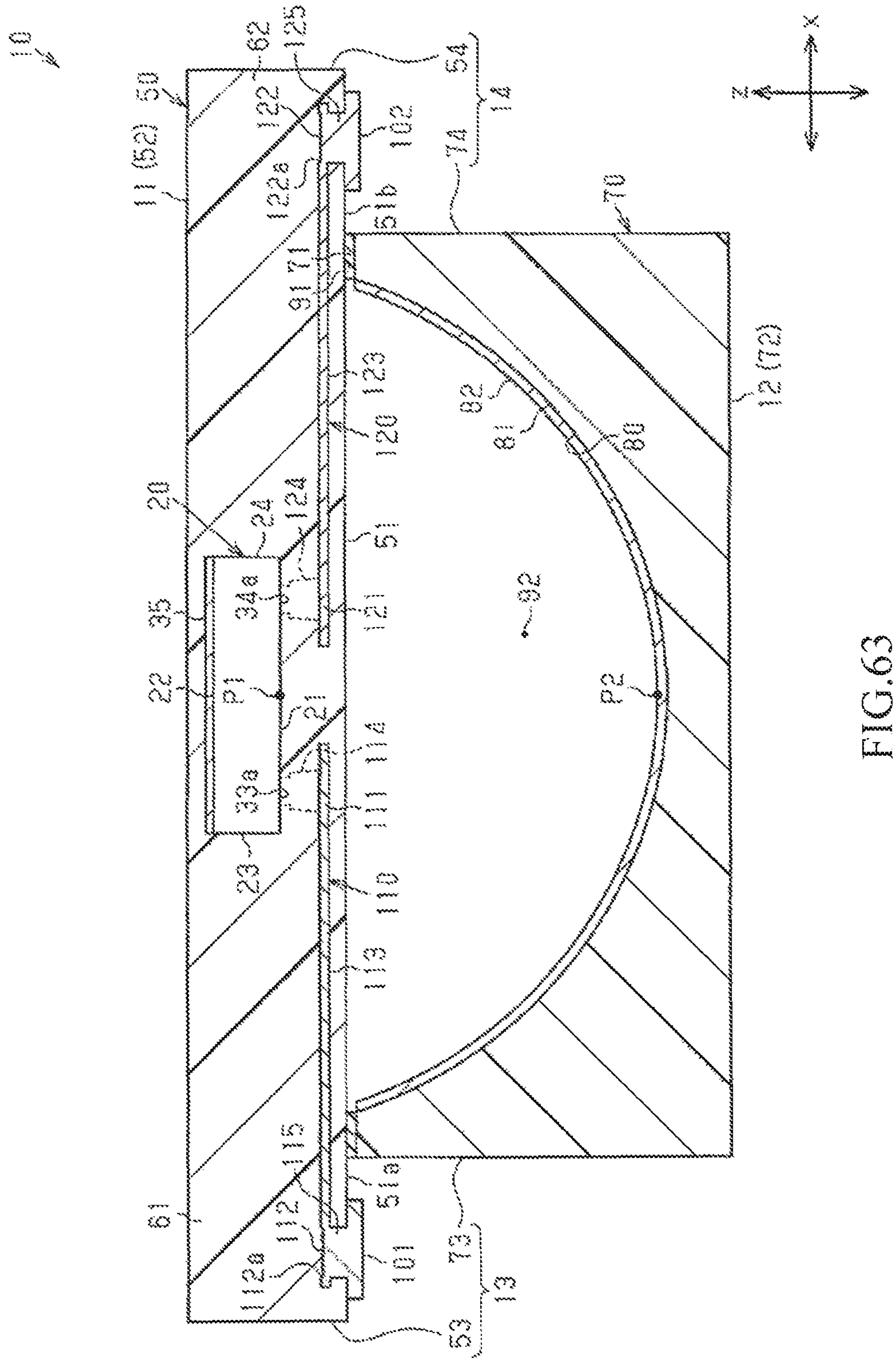
FIG. 63 is a section diagram for illustratively representing a terahertz device of a variation example.
Figure 64:
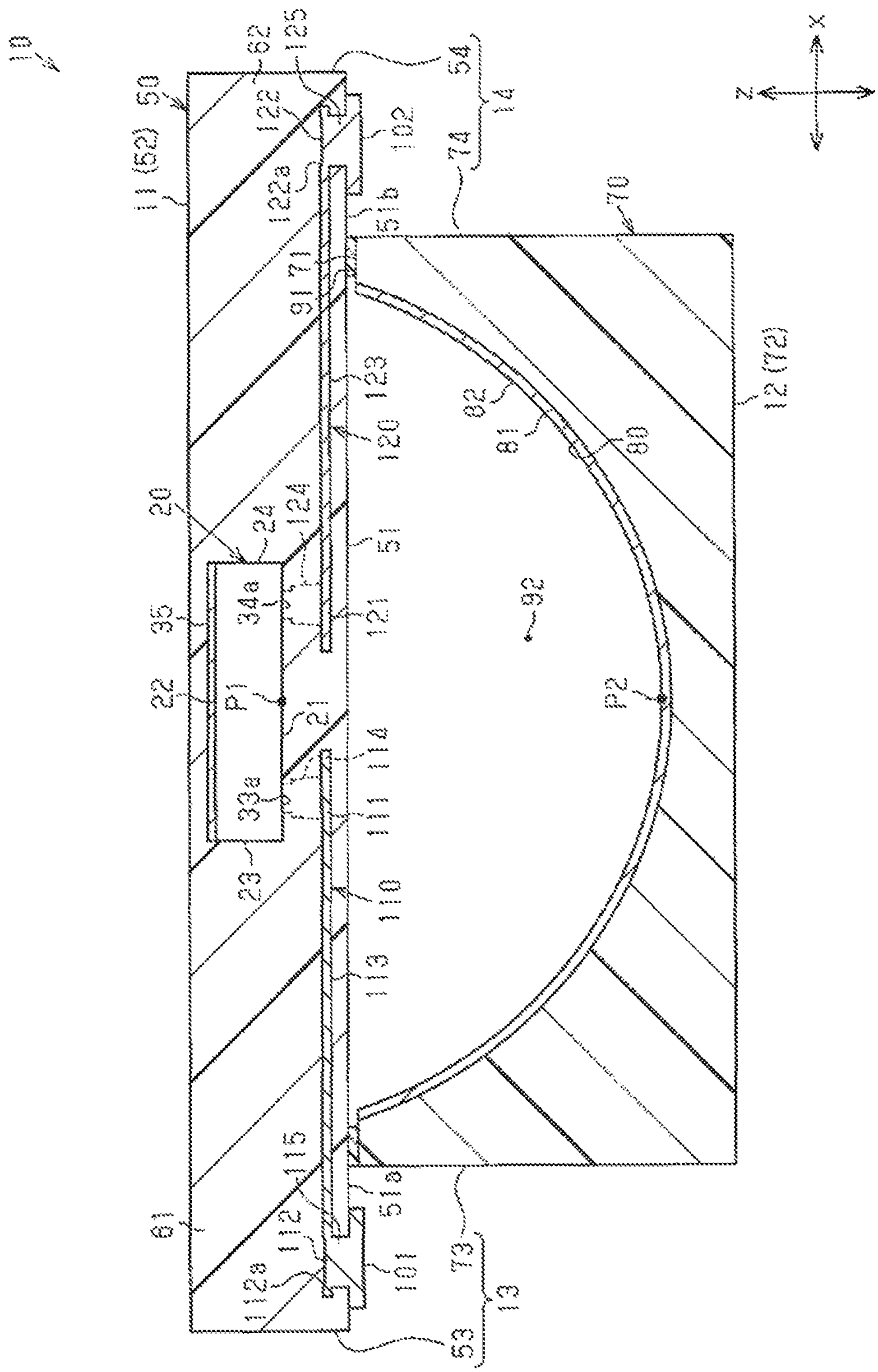
FIG. 64 is a section diagram for illustratively representing a terahertz device of a variation example.

Moreover, as shown in FIG. 63 and FIG. 64, the inner peripheral end of the adhesive layer 91 may be closer to outer sides in the x direction and the y direction (in other words, the sides of the base side surfaces 73 to 76) than the surface of the reflecting film 82. For example, as shown in FIG. 63, the inner peripheral end of the adhesive layer 91 may be configured on a position that is the same plane as the antenna surface 81. Further, as shown in FIG. 64, the inner peripheral end of the adhesive layer 91 may also be configured to be closer to the outer sides in the x direction and they direction than the antenna surface 81.

The two protruding portions 61 and 62 may protrude in the y direction but not the x direction, or may protrude in both the x direction and the y direction. The same applies to the electrodes 101 and 102 formed on the portions on the dielectric main surface 51 corresponding to the protruding portions 61 and 62, that is, the extruding surfaces 51*a* and 51*b*.

The terahertz element 20 may also be configured in a manner that the element back surface 22 faces the reflecting film 82. That is to say, the reflecting film 82 may also be disposed on the side of the element back surface 22 but not on the side of the element main surface 21. In this case, the element reflecting layer 35 may be omitted.

Alternatively, the reflecting film 82 may also be formed on the base main surface 71. In this case, a reflection reducing film may be formed on a position opposite to the base main surface 71.

The reflecting film 82 may also be a non-electrically floating state. That is to say, it is not necessary for the reflecting portion to be in an electrically floating state.

The gas in the gas space 92 is not limited to air, and may be changed as desired, given that the gas has a refractive index lower than the dielectric refractive index n2.

The specific material of the dielectric 50 can be changed as desired, given that the material allows passing through of electromagnetic waves and has the dielectric refractive index n2 higher than the gas refractive index n3 and lower than the element refractive index n1.

The constituting material of the element substrate 31 may also be a semiconductor other than InP. Since the element refractive index n1 is the refractive index of the element substrate 31, the element refractive index n1 is also changed when the constituting material of the element substrate 31 is changed. Thus, the element substrate 31 may include a material having a refractive index higher than the dielectric refractive index n2.

The dielectric 50 and the antenna base 70 may also be fixed by other means apart from using an adhesive, for example, fixed by welding.

The dielectric 50 and the antenna base 70 may also be a formed integral. In this case, the adhesive layer 91 may be omitted.

The antenna base 70 may also be formed of a metal. In this case, the reflecting layer 82 may be omitted. In this configuration, electromagnetic waves are reflected by the antenna surface 81. In this configuration, the antenna base 70 corresponds to the "reflecting portion". In this case, the antenna base 70 can become an electrically floating state and hence be insulated. However, the present invention is not limited to the above example, and the antenna base 70 may also be connected to a ground line, and so on.

Further, in this configuration, the antenna surface 81 opposes the terahertz element 20 through the dielectric 50 and the gas space 92, and on the other hand, the base main surface 71 opposes the terahertz element 20 without the gas space 92 interposed in between. That is to say, a portion of the reflecting portion may oppose the terahertz element 20 without the gas space 92 interposed in between. That is to say, it is sufficient for the reflecting portion to include a portion that opposes the terahertz element 20 through the dielectric 50 and the gas space 92, and it is not necessary for all of the reflecting portion to oppose the terahertz element 20 through the dielectric 50 and the gas space 92.

Figure 65:
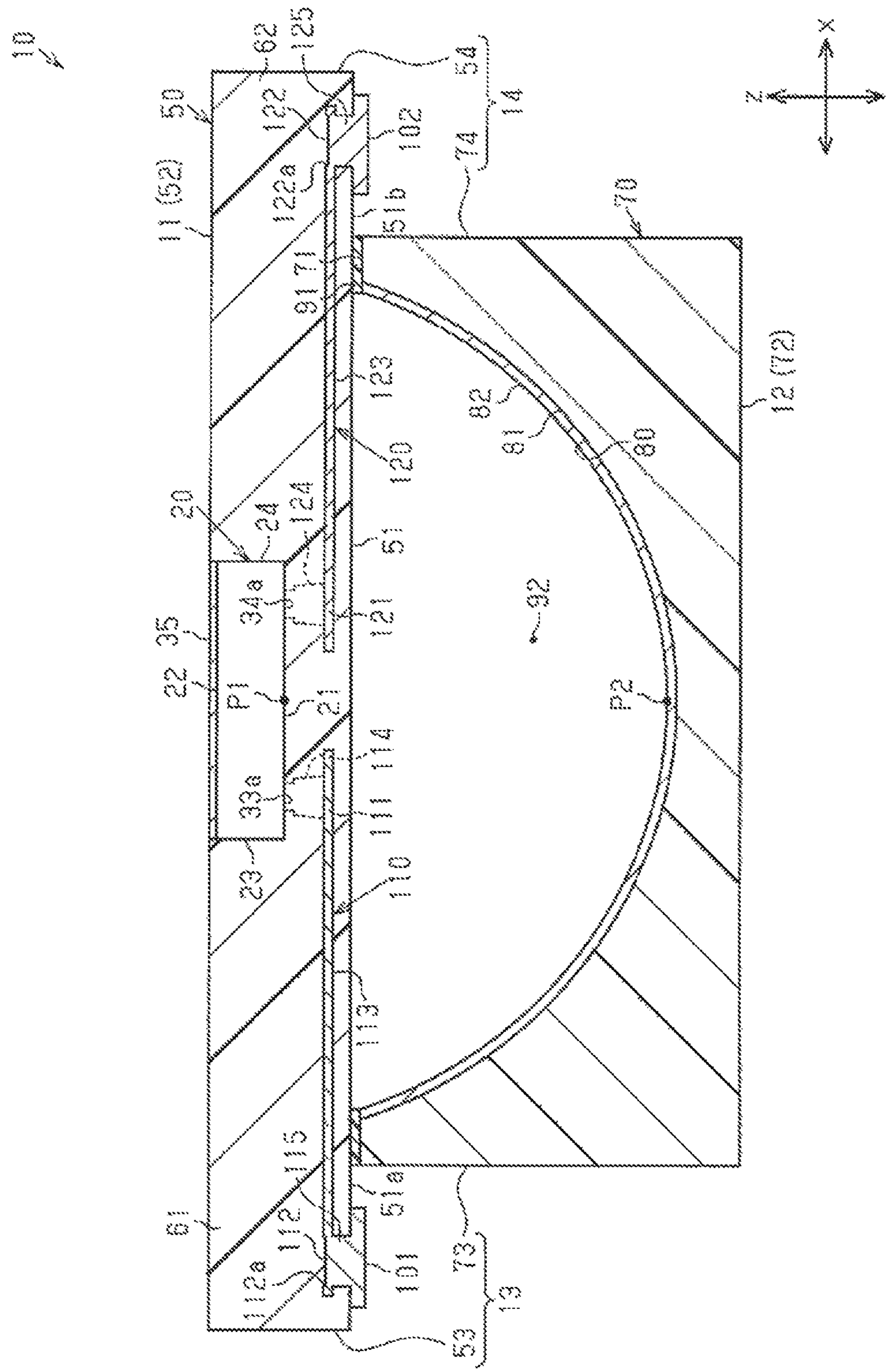
FIG. 65 is a section diagram for illustratively representing a terahertz device of a variation example.

As shown in FIG. 65, the dielectric 50 may be a configuration that does not cover the element back surface 22. That is to say, the element back surface 22 (or the element reflecting layer 35) may also be exposed. That is to say, it is sufficient for the dielectric 50 to at least surround the element main surface 21 and the element side surfaces 23 and 26 of the terahertz element 20.

A spacer may also be disposed between the dielectric 50 and the antenna base 70. In this case, the gas space 92 may also be defined by a surface of the spacer and the antenna surface 81.

The direction (that is, one direction) of electromagnetic waves reflected by the reflecting film 82 may be any. Moreover, given that the reflecting film 82 is a film that reflects electromagnetic waves in overall toward one direction, directions of all electromagnetic waves reflected by the reflecting film 82 do not need to consistent. For example, electromagnetic waves reflected by the reflecting film 82 may also be electromagnetic waves inclining with respect to the one direction.

The electrically conductive portions 110 and 120 may also be formed outside the dielectric 50. For example, the electrically conductive portions 110 and 120 may also be formed on the dielectric main surface 51 or the dielectric back surface 52 in a state of being electrically connected to the terahertz element 20. However, if focusing from the point of suppressing short circuit between the reflecting film 82 and the electrically conductive portions 110 and 120, the electrically conductive portions 110 and 120 may be disposed in the dielectric 50.

Figure 66:
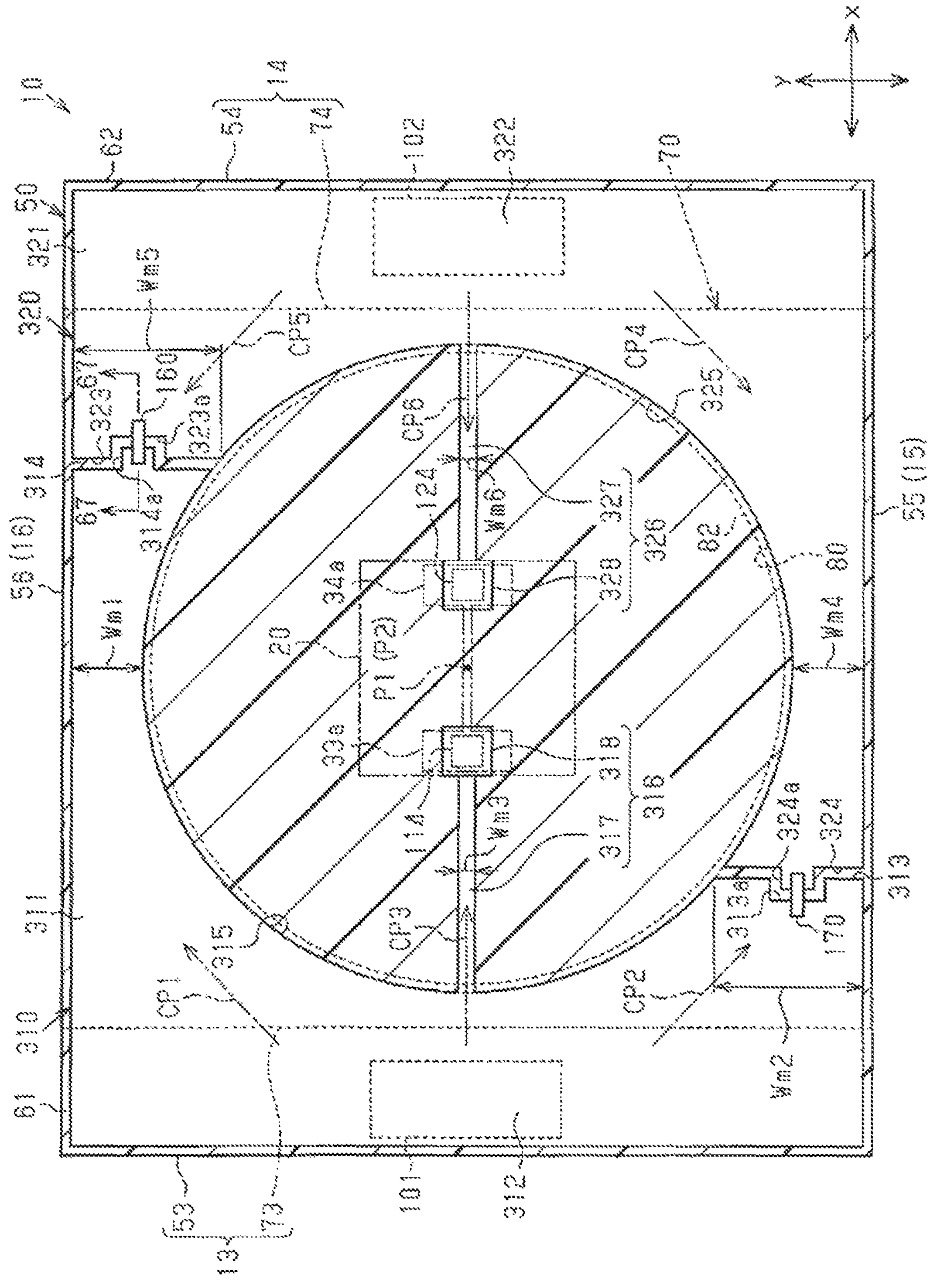
FIG. 66 is a section diagram of a terahertz device of a variation example.

As shown in FIG. 66, a first conductive portion 310 and a second electrically conductive portion 320 may also be formed as being larger in a range non-overlapping with the reflecting film 82.

For example, the first electrically conductive portion 310 includes a first base conductive portion 311 formed around the reflecting film 82, and a first protruding conductive portion 316 protruding from the first base conductive portion 311 toward the terahertz element 20, when observed in the z direction.

The first base conductive portion 311 is formed, for example, collaboratively with the second base conductive portion 321 to surround the reflecting film 82, when observed in the z direction. The first base conductive portion 311 is shaped by, for example, hollowing out along an opening edge of the reflecting film 82 (in other words, an opening edge of the antenna recess 80). Accordingly, the first base conductive portion 311 is non-overlapping with the reflecting film 82.

The first base conductive portion 311 includes a portion on a position staggered from the reflecting film 82 and extending in the y direction, and a portion extending in the x direction from an end portion in the y direction of that portion (an end portion on the side of the fourth dielectric side surface 56), when viewed in the z direction. A portion of the first base conductive portion 311 is formed in the first protruding portion 61, and opposes the first electrode 101 in the z direction. That is to say, the first base conductive portion 311 includes a first electrode opposing portion 312 opposing the first electrode 101.

The first base conductive portion 311 includes a first base end surface 311, and a first front end surface 314 serving as a surface opposing the second electrically conductive portion 320 (the second base conductive portion 321) in the x direction. The first base end surface 313 and the first front end surface 314 are staggered in the x direction, and specifically, the first front end surface 314 is configured closer to the vicinity of the second protruding portion 62 than the first base end surface 313. For example, the first base end surface 313 is configured closer to the side of the first protruding portion 61 than the terahertz element 20, and on the other hand, the first front end surface 314 is configured on the side closer to the second protruding portion 62 than the terahertz element 20.

The first base conductive portion 311 includes a first curve surface 315 connecting the first base end surface 313 and the first front end surface 314. The first curve surface 315 curves along the opening edge of the reflecting film 82 (in other words, the opening edge of the antenna recess 80), when observed in the z direction.

The first protruding conductive portion 316 protrudes from the first curve surface 315 toward the terahertz element 20. The first protruding conductive portion 316 extends in the x direction with the y direction as the width direction, and the front end portion of the first protruding conductive portion 316 opposes the terahertz element 20. That is to say, the first protruding conductive portion 316 includes a first protruding body portion 317 overlapping with the reflecting film 82, and a first element opposing portion 318 overlapping with the terahertz element 20, when observed in the z direction. As shown in FIG. 66, the first element opposing portion 318 is formed as being wider than the first protruding body portion 317.

Similar to the first electrically conductive portion 310, the second electrically conductive portion 320 includes a second base conductive portion 321 formed around the reflecting film 82, and a second protruding conductive portion 326 protruding from the second base conductive portion 321 toward the terahertz element 20, when observed in the z direction.

The second base conductive portion 321 is formed as, for example, collaboratively with the first base conductive portion 311 to surround the reflecting film 82, when observed in the z direction. That is to say, the two base conductive portions 311 and 321 in this variation example function collaboratively to surround the reflecting film 82, when viewed from the z direction. The second base conductive portion 321 is shaped by, for example, hollowing out along the opening edge of the reflecting film 82 (in other words, the opening edge of the antenna recess 80). Accordingly, the second base conductive portion 321 is non-overlapping with the reflecting film 82.

The second base conductive portion 321 includes a portion on a position staggered from the reflecting film 82 in the x direction and extending in the y direction, and a portion extending in the x direction from an end portion in the y direction of that portion (an end portion on the side of the fourth dielectric side surface 56), when observed in the z direction. A portion of the second base conductive portion 321 is formed in the second protruding portion 62, and opposes the second electrode 102 in the z direction. That is to say, the second base conductive portion 321 includes a second electrode opposing portion 322 opposing the second electrode 102.

The second base conductive portion 321 includes a second base end surface 323, and a second front end surface 324 serving as a surface opposing the first electrically conductive portion 310 (the first base conductive portion 311) in the x direction. The second base end surface 323 and the second front end surface 324 are staggered in the x direction, and specifically, the second front end surface 324 is configured closer to the vicinity of the first protruding portion 61 than the second base end surface 323. For example, the second base end surface 323 is configured to be closer to the side of the second protruding portion 62 than the terahertz element 20, and on the other hand, the second front end surface 324 is configured to be closer to the side of first protruding portion 61 than the terahertz element 20.

The first base conductive portion 311 and the second base conductive portion 321 are spaced and opposite in the x direction. Specifically, the first front end surface 314 and the second base end surface 323 are spaced and opposite in the x direction, and the first base end surface 313 and the second front end surface 324 are spaced and opposite in the x direction. The dielectric 50 is disposed between the two base conductive portions 311 and 321, so that the two base conductive portions 311 and 321 are not short circuited. The first base end surface 313, the first front end surface 314, the second base end surface 323 and the second front end surface 324 may also be said as opposing surfaces opposing each other in the two base conductive portions 311 and 321.

The second base conductive portion 321 includes a second curve surface 325 connecting the second base end surface 323 and the second front end surface 324. The second curve surface 325 curves along the opening edge of the reflecting film 82 (in other words, the opening edge of the antenna recess 80), when observed in the z direction.

The second protruding conductive portion 326 protrudes from the second curve surface 325 toward the terahertz element 20. The second protruding conductive portion 326 extends in the x direction with the y direction as the width direction, and the front end portion of the second protruding conductive portion 326 opposes the terahertz element 20. That is to say, the second protruding conductive portion 326 includes a second protruding body portion 327 overlapping with the reflecting film 82, and a second element opposing portion 328 overlapping with the terahertz element 20, when observed in the z direction. As shown in FIG. 66, the second element opposing portion 328 is formed as being wider than that of the second protruding body portion 327.

In this variation example, the terahertz device 10 may also include the first protection diode 160 and the second protection diode 170. The first protection diode 160 and the second protection diode 170 are electrically connected to the two base conductive portions 311 and 321.

For example, the first base conductive portion 311 includes a first protrusion **314*a* protruding from the first front end surface 314 toward the second base end surface 323, and the second base conductive portion 321 includes a second recess 323*a* recessed from the second base end surface 323. A portion of the first protrusion 314*a* enters the second recess 323*a*. The first protection diode 160 is configured throughout the first protrusion 314*a* and the second base conductive portion 321**.

Figure 67:
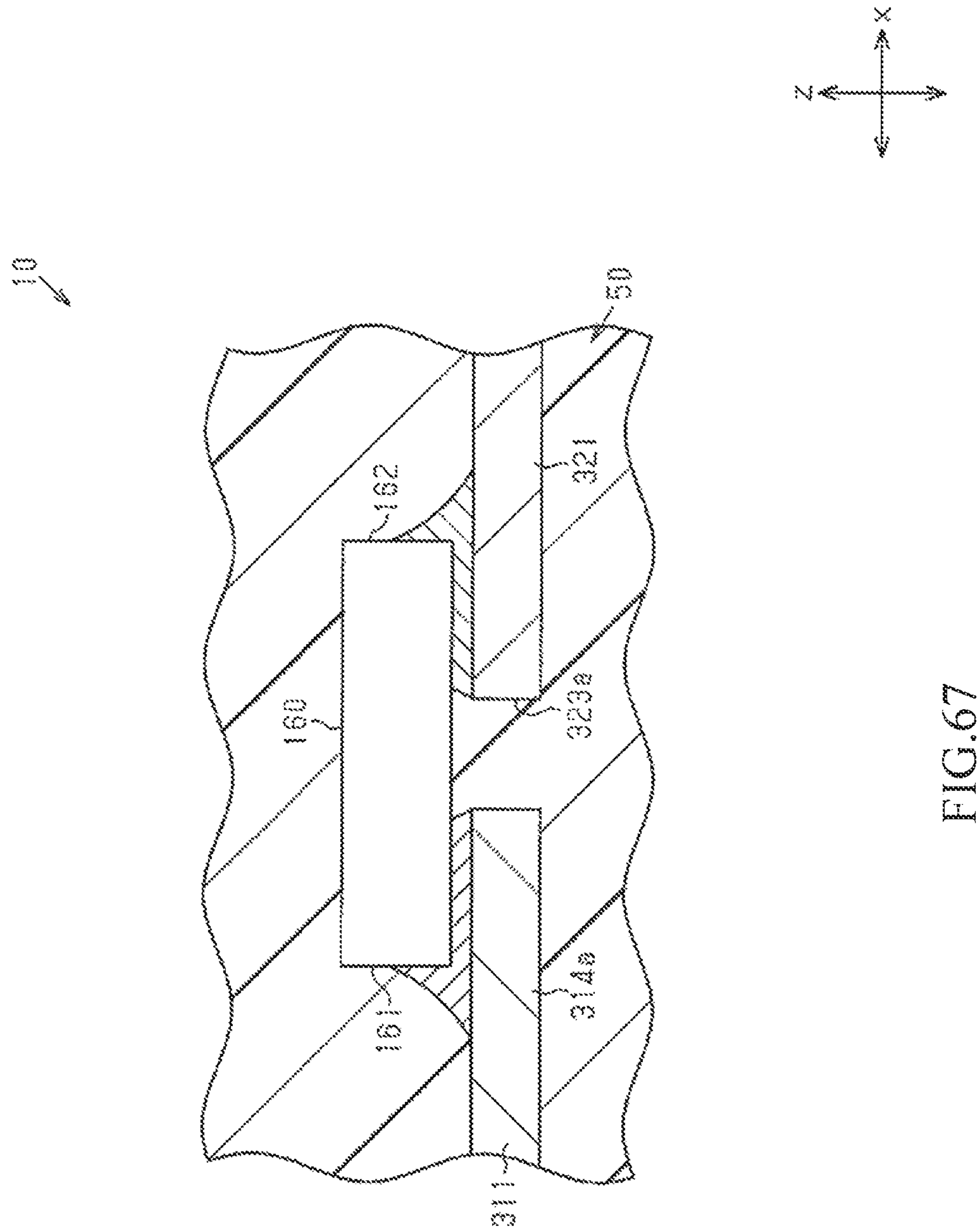
FIG. 67 is a section diagram of FIG. 66 along the line 67-67.

As shown in FIG. 67, the first anode electrode 161 and the first cathode electrode 162 may also be formed on two end portions in the x direction of the first protection diode 160. In this case, the first anode electrode 161 may be bonded to the first protrusion **314*a*, and the first cathode electrode 162 may be bonded to the second base conductive portion 321. Accordingly, the first protection diode 160 is electrically connected to the two electrically conductive portions 310 and 320. Moreover, the first cathode electrode 162 may be bonded to the first protrusion 314*a*, and the first anode electrode 161 may be bonded to the second base conductive portion 321**.

Alternatively, as shown in FIG. 66, the second base conductive portion 321 includes a second protrusion **324*a* protruding from the second front end surface 324 toward the first base end surface 313, and the first base conductive portion 311 includes a first recess 313*a* recessed from the first base end surface 313. A portion of the second protrusion 324***a* enters the first recess 313*a*. The second protection diode 170 may also be configured throughout the second protrusion 324*a* and the first base conductive portion 311.

Similar to the first protection diode 160, the second protection diode 170 may include a second anode electrode 171 and a second cathode electrode 172 formed on two end portions in the x direction, and is bonded to the second protrusion 324*a* and the first base conductive portion 311 by a connecting direction opposite to that of the first protection diode 160.

Herein, current paths from the first electrode opposing portion 312 include a first current path CP1 from the first electrode opposing portion 312 to the first protection diode 160, a second current path CP2 from the first electrode opposing portion 312 to the second protection diode 170, and a third current path CP3 from the first electrode opposing portion 312 to the first element opposing portion 318.

In this configuration, the first electrically conductive portion 310 can be formed such that the wiring resistances of the first current path CP1 and the second current path CP2 are lower than the wiring resistance of the third current path CP3. For example, the minimum width of the first current path CP1 is set to a first minimum width Wm1, the minimum width of the second current path CP2 is set to a second minimum width Wm2, and the minimum width of the third current path CP is set to a third minimum width Wm3. In this case, the first minimum width Wm1 and the second minimum Wm2 may be greater than the third minimum width Wm3.

In the example in FIG. 66, the first minimum width Wm1 is the shortest distance between the first curve surface 315 and the end surface in the y direction of the first base conductive portion 311, the second minimum Wm2 is the width (the y-direction length) of the first base end surface 313, and the third minimum Wm3 is the width of the first protruding body portion 317. Moreover, the first minimum width Wm1 and the second minimum Wm2 may be greater than the width of the first element opposing portion 318.

In addition, the first current path CP1 may be said as a path from the first protection diode 160 to the first electrode opposing portion 312, or may be said as a current path between the first protection diode 160 and the first electrode opposing portion 312. Similarly, the second current path CP2 may be said as a path from the second protection diode 170 to the first electrode opposing portion 312, or may be said as a current path between the second protection diode 170 and the first electrode opposing portion 312. The third current path CP3 may be said as a path from the first element opposing portion 318 to the first electrode opposing portion 312, or may be said as a current path between the first element opposing portion 318 and the first electrode opposing portion 312.

Similarly, current paths from the second electrode opposing portion 322 include a fourth current path CP4 from the second electrode opposing portion 322 to the second protection diode 170, a fifth current path CP5 from the second electrode opposing portion 322 to the first protection diode 160, and a sixth current path CP6 from the second electrode opposing portion 322 to the second element opposing portion 328.

In this configuration, the second electrically conductive portion 320 can be formed such that the wiring resistances of the fourth current path CP4 and the fifth current path CP5 are lower than the wiring resistance of the sixth current path CP6. For example, if the minimum width of the fourth current path CP4 is set to a fourth minimum width Wm4, the minimum width of the fifth current path CP5 is set to a fifth minimum width Wm5, and the minimum width of the sixth current path CP6 is set to a sixth minimum width Wm6, the fourth minimum width Wm4 and the fifth minimum width Wm5 may be greater than the sixth minimum width Wm6.

In the example in FIG. 66, the fourth minimum width Wm4 is the shortest distance between the second curve surface 325 and the end surface in the y direction of the second base conductive portion 321, the fifth minimum Wm5 is the width (the y-direction length) of the second base end surface 323, and the sixth minimum Wm6 is the width of the second protruding body portion 327. Moreover, the fourth minimum width Wm4 and the fifth minimum Wm5 may be greater than the width of the second element opposing portion 328.

In addition, the fourth current path CP4 may be said as a path from the second protection diode 170 to the second electrode opposing portion 322, or may be said as a current path between the second protection diode 170 and the second electrode opposing portion 322. Similarly, the fifth current path CP5 may be said as a path from the first protection diode 160 to the second electrode opposing portion 322, or may be said as a current path between the first protection diode 160 and the second electrode opposing portion 322. The sixth current path CP6 may be said as a path from the second element opposing portion 328 to the second electrode opposing portion 322, or may be said as a current path between the second element opposing portion 328 and the second electrode opposing portion 322.

In the variation example, specific mounting forms of the protection diodes 160 and 170 on the two electrically conductive portions 310 and 320 may be any as desired.

Figure 68:
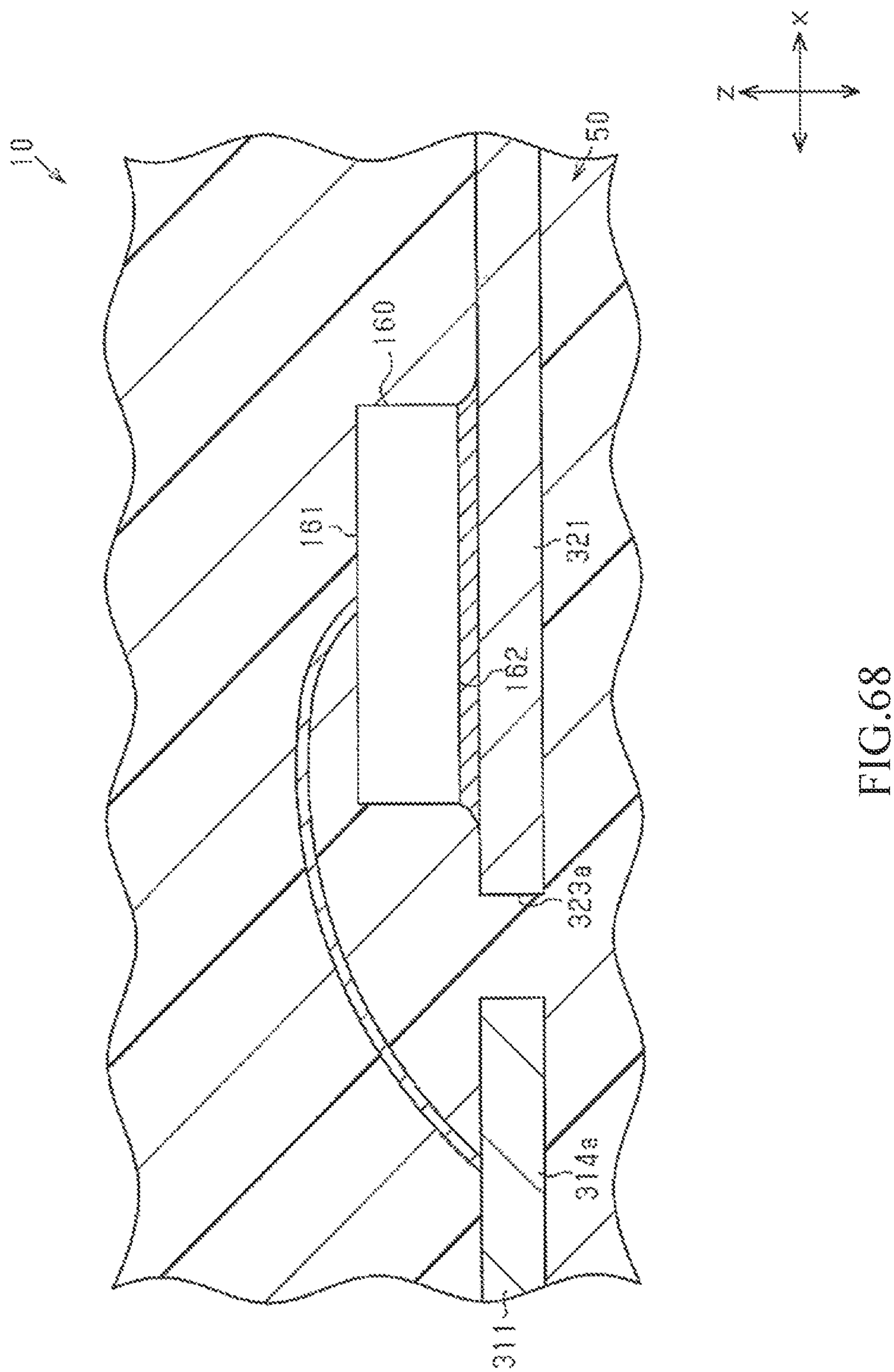
FIG. 68 is a section diagram of a variation example of a mounting form of a protection diode.

For example, as shown in FIG. 68, when the first anode electrode 161 and the first cathode electrode 162 are formed on two end surfaces (the upper surface and the lower surface) in the z direction of the first protection diode 160, the first protection diode 160 may also be configured to be die-bonded to the second base conductive portion 321 and wire-bonded to the first protrusion 314*a*. Specifically, for example, the first cathode electrode 162 formed on the lower surface of the first protection diode 160 may be bonded to the second base conductive portion 321, and the first anode electrode 161 formed on the upper surface of the first protection diode 160 may be electrically connected to the first protrusion 314*a* by a lead wire. Moreover, the first protection diode 160 may also be configured as being die-bonded to the first protrusion 314*a* and wire-bonded to the second base conductive portion 321. That is to say, it is sufficient for the first protection diode 160 to be electrically connected to the two base conductive portions 311 and 321, instead of also arranged throughout the two base conductive portions 311 and 321. The same applies to the second protection diode 170.

Figure 69:
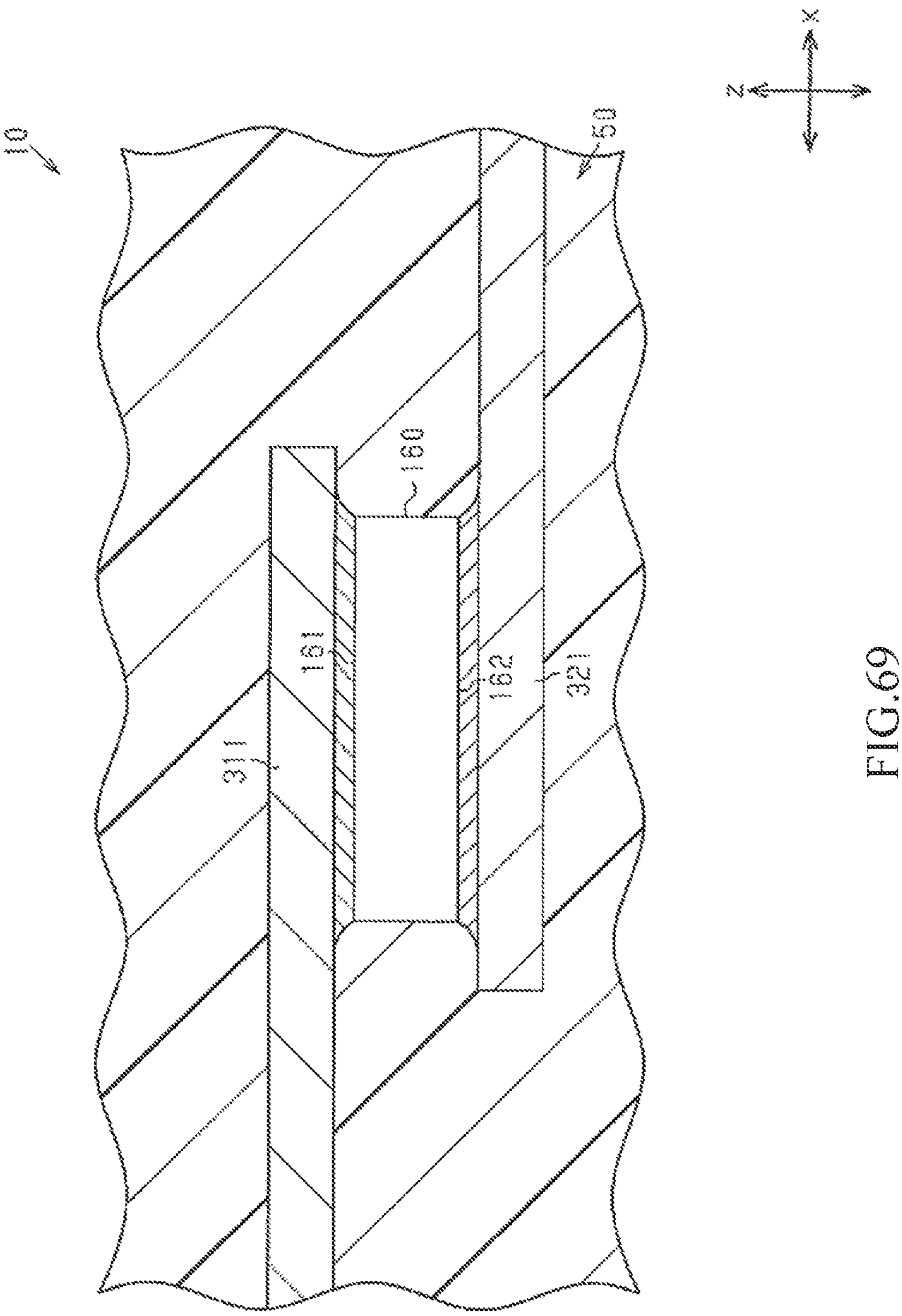
FIG. 69 is a section diagram of a variation example of a mounting form of a protection diode.

In addition, as shown in FIG. 69, a multilayer structure in which the first base conductive portion 311 and the second base conductive portion 321 are in staggered arrangement in the z direction may also be adopted. In this case, the first protection diode 160 may be configured between the first base conductive portion 311 and the second base conductive portion 321, and the first protection diode 160 is bonded with the two base conductive portions 311 and 321.

In the variation example, the value relationship of the minimum widths Wm1 to Wm6 may be any as desired. For example, the third minimum width Wm3 may be greater than or equal to the first minimum width Wm1 and the second minimum width Wm2.

The positions of the protection diodes 160 and 170 may be any as desired. For example, in one configuration, a protrusion protruding toward the first front end surface 314 may be disposed on the second base end surface 323, and the first protection diode 160 is electrically connected to the protrusion and the first protrusion 314*a*. The same applies to the second protection diode 170. Moreover, at least one of the two protection diodes 160 and 170 may be omitted.

Figure 70:
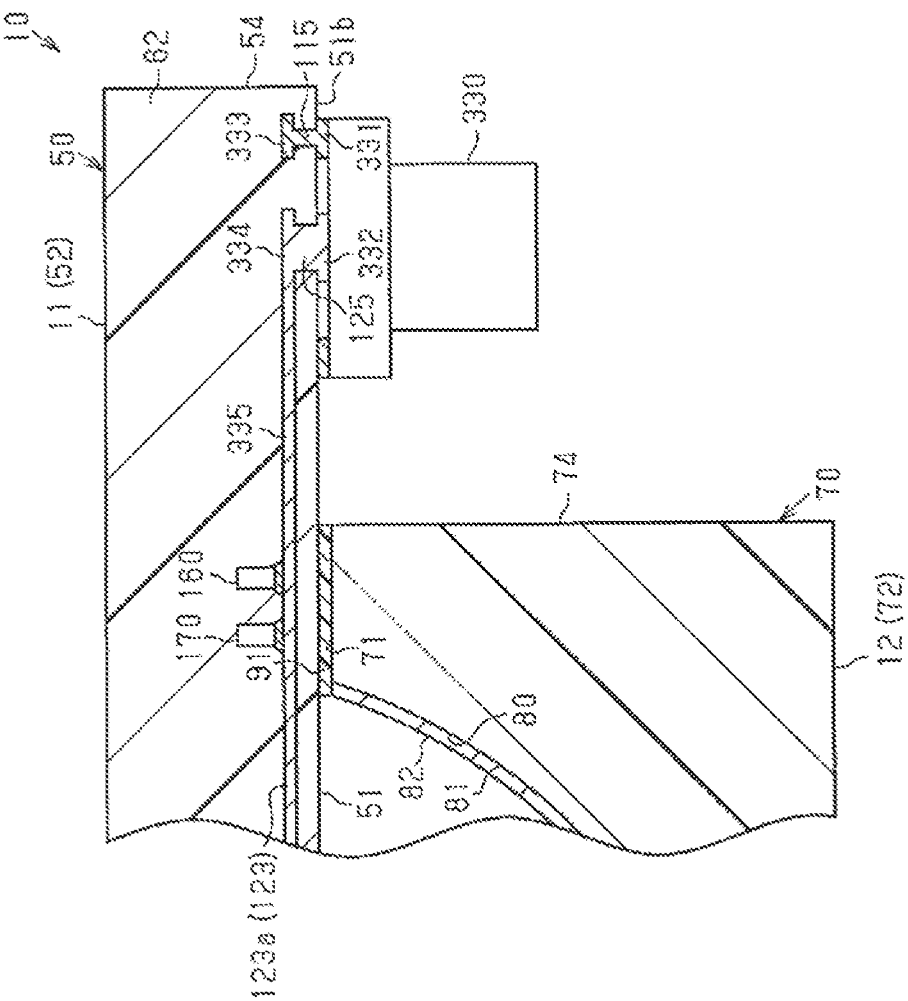
FIG. 70 is a section diagram for illustratively representing a portion of a terahertz device of a variation example.
Figure 71:
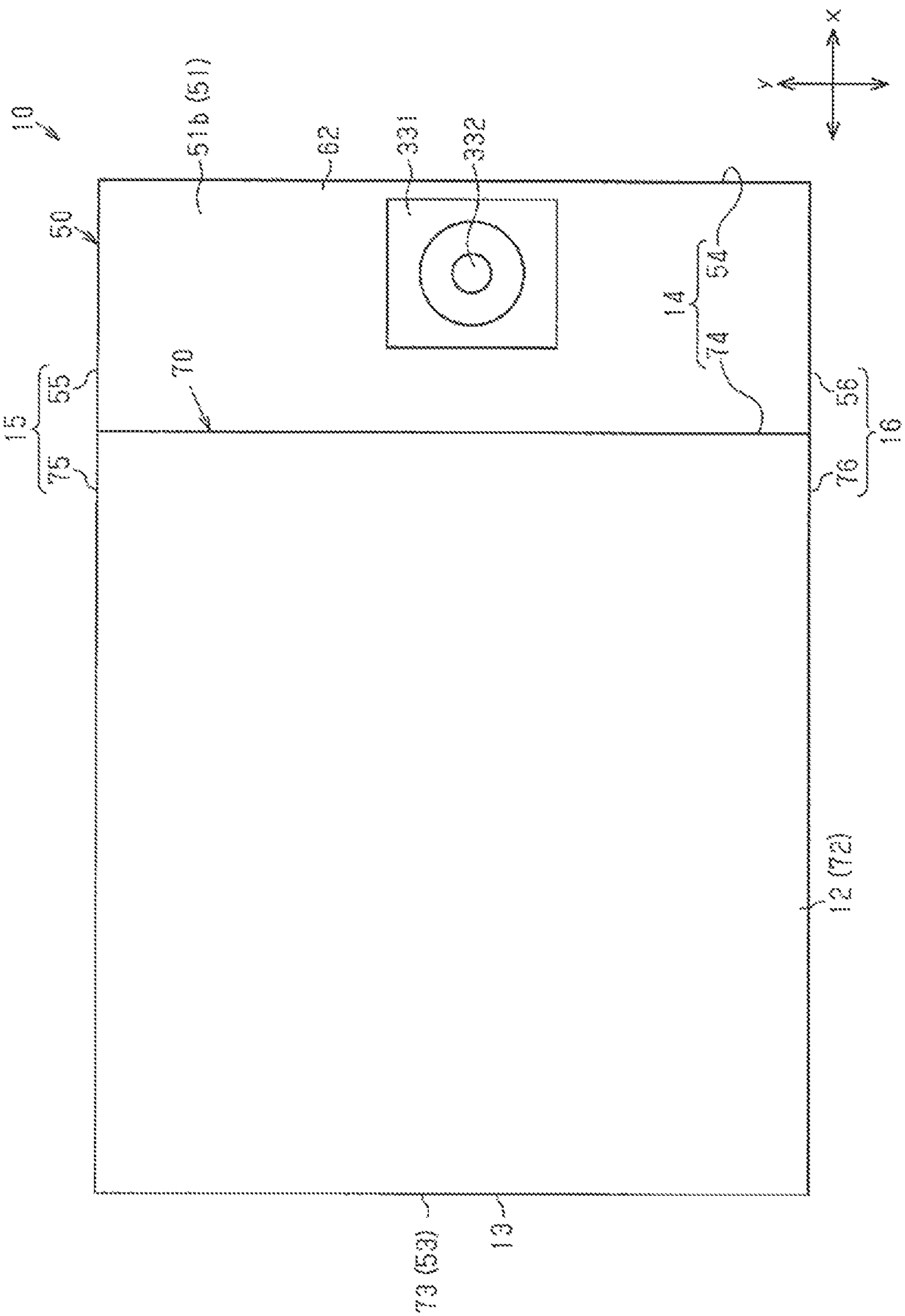
FIG. 71 is a bottom view for illustratively representing a terahertz device in a state with a connector removed.

As shown in FIG. 70, the terahertz device 10 may also include a connector 330. In this case, as shown in FIG. 71, a first electrode 331 and a second electrode 332 capable of forming the shape of the connector 330 may be mounted on the second extruding surface 51*b*. The specific shapes of the two electrodes 331 and 332 may be any as desired, given that the shapes are approximately changed according to the specification of the connector 330. As an example, the first electrode 331 is shaped as a rectangle with a hole, and the second electrode 332 is shaped as a circle formed in the hole. Moreover, for better indication in a drawing, FIG. 71 shows a state in which the connector 330 is removed.

Figure 72:
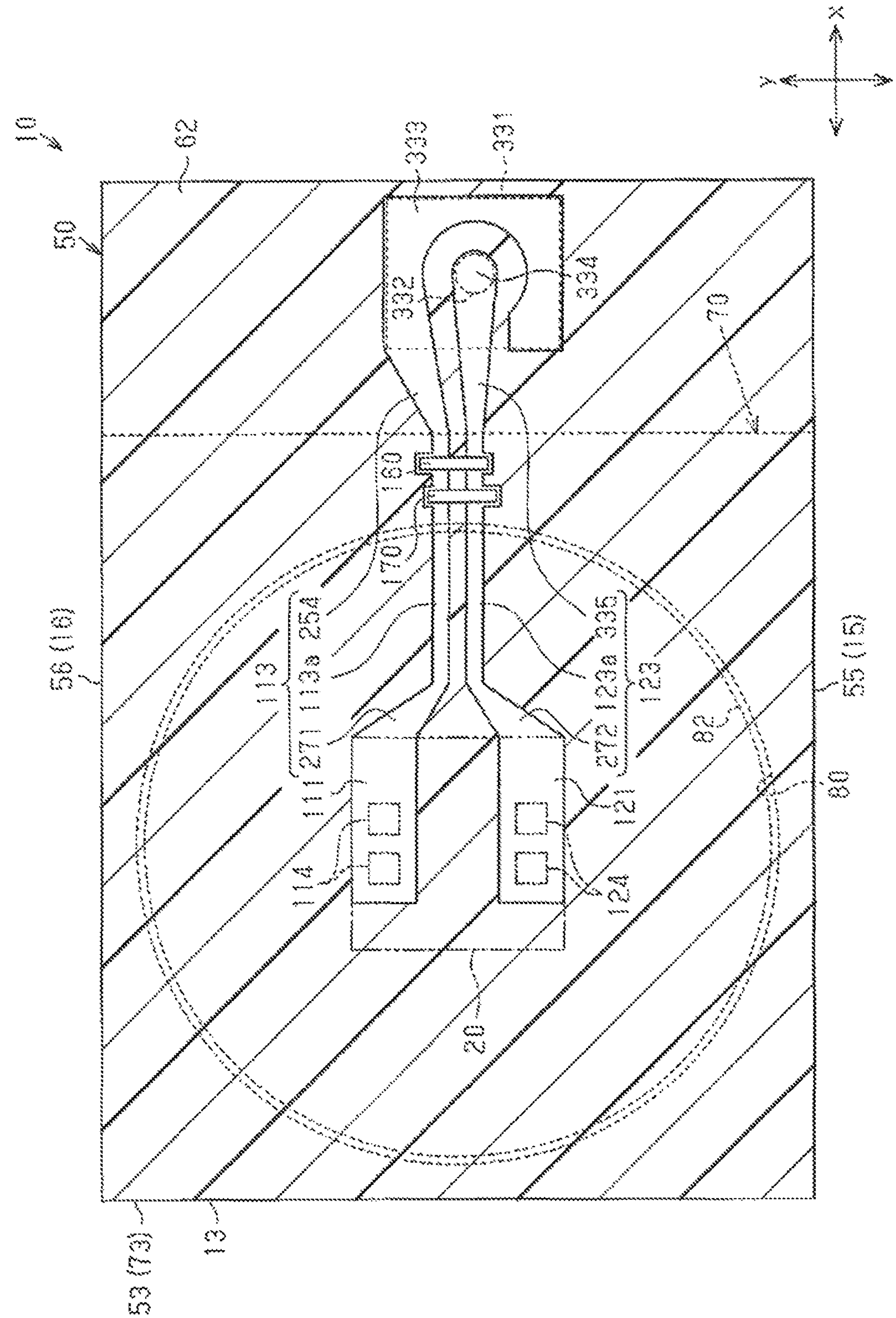
FIG. 72 is a section diagram of an electrically conductive portion of a variation example.

Moreover, as shown in FIG. 72, electrode opposing portions 333 and 334 may also be formed correspondingly to the shape of the electrodes 331 and 332. For example, the second electrode opposing portion 334 and a second electrode side taper portion 335 may function collaboratively to be shaped as a droplet (in other words, shaped as a waterdrop or a teardrop). Moreover, the first electrode opposing portion 333 may also be shaped as a rectangular frame in a manner of surrounding the second electrode opposing portion 334 and the second electrode side taper portion 335. In this case, the first electrode opposing portion 333 can be provided with an opening without coming into contact with the second electrode opposing portion 334 and the second electrode side taper portion 335.

In addition, the specific shapes and position of the first column portion 115 connecting the first electrode opposing portion 333 and the first electrode 331, and the second column portion 125 connecting the second electrode opposing portion 334 and the second electrode 332 may be any as desired. Moreover, the first column portion 115 may also be provided in plural.

As shown in FIG. 72, at least one of the protection diodes 160 and 170 may also be disposed between the two connecting portions 113 and 123. The two protection diodes 160 and 170 may be electrically connected to the two connecting portions 113 and 123, respectively. For example, the two protection diodes 160 and 170 may be mounted on the two connecting body portions 113*a* and 123*a* in a state of being bonded with the two connecting body portions 113*a* and 123*a*, respectively. In this case, portions of the connecting portions 113 and 123 (specifically, the connecting body portions 113*a* and 123*a*) may be expanded by means of mounting the two protection diodes 160 and 170. Moreover, the two protection diodes 160 and 170 may also be mounted in portions non-overlapping with the reflective film 82 in the connecting portions 113 and 123. However, the two protection diodes 160 and 170 are optional, and may be omitted.

Moreover, the first protection diode 160 may also be configured as being mounted on one of the two connecting portions 113 and 123 and wire-bonded to the other. The same applies to the second protection diode 170.

As shown in FIG. 71 and FIG. 72, when the two electrodes 331 and 332 are disposed on the second extruding surface 51*b*, the first protruding portion 61 may also be omitted. On the other hand, when the two electrodes 331 and 332 are disposed on the first extruding surface 51*a*, the second protruding portion 62 may also be omitted.

The terahertz element 20 may also be an element that receives electromagnetic waves and converts the received electromagnetic waves to electric energy. Specifically, the terahertz element 20 may be, for example, an element that receives electromagnetic waves irradiated (inputted) to the oscillation point P1. In this case, the oscillation point P1 may be said as a receiving point at which electromagnetic waves are received, or may be said as a resonance point at which resonance of electromagnetic waves of the terahertz waveband takes place.

In this configuration, the reflecting film 82 may be a film that reflects incident electromagnetic waves toward the terahertz element 20 (preferably the receiving point). According to this configuration, electromagnetic waves reflected by the reflecting film 82 are transmitted to the terahertz element 20 through the gas space 92 and the dielectric 50. Accordingly, the receiving strength of the terahertz device 10 is increased, hence enhancing the gain associated with reception.

Herein, because the terahertz element 20 is surrounded by the dielectric 50 having the dielectric refractive index n2 lower than the element refractive index n1 and higher than the gas refractive index n3, the refractive index increases in a stepped manner from the reflecting film 82 toward the terahertz element 20. Therefore, the change in refractive index at a boundary of the terahertz element 20 can be reduced. Accordingly, excessive reflection of electromagnetic waves at the boundary of the terahertz element 20 can be suppressed, such that the generation of multiple resonant modes in the terahertz element 20 can be suppressed.

In this configuration, the device main surface 11 may be said as an incident surface for receiving incident electromagnetic waves, and the reflecting film 82 may be said as a film that reflects the incident electromagnetic waves from the device main surface 11 toward the terahertz element 20. In addition, the device main surface 11 may be said as an input surface for inputting electromagnetic waves, and the terahertz device 10 may also be said as a device that receives the inputted electromagnetic waves from the device main surface 11.

Moreover, the reflecting film 82 is configured to reflect a portion of the incident electromagnetic waves toward the terahertz element 20, or may be configured to reflect all the incident electromagnetic waves toward the terahertz element 20.

In addition, the terahertz element 20 may also be an element that performs both oscillation (generation) and reception of electromagnetic waves. That is to say, the oscillation point P1 may also be one point at which at least one of oscillation and reception of electromagnetic waves is performed.

(Notes)

The technical concepts based on the embodiments and the variation examples are recoded in the description below.

(Note 1)

A terahertz device, comprising:

a terahertz element, generating or receiving an electromagnetic wave;

a dielectric, surrounding the terahertz element, comprising a dielectric main surface and a dielectric back surface;

a first surface electrode, formed on the dielectric main surface and electrically connected to the terahertz element; and a second surface electrode, formed on the dielectric back surface and electrically connected to the terahertz element.

(Note 2)

Alternatively, the terahertz device comprises a connector.

(Note 3)

Alternatively, the terahertz device comprises a first electrically conductive portion and a second electrically conductive portion as an electrically conductive portion; wherein, the first electrically conductive portion comprises a first base conductive portion formed around the reflecting film, when observed in a thickness direction of the terahertz device, the second electrically conductive portion comprises a second base conductive portion formed around the reflecting film, when observed in the thickness direction of the terahertz device, and the first base conductive portion and the second base conductive portion are spaced and opposite.

(Note 4)

Alternatively, the reflecting film has an opening toward a direction, the first base conductive portion comprises a first curve surface curving along an opening edge of the reflecting film, the first electrically conductive portion comprises a first protruding conductive portion protruding from the first curve surface toward the terahertz element, the second base conductive portion comprises a second curve surface curving along the opening edge of the reflecting film, and the second electrically conductive portion comprises a second protruding conductive portion protruding from the second curve surface toward the terahertz element.

(Note 5)

Alternatively, the terahertz device comprises a protection diode electrically connected to the two base conducting portions.

(Note 6)

Alternatively, the first base conductive portion comprises a first electrode opposing portion opposing the first electrode, the first protruding conductive portion comprises a first element opposing portion opposing the terahertz element, and the first electrically conductive portion is formed such that a wiring resistance of a current path between the first electrode opposing portion and the protection diode is lower than a wiring resistance of a current path between the first electrode opposing portion and the first element opposing portion.

(Note 7)

Alternatively, a minimum width of a current path between the first electrode opposing portion and the protection diode is greater than a minimum width of a current path between the first electrode opposing portion and the first element opposing portion.

(Note 8)

Alternatively, the second base conductive portion comprises a second electrode opposing portion opposing the second electrode, the second protruding conductive portion comprises a second element opposing portion opposing the terahertz element, and the second electrically conductive portion is formed such that a wiring resistance of a current path between the second electrode opposing portion and the protection diode is lower than a wiring resistance of a current path between the second electrode opposing portion and the second element opposing portion.

(Note 9)

Alternatively, a minimum width of a current path between the second electrode opposing portion and the protection diode is greater than a minimum width of a current path between the second electrode opposing portion and the second element opposing portion.

[1] A terahertz device, comprising:

a terahertz element, generating an electromagnetic wave;

a dielectric, comprising a dielectric material and surrounding the terahertz element;

a gas space, comprising a gas; and an reflecting portion, comprising a portion opposing the terahertz element through the dielectric and the gas space and reflecting the electromagnetic wave toward a direction, wherein the electromagnetic wave is generated from the terahertz element and transmitted through the dielectric and the gas space, wherein, an element refractive index, which is a refractive index of the terahertz element, is higher than a gas refractive index, which is a refractive index of the gas, and a dielectric refractive index, which is a refractive index of the dielectric, is lower than the element refractive index and higher than the gas refractive index.

[2] The terahertz device according to [1], wherein the terahertz element comprises an element substrate, and the element refractive index is a refractive index of the element substrate.

[3] The terahertz device according to [2], wherein the element substrate comprises InP.

[4] The terahertz device according to any one of [1 to 3], wherein the gas is air.

[5] The terahertz device according to any one of [1 to 4], wherein the dielectric comprises epoxy resin.

[6] The terahertz device according to any one of [1 to 5], comprising:

an antenna base, comprising an antenna surface opposing the terahertz element through the dielectric and the gas space;

wherein the reflecting portion is a reflecting film formed on the antenna surface.

[7] The terahertz device according to [6], wherein the antenna base is formed of an insulative material.

[8] The terahertz device according to [6 or 7], wherein the terahertz element comprises an element main surface and an element back surface serving as surfaces crossing a thickness direction of the terahertz element;

the element main surface comprises an oscillation point;

the element back surface is a surface on a side opposite to the element main surface; and the dielectric comprises:

a dielectric main surface opposing the reflecting film in the thickness direction of the terahertz element, and a dielectric back surface, being a surface on a side opposite to the dielectric main surface.

[9] The terahertz device according to [8], wherein the reflecting film is formed as being larger than the terahertz element, when observed in the thickness direction of the terahertz element.

[10] The terahertz device according to [8 or 9], wherein the gas space is defined by the dielectric main surface and the antenna surface.

[11] The terahertz device according to [10], wherein the antenna base comprises:

a base main surface, opposing the dielectric main surface; and an antenna recess, recessed from the base main surface; and the antenna surface is an inner surface of the antenna recess, and curves in a manner of recessing toward a direction away from the terahertz element.

[12] The terahertz device according to [11], wherein the reflecting film is formed on the antenna surface but is not formed on the base main surface.

[13] The terahertz device according to [11 or 12], wherein the antenna recess comprises a diameter expansion surface with an expanded diameter compared to the antenna surface, and a step surface formed between the antenna surface and the diameter expansion surface; and the reflecting film is formed throughout the antenna surface and the step surface.

[14] The terahertz device according to any one of [11 to 13], comprising:

a fixing portion, fixing the dielectric with the antenna base.

[15] The terahertz device according to [14], wherein the fixing portion comprises an adhesive layer disposed between the base main surface and the dielectric main surface and bonding the dielectric and the antenna base, and the gas space is sealed by the adhesive layer.

[16] The terahertz device according to any one of [8 to 15], wherein the terahertz element is surrounded by the dielectric in a state where the element main surface faces the reflecting film.

[17] The terahertz device according to [16], wherein the terahertz element irradiates the electromagnetic wave radially from the oscillation point throughout a range of an opening angle, and the reflecting film is formed throughout an angle greater than the opening angle with respect to the oscillation point.

[18] The terahertz device according to [16 or 17], wherein the reflecting film is shaped as a parabolic antenna.

[19] The terahertz device according to [18], wherein the reflecting film is configured by locating a focus of the reflecting film at the oscillation point.

[20] The terahertz device according to [18], wherein a center point of the reflecting film coincides with the oscillation point, when observed in the thickness direction of the terahertz element.

[21] The terahertz device according to [18], wherein the terahertz element is configured on a position at which a center point of the reflecting film is staggered from the oscillation point, when observed in the thickness direction of the terahertz element.

[22] The terahertz device according to any one of [8 to 21], wherein an element reflecting layer that reflects the electromagnetic wave generated from the terahertz element is formed on the element back surface.

[23] The terahertz device according to any one of [8 to 22], wherein an electrically conductive portion electrically connected to the terahertz element is disposed in the dielectric.

[24] The terahertz device according to [23], wherein the dielectric comprises a protruding portion further protruding to a side compared to the antenna base, when observed in the thickness direction of the terahertz element;

an electrode electrically connected to the electrically conductive portion is formed on a portion on the dielectric main surface or the dielectric back surface corresponding to the protruding portion; and the electrically conductive portion electrically connects the terahertz element and the electrode.

[25] The terahertz device according to [24], wherein if a protruding direction of the protruding portion is set as a first direction, and a direction orthogonal to both the first direction and the thickness direction of the terahertz element is set as a second direction, the electrically conductive portion extends in the first direction in a manner of overlapping with both the terahertz element and the electrode, when observed in the thickness direction of the terahertz element.

[26] The terahertz device according to [25], wherein the terahertz element comprises a pad;

the electrically conductive portion comprises:

an element opposing portion, opposing the pad in the thickness direction of the terahertz element, and a bump, disposed between the pad and the element opposing portion; and the terahertz element is flip-chip mounted on the element opposing portion with the bump interposed in between.

[27] The terahertz device according to [26], wherein the electrically conductive portion comprises:

an electrode opposing portion, opposing the electrode in the thickness direction of the terahertz element, and a connecting portion, connecting the element opposing portion and the electrode opposing portion and extending in the first direction; and if the second direction is a width direction of the electrically conductive portion, at least a portion of the connecting portion is formed as being narrower than the element opposing portion.

[28] The terahertz device according to [27], wherein the electrode opposing portion is formed as being wider than the connecting portion.

[29] The terahertz device according to [27 or 28], wherein the connecting portion comprises:

a connecting body portion, formed as having a width narrower than the element opposing portion; and an element side taper portion, connecting the connecting body portion and the element opposing portion, and formed as having a width that gradually increases from the connecting body portion toward the element opposing portion.

[30] The terahertz device according to [29], wherein the connecting body portion is formed as having a width narrower than the electrode opposing portion;

the connecting portion comprises an electrode side taper portion; and the electrode side taper portion connects the connecting body portion and the electrode opposing portion, and is formed as having a width that gradually increases from the connecting body portion toward the electrode opposing portion.

[31] The terahertz device according to any one of [26 to 30], comprising:

a first electrically conductive portion and a second electrically conductive portion as an electrically conductive portion;

wherein the first electrically conductive portion and the second electrically conductive portion extend from the terahertz element towards directions away from each other, when observed in the thickness direction of the terahertz element.

[32] The terahertz device according to [31], wherein the dielectric comprises a first protruding portion and a second protruding portion arranged apart in the first direction, as the protruding portion;

the terahertz element comprises a first pad and a second pad arranged apart and opposite in the first direction, as the pad;

the terahertz device comprises a first electrode formed on a portion on the dielectric main surface or the dielectric back surface corresponding to the first protruding portion, and a second electrode formed on a portion on the dielectric main surface or the dielectric back surface corresponding to the second protruding portion, as the electrode; and the first electrically conductive portion extends in the first direction in a manner of opposing both of the first pad and the first electrode, and the second electrically conductive portion extends in the first direction in a manner of opposing both of the second pad and the second electrode.

[33] The terahertz device according to [32], wherein the first electrically conductive portion comprises:

a first element opposing portion, as the element opposing portion opposing the first pad in the thickness direction of the terahertz element, and a first bump, as the bump disposed between the first pad and the first element opposing portion; and the second electrically conductive portion comprises:

a second element opposing portion, as the element opposing portion opposing the second pad in the thickness direction of the terahertz element, and a second bump, as the bump disposed between the second pad and the second element opposing portion; and the first pad and the second pad extend in the second direction, the first element opposing portion and the second element opposing portion extend in the second direction, the first bump is arranged in plural in the second direction, and the second bump is arranged in plural in the second direction.

[34] The terahertz device according to any one of [26 to 30], comprising:

a first electrically conductive portion and a second electrically conductive portion as the electrically conductive portion;

wherein the first electrically conductive portion and the second electrically conductive portion extend in the first direction in a manner of being arranged in the second direction.

[35] The terahertz device according to [34], wherein the dielectric comprises a first protruding portion and a second protruding portion arranged apart in the first direction, as the protruding portion;

the terahertz element comprises a first pad and a second pad arranged apart in the second direction, as the pad;

the terahertz device comprises a first electrode and a second electrode formed on the dielectric main surface or the dielectric back surface, as the electrode;

the first electrode and the second electrode are arranged in the second direction on any portion of a portion corresponding to the first protruding portion or a portion corresponding to the second protruding portion;

the first electrically conductive portion extends in the first direction in a manner of opposing both of the first pad and the first electrode, the second electrically conductive portion extends in the first direction in a manner of opposing both of the second pad and the second electrode, and the first electrically conductive portion and the second electrically conductive portion are arranged in the second direction.

[36] The terahertz device according to [35], wherein the first electrically conductive portion comprises:

a first element opposing portion, as the element opposing portion opposing the first pad in the thickness direction of the terahertz element, and a first bump, as the bump disposed between the first pad and the first element opposing portion; and the second electrically conductive portion comprises:

a second element opposing portion, as the element opposing portion opposing the second pad in the thickness direction of the terahertz element, and a second bump, as the bump disposed between the second pad and the second element opposing portion; and the first pad and the second pad extend in the first direction, the first element opposing portion and the second element opposing portion extend in the first direction, the first bump is arranged in plural in the first direction, and the second bump is arranged in plural in the first direction.

[37] The terahertz device according to any one of [1 to 36], comprising:

an electrode, for electrically connecting to an exterior, the electrode, being disposed on a position non-overlapping with the reflecting portion, when observed in the thickness direction of the terahertz element.

[38] The terahertz device according to [37], wherein the dielectric comprises:

a dielectric main surface, opposing the reflecting portion; and a dielectric back surface, being a surface on a side opposite to the dielectric main surface; and the terahertz device comprises a first surface electrode formed on the dielectric main surface and a second surface electrode formed on the dielectric back surface, as the electrode.

[39] The terahertz device according to [38], comprising:

a column portion, passing through the dielectric and electrically connecting the first surface electrode and the second surface electrode, the column portion being shaped as a frame surrounding the terahertz element.

[40] The terahertz device according to any one of [1 to 39], wherein the reflecting portion is in an electrically floating state.

[41] The terahertz device according to any one of [1 to 40], comprising:

a protection diode, disposed in the dielectric and connected in parallel to the terahertz element.

[42] A terahertz device, comprising:

a terahertz element, receiving an electromagnetic wave;

a dielectric, comprising a dielectric material and surrounding the terahertz element;

a gas space, comprising a gas; and a reflecting portion, comprising a portion opposing the terahertz element through the dielectric and the gas space, and reflecting an incident electromagnetic wave to the terahertz element;

wherein an element refractive index, which is a refractive index of the terahertz element, is higher than a gas refractive index, which is a refractive index of the gas, and a dielectric refractive index, which is a refractive index of the dielectric, is lower than the element refractive index and higher than the gas refractive index.

[43] The terahertz device according to [42], wherein the terahertz element comprises an element substrate, and the element refractive index is a refractive index of the element substrate.

[44] The terahertz device according to [43], wherein the element substrate comprises InP.

[45] The terahertz device according to any one of [42 to 44], wherein the gas is air.

[46] The terahertz device according to any one of [42 to 45], wherein the dielectric comprises epoxy resin.

[47] The terahertz device according to any one of [42 to 46], comprising:

an antenna base, comprising an antenna surface opposing the terahertz element through the dielectric and the gas space;

wherein the reflecting portion is a reflecting film formed on the antenna surface.

[48] The terahertz device according to [47], wherein the antenna base is formed of an insulative material.

[49] The terahertz device according to [47 or 48], wherein the terahertz element comprises an element main surface and an element back surface serving as surfaces crossing a thickness direction of the terahertz element;

the element main surface comprises an oscillation point;

the element back surface is a surface on a side opposite to the element main surface; and the dielectric comprises:

a dielectric main surface opposing the reflecting film in the thickness direction of the terahertz element, and a dielectric back surface, being a surface on a side opposite to the dielectric main surface.

[50] The terahertz device according to [49], wherein the reflecting film is formed as being larger than the terahertz element, when observed in the thickness direction of the terahertz element.

[51] The terahertz device according to [49 or 50], wherein the gas space is defined by the dielectric main surface and the antenna surface.

[52] The terahertz device according to [51], wherein the antenna base comprises:

a base main surface, opposing the dielectric main surface; and an antenna recess, recessed from the base main surface; and the antenna surface is an inner surface of the antenna recess, and curves in a manner of recessing toward a direction away from the terahertz element.

[53] The terahertz device according to [52], wherein the reflecting film is formed on the antenna surface but is not formed on the base main surface.

[54] The terahertz device according to [52 or 53], wherein the antenna recess comprises a diameter expansion surface with an expanded diameter compared to the antenna surface, and a step surface formed between the antenna surface and the diameter expansion surface; and the reflecting film is formed throughout the antenna surface and the step surface.

[55] The terahertz device according to any one of [52 to 54], comprising:

a fixing portion, fixing the dielectric with the antenna base.

[56] The terahertz device according to [55], wherein the fixing portion comprises an adhesive layer disposed between the base main surface and the dielectric main surface and bonding the dielectric and the antenna base, and the gas space is sealed by the adhesive layer.

[57] The terahertz device according to any one of [49 to 56], wherein the terahertz element is surrounded by the dielectric in a state where the element main surface faces the reflecting film.

[58] The terahertz device according to [57], wherein the terahertz element irradiates the electromagnetic wave radially from the oscillation point throughout a range of an opening angle, and the reflecting film is formed through an angle greater than the opening angle with respect to the oscillation point.

[59] The terahertz device according to [57 or 58], wherein the reflecting film is shaped as a parabolic antenna.

[60] The terahertz device according to [59], wherein the reflecting film is configured by locating a focus of the reflecting film at the oscillation point.

[61] The terahertz device according to [59], wherein a center point of the reflecting film coincides with the oscillation point, when observed in the thickness direction of the terahertz element.

[62] The terahertz device according to [59], wherein the terahertz element is configured on a position at which a center of the reflecting film is staggered from the resonant point, when observed in the thickness direction of the terahertz element.

[63] The terahertz device according to any one of [49 to 62], wherein an element reflecting layer that reflects the electromagnetic wave is formed on the element back surface.

[64] The terahertz device according to any one of [49 to 63], wherein an electrically conductive portion electrically connected to the terahertz element is disposed in the dielectric.

[65] The terahertz device according to [64], wherein the dielectric comprises a protruding portion further protruding to a side compared to the antenna base, when observed in the thickness direction of the terahertz element;

an electrode electrically connected to the electrically conductive portion is formed on a portion on the dielectric main surface or the dielectric back surface corresponding to the protruding portion; and the electrically conductive portion electrically connects the terahertz element and the electrode.

[66] The terahertz device according to [65], wherein if a protruding direction of the protruding portion is set as a first direction, and a direction orthogonal to both the first direction and the thickness direction of the terahertz element is set as a second direction, the electrically conductive portion extends in the first direction in a manner of overlapping with both the terahertz element and the electrode, when observed in the thickness direction of the terahertz element.

[67] The terahertz device according to [66], wherein the terahertz element comprises a pad; and the electrically conductive portion comprises:

an element opposing portion, opposing the pad in the thickness direction of the terahertz element, and a bump, disposed between the pad and the element opposing portion; and the terahertz element is flip-chip mounted on the element opposing portion with the bump interposed in between.

[68] The terahertz device according to [67], wherein the electrically conductive portion comprises:

an electrode opposing portion, opposing the electrode in the thickness direction of the terahertz element, and a connecting portion, connecting the element opposing portion and the electrode and extending in the first direction; and if the second direction is a width direction of the electrically conductive portion, at least a portion of the connecting portion is formed as being narrower than the element opposing portion.

[69] The terahertz device according to [68], wherein the electrode opposing portion is formed as being wider than the connecting portion.

[70] The terahertz device according to [68 or 69], wherein the connecting portion comprises:

a connecting body portion, formed as having a width narrower than the first element opposing portion; and an element side taper portion, connecting the connecting body portion and the element opposing portion, and formed as having a width that gradually increases from the connecting body portion toward the element opposing portion.

[71] The terahertz device according to [70], wherein the connecting body portion is formed as having a width narrower than the electrode opposing portion;

the connecting portion comprises an electrode side taper portion; and the electrode side taper portion connects the connecting body portion and the electrode opposing portion, and is formed as having a width that gradually increases from the connecting body portion toward the electrode opposing portion.

[72] The terahertz device according to any one of [67 to 71], comprising:

a first electrically conductive portion and a second electrically conductive portion as an electrically conductive portion;

wherein the first electrically conductive portion and the second electrically conductive portion extend from the terahertz element towards directions away from each other, when observed in the thickness direction of the terahertz element.

[73] The terahertz device according to [72], wherein the dielectric comprises a first protruding portion and a second protruding portion arranged apart in the first direction, as the protruding portion;

the terahertz element comprises a first pad and a second pad arranged apart and opposite in the first direction, as the pad;

the terahertz device comprises a first electrode formed on a portion on the dielectric main surface or the dielectric back surface corresponding to the first protruding portion, and a second electrode formed on a portion on the dielectric main surface or the dielectric back surface corresponding to the second protruding portion, as the electrode; and the first electrically conductive portion extends in the first direction in a manner of opposing both of the first pad and the first electrode, and the second electrically conductive portion extends in the first direction in a manner of opposing both of the second pad and the second electrode.

[74] The terahertz device according to [73], wherein the first electrically conductive portion comprises:

a first element opposing portion, as the element opposing portion opposing the first pad in the thickness direction of the terahertz element, and a first bump, as the bump disposed between the first pad and the first element opposing portion; and the second electrically conductive portion comprises:

a second element opposing portion, as the element opposing portion opposing the second pad in the thickness direction of the terahertz element, and a second bump, as the bump disposed between the second pad and the second element opposing portion; and the first pad and the second pad extend in the second direction, the first element opposing portion and the second element opposing portion extend in the second direction, the first bump is arranged in plural in the second direction, and the second bump is arranged in plural in the second direction.

[75] The terahertz device according to any one of [67 to 71], comprising:

a first electrically conductive portion and a second electrically conductive portion as the electrically conductive portion;

wherein the first electrically conductive portion and the second electrically conductive portion extend in the first direction in a manner of being arranged in the second direction.

[76] The terahertz device according to [75], wherein the dielectric comprises a first protruding portion and a second protruding portion arranged apart in the first direction, as the protruding portion;

the terahertz element comprises a first pad and a second pad arranged apart in the second direction, as the pad;

the terahertz device comprises a first electrode and a second electrode formed on the dielectric main surface or the dielectric back surface, as the electrode;

the first electrode and the second electrode are arranged in the second direction on any portion of a portion corresponding to the first protruding portion or a portion corresponding to the second protruding portion; and the first electrically conductive portion extends in the first direction in a manner of opposing both of the first pad and the first electrode, the second electrically conductive portion extends in the first direction in a manner of opposing both of the second pad and the second electrode, and the first electrically conductive portion and the second electrically conductive portion are arranged in the second direction.

[77] The terahertz device according to [76], wherein the first electrically conductive portion comprises:

a first element opposing portion, as the element opposing portion opposing the first pad in the thickness direction of the terahertz element, and a first bump, as the bump disposed between the first pad and the first element opposing portion; and the second electrically conductive portion comprises:

a second element opposing portion, as the element opposing portion opposing the second pad in the thickness direction of the terahertz element, and a second bump, as the bump disposed between the second pad and the second element opposing portion; and the first pad and the second pad extend in the first direction, the first element opposing portion and the second element opposing portion extend in the first direction, the first bump is arranged in plural in the first direction, and the second bump is arranged in plural in the first direction.

[78] The terahertz device according to any one of [42 to 77], comprising:

an electrode, for electrically connecting to an exterior, the electrode, being disposed on a position non-overlapping with the reflecting portion, when observed in the thickness direction of the terahertz element.

[79] The terahertz device according to [78], wherein the dielectric comprises:

a dielectric main surface, opposing the reflecting portion; and a dielectric back surface, being a surface on a side opposite to the dielectric main surface; and the terahertz device comprises a first surface electrode formed on the dielectric main surface and a second surface electrode formed on the dielectric back surface, as the electrode.

[80] The terahertz device according to [79], comprising:

a column portion, passing through the dielectric and electrically connecting the first surface electrode and the second surface electrode, the column portion being shaped as a frame surrounding the terahertz element.

[81] The terahertz device according to any one of [42 to 80], wherein the reflecting portion is in an electrically floating state.

[82] The terahertz device according to any one of [42 to 81], comprising:

a protection diode, disposed in the dielectric and connected in parallel to the terahertz element.

What is claimed is:

1. A terahertz device, comprising:

a terahertz element, generating an electromagnetic wave;

a dielectric, including a dielectric material and surrounding the terahertz element;

a gas space, in which a gas exists; and a reflecting portion, including a portion opposing the terahertz element through the dielectric and the gas space, and reflecting the electromagnetic wave toward a direction, wherein the electromagnetic wave is generated from the terahertz element and transmitted through the dielectric and the gas space, wherein an element refractive index, which is a refractive index of the terahertz element, is greater than a gas refractive index, which is a refractive index of the gas, a dielectric refractive index, which is a refractive index of the dielectric, is less than the element refractive index and greater than the gas refractive index, and the terahertz device includes an antenna base that has an antenna surface facing the terahertz element through the dielectric and the gas space, and wherein the reflecting portion is a reflective film formed on the antenna surface, the terahertz element includes:

an element main surface, having an oscillation point as a surface intersecting a thickness direction of the terahertz element; and an element back surface, being a surface opposite to the element main surface, and wherein the dielectric includes:

a dielectric main surface, facing the reflective film in the thickness direction of the terahertz element; and a dielectric back surface, being a surface opposite to the dielectric main surface, wherein a conductive portion electrically connected to the terahertz element is disposed in the dielectric.

2. The terahertz device of claim 1, wherein the the dielectric has a protruding portion projecting laterally from the antenna base and viewed along the thickness direction of the terahertz element, an electrode electrically connected to the conductive portion is disposed on a portion of the dielectric main surface or the dielectric back surface corresponding to the protruding portion, and the conductive portion electrically connects the terahertz element and the electrode.

3. The terahertz device of claim 2, wherein when a protruding direction of the protruding portion is set as a first direction, and a direction orthogonal to both the first direction and the thickness direction of the terahertz element is set as a second direction, the conductive portion extends in the first direction in a manner of overlapping both the terahertz element and the electrode and viewed along the thickness direction of the terahertz element.

4. The terahertz device of claim 3, wherein the terahertz element includes a pad, the conductive portion includes:

an element opposing portion, opposing the pad in the thickness direction of the terahertz element; and a bump, disposed between the pad and the element opposing portion, and the terahertz element is flip-chip mounted on the element opposing portion with the bump interposed in between.

5. The terahertz device of claim 4, wherein the conductive portion includes:

an electrode opposing portion, opposing the electrode in the thickness direction of the terahertz element; and a connecting portion, connecting the element opposing portion and the electrode opposing portion, and extending in the first direction, and when the second direction is a width direction of the conductive portion, at least a part of the connecting portion narrower than the element opposing portion is formed.

6. The terahertz device of claim 5, wherein the electrode opposing portion wider than the connecting portion is formed.

7. The terahertz device of claim 5, wherein the connecting portion includes:

a connecting body portion, formed to be narrower than the element opposing portion; and an element side taper portion, connecting the connecting body portion and the element opposing portion, and formed to have a width that gradually increases from the connecting body portion toward the element opposing portion.

8. The terahertz device of claim 7, wherein the connecting body portion is formed to be narrower than the electrode opposing portion, and the connecting portion includes an electrode side taper portion, connecting the connecting body portion and the electrode opposing portion, and formed to have a width that gradually increases from the connecting body portion toward the electrode opposing portion.

9. The terahertz device of claim 4, wherein the conductive portion includes a first conductive portion and a second conductive portion, and the first conductive portion and the second conductive portion extend in a direction away from the terahertz element and viewed along the thickness direction of the terahertz element.

10. The terahertz device of claim 9, wherein the dielectric includes a first protruding portion and a second protruding portion arranged apart in the first direction, as the protruding portion, the terahertz element includes a first pad and a second pad arranged apart and opposite in the first direction, as the pad, the terahertz device includes a first electrode formed on a portion on the dielectric main surface or the dielectric back surface corresponding to the first protruding portion, and a second electrode formed on a portion on the dielectric main surface or the dielectric back surface corresponding to the second protruding portion, as the electrode, the first conductive portion extends in the first direction in a manner of opposing both of the first pad and the first electrode, and the second conductive portion extends in the first direction in a manner of opposing both of the second pad and the second electrode.

11. The terahertz device of claim 10, wherein the first conductive portion includes:

a first element opposing portion, as the element opposing portion opposing the first pad in the thickness direction of the terahertz element; and a first bump, as the bump disposed between the first pad and the first element opposing portion, the second conductive portion includes:

a second element opposing portion, as the element opposing portion opposing the second pad in the thickness direction of the terahertz element; and a second bump, as the bump disposed between the second pad and the second element opposing portion, the first pad and the second pad extend in the second direction, the first element opposing portion and the second element opposing portion extend in the second direction, the first bump is arranged in plural in the second direction, and the second bump is arranged in plural in the second direction.

12. The terahertz device of claim 4, wherein the conductive portion includes a first conductive portion and a second conductive portion, and the first conductive portion and the second conductive portion extend in the first direction in a manner of being arranged in the second direction.

13. The terahertz device of claim 12, wherein the dielectric includes a first protruding portion and a second protruding portion arranged apart in the first direction, as the protruding portion, the terahertz element includes a first pad and a second pad arranged apart in the second direction, as the pad, the terahertz device includes a first electrode and a second electrode formed on the dielectric main surface or the dielectric back surface, as the electrode, the first electrode and the second electrode are arranged in the second direction on either a part corresponding to the first protruding portion or a part corresponding to the second protruding portion, the first conductive portion extends in the first direction in a manner of opposing both the first pad and the first electrode, the second conductive portion extends in the first direction in a manner of opposing both the second pad and the second electrode, and the first conductive portion and the second conductive portion are arranged in the second direction.

14. The terahertz device of claim 13, wherein the first conductive portion includes:

a first element opposing portion, as the element opposing portion opposing the first pad in the thickness direction of the terahertz element; and a first bump, as the bump disposed between the first pad and the first element opposing portion, the second conductive portion includes:

a second element opposing portion, as the element opposing portion opposing the second pad in the thickness direction of the terahertz element; and a second bump, as the bump disposed between the second pad and the second element opposing portion, the first pad and the second pad extend in the first direction, the first element opposing portion and the second element opposing portion extend in the first direction, the first bump is arranged in plural in the first direction, and the second bump is arranged in plural in the first direction.

* * * * *